US011805649B2

(12) United States Patent
Pulugurtha et al.

(10) Patent No.: US 11,805,649 B2
(45) Date of Patent: Oct. 31, 2023

(54) THREE-DIMENSIONAL MEMORY DEVICE WITH WIGGLED DRAIN-SELECT-LEVEL ISOLATION STRUCTURE AND METHODS OF MANUFACTURING THE SAME

(71) Applicant: SANDISK TECHNOLOGIES LLC, Addison, TX (US)

(72) Inventors: Srinivas Pulugurtha, San Jose, CA (US); Johann Alsmeier, San Jose, CA (US); Yanli Zhang, San Jose, CA (US); James Kai, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 274 days.

(21) Appl. No.: 17/385,728

(22) Filed: Jul. 26, 2021

(65) Prior Publication Data

US 2021/0358946 A1 Nov. 18, 2021

Related U.S. Application Data

(63) Continuation-in-part of application No. PCT/US2019/063162, filed on Nov. 26, 2019, which (Continued)

(51) Int. Cl.
*H01L 27/11582* (2017.01)
*H01L 27/11556* (2017.01)

(Continued)

(52) U.S. Cl.
CPC ........... *H10B 43/27* (2023.02); *H01L 21/308* (2013.01); *H01L 21/31144* (2013.01);

(Continued)

(58) Field of Classification Search
CPC ............. H01L 21/308; H01L 21/31144; H01L 21/32134; H01L 21/76224;

(Continued)

(56) References Cited

U.S. PATENT DOCUMENTS

| | | | |
|---|---|---|---|
| 5,915,167 | A | 6/1999 | Leedy |
| 8,437,192 | B2 | 5/2013 | Lung et al. |

(Continued)

FOREIGN PATENT DOCUMENTS

| | | | |
|---|---|---|---|
| WO | WO 2018/144957 A1 | 8/2018 | |
| WO | WO 2020/005335 A1 | 1/2020 | |

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).

(Continued)

*Primary Examiner* — David C Spalla
(74) *Attorney, Agent, or Firm* — THE MARBURY LAW GROUP PLLC

(57) ABSTRACT

A three-dimensional memory device includes an alternating stack of insulating layers and electrically conductive layers located over a substrate, memory openings vertically extending through the alternating stack, memory opening fill structures located within a respective one of the memory openings, and at least one drain-select-level isolation structure vertically extending through at least a topmost electrically conductive layer among the electrically conductive layers. The at least one drain-select-level isolation structure may include wiggles and cut through upper portions of at least some of the memory opening fill structures, or may include a vertically-extending dielectric material portion and laterally-protruding dielectric material portions adjoined to the vertically-extending dielectric material portion and laterally protruding into lateral recesses located adjacent to the at least the topmost electrically conductive layer.

20 Claims, 112 Drawing Sheets

Related U.S. Application Data is a continuation of application No. 16/352,157, filed on Mar. 13, 2019, now Pat. No. 10,937,800.

(51) Int. Cl.

| | |
|---|---|
| ***H01L 21/762*** | (2006.01) |
| ***H01L 29/10*** | (2006.01) |
| ***H01L 21/3213*** | (2006.01) |
| ***H01L 21/8234*** | (2006.01) |
| ***H01L 21/308*** | (2006.01) |
| ***H01L 21/311*** | (2006.01) |
| ***H10B 43/27*** | (2023.01) |
| ***H10B 41/27*** | (2023.01) |

(52) U.S. Cl.

CPC .. *H01L 21/32134* (2013.01); *H01L 21/76224* (2013.01); *H01L 21/823412* (2013.01); *H01L 21/823418* (2013.01); *H01L 29/1037* (2013.01); *H10B 41/27* (2023.02)

(58) Field of Classification Search

CPC ..... H01L 21/823412; H01L 21/823418; H01L 21/823487; H01L 21/823885; H01L 29/0676; H01L 29/1037; H01L 29/66666; H01L 29/7827; H01L 29/78642; H01L 29/7788; H10B 41/27; H10B 43/27

See application file for complete search history.

(56) References Cited

U.S. PATENT DOCUMENTS

| | | | | |
|---|---|---|---|---|
| 9,728,547 | B1 | 8/2017 | Ohsaki et al. | |
| 9,922,987 | B1 | 3/2018 | Mizutani et al. | |
| 9,972,640 | B1 | 5/2018 | Kai et al. | |
| 10,192,878 | B1 | 1/2019 | Tsutsumi et al. | |
| 10,236,300 | B2 | 3/2019 | Zhang et al. | |
| 10,290,650 | B1 | 5/2019 | Iwai | |
| 10,297,610 | B2 | 5/2019 | Kai et al. | |
| 10,373,969 | B2 | 8/2019 | Zhang et al. | |
| 10,381,450 | B1 | 8/2019 | Yada et al. | |
| 10,403,639 | B2 | 9/2019 | Orimoto et al. | |
| 10,475,804 | B1 | 11/2019 | Nishikawa et al. | |
| 10,490,564 | B2 | 11/2019 | Mushiga et al. | |
| 10,490,569 | B2 | 11/2019 | Mushiga et al. | |
| 10,553,599 | B1 | 2/2020 | Chen et al. | |
| 10,586,803 | B2 | 3/2020 | Mushiga et al. | |
| 10,600,800 | B2 | 3/2020 | Nishikawa et al. | |
| 10,685,978 | B1 | 6/2020 | Lu et al. | |
| 10,741,576 | B2 | 8/2020 | Nishikawa et al. | |
| 10,777,575 | B1 | 9/2020 | Cui et al. | |
| 10,937,800 | B2 | 3/2021 | Kim et al. | |
| 2014/0264542 | A1* | 9/2014 | Simsek-Ege | H01L 29/7889 438/287 |
| 2016/0071860 | A1 | 3/2016 | Kai et al. | |
| 2018/0114794 | A1* | 4/2018 | Jang | H10B 43/27 |
| 2018/0138189 | A1 | 5/2018 | Kai et al. | |
| 2019/0027488 | A1 | 1/2019 | Kai et al. | |
| 2019/0027489 | A1* | 1/2019 | Orimoto | H10B 43/35 |
| 2019/0035803 | A1 | 1/2019 | Zhang et al. | |
| 2019/0214395 | A1 | 7/2019 | Zhang et al. | |
| 2019/0267461 | A1 | 8/2019 | Yada et al. | |
| 2019/0326306 | A1 | 10/2019 | Mushiga et al. | |
| 2019/0326307 | A1 | 10/2019 | Mushiga et al. | |
| 2019/0326313 | A1 | 10/2019 | Cui et al. | |
| 2020/0006358 | A1 | 1/2020 | Nishikawa et al. | |
| 2020/0051995 | A1* | 2/2020 | Tanaka | H10B 41/50 |
| 2020/0058673 | A1 | 2/2020 | Nishikawa et al. | |
| 2020/0168623 | A1 | 5/2020 | Nishikawa et al. | |
| 2020/0251489 | A1* | 8/2020 | Tsutsumi | H10B 41/35 |

OTHER PUBLICATIONS

Notification of Transmittal of the International Search Report and Written Opinion of the International Search Authority for International Patent Application No. PCT/US2019/063162, dated Feb. 25, 2020, 9 pages.

U.S. Appl. No. 17/317,479, filed May 11, 2021, SanDisk Technologies LLC.

U.S. Appl. No. 17/317,578, filed May 11, 2021, SanDisk Technologies LLC.

* cited by examiner

THREE-DIMENSIONAL MEMORY DEVICE WITH WIGGLED DRAIN-SELECT-LEVEL ISOLATION STRUCTURE AND METHODS OF MANUFACTURING THE SAME

RELATED APPLICATIONS

This application is a continuation-in-part (CIP) application of PCT International Application Serial No. PCT/US2019/063162 filed on Nov. 26, 2019, which is a continuation of U.S. patent application Ser. No. 16/352,157 filed on Mar. 13, 2019, the entire contents of which are incorporated herein by reference.

FIELD

The present disclosure relates generally to the field of semiconductor devices, and particularly to a three-dimensional memory device having wiggled drain-select-level isolation structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises an alternating stack of insulating layers and electrically conductive layers, memory openings vertically extending through the alternating stack, memory opening fill structures located within a respective one of the memory openings, wherein each of the memory opening fill structures comprises a memory film and a vertical semiconductor channel, and at least one drain-select-level isolation structure vertically extending through at least a topmost electrically conductive layer of the electrically conductive layers and laterally extending generally along a first horizontal direction and having a periodic repetition of lateral wiggles along a second horizontal direction that is perpendicular to the first horizontal direction, wherein the at least one drain-select-level isolation structure cuts through drain-select-level portions of at least some of the memory opening fill structures.

According to another aspect of the present disclosure, a three-dimensional memory device comprises an alternating stack of insulating layers and electrically conductive layers, memory openings vertically extending through the alternating stack, memory opening fill structures located within a respective one of the memory openings, wherein each of the memory opening fill structures comprises a memory film and a vertical semiconductor channel, and at least one drain-select-level isolation structure vertically extending through at least a topmost electrically conductive layer of the electrically conductive layers. The at least one drain-select-level isolation structure comprises a vertically-extending dielectric material portion and laterally-protruding dielectric material portions adjoined to the vertically-extending dielectric material portion and laterally protruding into lateral recesses located adjacent to the at least the topmost electrically conductive layer.

According to yet another aspect of the present disclosure, a method of forming a three-dimensional memory device comprises forming an alternating stack of insulating layers and sacrificial material layers over a substrate, wherein the sacrificial material layers comprise word-line-level sacrificial material layers and at least one drain-select-level sacrificial material layer that overlie the drain-select-level sacrificial material layers, forming memory openings vertically extending through the alternating stack, forming memory opening fill structures within the memory openings, wherein each of the memory opening fill structures comprises a memory film and a vertical semiconductor channel, forming a drain-select-level isolation trench through the at least one drain-select-level sacrificial material layer between a neighboring pair of rows of memory opening fill structures of the memory opening fill structures; forming lateral recesses around the drain-select-level isolation trench by laterally recessing the at least one drain-select-level sacrificial material layer selective to the insulating layers or by laterally recessing at least one drain-select-level electrically conductive layer that is formed by replacing the at least one drain-select-level sacrificial material layer selective to the insulating layers, and forming a drain-select-level isolation structure within a combined volume including the drain-select-level isolation trench and the lateral recesses.

58A. The vertical plane A-A' is the plane of the schematic vertical cross-sectional view of FIG. 58A.

Figure 59A:
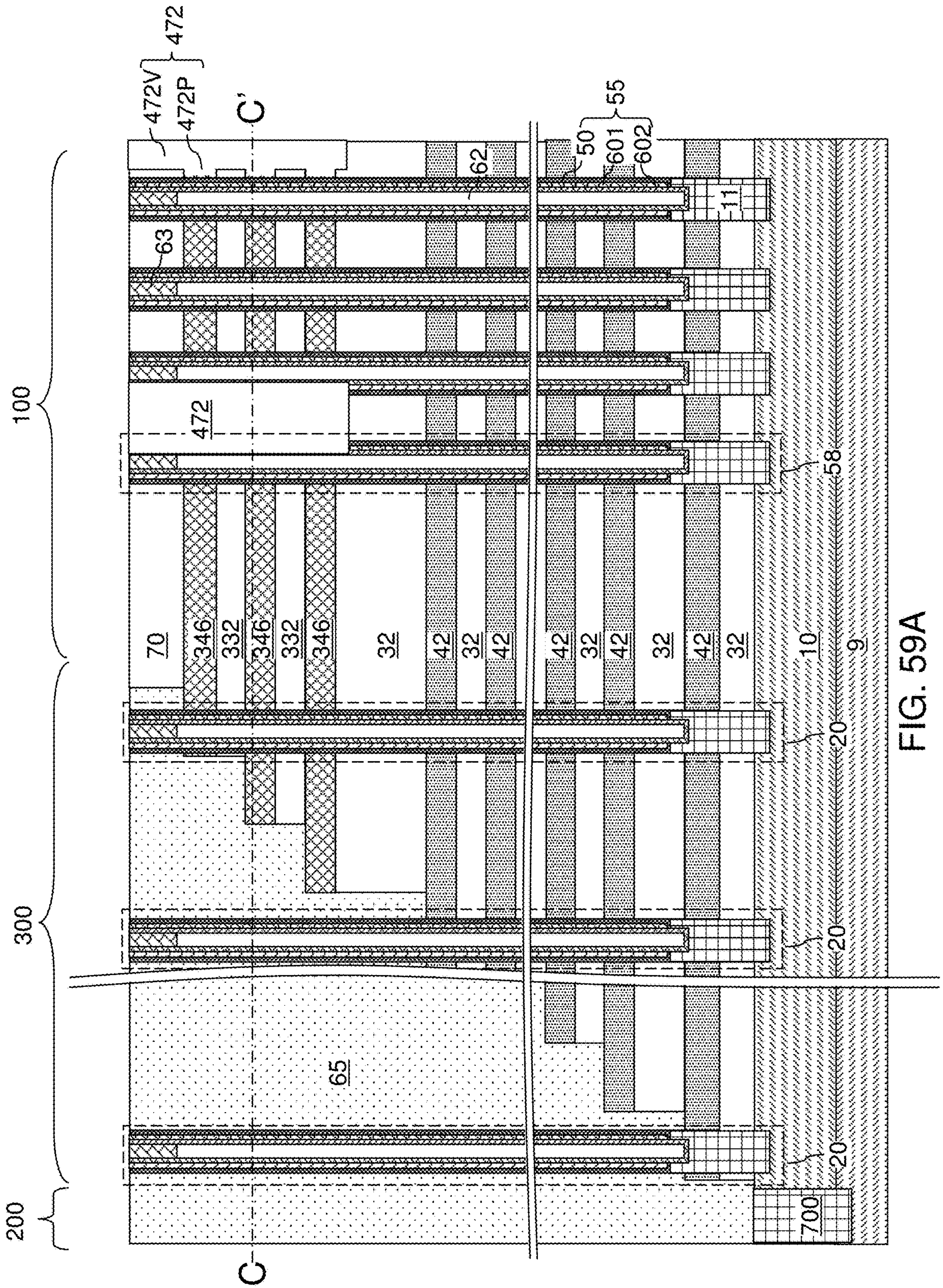

FIG. 59A is a vertical cross-sectional view the third exemplary structure after formation of drain-select-level isolation structures according to an embodiment of the present disclosure.

Figure 59B:
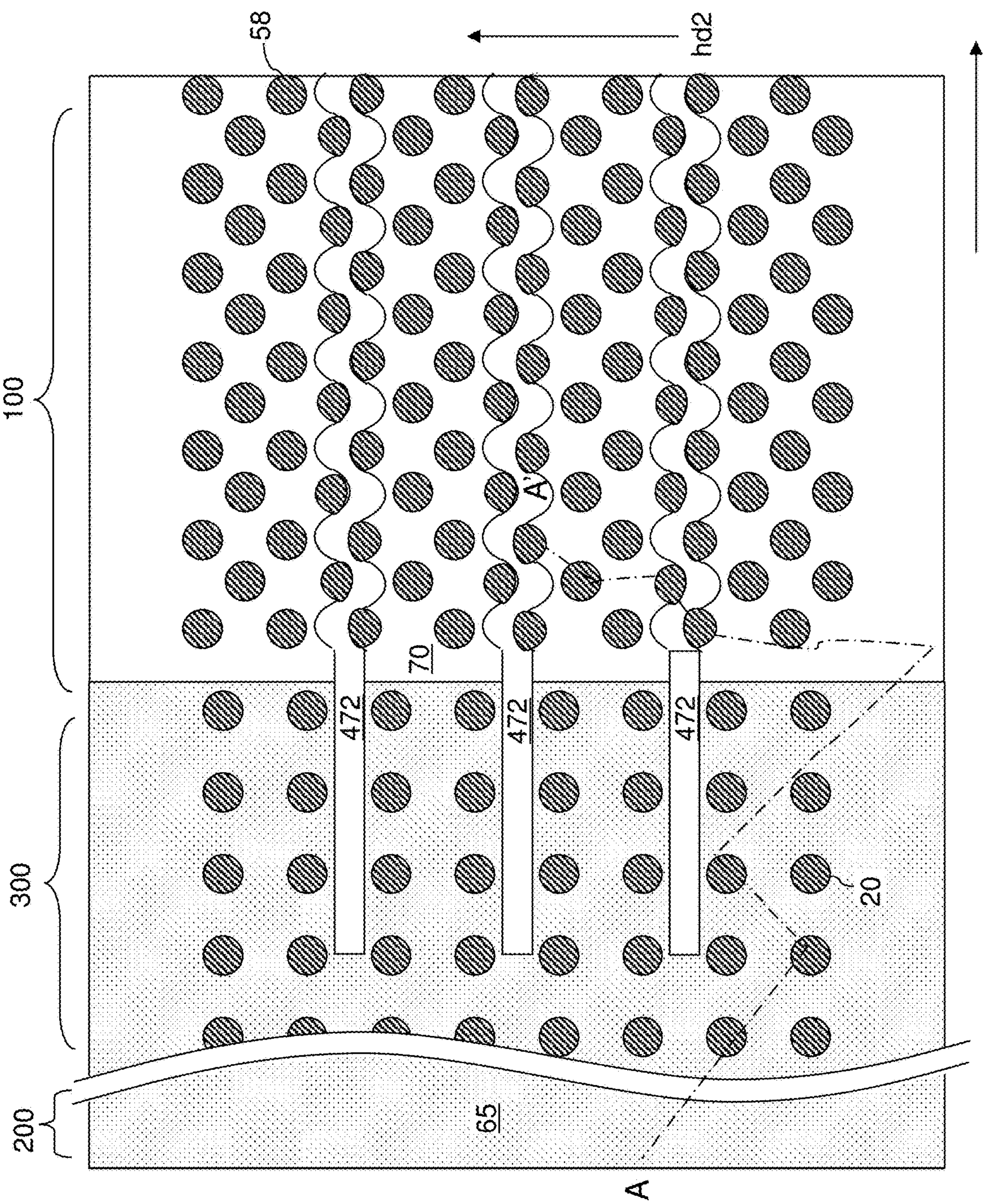

FIG. 59B is a top-down view of the third exemplary structure of FIG. 59A. The vertical plane A-A' is the plane of the schematic vertical cross-sectional view of FIG. 59A.

Figure 59C:
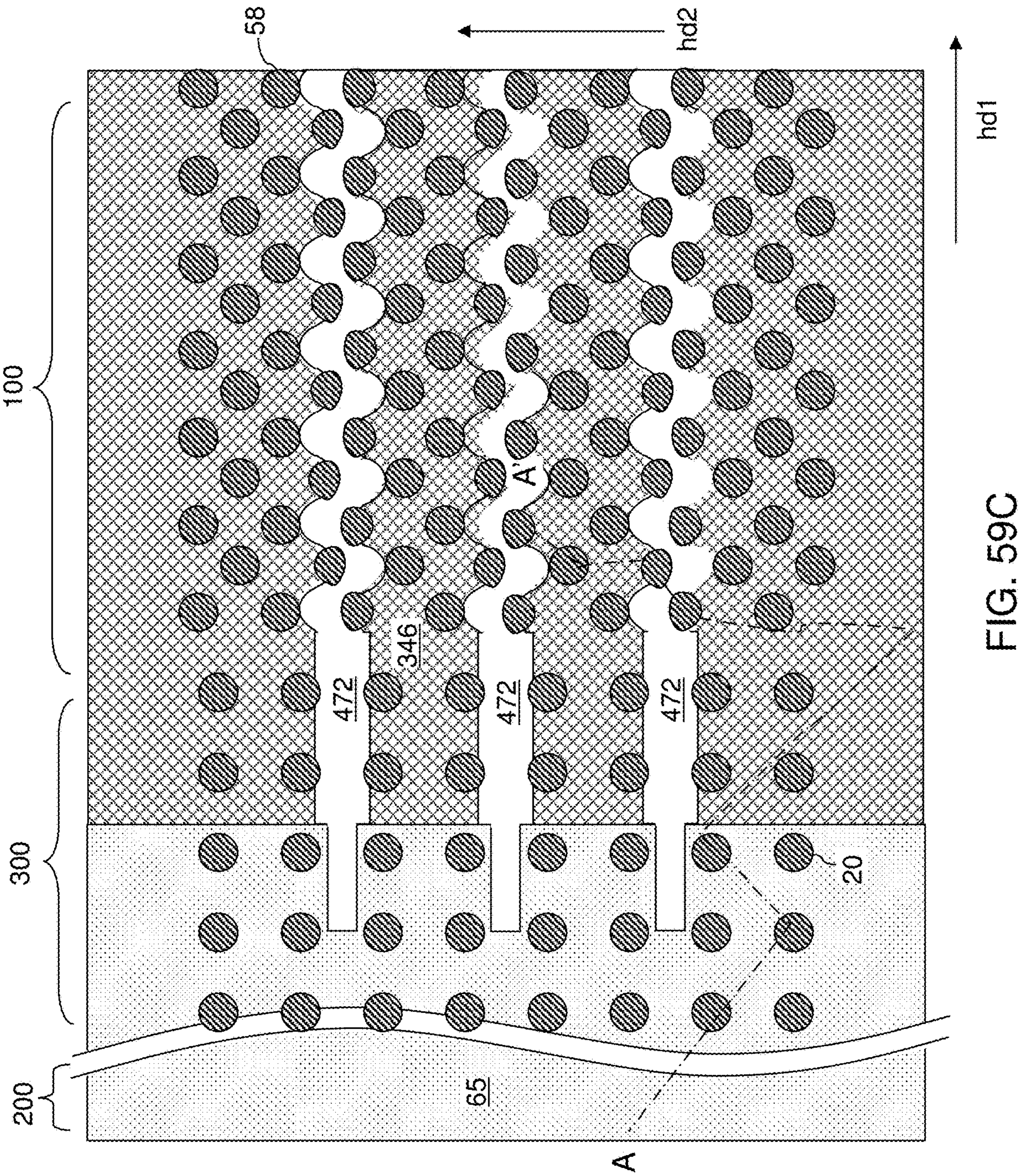

FIG. 59C is a horizontal cross-sectional view of the third exemplary structure along the horizontal plane C-C' of FIG. 59A. The vertical plane A-A' is the plane of the schematic vertical cross-sectional view of FIG. 59A.

Figure 60A:
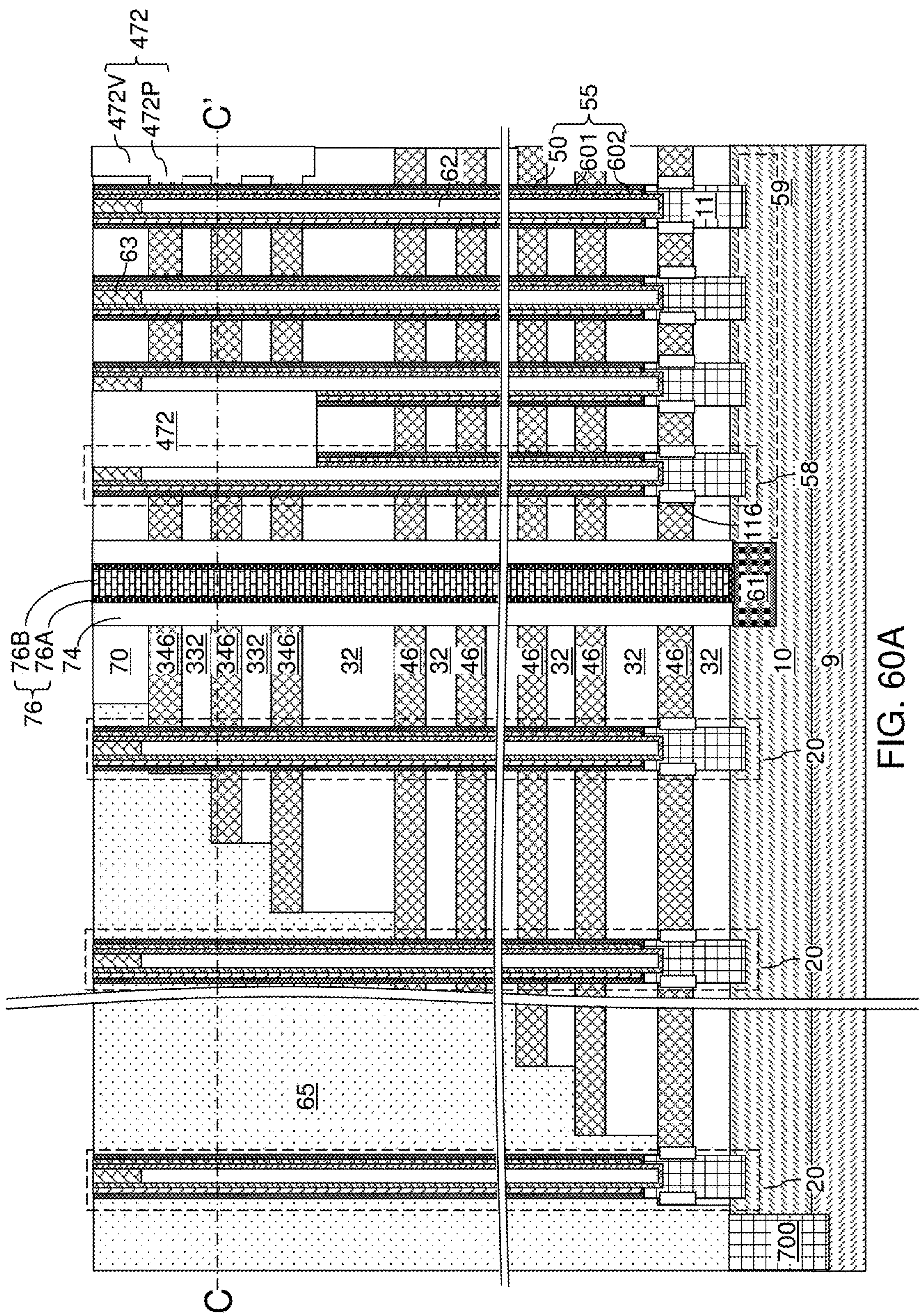

FIG. 60A is a vertical cross-sectional view the third exemplary structure after replacement of word-line-level sacrificial material layers with word-line-level electrically conductive layers and formation of backside trench fill structures according to an embodiment of the present disclosure.

Figure 60B:
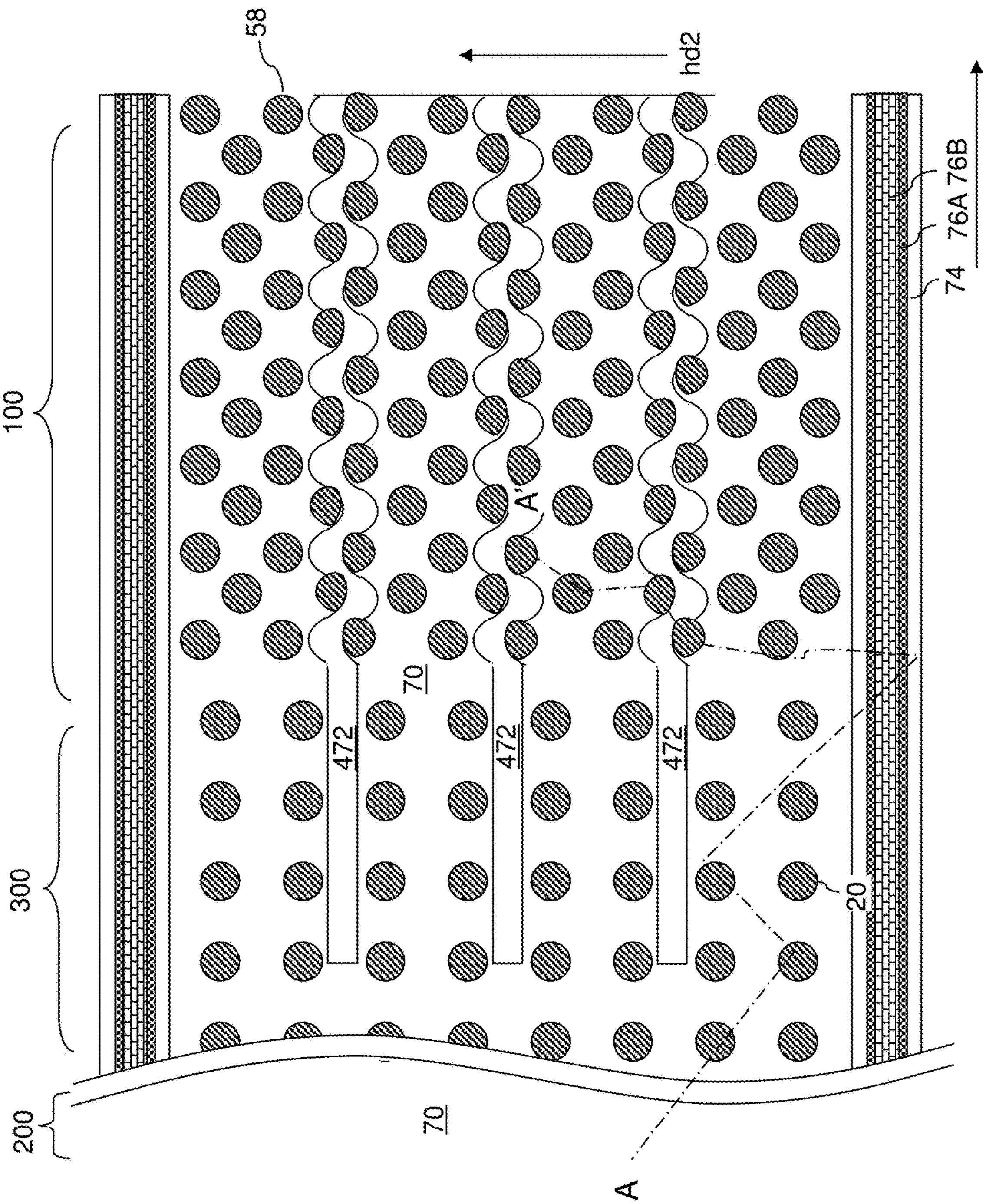

FIG. 60B is a top-down view of the third exemplary structure of FIG. 60A. The vertical plane A-A' is the plane of the schematic vertical cross-sectional view of FIG. 60A.

Figure 60C:
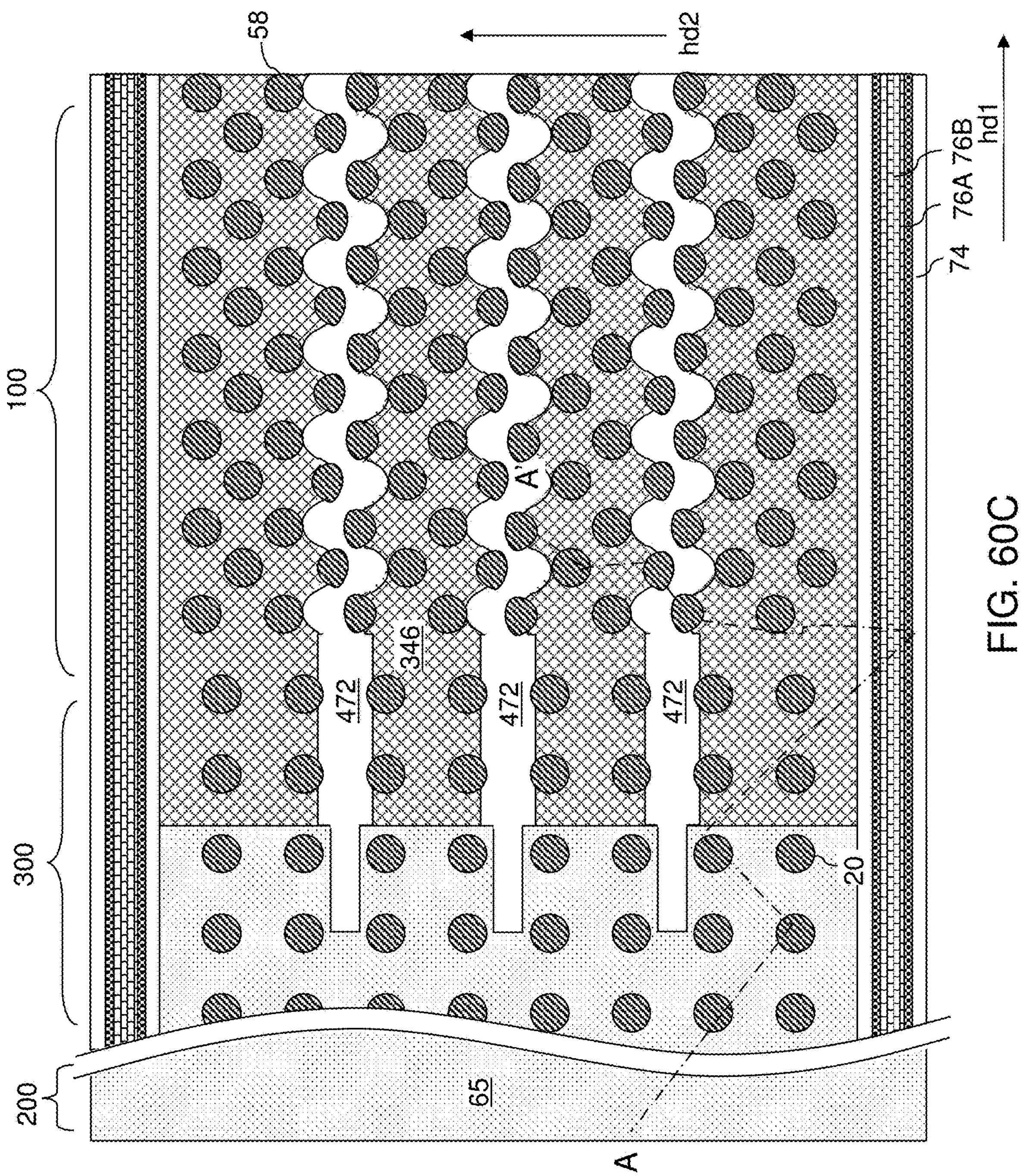

FIG. 60C is a horizontal cross-sectional view of the third exemplary structure along the horizontal plane C-C' of FIG. 60A. The vertical plane A-A' is the plane of the schematic vertical cross-sectional view of FIG. 60A.

Figure 61A:
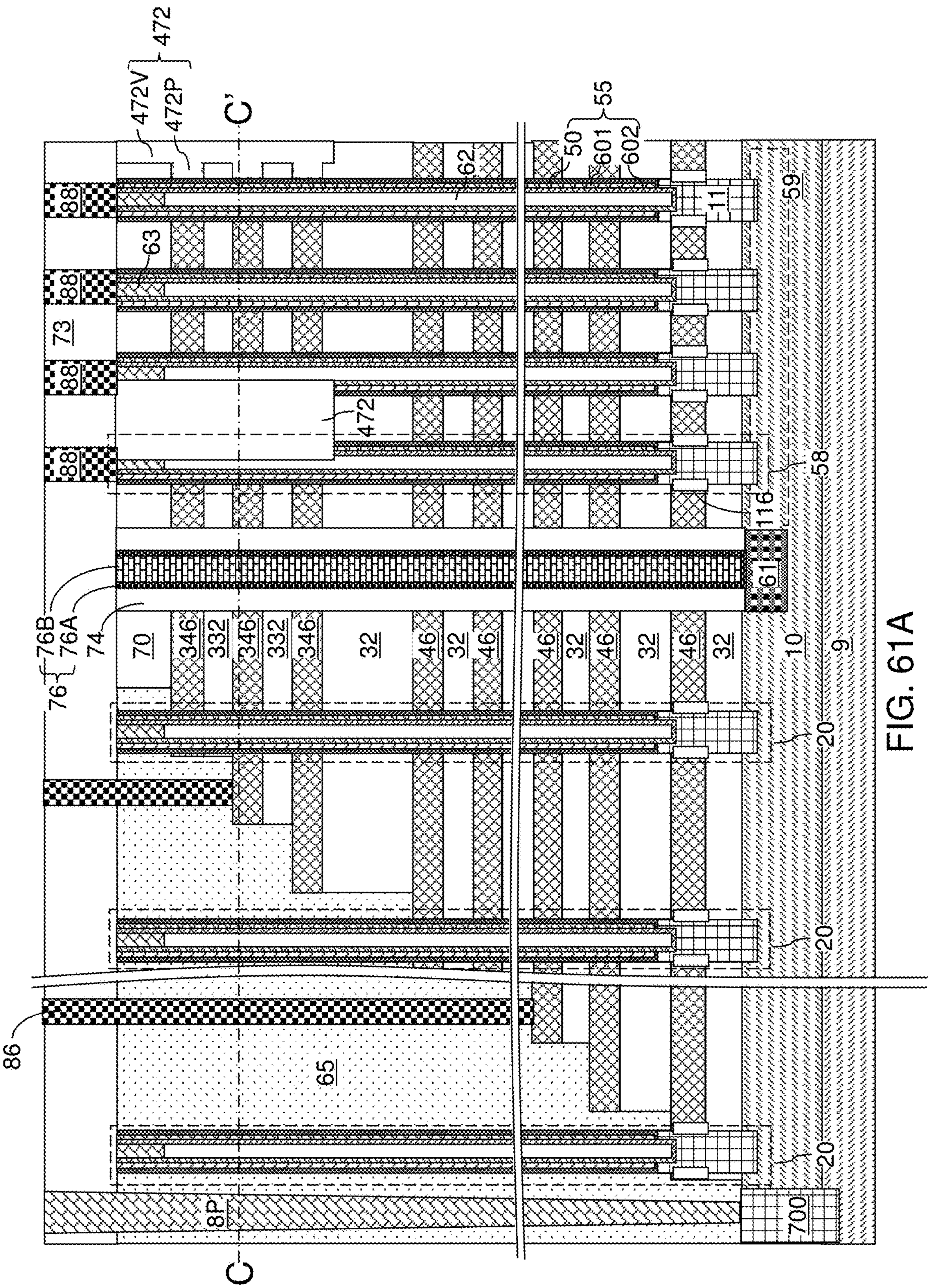

FIG. 61A is a vertical cross-sectional view the third exemplary structure after formation of various contact via structures according to an embodiment of the present disclosure.

Figure 61B:
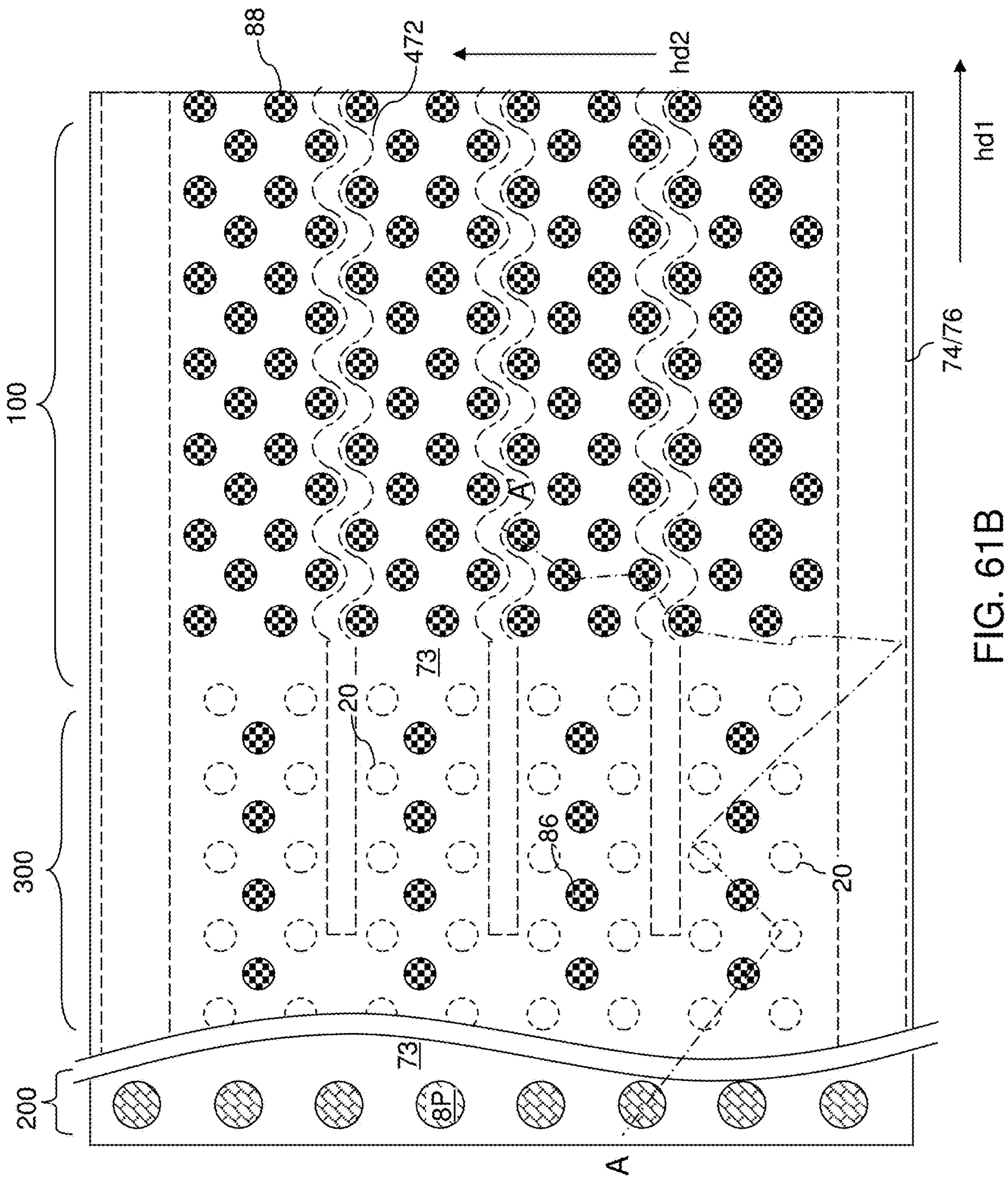

FIG. 61B is a top-down view of the third exemplary structure of FIG. 61A. The vertical plane A-A' is the plane of the schematic vertical cross-sectional view of FIG. 61A.

Figure 61C:
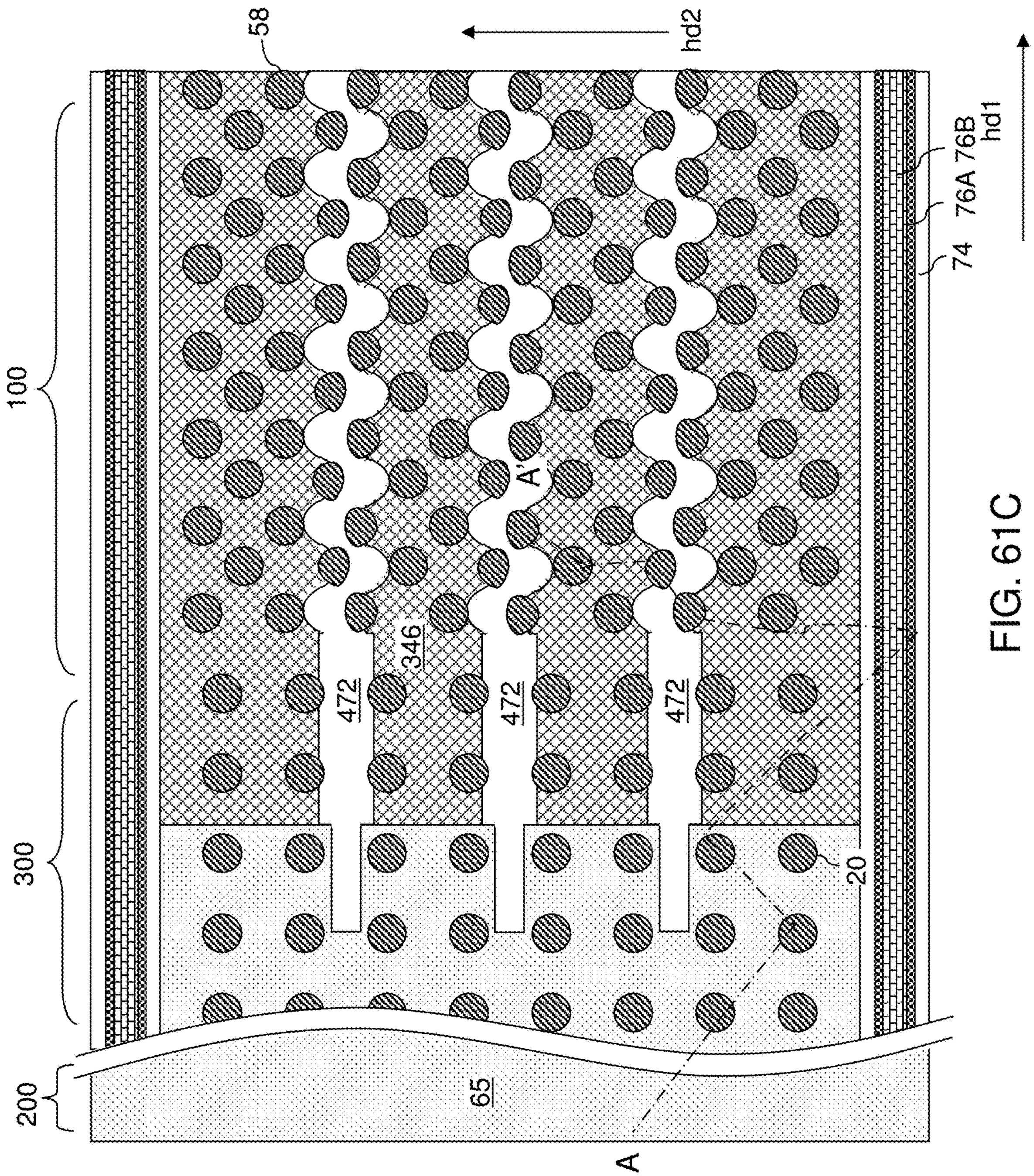

FIG. 61C is a horizontal cross-sectional view of the third exemplary structure along the horizontal plane C-C' of FIG. 61A. The vertical plane A-A' is the plane of the schematic vertical cross-sectional view of FIG. 61A.

Figure 62A:
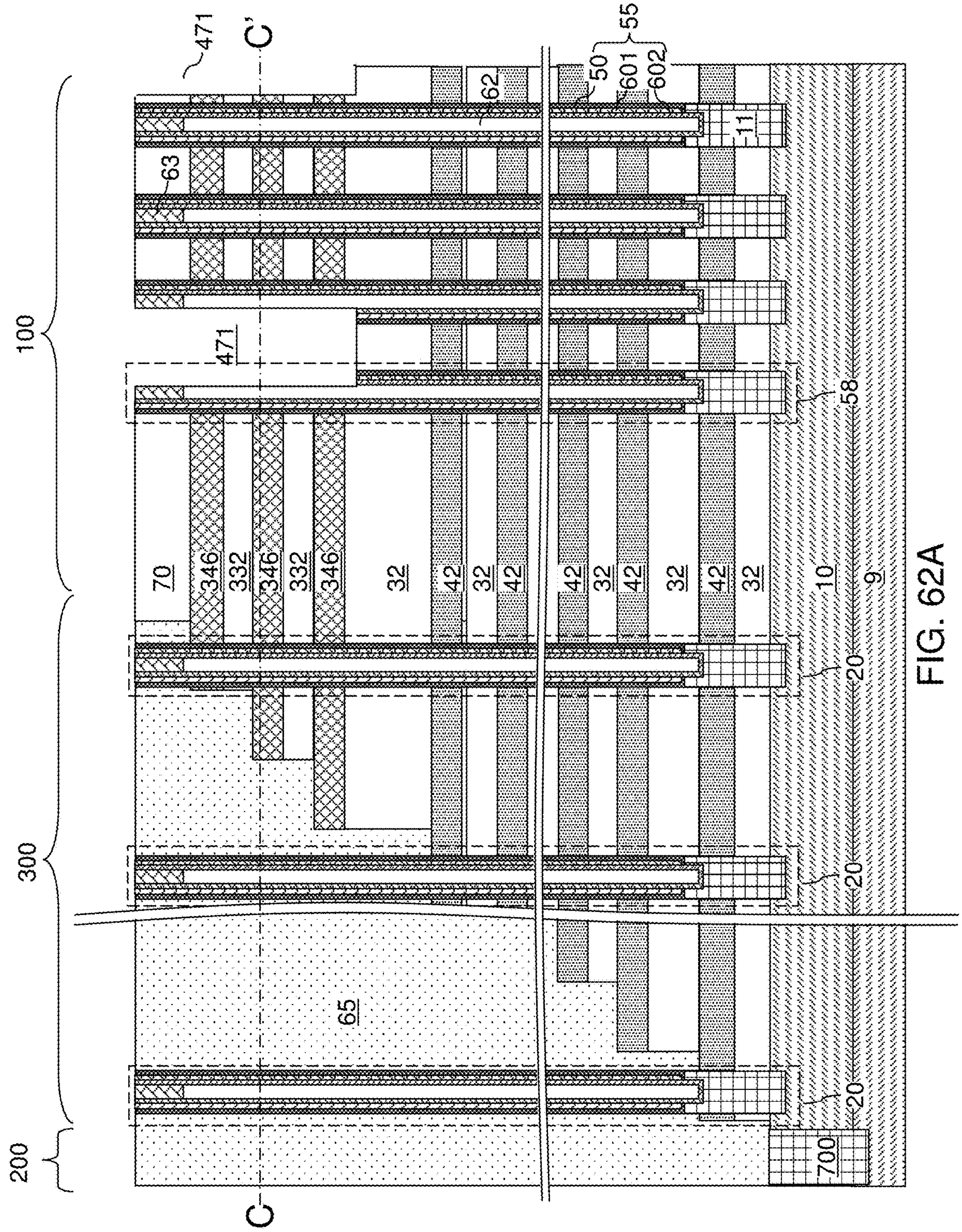

FIG. 62A is a vertical cross-sectional view of an alternative configuration of the third exemplary structure after formation of drain-select-level isolation structures according to an embodiment of the present disclosure.

Figure 62B:
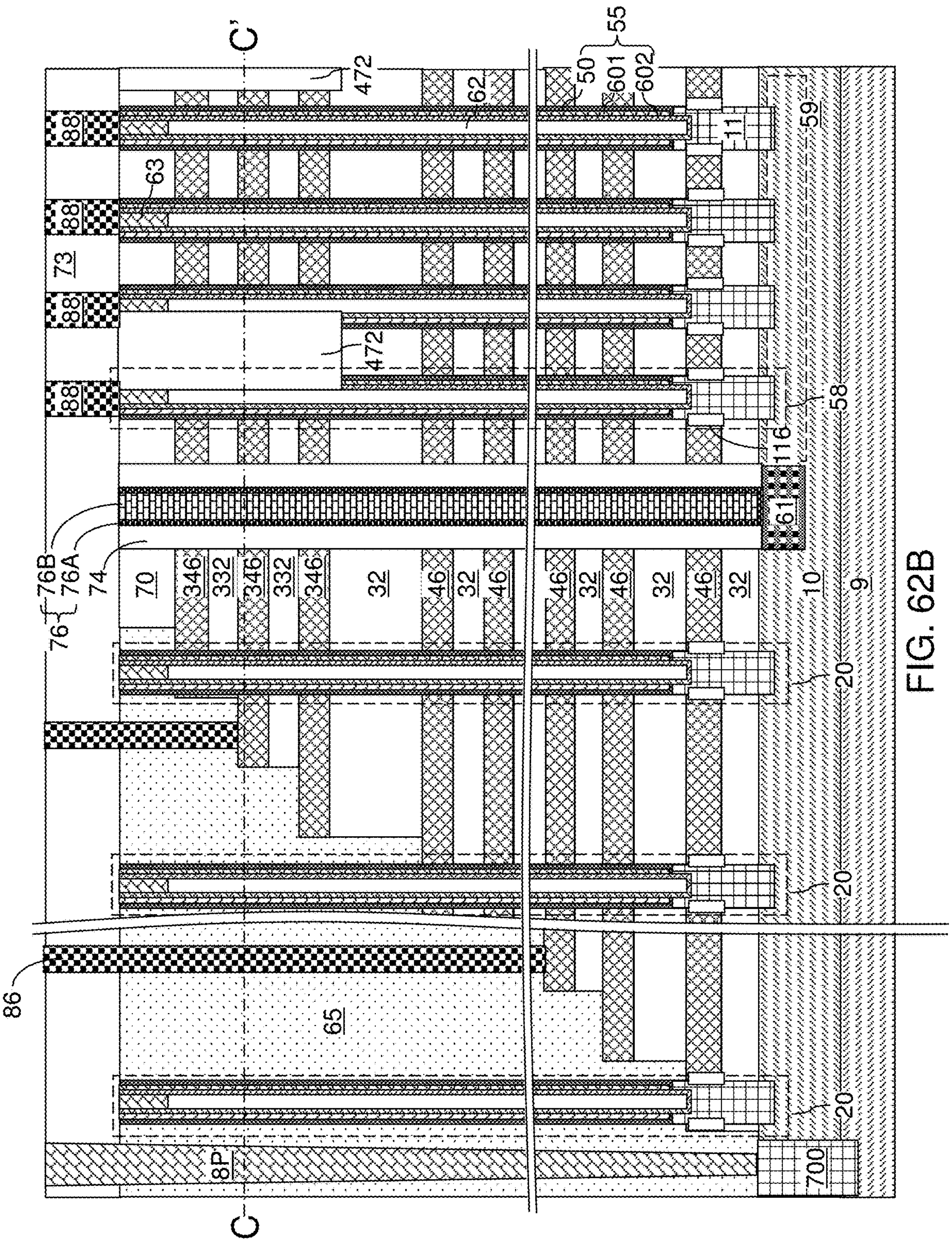

FIG. 62B is a vertical cross-sectional view of the alternative configuration of the third exemplary structure after formation of various contact via structures according to an embodiment of the present disclosure.

Figure 63A:
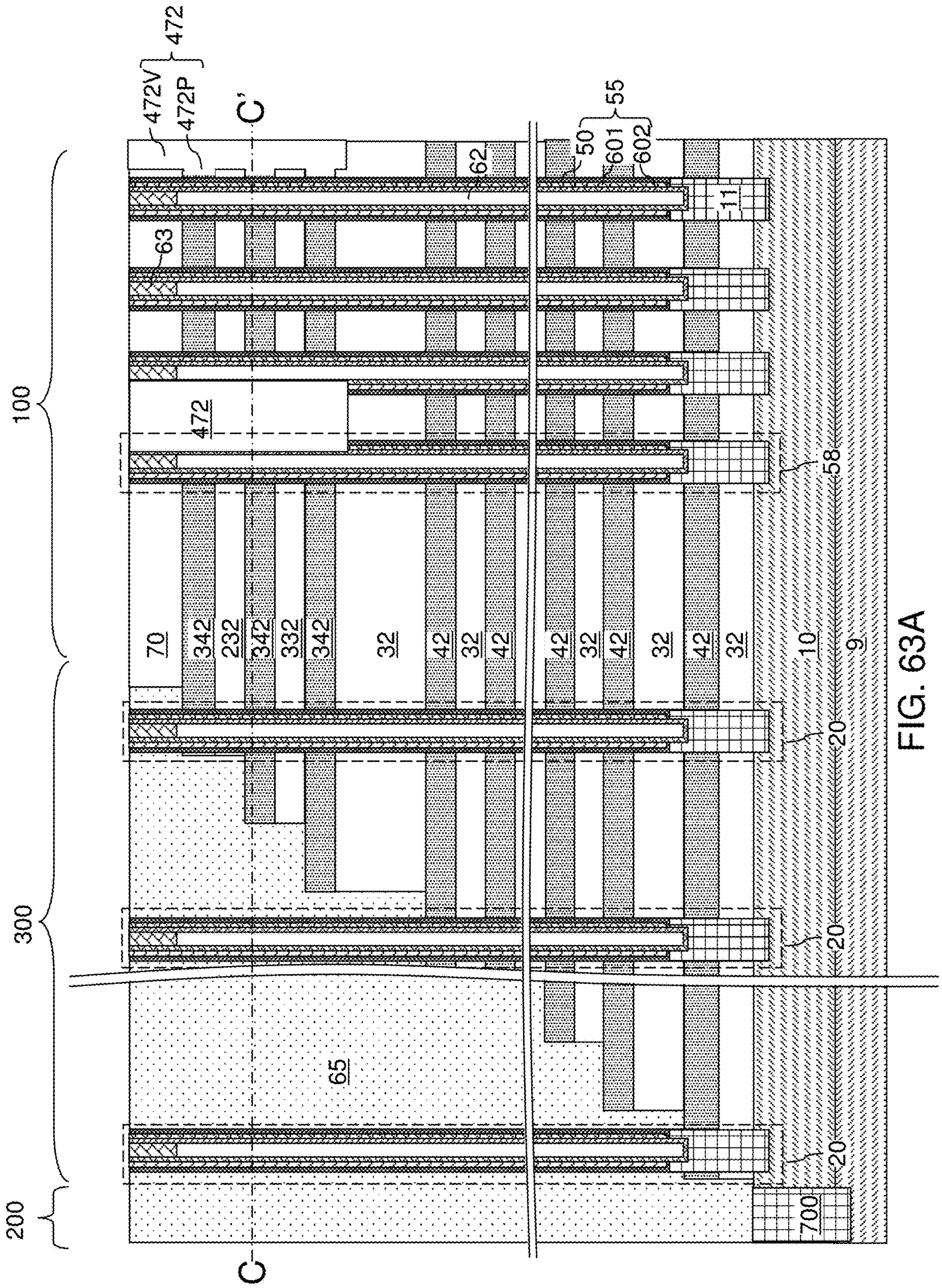

FIG. 63A is a vertical cross-sectional view of another alternative configuration of the third exemplary structure after formation of drain-select-level isolation structures according to an embodiment of the present disclosure.

Figure 63B:
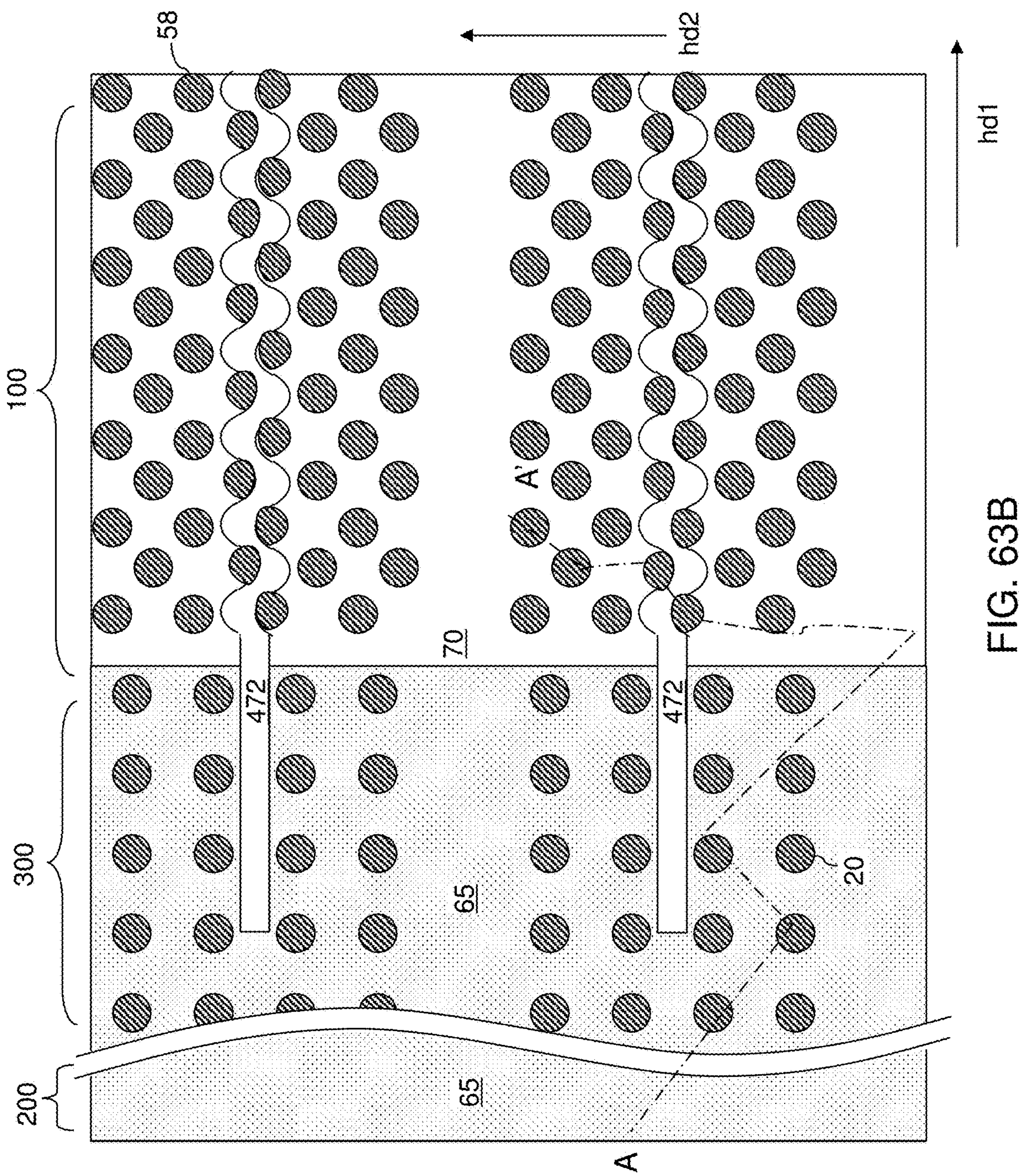

FIG. 63B is a top-down view of the another alternative configuration of the third exemplary structure of FIG. 63A. The vertical plane A-A' is the plane of the schematic vertical cross-sectional view of FIG. 63A.

Figure 63C:
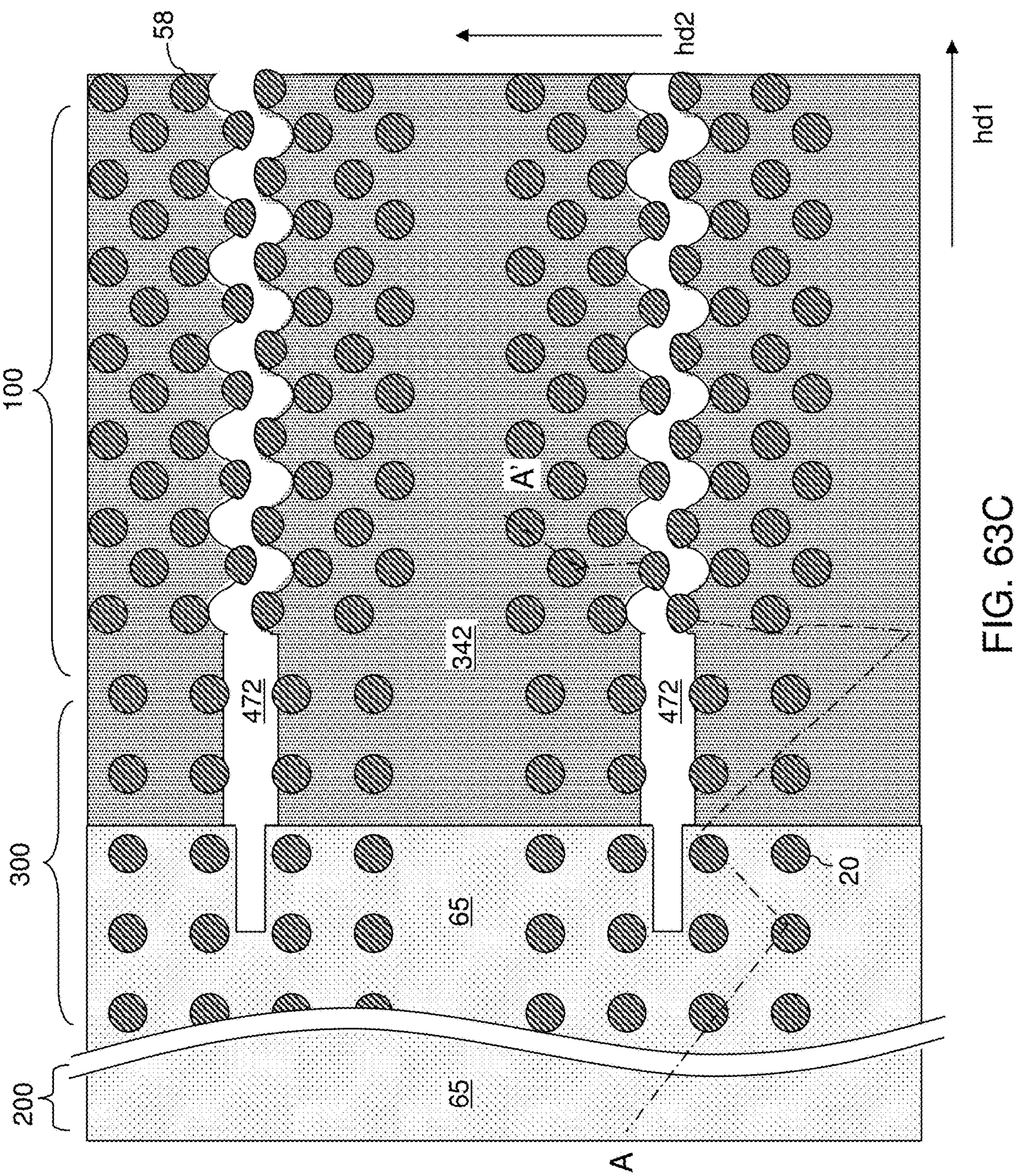

FIG. 63C is a horizontal cross-sectional view of the another alternative configuration of the third exemplary structure along the horizontal plane C-C' of FIG. 63A. The vertical plane A-A' is the plane of the schematic vertical cross-sectional view of FIG. 63A.

Figure 64A:
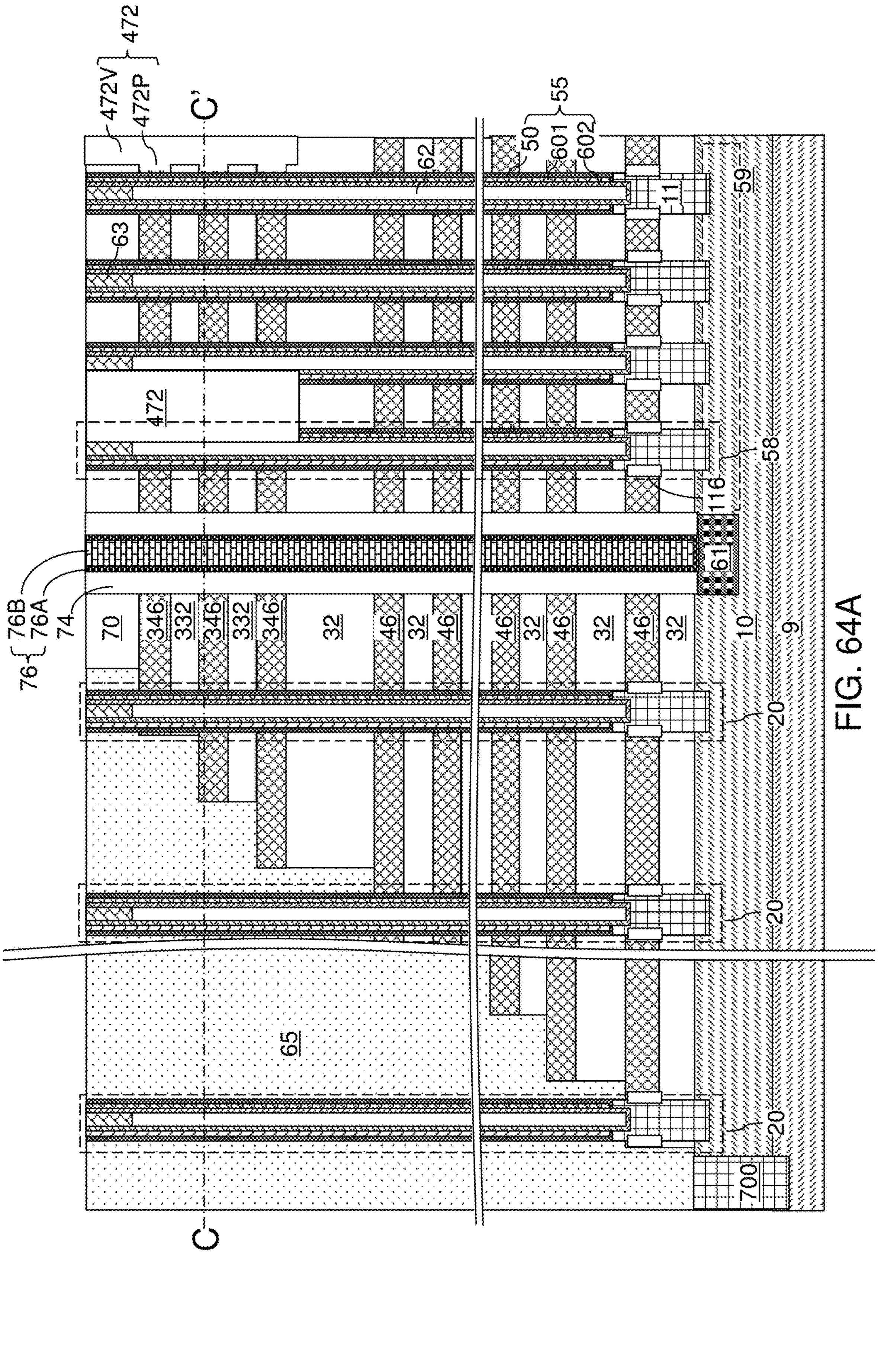

FIG. 64A is a vertical cross-sectional view the another alternative configuration of the third exemplary structure after formation of various contact via structures according to an embodiment of the present disclosure.

Figure 64B:
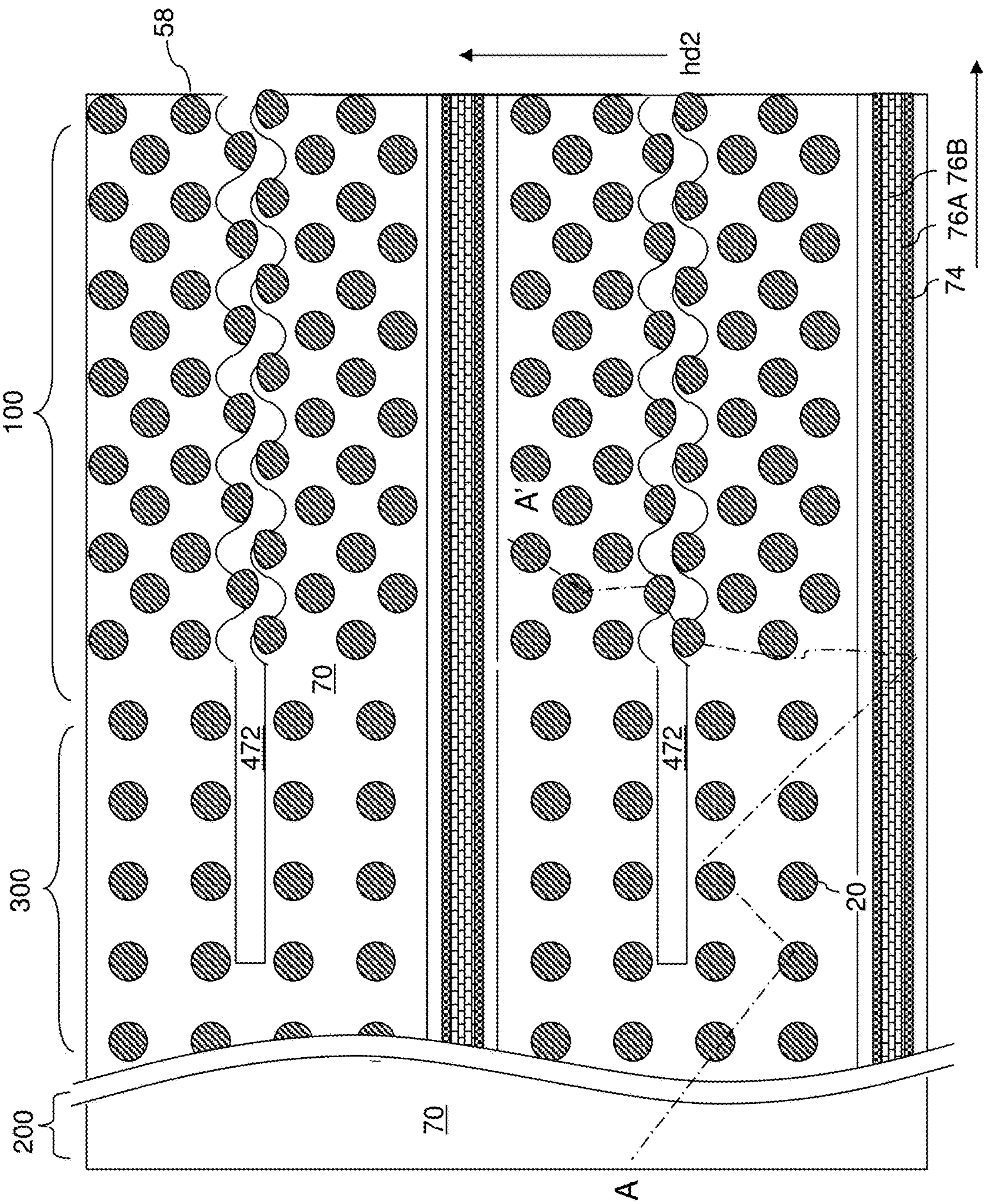

FIG. 64B is a top-down view of the another alternative configuration of the third exemplary structure of FIG. 64A. The vertical plane A-A' is the plane of the schematic vertical cross-sectional view of FIG. 64A.

Figure 64C:
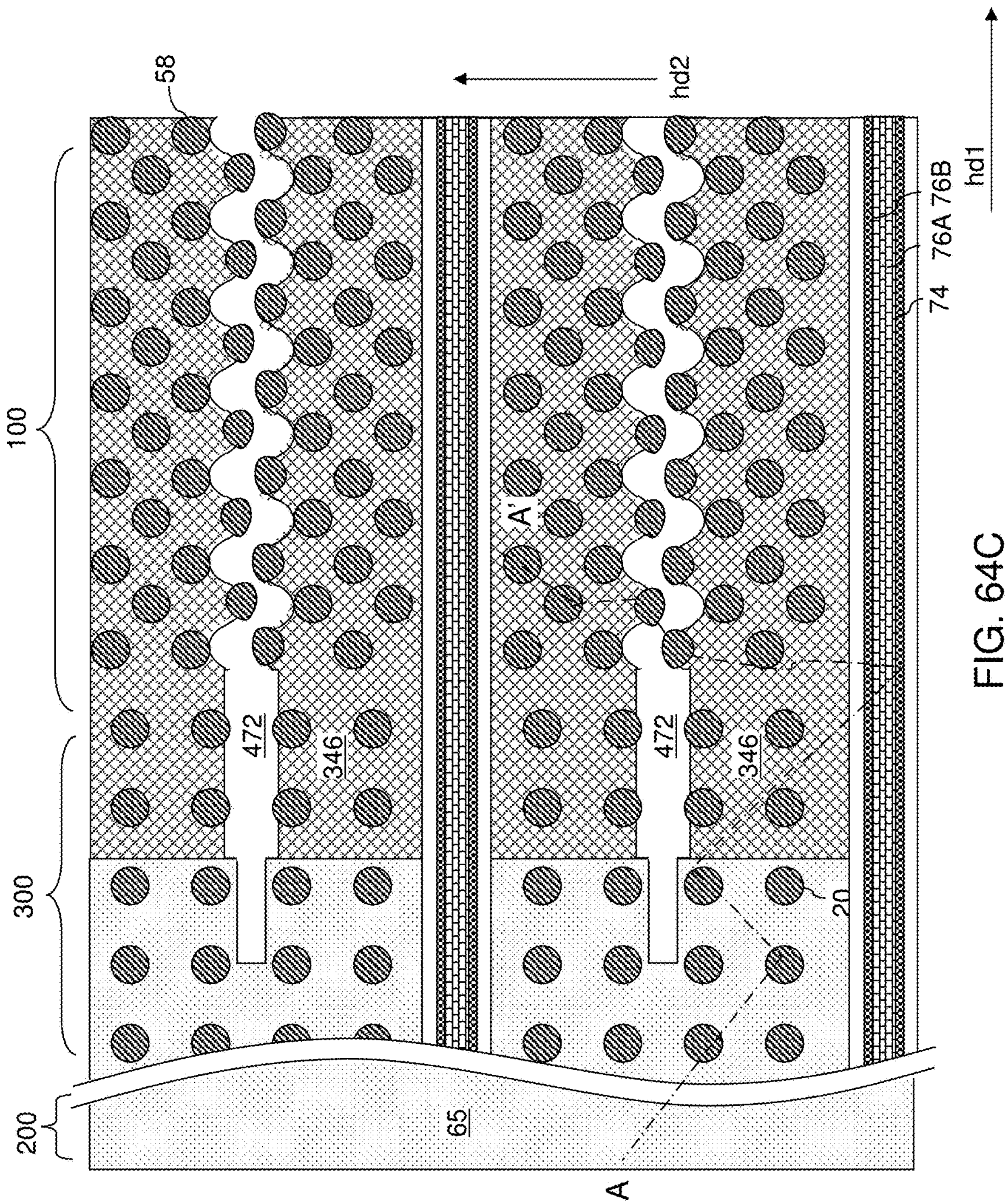

FIG. 64C is a horizontal cross-sectional view of the another alternative configuration of the third exemplary structure along the horizontal plane C-C' of FIG. 64A. The vertical plane A-A' is the plane of the schematic vertical cross-sectional view of FIG. 64A.

Figure 65A:
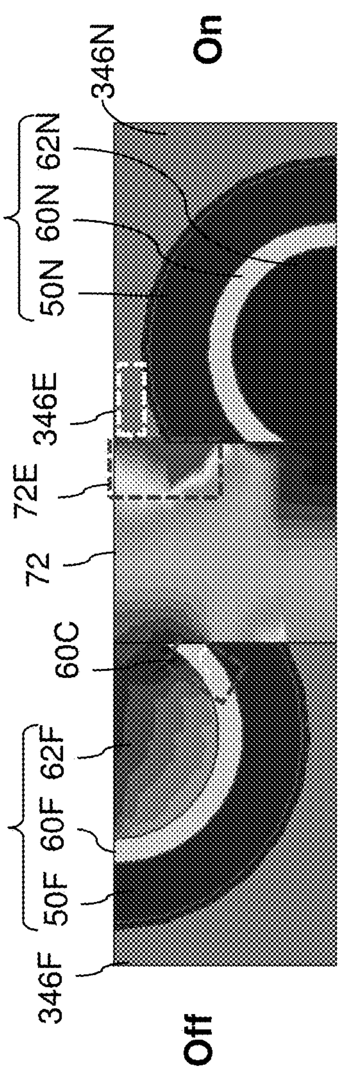

FIG. 65A is horizontal cross-sectional view of a portion of comparative structure during device operation.

Figure 65B:
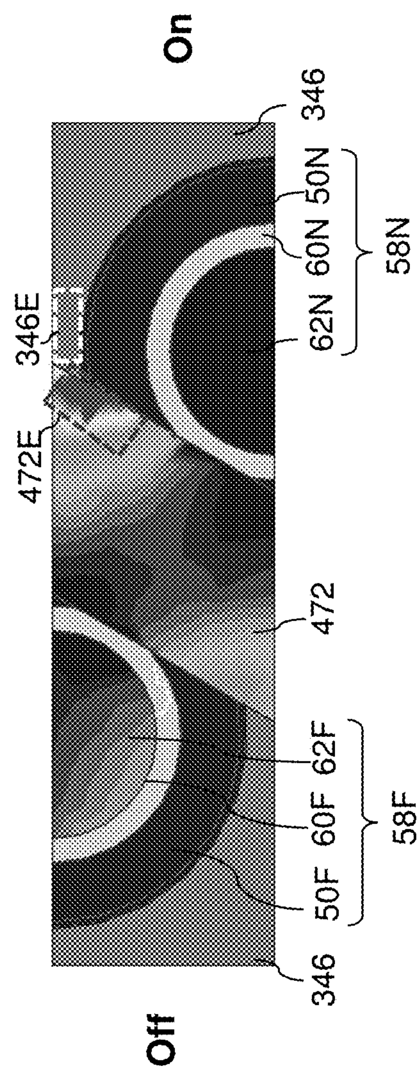

FIG. 65B is horizontal cross-sectional view of a portion of the third exemplary structure during device operation.

Figure 66A:
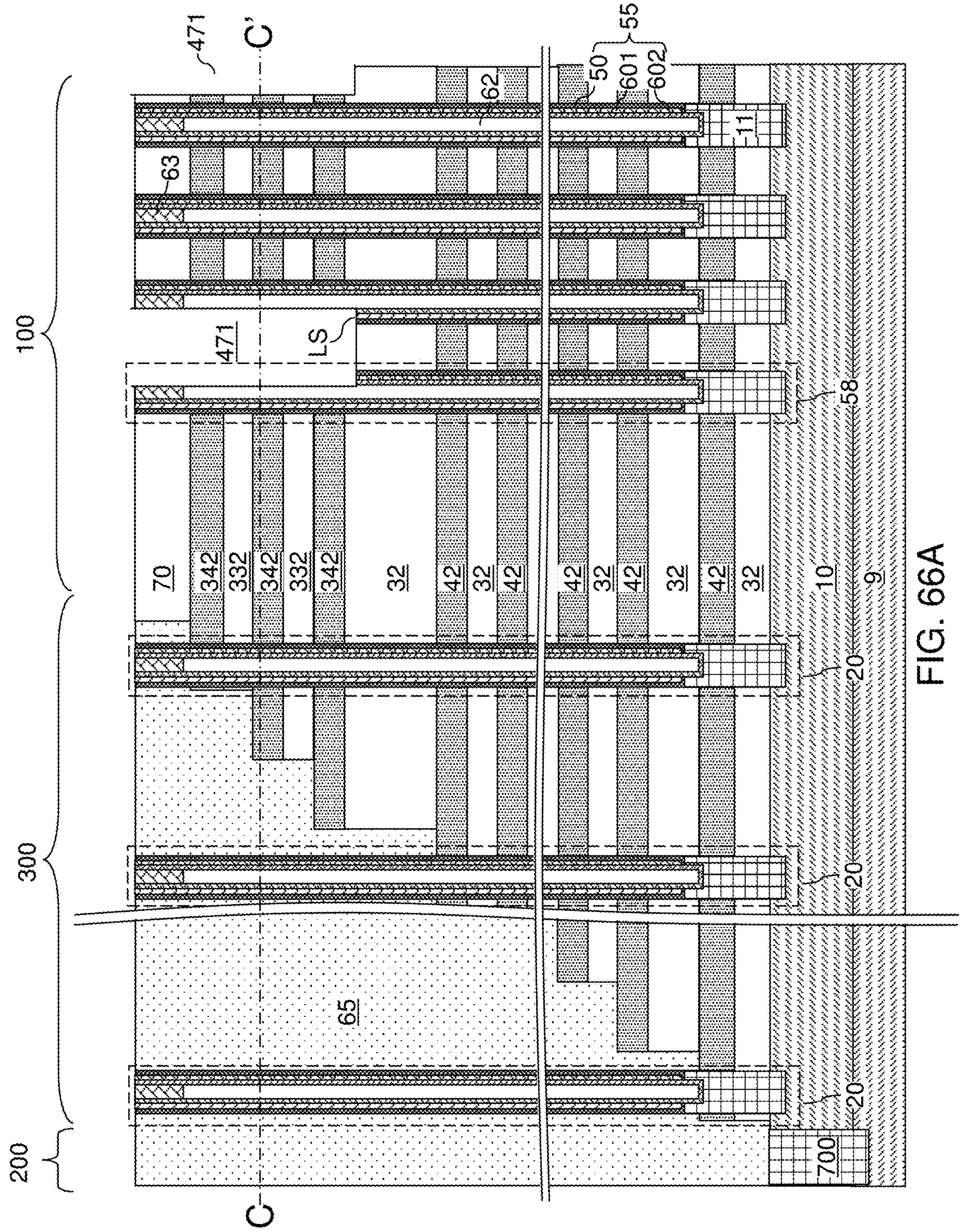

FIG. 66A is a vertical cross-sectional view a fourth exemplary structure after formation of drain-select-level isolation trenches according to an embodiment of the present disclosure.

Figure 66B:
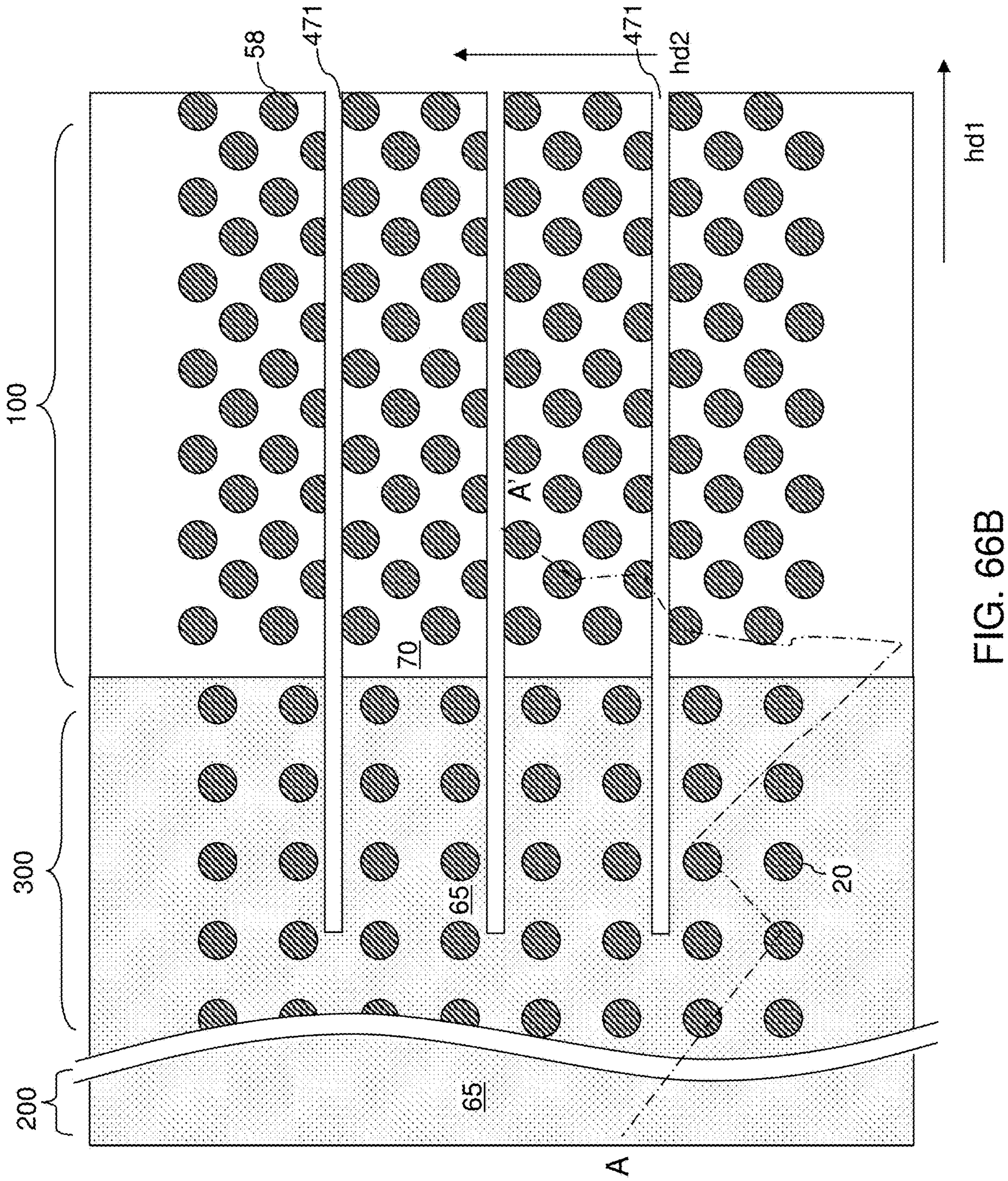

FIG. 66B is a top-down view of the fourth exemplary structure of FIG. 66A. The vertical plane A-A' is the plane of the schematic vertical cross-sectional view of FIG. 66A.

Figure 66C:
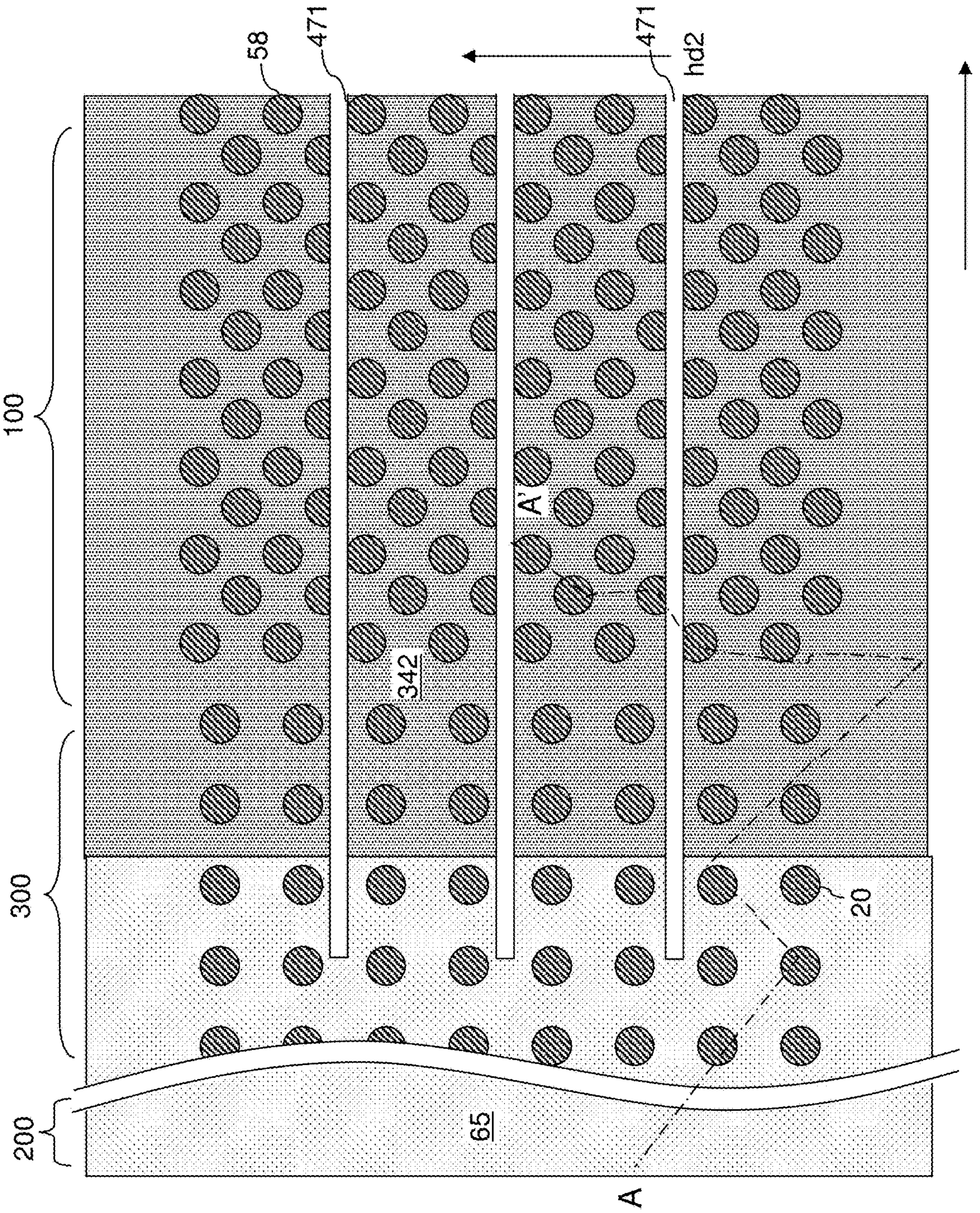

FIG. 66C is a horizontal cross-sectional view of the fourth exemplary structure along the horizontal plane C-C' of FIG. 66A. The vertical plane A-A' is the plane of the schematic vertical cross-sectional view of FIG. 66A.

Figure 67A:
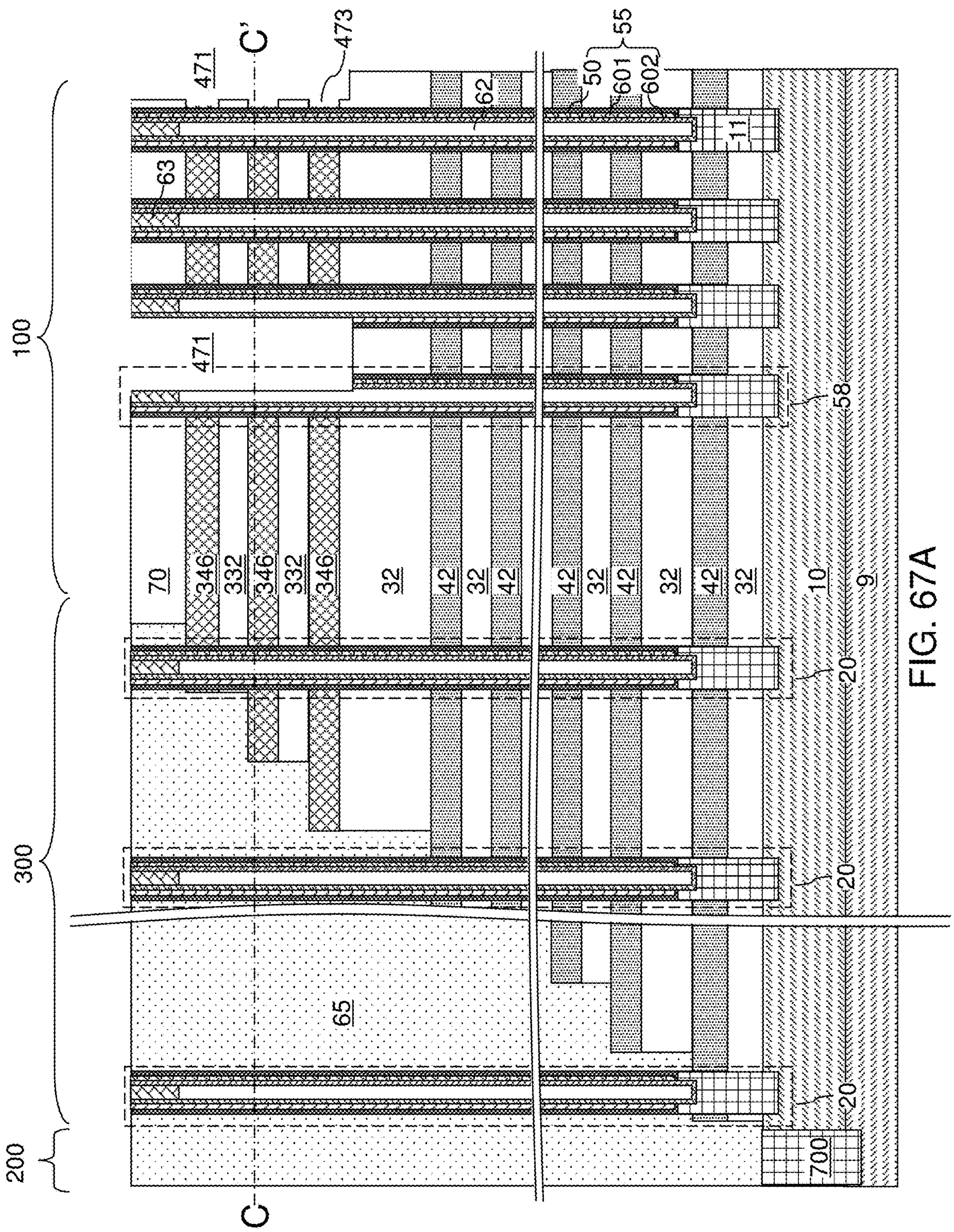

FIG. 67A is a vertical cross-sectional view the fourth exemplary structure after replacing the drain-select-level sacrificial material layers with drain-select-level electrically conductive layers and laterally recessing the drain-select-level electrically conductive layers according to an embodiment of the present disclosure.

Figure 67B:
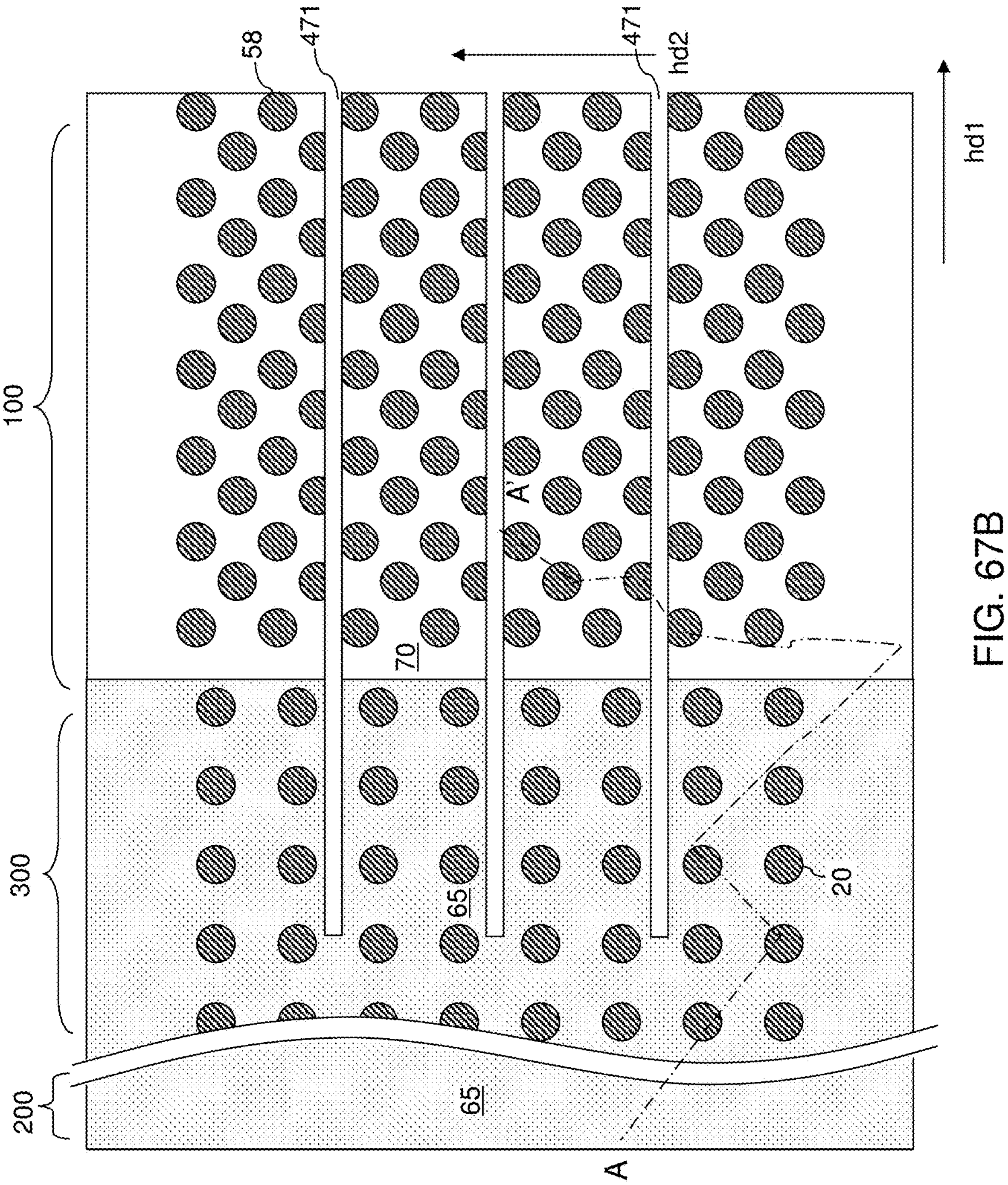

FIG. 67B is a top-down view of the fourth exemplary structure of FIG. 67A. The vertical plane A-A' is the plane of the schematic vertical cross-sectional view of FIG. 67A.

Figure 67C:
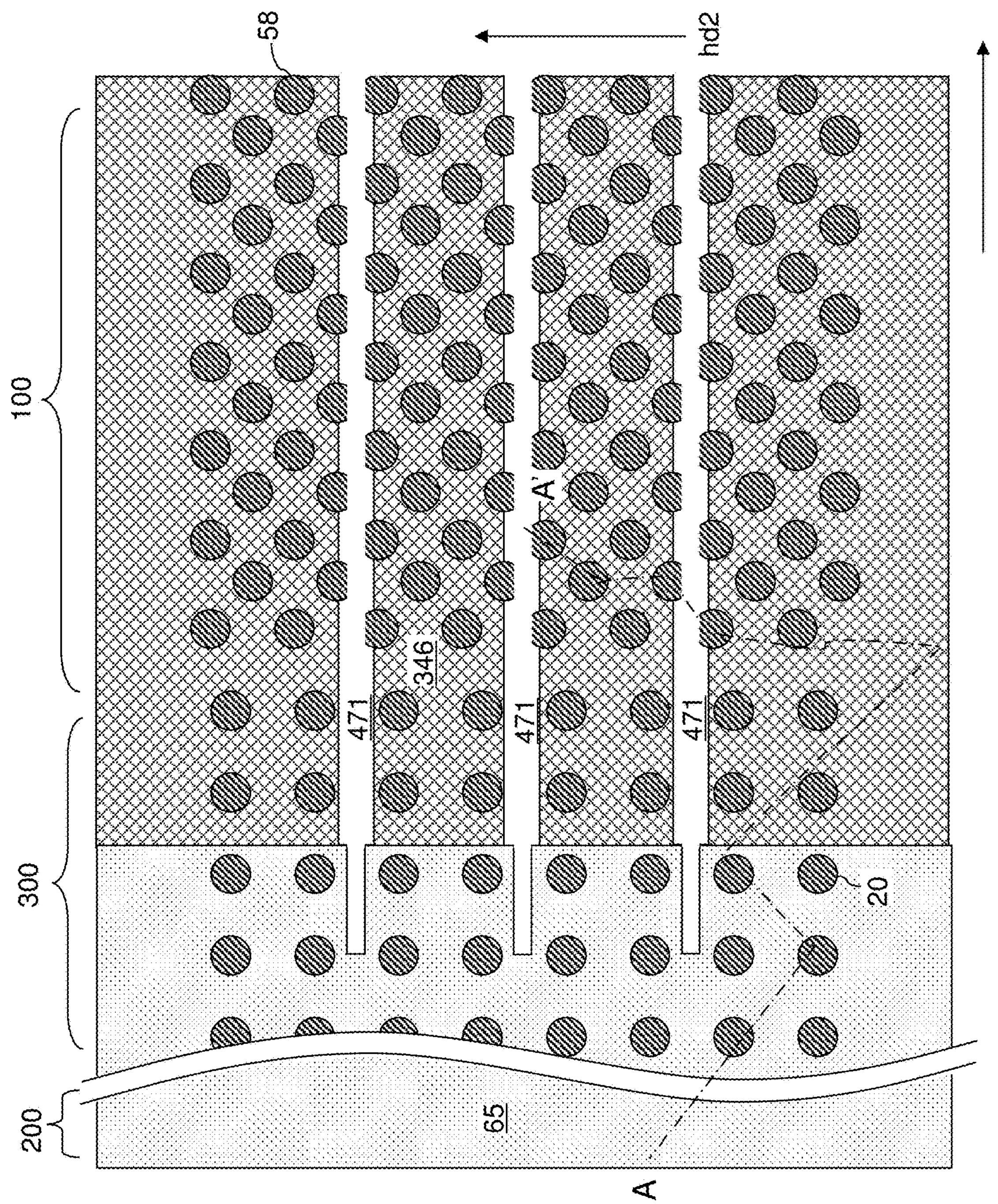

FIG. 67C is a horizontal cross-sectional view of the fourth exemplary structure along the horizontal plane C-C' of FIG. 67A. The vertical plane A-A' is the plane of the schematic vertical cross-sectional view of FIG. 67A.

Figure 68A:
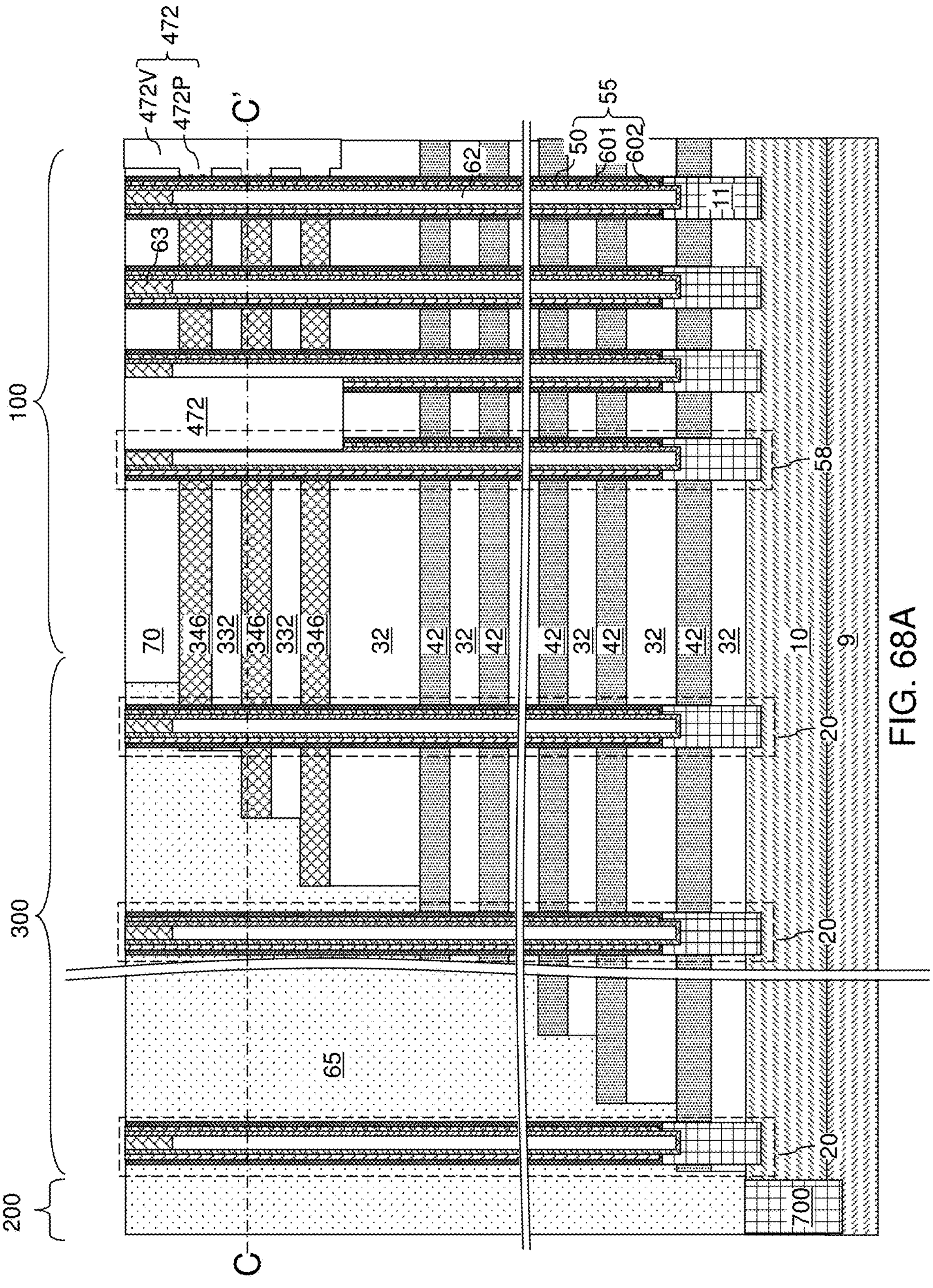

FIG. 68A is a vertical cross-sectional view the fourth exemplary structure after formation of drain-select-level isolation structures according to an embodiment of the present disclosure.

Figure 68B:
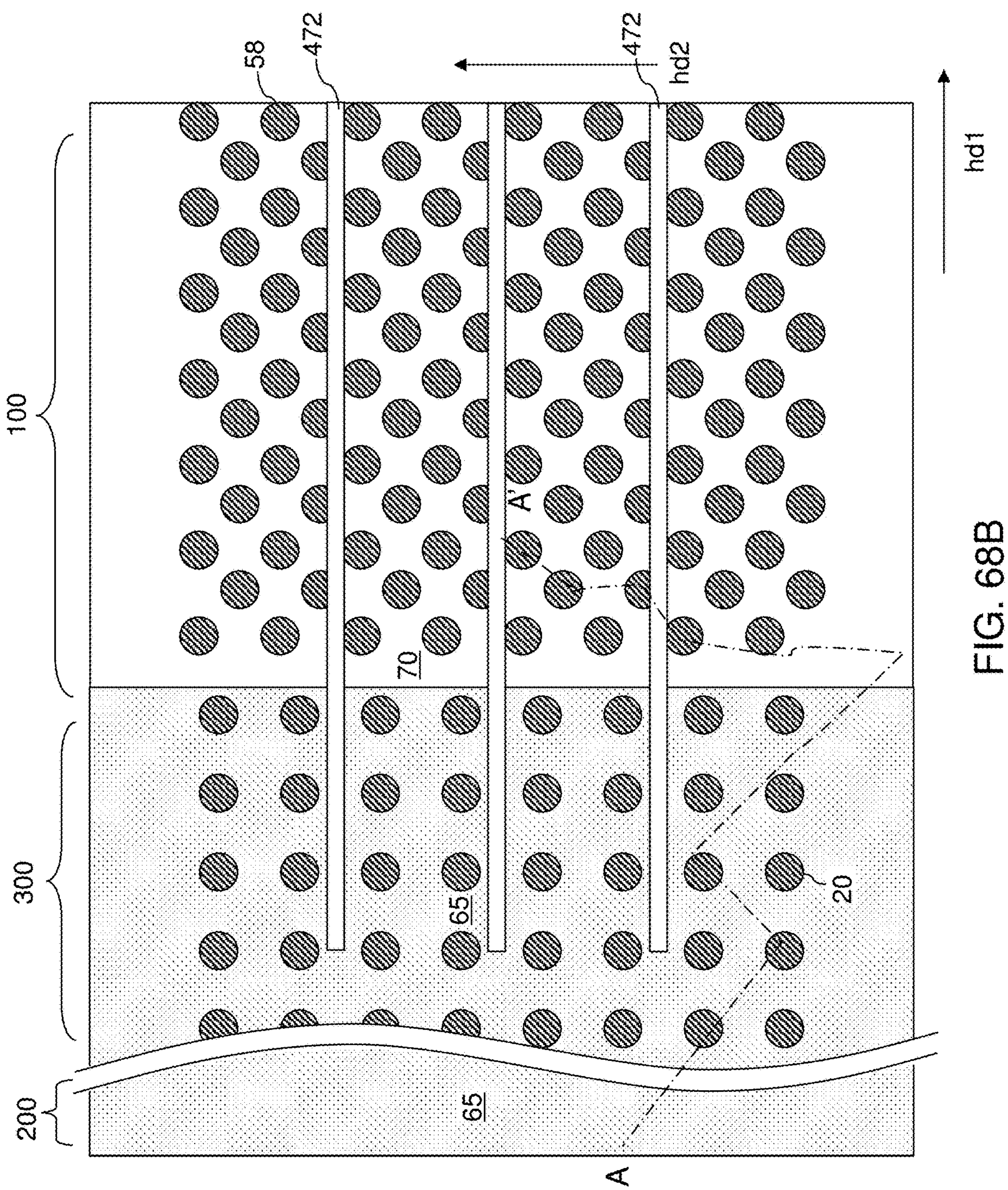

FIG. 68B is a top-down view of the fourth exemplary structure of FIG. 68A. The vertical plane A-A' is the plane of the schematic vertical cross-sectional view of FIG. 68A.

Figure 68C:
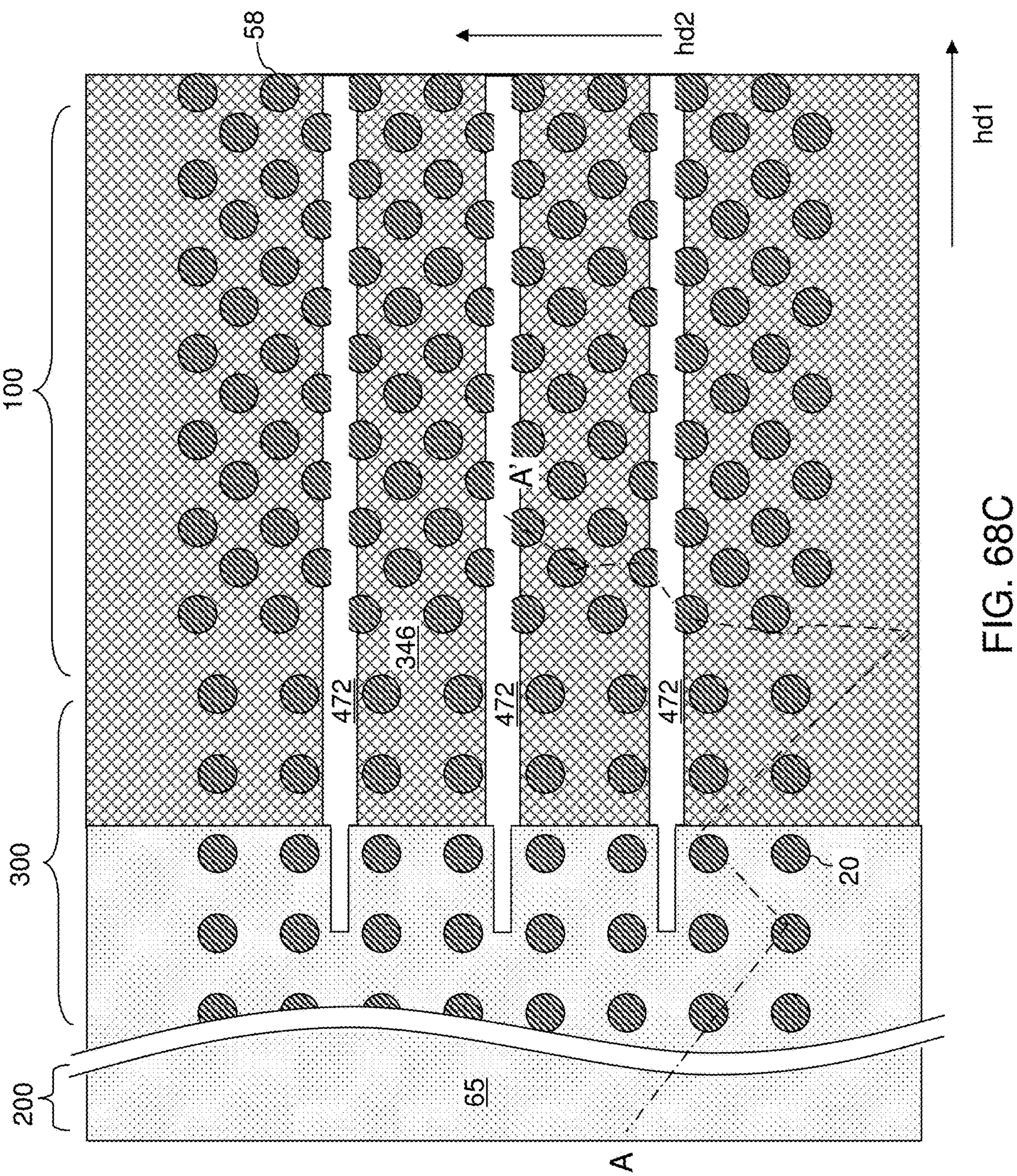

FIG. 68C is a horizontal cross-sectional view of the fourth exemplary structure along the horizontal plane C-C' of FIG. 68A. The vertical plane A-A' is the plane of the schematic vertical cross-sectional view of FIG. 68A.

Figure 69A:
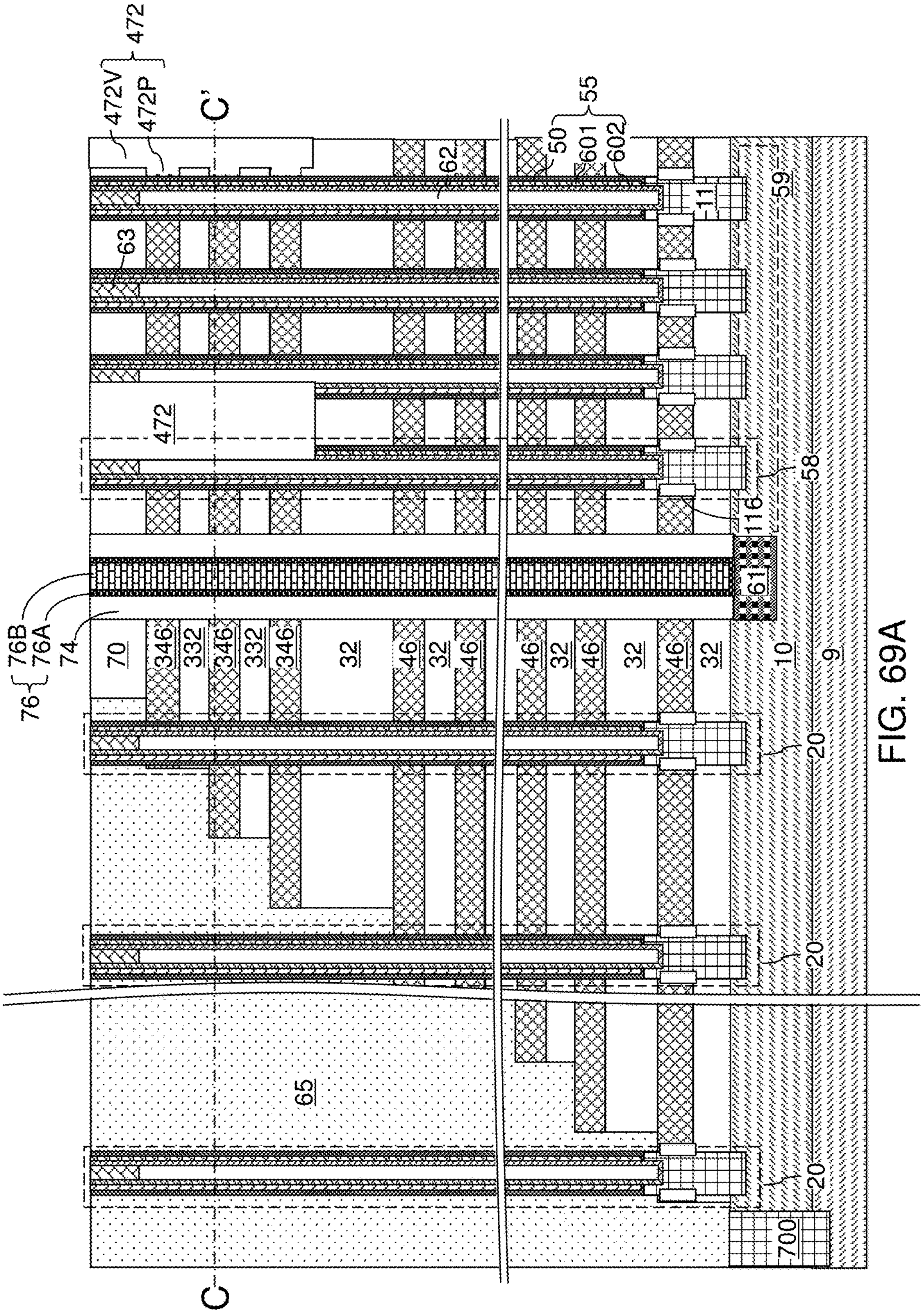

FIG. 69A is a vertical cross-sectional view the fourth exemplary structure after replacement of word-line-level sacrificial material layers with word-line-level electrically conductive layers and formation of backside trench fill structures according to an embodiment of the present disclosure.

Figure 69B:
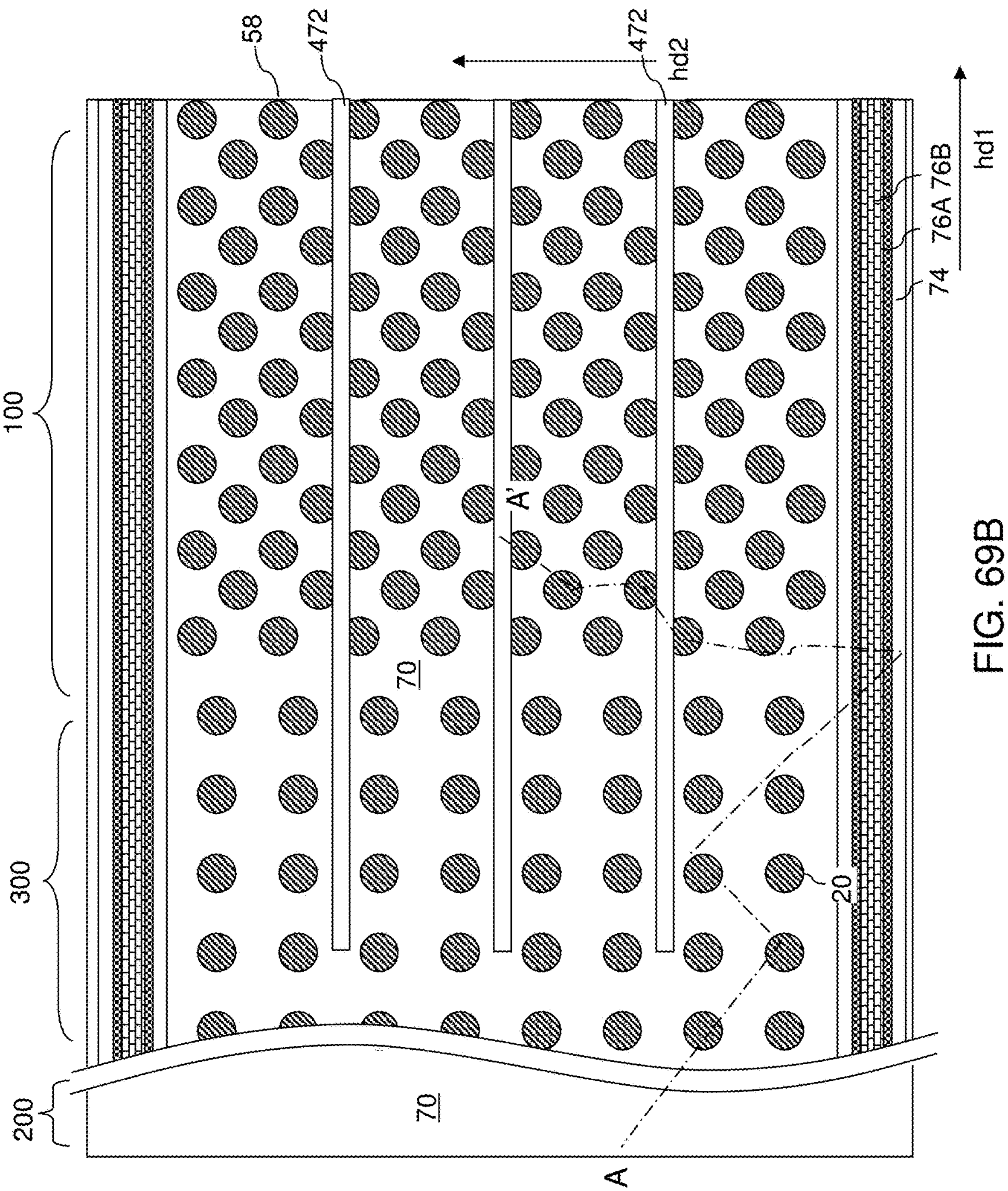

FIG. 69B is a top-down view of the fourth exemplary structure of FIG. 69A. The vertical plane A-A' is the plane of the schematic vertical cross-sectional view of FIG. 69A.

Figure 69C:
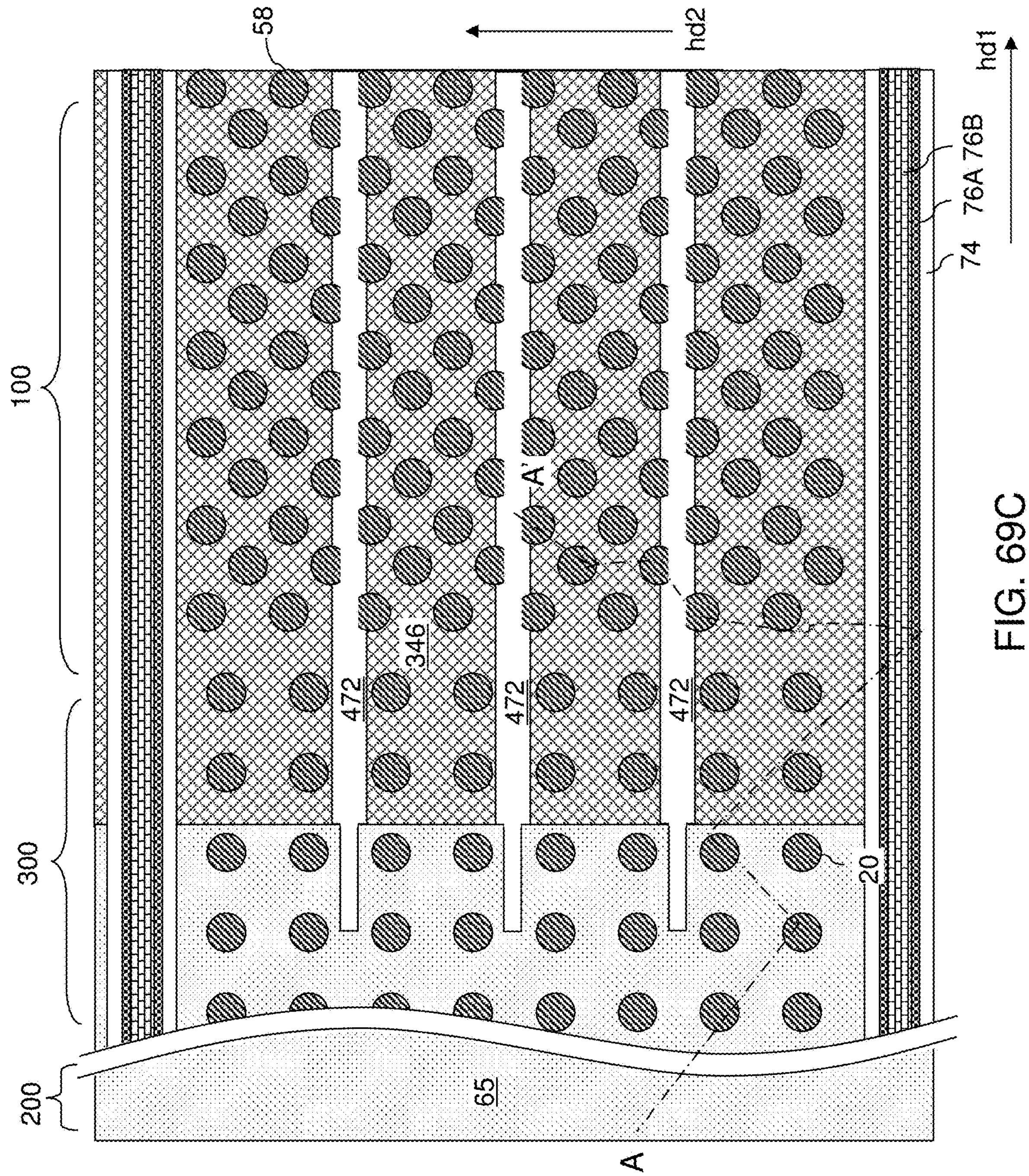

FIG. 69C is a horizontal cross-sectional view of the fourth exemplary structure along the horizontal plane C-C' of FIG. 69A. The vertical plane A-A' is the plane of the schematic vertical cross-sectional view of FIG. 69A.

Figure 70A:
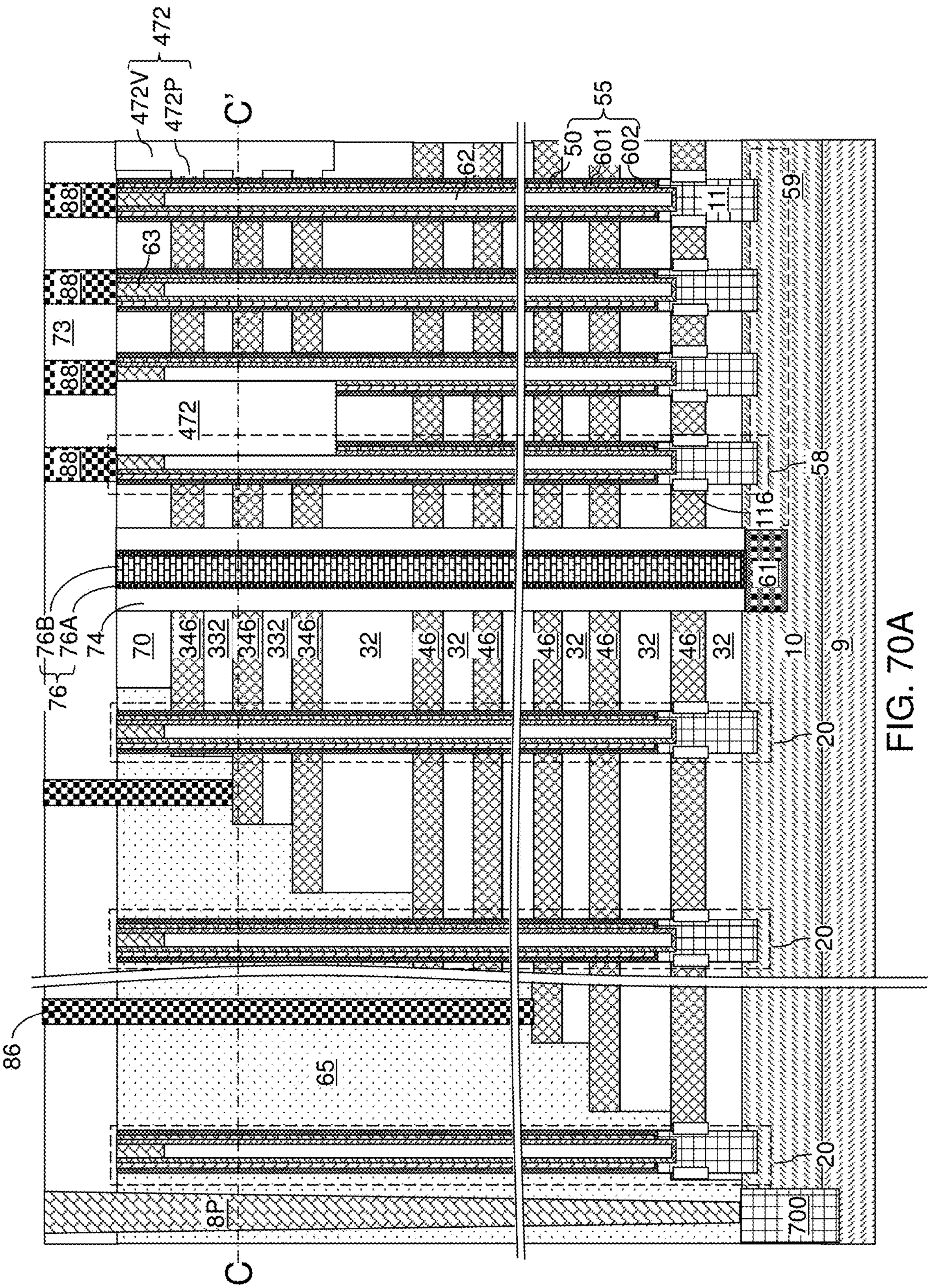

FIG. 70A is a vertical cross-sectional view the fourth exemplary structure after formation of various contact via structures according to an embodiment of the present disclosure.

Figure 70B:
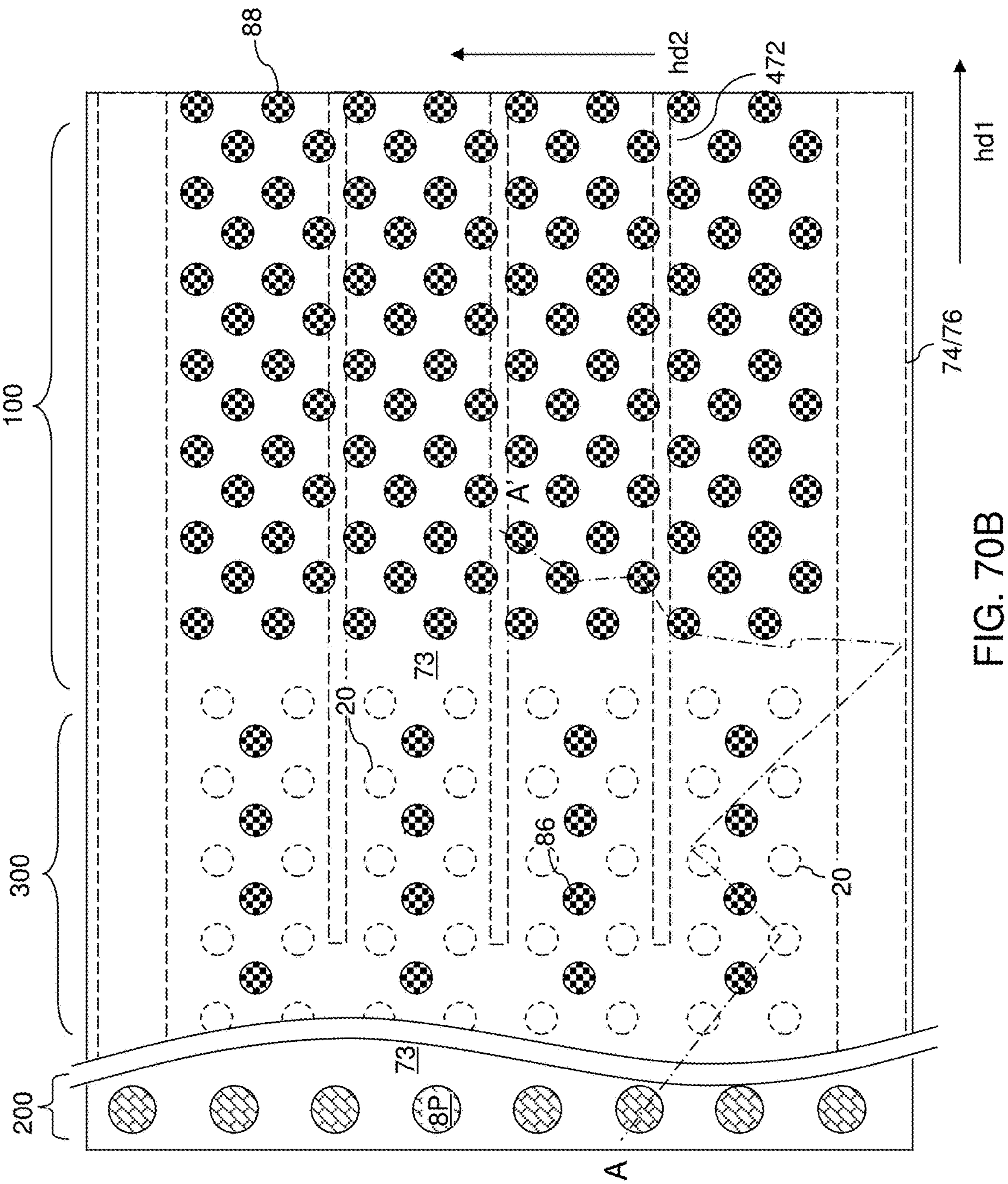

FIG. 70B is a top-down view of the fourth exemplary structure of FIG. 70A. The vertical plane A-A' is the plane of the schematic vertical cross-sectional view of FIG. 70A.

Figure 70C:
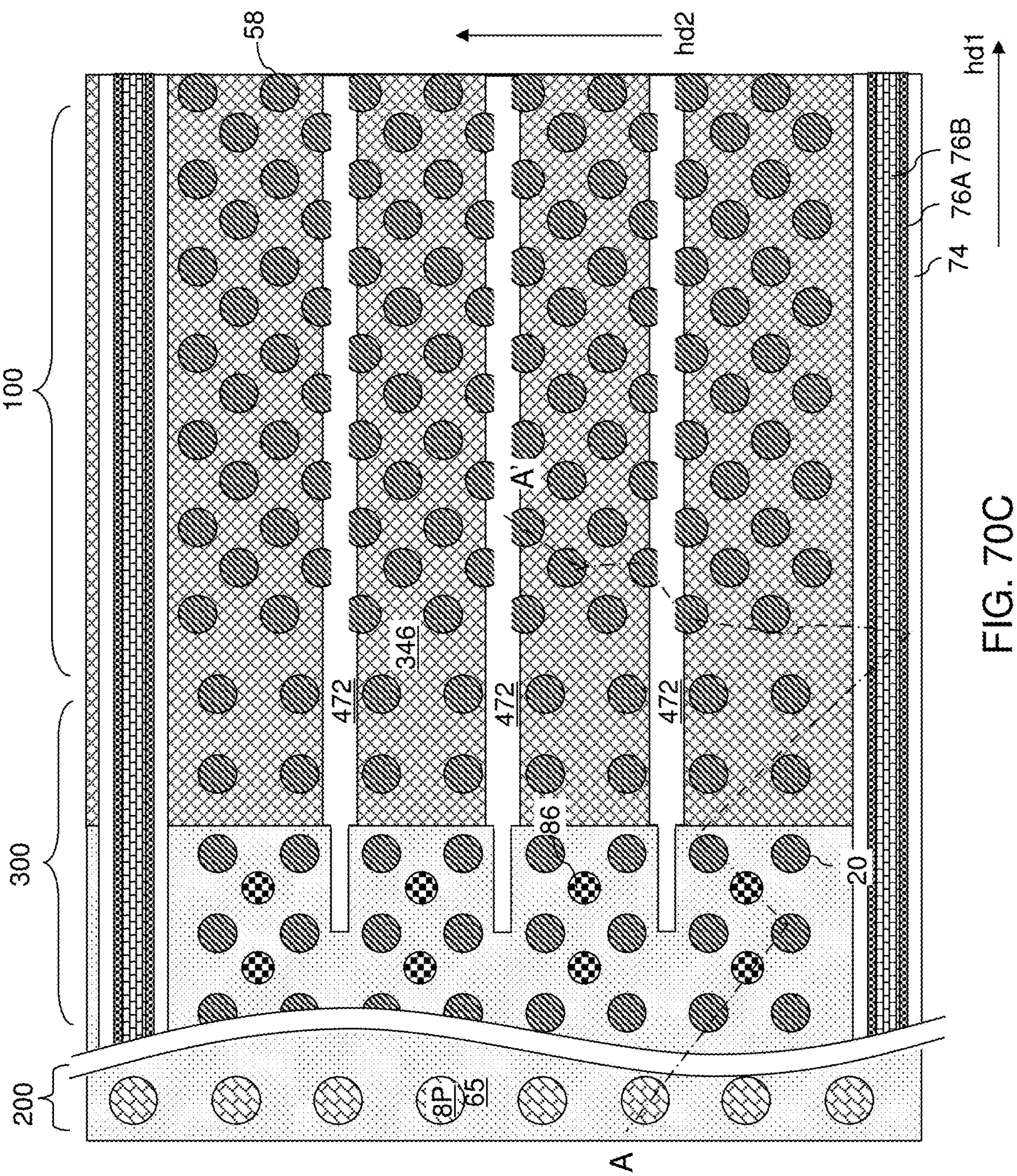

FIG. 70C is a horizontal cross-sectional view of the fourth exemplary structure along the horizontal plane C-C' of FIG.

70A. The vertical plane A-A' is the plane of the schematic vertical cross-sectional view of FIG. 70A.

Figure 71:
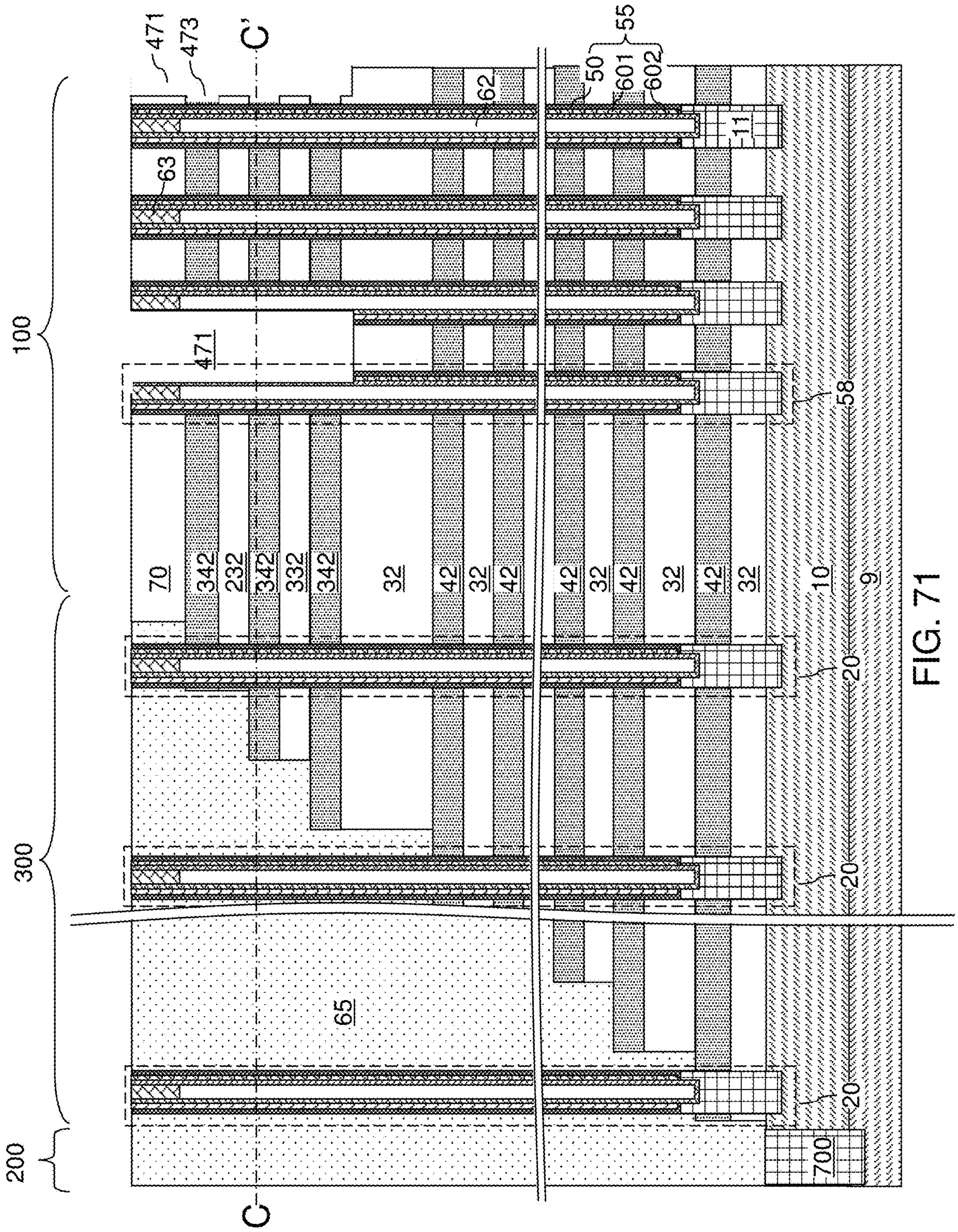

FIG. 71 is a vertical cross-sectional view of an alternative configuration of the third exemplary structure after formation of drain-select-level isolation trenches according to an embodiment of the present disclosure.

Figure 72:
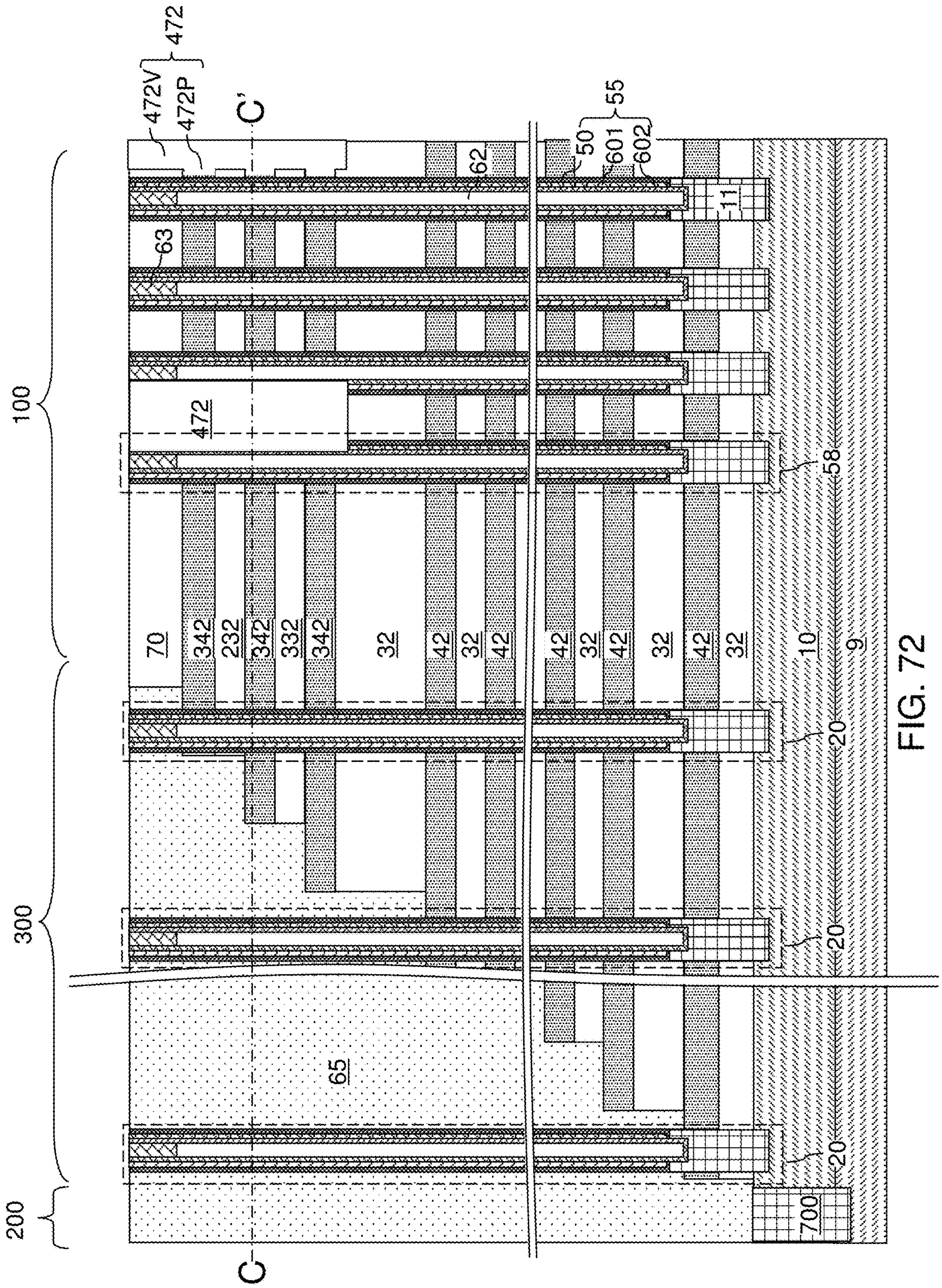

FIG. 72 is a vertical cross-sectional view of an alternative configuration of the third exemplary structure after formation of drain-select-level isolation structures according to an embodiment of the present disclosure.

Figure 73:
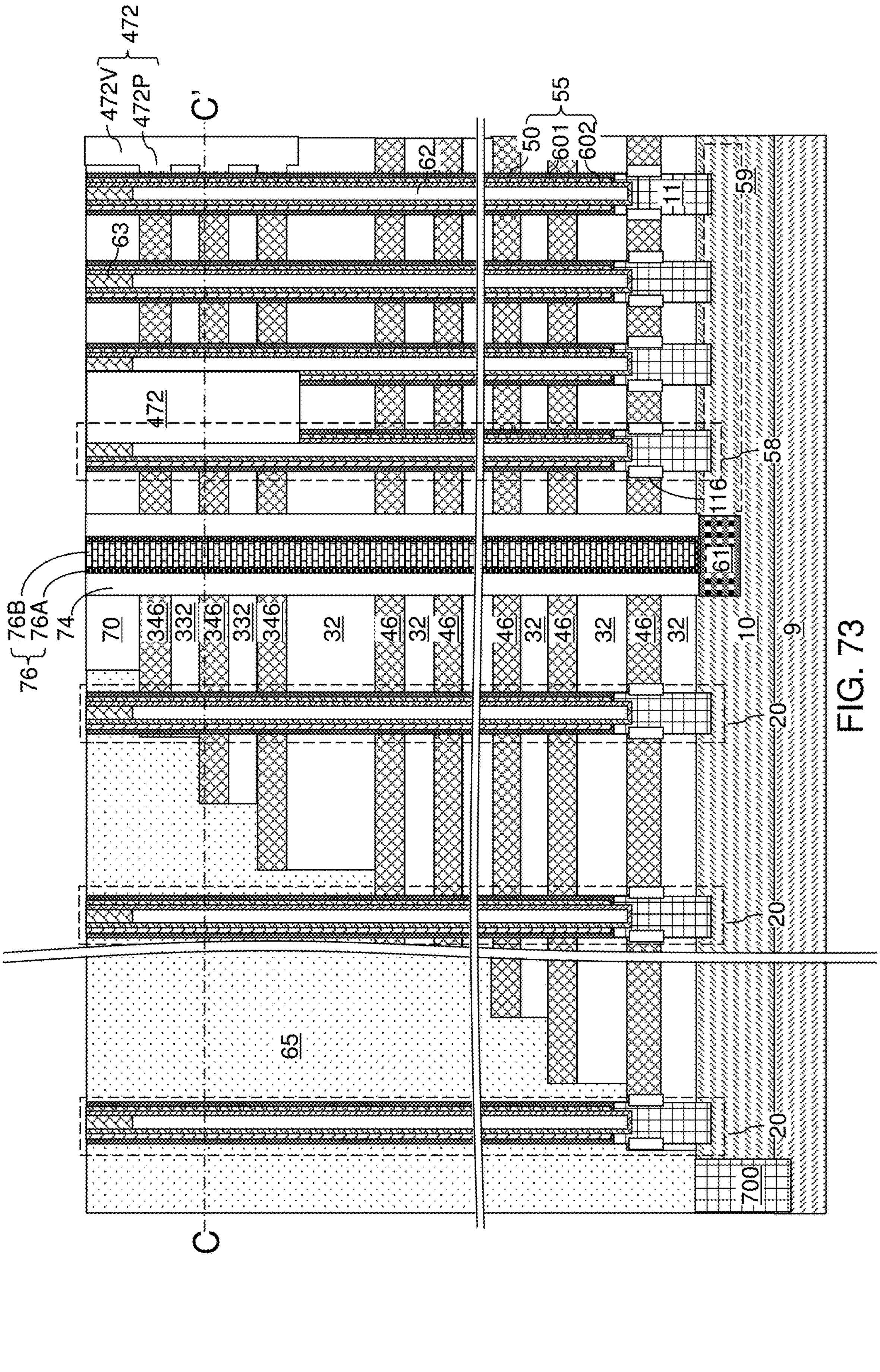

FIG. 73 is a vertical cross-sectional view of an alternative configuration of the third exemplary structure after replacement of sacrificial material layers with electrically conductive layers according to an embodiment of the present disclosure.

DETAILED DESCRIPTION

As discussed above, various embodiments of the present disclosure are directed to a three-dimensional memory device having on-axis, self-aligned drain-select-level isolation structures and methods of manufacturing the same, the various aspects of which are described below. The embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The three-dimensional memory devices of various embodiments of the present disclosure include a monolithic three-dimensional NAND string memory device, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected for a read operation.

Figure 1:
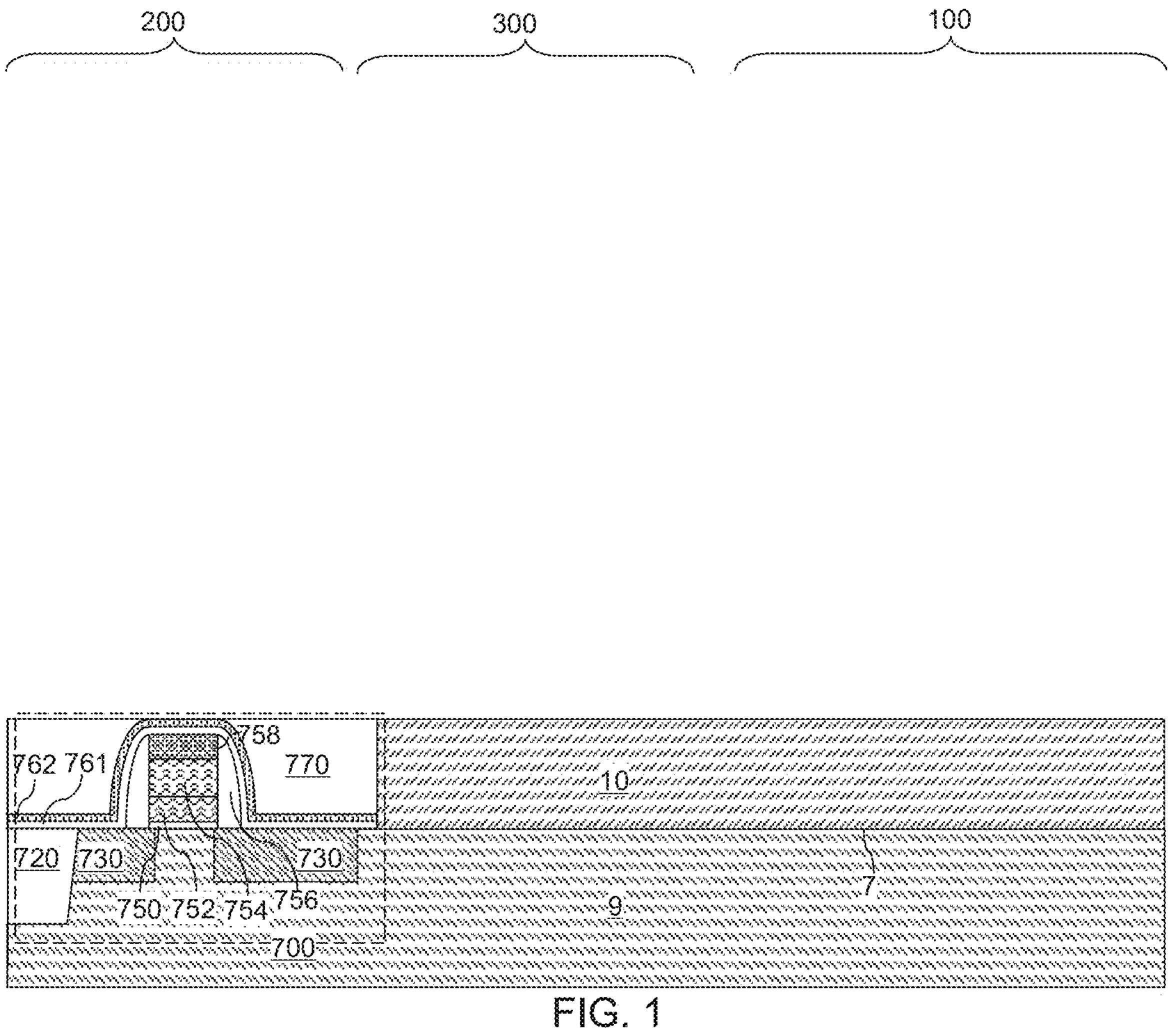
FIG. 1 is a schematic vertical cross-sectional view of a first exemplary structure after formation of at least one peripheral device, and a semiconductor material layer according to a first embodiment of the present disclosure.

Referring to FIG. 1, a first exemplary structure according to the first embodiment of the present disclosure is illustrated, which can be used, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants using the at least one gate structure (750, 752, 754, 758) as masking structures. Additional masks may be used as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be used for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
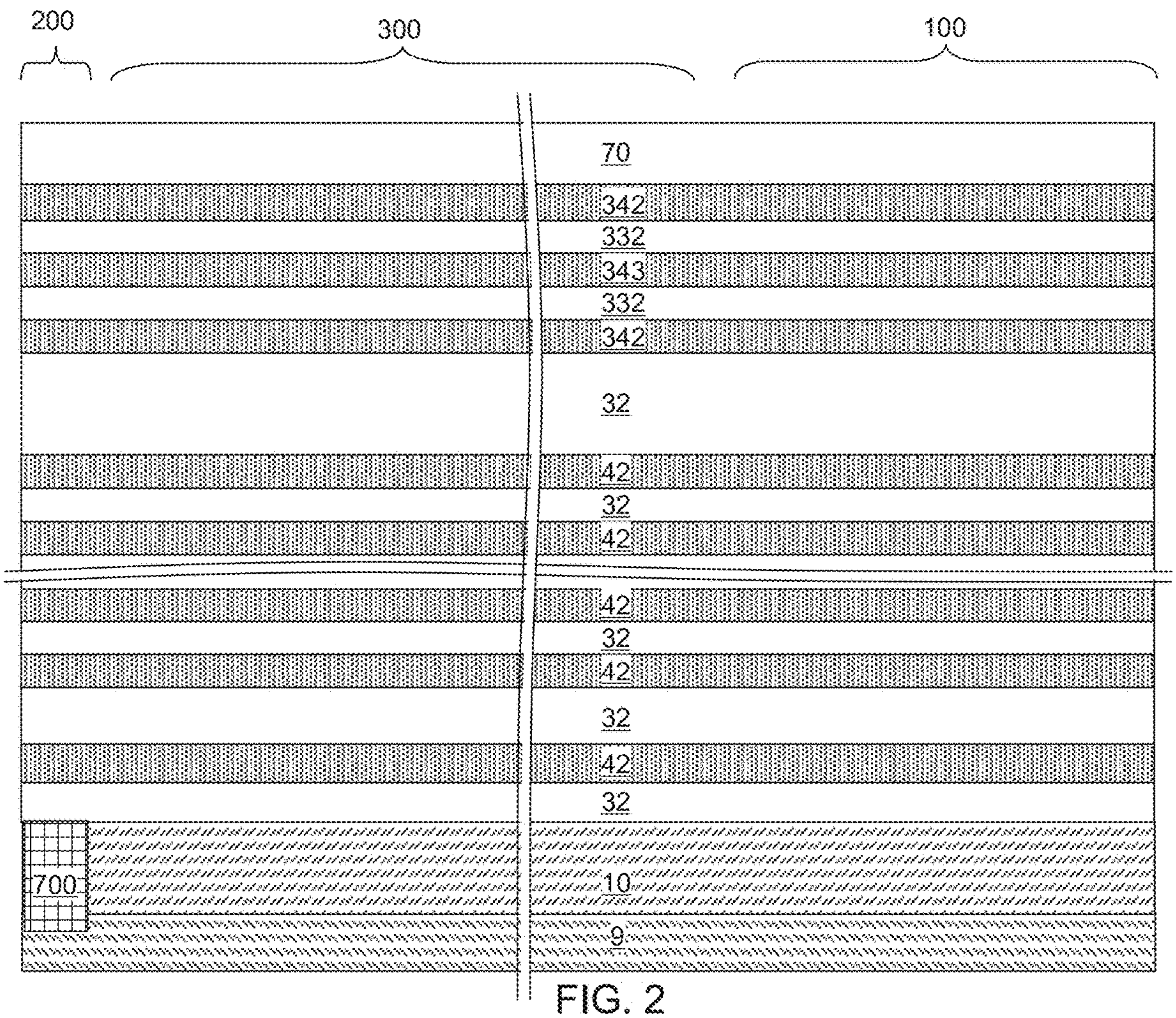
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers and second material layers is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each first material layer includes a first material, and each second material layer includes a second material that is different from the first material.

In one embodiment, each first material layer can be an insulating layer 32 or a drain-select-level insulating layer 332, and each second material layer can be a word-line-level sacrificial material layer 42 or a drain-select-level sacrificial material layer 342. A vertically alternating sequence of the word-line-level insulating layers 32 and the word-line-level sacrificial material layers 42 can be formed. The topmost one of the word-line-level insulating layers 32 can have a greater thickness than underlying word-line-level insulating layers 32. For example, the word-line-level insulating layers 32 other than the topmost insulating layer 32 can have a thickness in a range from 20 nm to 60 nm, and the topmost insulating layer 32 can have a thickness in a range from 30 nm to 150 nm, although lesser and greater thicknesses can also be used. The word-line-level sacrificial material layers 42 can have a thickness in a range from 20 nm to 60 nm. A vertically alternating sequence of drain-select-level sacrificial material layers 342 and drain-select-level insulating layers 332 can be subsequently formed. The drain-select-level insulating layers 332 can have a thickness in a range from 20 nm to 60 nm, and the drain-select-level sacrificial material layers 342 can have a thickness in a range from 20 nm to 60 nm. An insulating cap layer 70 can be subsequently formed.

The word-line-level insulating layers 32, the drain-select-level insulating layers 332, and the insulating cap layer 70 are herein collectively referred to as insulating layers (32, 332, 70). The word-line-level sacrificial material layers 42 and the drain-select-level sacrificial material layers 342 are herein collectively referred to as sacrificial material layers (42, 342). The layer stack including the word-line-level insulating layers 32, the word-line-level sacrificial material layers 42, the drain-select-level insulating layers 332, the drain-select-level sacrificial material layers 342, and the insulating cap layer 70 is herein referred to as an alternating stack (32, 42, 332, 342, 70). The word-line-level insulating layers 32, the drain-select-level insulating layers 332, and the insulating cap layer 70 can be composed of the first material, and the word-line-level sacrificial material layers 42 and the drain-select-level sacrificial material layers 342 can be composed of a second material different from that of word-line-level insulating layers 32. Insulating materials that can be used for the word-line-level insulating layers 32, the drain-select-level insulating layers 332, and the insulating cap layer 70 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the word-line-level insulating layers 32, the drain-select-level insulating layers 332, and the insulating cap layer 70 can be silicon oxide.

The second material of the word-line-level sacrificial material layers 42 and the drain-select-level sacrificial material layers 342 is a sacrificial material that can be removed selective to the first material of the word-line-level insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The word-line-level sacrificial material layers 42 and the drain-select-level sacrificial material layers 342 may comprise an insulating material, a semiconductor material, or a conductive material. The second material of the word-line-level sacrificial material layers 42 and the drain-select-level sacrificial material layers 342 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the word-line-level sacrificial material layers 42 and the drain-select-level sacrificial material layers 342 can be spacer material layers that comprise silicon nitride or a semiconductor material including at least one of silicon and germanium.

In one embodiment, the word-line-level insulating layers 32, the drain-select-level insulating layers 332, and the insulating cap layer 70 can include silicon oxide, and sacrificial material layers can include silicon nitride sacrificial material layers. The first material of the word-line-level insulating layers 32, the drain-select-level insulating layers 332, and the insulating cap layer 70 can be deposited, for example, by chemical vapor deposition (CVD). For example, if silicon oxide is used for the word-line-level insulating layers 32, the drain-select-level insulating layers 332, and the insulating cap layer 70, tetraethyl orthosilicate (TEOS) can be used as the precursor material for the CVD process. The second material of the word-line-level sacrificial material layers 42 and the drain-select-level sacrificial material layers 342 can be formed, for example, CVD or atomic layer deposition (ALD).

While the descriptions of the present disclosure refer to an embodiment in which the word-line-level sacrificial material layers 42 and the drain-select-level sacrificial material layers 342 are formed as space material layers that are formed between each vertically neighboring pair of the word-line-level insulating layers 32, the drain-select-level insulating layers 332, and the insulating cap layer 70, in other embodiments electrically conductive layers are formed as spacer material layers in lieu of the word-line-level sacrificial material layers 42 and the drain-select-level sacrificial material layers 342. In this case, steps for replacing the spacer material layers with electrically conductive layers can be omitted.

Figure 3:
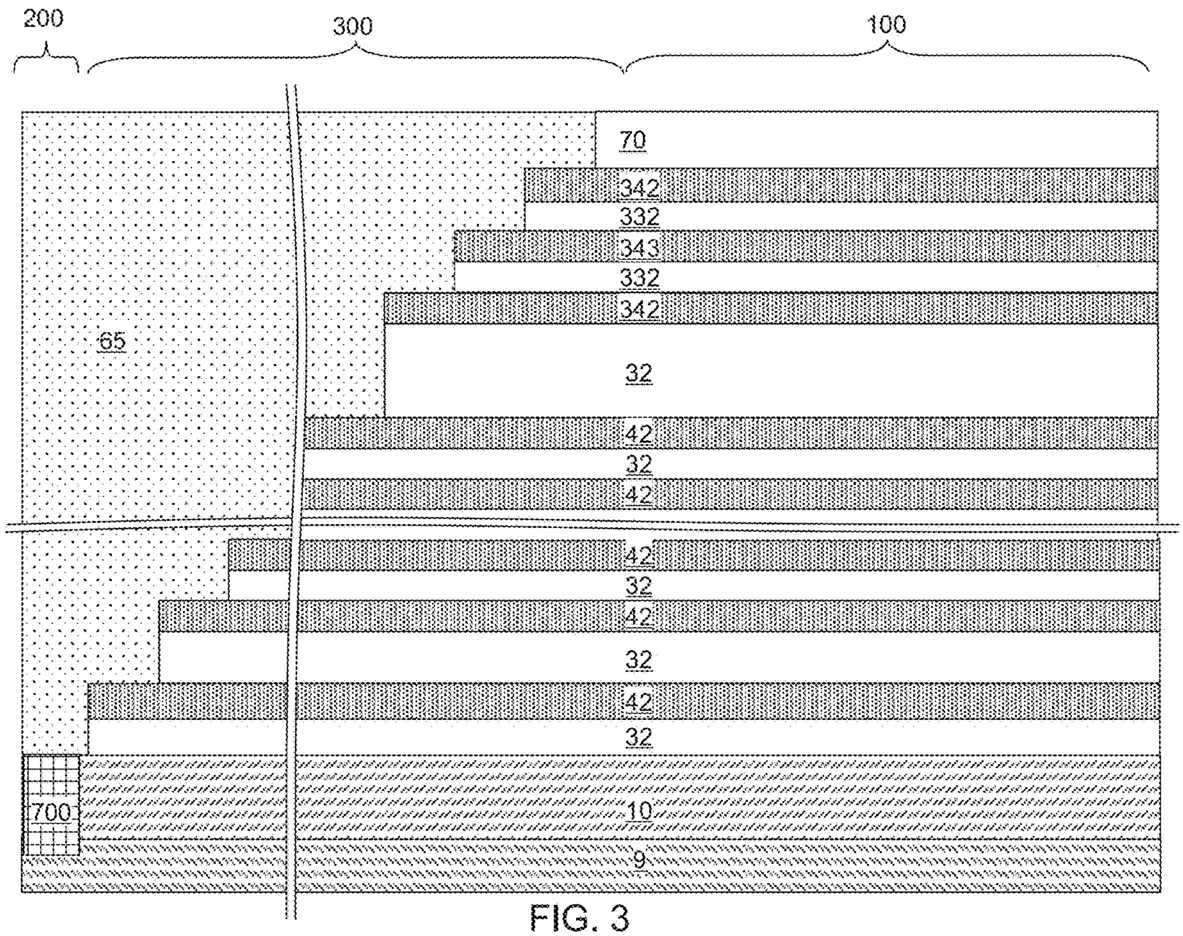
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42, 332, 342, 70), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42, 332, 342, 70) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each word-line-level sacrificial material layer 42 other than a topmost word-line-level sacrificial material layer 42 within the alternating stack (32, 42, 332, 342, 70) laterally extends farther than any overlying word-line-level sacrificial material layer 42 within the alternating stack (32, 42, 332, 342, 70) in the terrace region. The terrace region includes stepped surfaces of the alternating stack (32, 42, 332, 342, 70) that continuously extend from a bottommost layer within the alternating stack (32, 42, 332, 342, 70) to a topmost layer within the alternating stack (32, 42, 332, 342, 70).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Figure 4A:
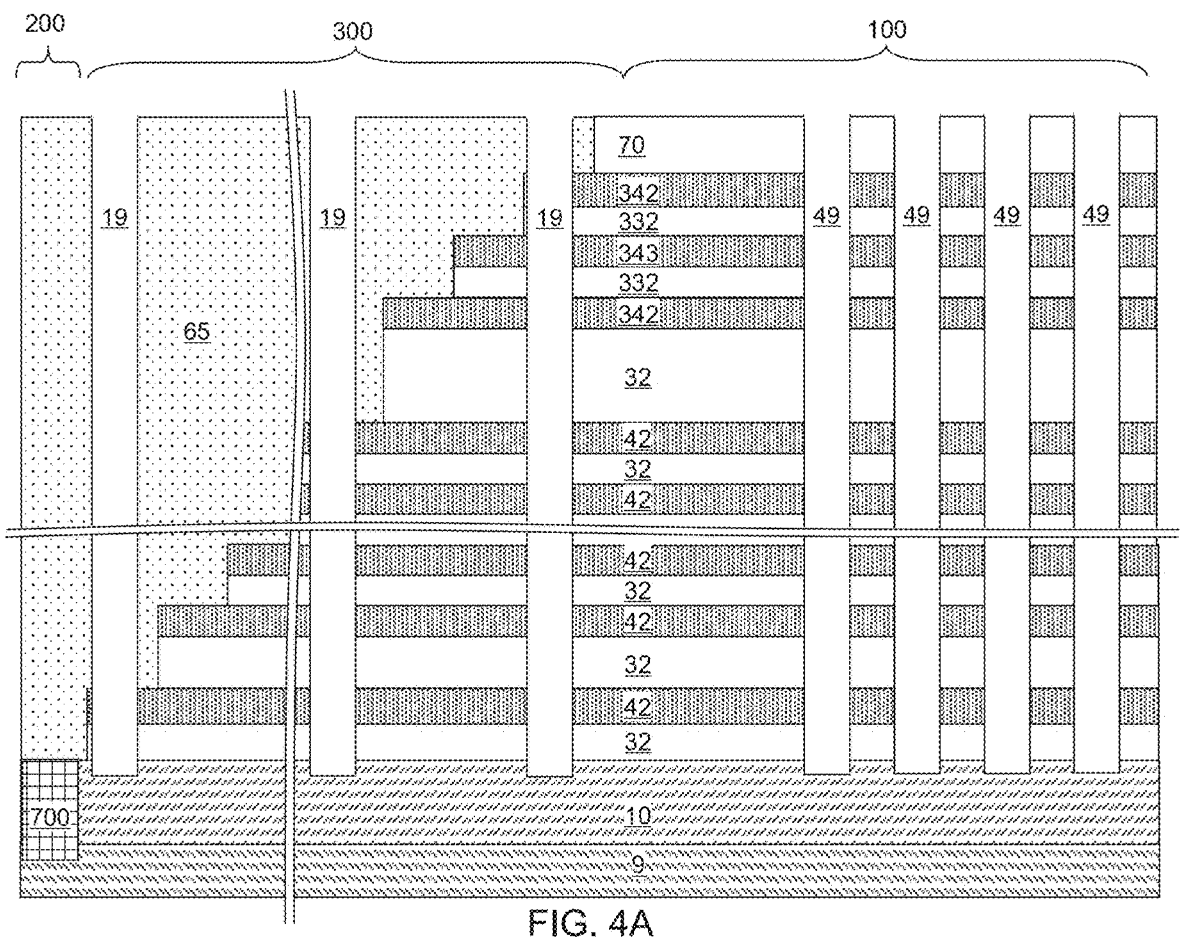
FIG. 4A is a schematic vertical cross-sectional view of the first exemplary structure after formation of memory openings and support openings according to the first embodiment of the present disclosure.
Figure 4B:
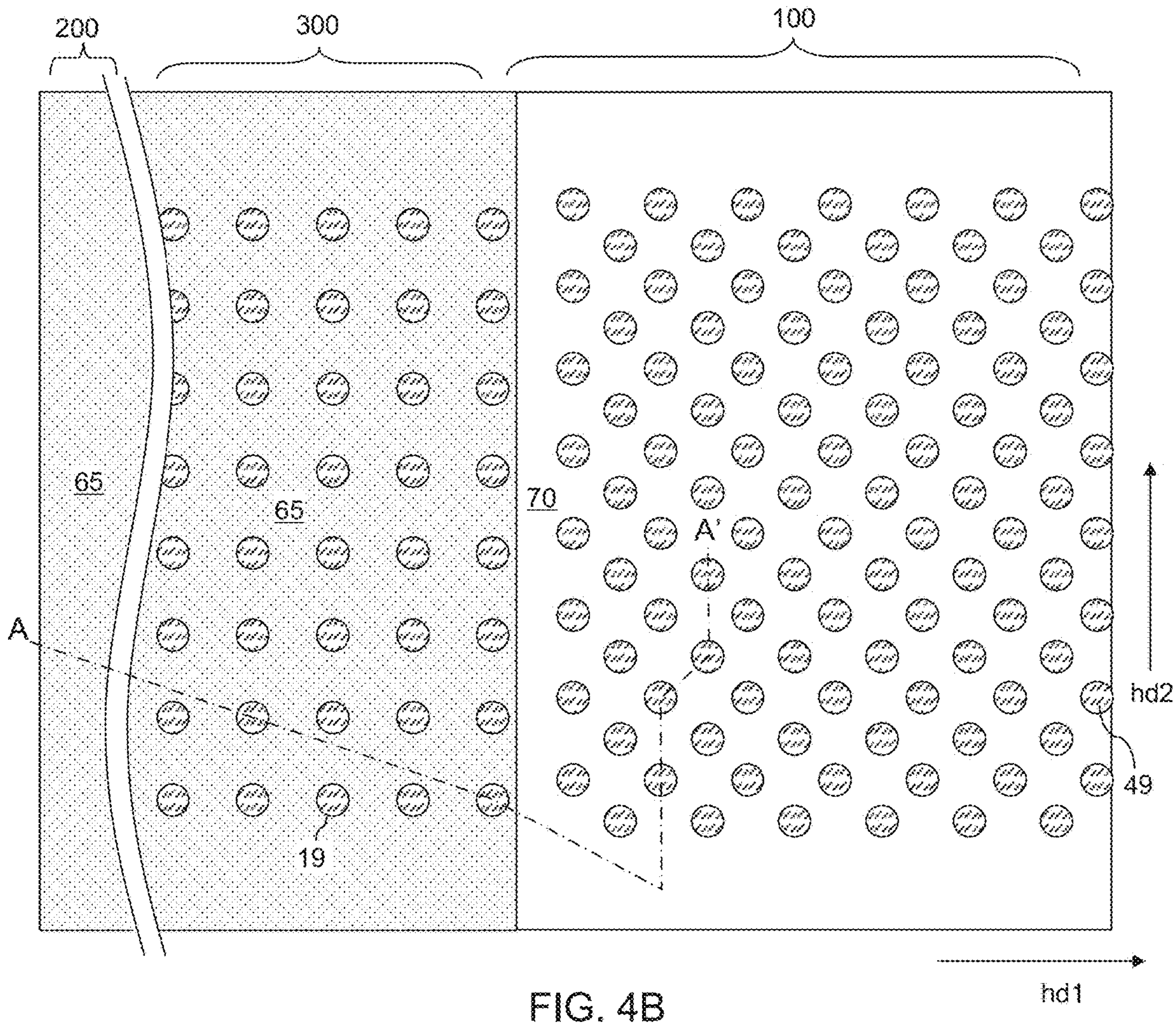
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42, 332, 342, 70) by at least one anisotropic etch that uses the patterned lithographic material stack as an etch mask. Portions of the alternating stack (32, 42, 332, 342, 70) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42, 332, 342, 70) in the memory array region 100. The support openings 19 are formed through the retro-stepped dielectric material portion 65 and the portion of the alternating stack (32, 42, 332, 342, 70) that underlie the stepped surfaces in the staircase region 300.

The memory openings 49 extend through the entirety of the alternating stack (32, 42, 332, 342, 70). The support openings 19 extend through a subset of layers within the alternating stack (32, 42, 332, 342, 70). The chemistry of the anisotropic etch process used to etch through the materials of the alternating stack (32, 42, 332, 342, 70) can alternate to optimize etching of the first and second materials in the alternating stack (32, 42, 332, 342, 70). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42, 332, 342, 70) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the unrecessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 5A:
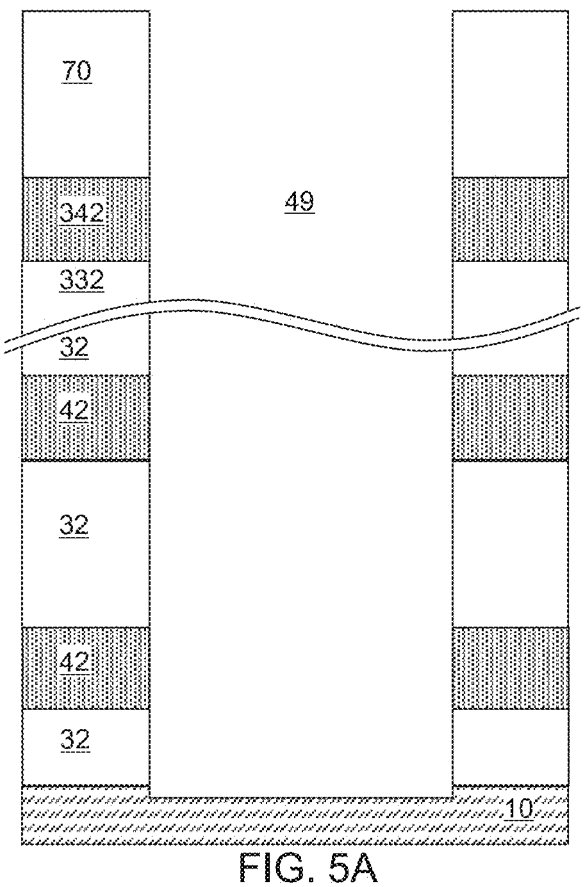
FIGS. 5A-5E are sequential schematic vertical cross-sectional views of a memory opening within the first exemplary structure during a first set of processing steps for forming a lower memory opening fill structure according to the first embodiment of the present disclosure.

Referring to FIG. 5A, a memory opening 49 in the first exemplary structure of FIGS. 4A and 4B is illustrated. The memory opening 49 extends through the insulating cap layer 70, the alternating stack (32, 42, 332, 342, 70), and optionally into an upper portion of the semiconductor material layer 10. At this processing step, each support opening 19 can extend through the retro-stepped dielectric material portion 65, a subset of layers in the alternating stack (32, 42, 332, 342, 70), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the word-line-level sacrificial material layers 42 can be laterally recessed partially to form lateral recesses (not shown), for example, by an isotropic etch.

Figure 5B:
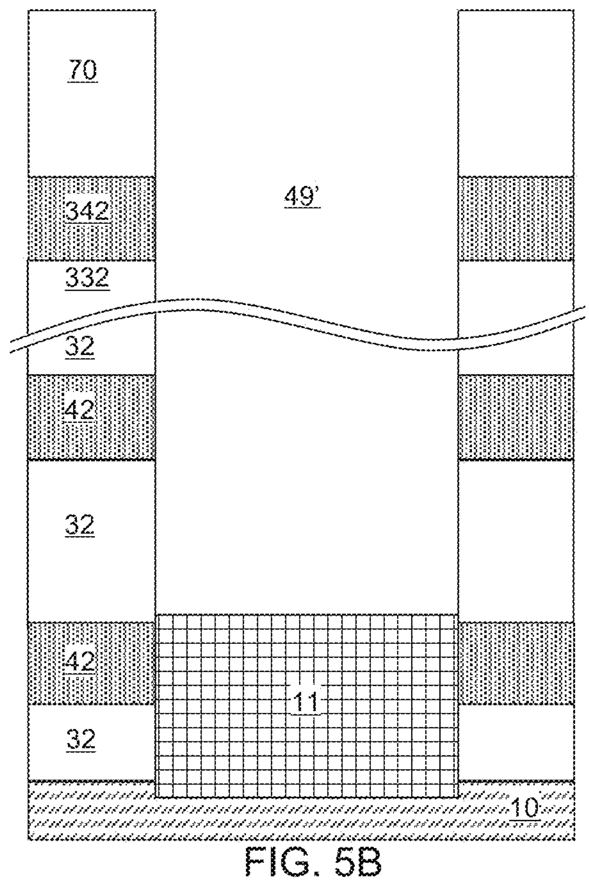

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost word-line-level sacrificial material layer 42. In this case, a source select gate electrode can be subsequently formed by replacing the bottommost word-line-level sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5C:
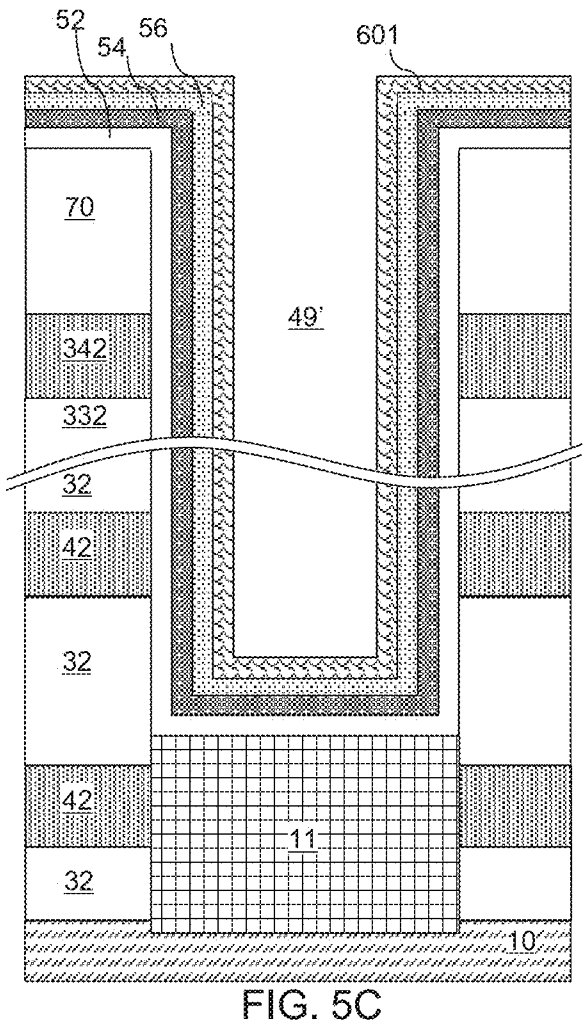

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into word-line-level sacrificial material layers 42. In one embodiment, the charge storage layer 54 includes a silicon nitride layer. In one embodiment, the word-line-level sacrificial material layers 42 and the word-line-level insulating layers 32 can have vertically coincident sidewalls, and the charge storage layer 54 can be formed as a single continuous layer.

In another embodiment, the word-line-level sacrificial material layers 42 can be laterally recessed with respect to the sidewalls of the word-line-level insulating layers 32, and a combination of a deposition process and an anisotropic etch process can be used to form the charge storage layer 54 as a plurality of memory material portions that are vertically spaced apart. While the descriptions in the present disclosure refer to an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Figure 5D:
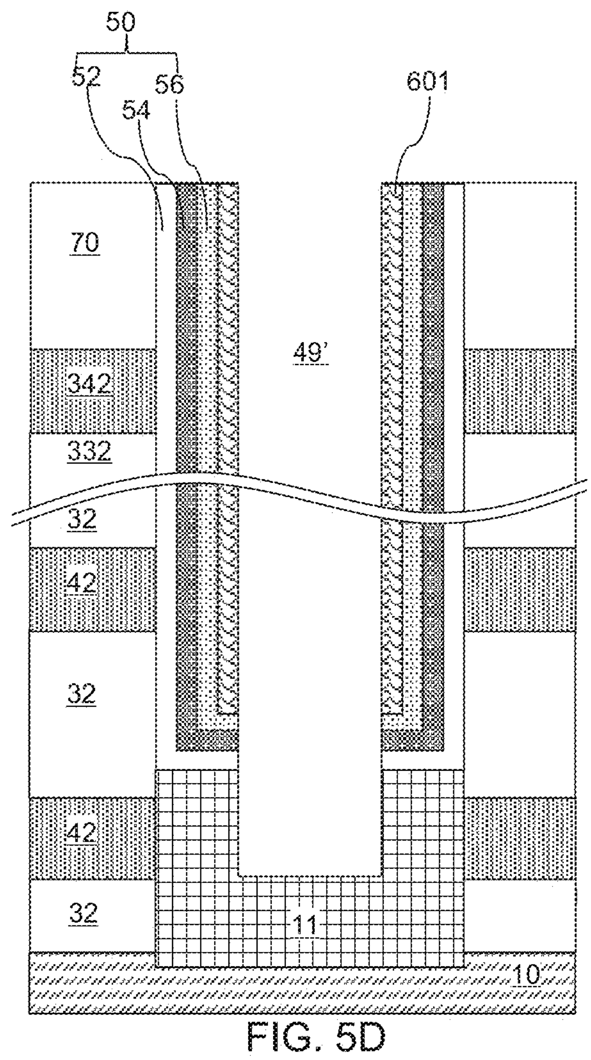

Referring to FIG. 5D, the optional first semiconductor channel layer 601, the tunneling dielectric layer 56, the charge storage layer 54, and the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the word-line-level sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5E:
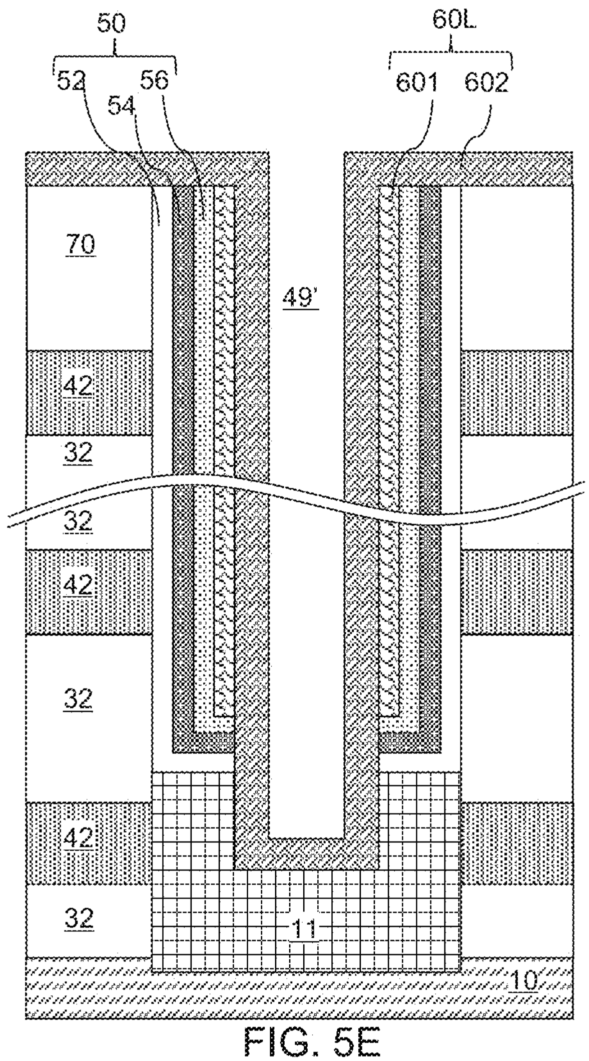
Figure 6A:
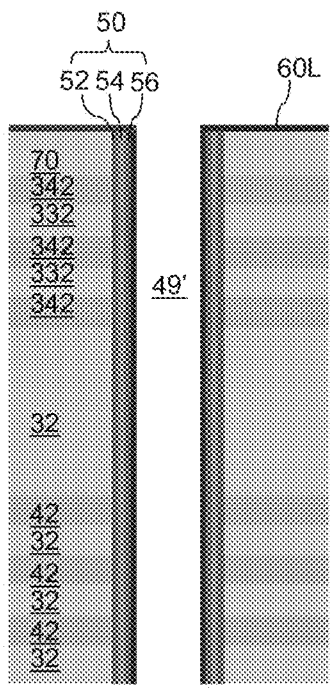
FIGS. 6A-6F are sequential schematic vertical cross-sectional views of a memory opening within the first exemplary structure during a second set of processing steps for forming a lower memory opening fill structure according to the first embodiment of the present disclosure.

Referring to FIGS. 5E and 6A, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602. The first semiconductor channel layer 601 and the second semiconductor channel layer 602 are collectively referred to as a semiconductor channel material layer 60L.

Figure 6B:
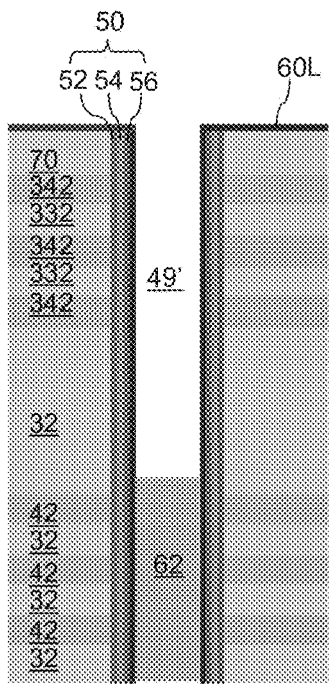

Referring to FIG. 6B, a dielectric material such as silicon oxide can be deposited in the memory cavities 49', and can be vertically recessed to the level of the topmost insulating layer 32. Each remaining portion of the dielectric material constitutes a dielectric core 62. A memory cavity 49' having a reduced depth is present above each dielectric core 62.

Figure 6C:
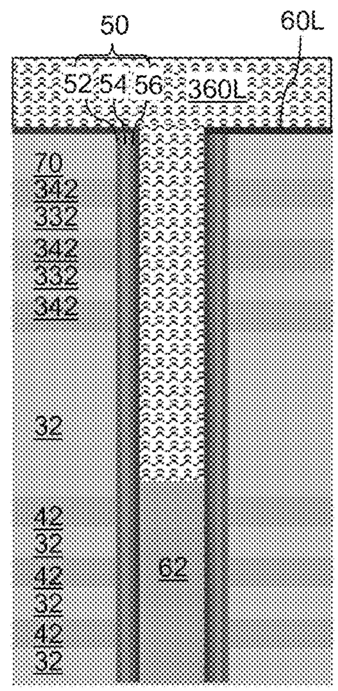

Referring to FIG. 6C, a connection channel material layer 360L can be deposited in the memory cavities 49'. The connection channel material layer 360L includes a doped semiconductor material having a doping of the first conductivity type, i.e., the same conductivity type as the doping of the semiconductor channel material layer 60L.

Figure 6D:
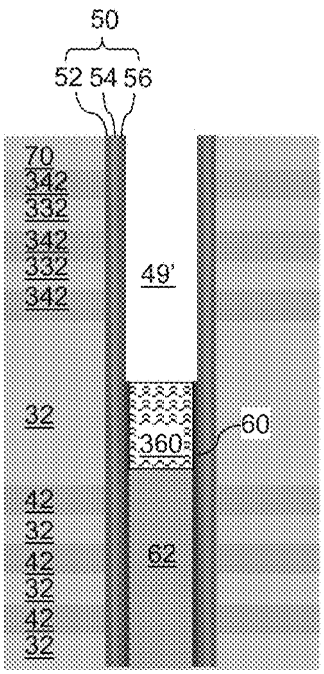

Referring to FIG. 6D, the connection channel material layer 360L and the semiconductor channel material layer 60L are recessed such that top surfaces of remaining portions of the connection channel material layer 360L and the semiconductor channel material layer 60L are formed below the horizontal plane including the top surface of the topmost insulating layer 32. Each remaining portion of the semiconductor channel material layer 60L constitutes a vertical semiconductor channel 60, and each remaining portion of the connection channel material layer 360L constitutes a connection channel portion 360.

Figure 6E:
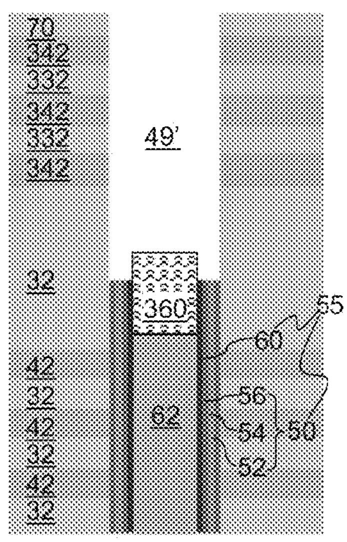

Referring to FIG. 6E, a series of isotropic etch processes can be performed to remove physically exposed portions of the memory film 50. Each combination of a memory film 50 and a vertical semiconductor channel 60 in a memory opening 49 constitutes a memory stack structure 55.

Figure 6F:
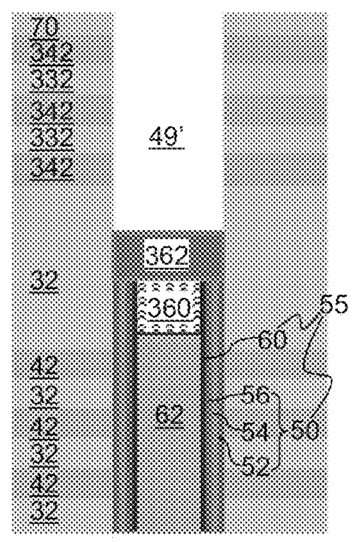

Referring to FIG. 6F, an oxidation process can be performed to convert a top portion of each connection channel portion 360 into a semiconductor oxide plate 362, which may be a silicon oxide plate. Each set of material portions located in a memory opening 49 constitutes a lower memory opening fill structure. Each set of material portions located in a support opening 19 constitutes a lower support pillar structure.

Referring to FIGS. 7A, 7B, 8A, and 8B, a sacrificial material liner is conformally deposited and anisotropically etched to form a sacrificial spacer 312. The sacrificial spacers 312 can include a semiconductor material such as amorphous silico or polysilicon. A sacrificial fill material such as silicon oxide can be deposited in each sacrificial spacer 312. Excess portions of the sacrificial fill material can be removed from above the horizontal plane including the top surface of the insulating cap layer 70. Each remaining portion of the sacrificial fill material constitutes a sacrificial pillar structure 314. A set of all material portions filling a memory opening 49 constitutes an in in-process memory opening fill structure 58'. A set of all material portions filling a support opening 19 constitutes an in-process support pillar structure 20'.

Figure 7A:
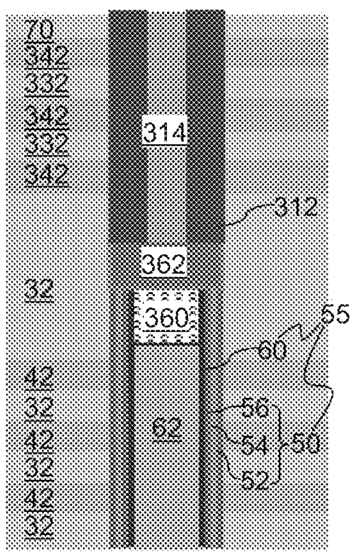
FIG. 7A is a vertical cross-sectional view of a memory opening within the first exemplary structure after formation of an in-process upper memory opening fill structure according to the first embodiment of the present disclosure.
Figure 7B:
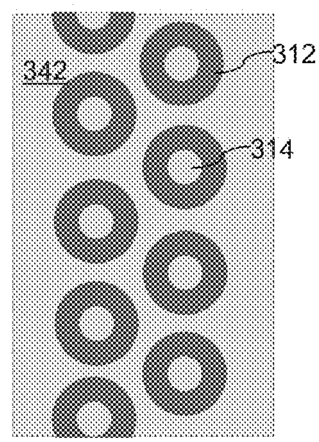
FIG. 7B is a top-down view of a region of the first exemplary structure at the processing steps of FIG. 7A.
Figure 7C:
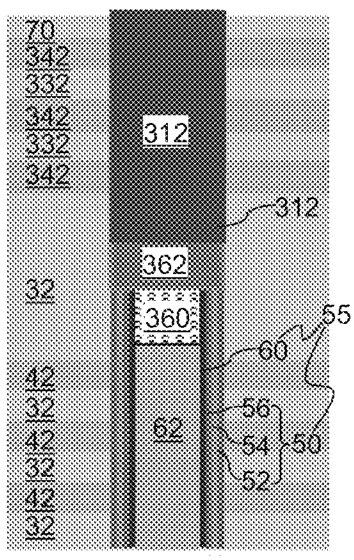
FIG. 7C is a vertical cross-sectional view of a memory opening within a first alternative embodiment of the first exemplary structure after formation of an in-process upper memory opening fill structure according to the first embodiment of the present disclosure.
Figure 7D:
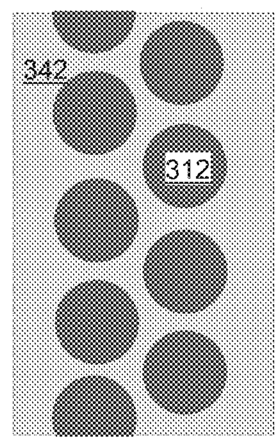
FIG. 7D is a top-down view of a region of the alternative embodiment of the first exemplary structure at the processing steps of FIG. 7C.
Figure 8A:
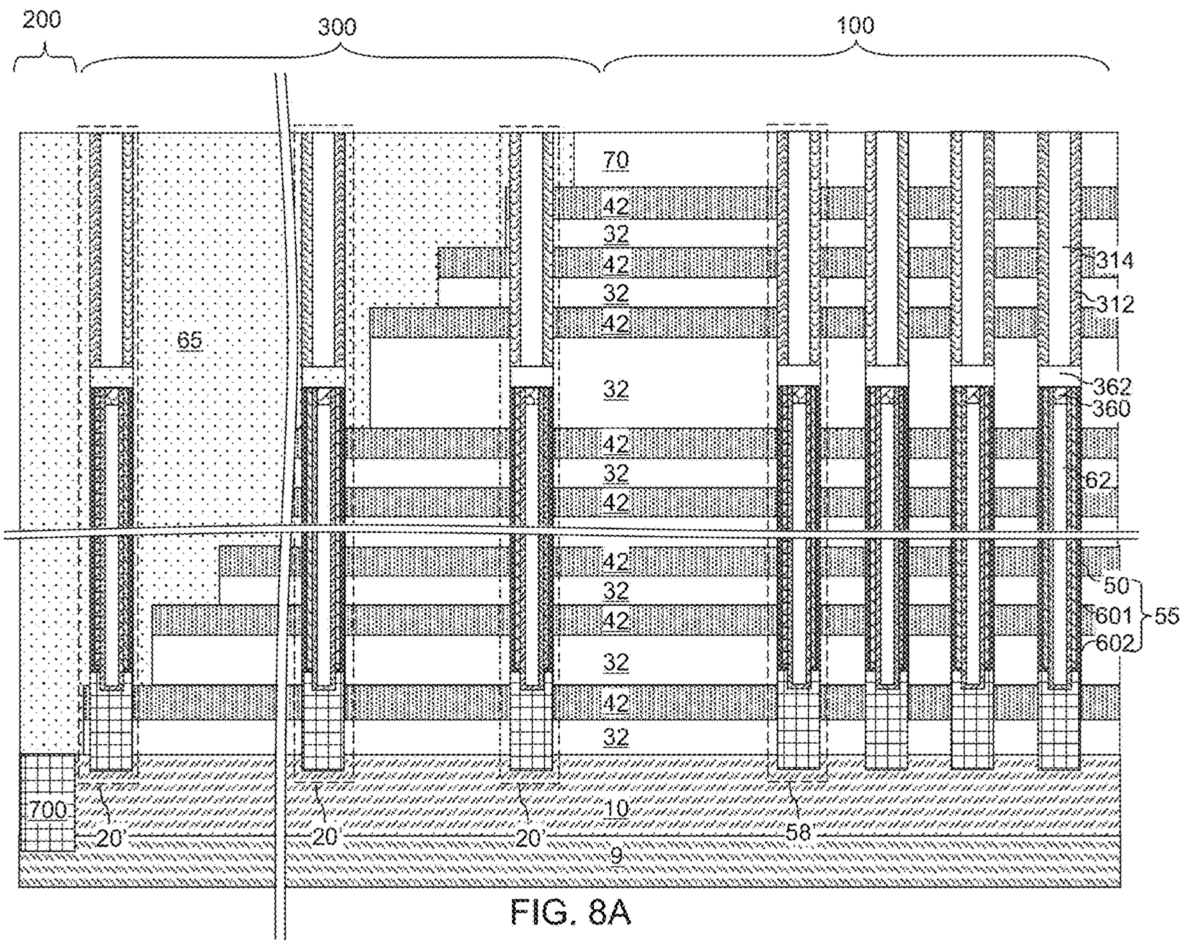
FIG. 8A is a schematic vertical cross-sectional view of the first exemplary structure after formation of in-process memory opening fill structures and in-process support pillar structures according to the first embodiment of the present disclosure.
Figure 8B:
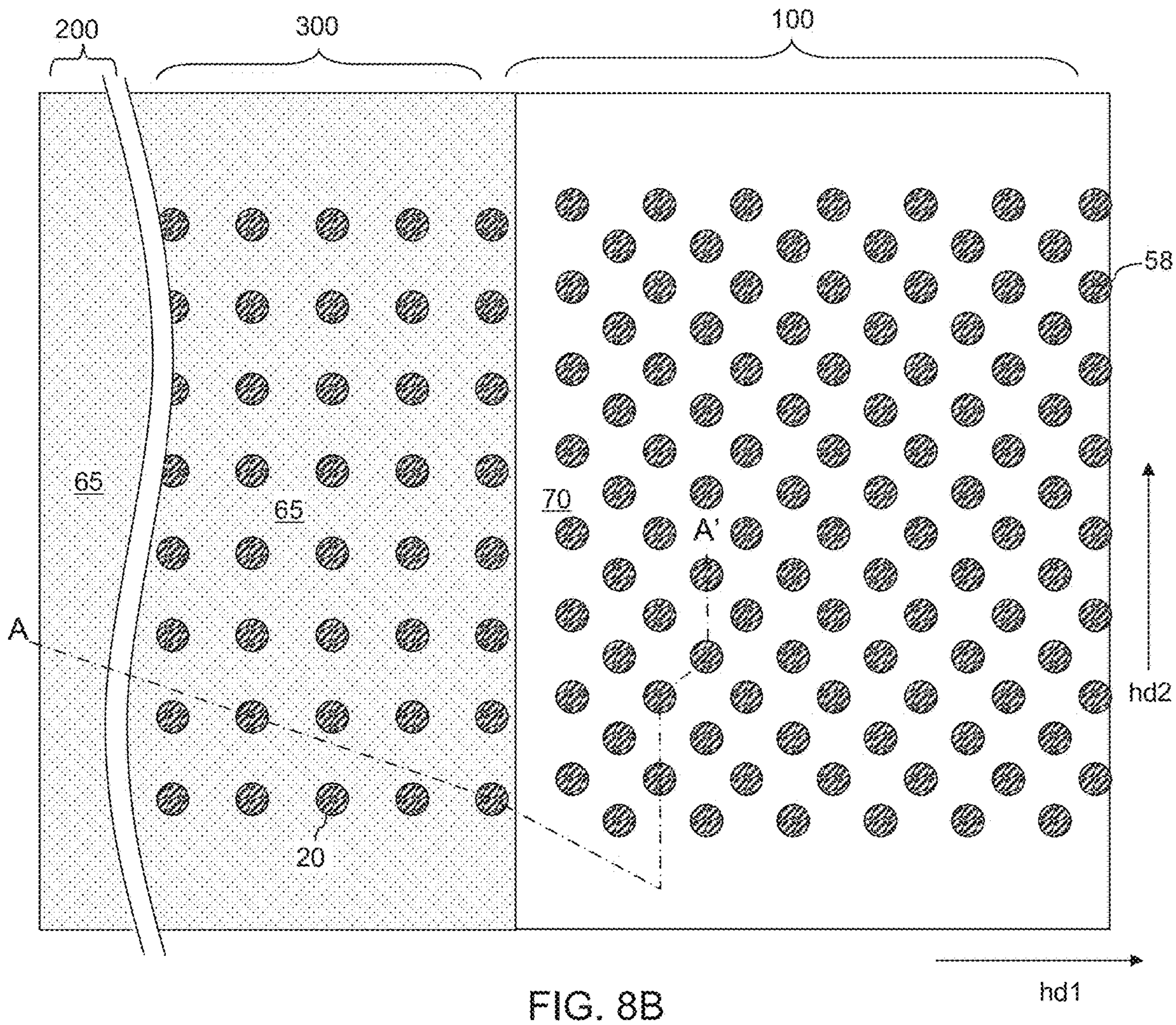
FIG. 8B is a partial see-through top-down view of the first exemplary structure of FIG. 8A. The vertical plane A-A' is the plane of the schematic vertical cross-sectional view of FIG. 8A.

Formation of the sacrificial pillar structures 314 is optional. In an alternative embodiment, formation of the sacrificial pillar structures 314 may be omitted by increasing the thickness of the sacrificial material liner such that the entire volume of each memory cavity 49' is filled with the material of the sacrificial material liner. In this case, the sacrificial spacers 312 can fill the entirety of each memory cavity 49'. A resulting structure is illustrated in FIGS. 7C and 7D. In case the sacrificial pillar structures 314 are omitted, a subsequent processing step for removing the sacrificial pillar structures can also be omitted.

Figure 9A:
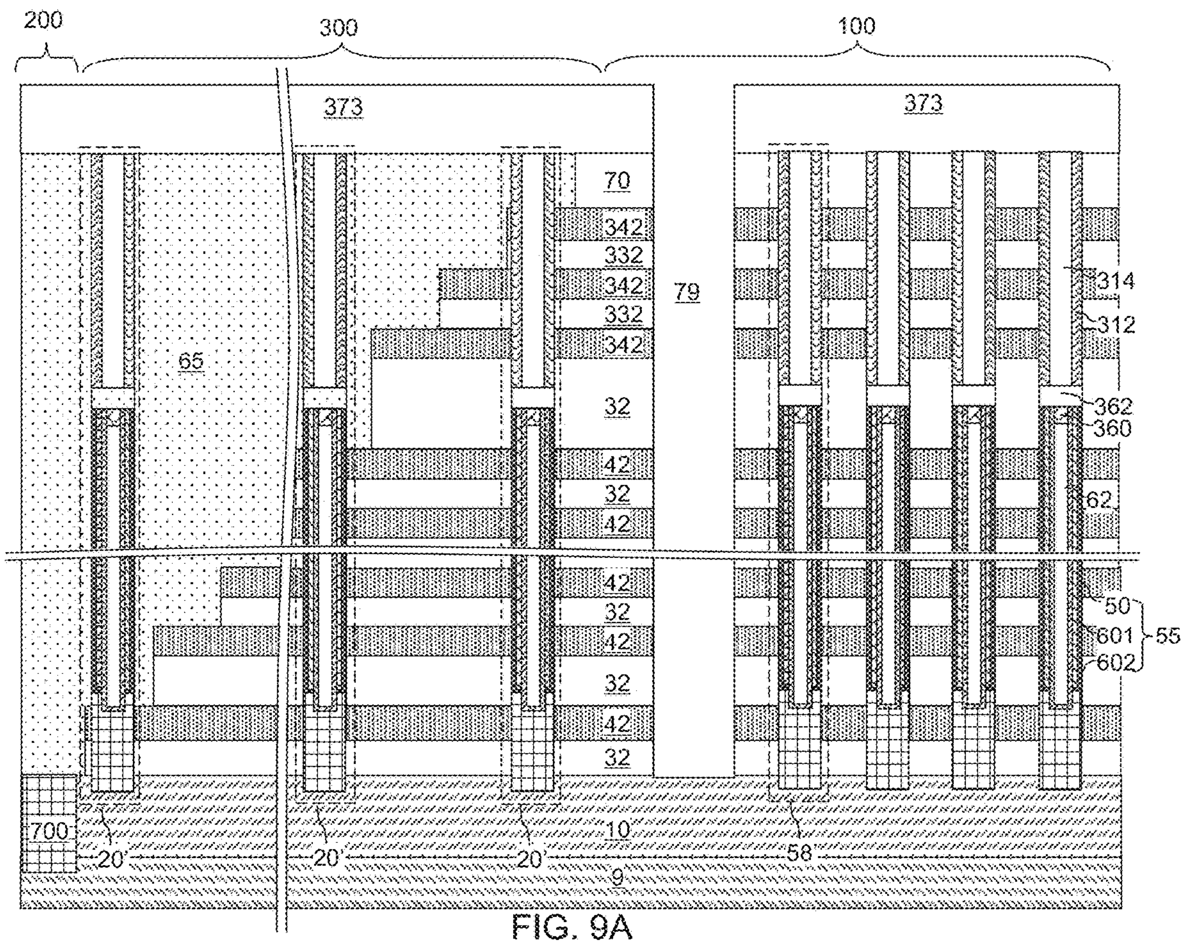
FIG. 9A is a schematic vertical cross-sectional view of the first exemplary structure after formation of a sacrificial planarization stopper layer and backside trenches according to the first embodiment of the present disclosure.
Figure 9B:
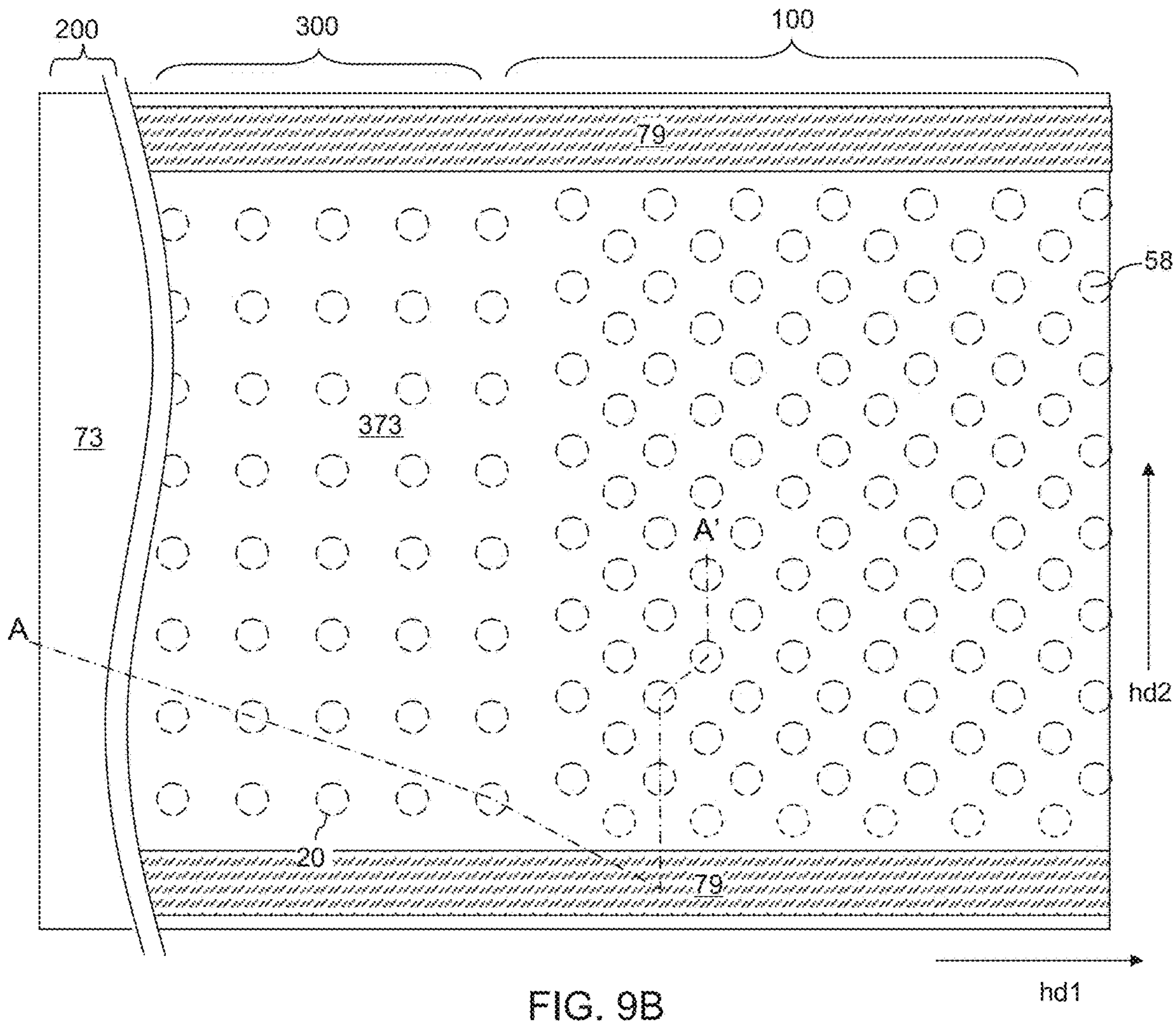
FIG. 9B is a partial see-through top-down view of the first exemplary structure of FIG. 9A. The vertical plane A-A' is the plane of the schematic vertical cross-sectional view of FIG. 9A.

Referring to FIGS. 9A and 9B, a sacrificial planarization stopper layer 373 can be formed over the alternating stack (32, 42, 332, 342, 70) and over the in-process memory opening fill structures 58' and the in-process support pillar structures 20'. The sacrificial planarization stopper layer 373 includes a dielectric material that is different from the dielectric material of the word-line-level sacrificial material layers 42. For example, the sacrificial planarization stopper layer 373 can include silicon oxide. The sacrificial planarization stopper layer 373 can have a thickness in a range from 50 nm to 500 nm, although lesser and greater thicknesses can also be used.

A photoresist layer (not shown) can be applied over the sacrificial planarization stopper layer 373, and is lithographically patterned to form openings in areas between clusters of in-process memory opening fil structures 58'. The pattern in the photoresist layer can be transferred through the sacrificial planarization stopper layer 373, the alternating stack (32, 42, 332, 342, 70) and/or the retro-stepped dielectric material portion 65 using an anisotropic etch to form backside trenches 79, which vertically extend from the top surface of the sacrificial planarization stopper layer 373 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The in-process memory opening fil structures 58' can be arranged in rows that extend along the first horizontal direction hd1. Each backside trench 79 can have a uniform width that is invariant along the lengthwise direction (i.e., along the first horizontal direction hd1). In one embodiment, the backside trenches 79 can include a source contact opening in which a source contact via structure can be subsequently formed. The photoresist layer can be removed, for example, by ashing.

Figure 10:
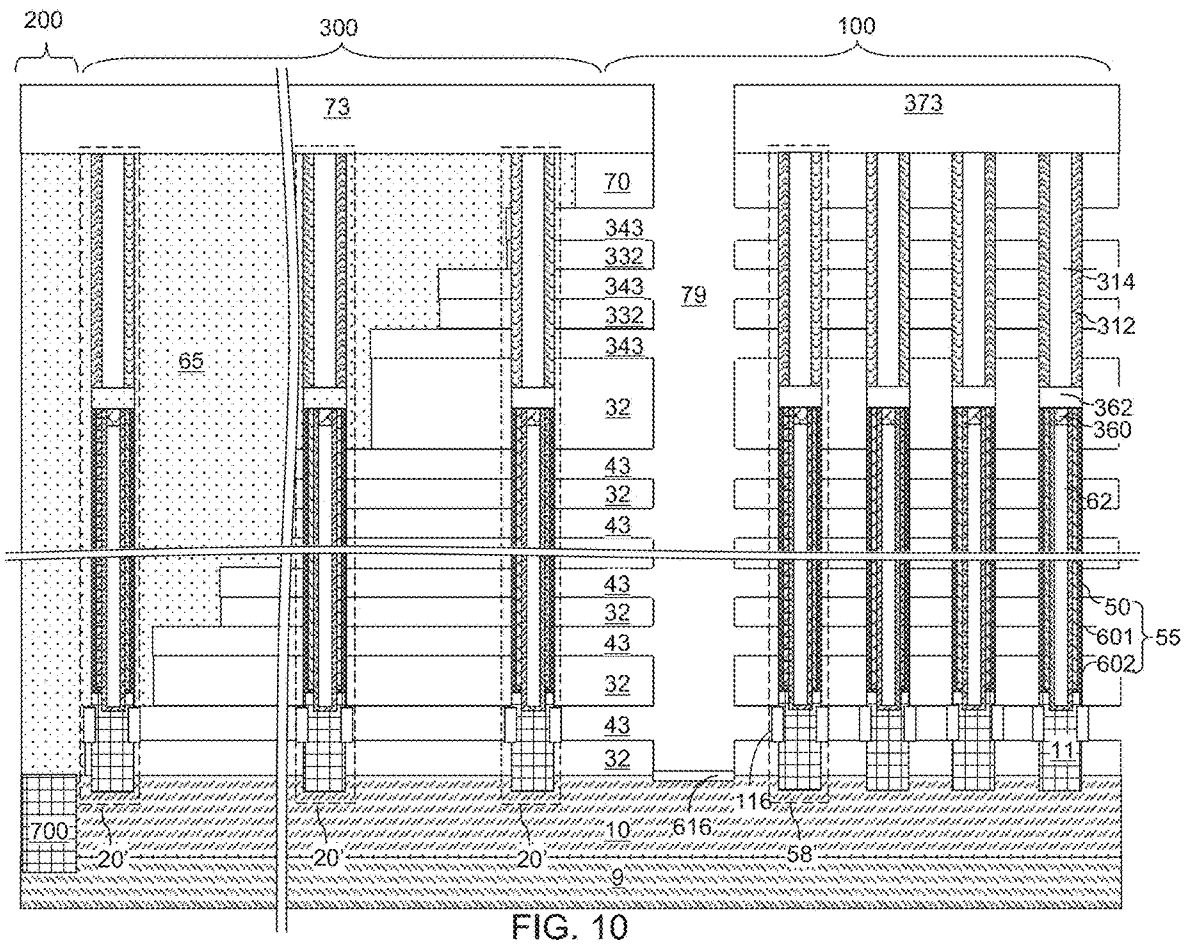
FIG. 10 is a schematic vertical cross-sectional view of the first exemplary structure after formation of backside recesses according to the first embodiment of the present disclosure.
Figure 11A:
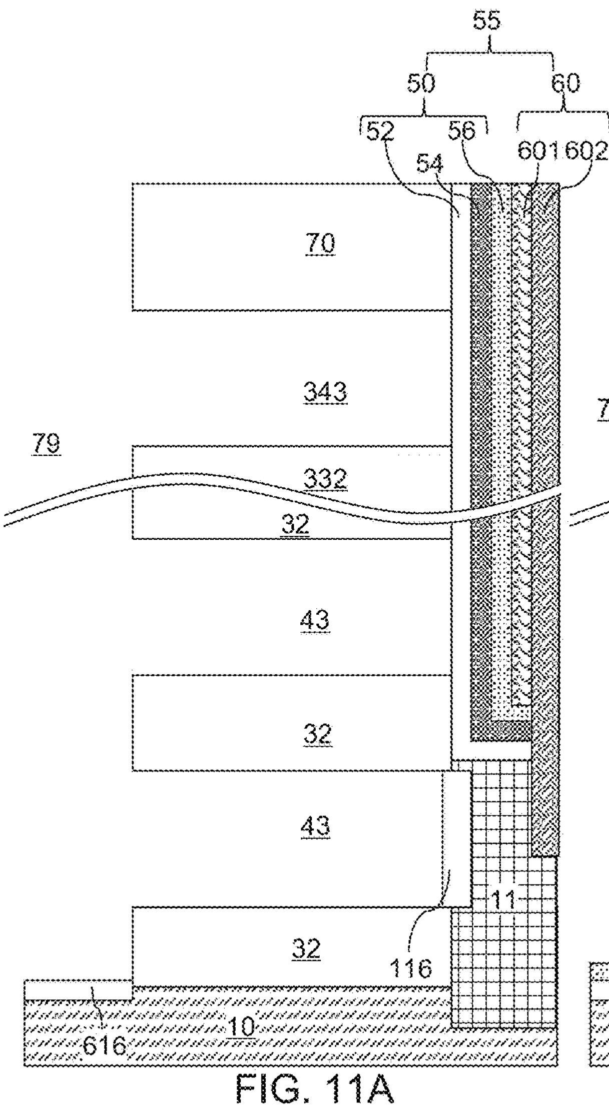
FIGS. 11A-11D are sequential vertical cross-sectional views of a region of the first exemplary structure during formation of electrically conductive layers according to the first embodiment of the present disclosure.

Referring to FIGS. 10 and 11A, an etchant that selectively etches the second material of the word-line-level sacrificial material layers 42 and the drain-select-level sacrificial material layers 342 with respect to the first material of the word-line-level insulating layers 32, the drain-select-level insulating layers 332, and the insulating cap layer 70 can be introduced into the backside trenches 79, for example, using an etch process. FIG. 11A illustrates a region of the first exemplary structure of FIG. 10. Word-line-level backside recesses 43 are formed in volumes from which the word-line-level sacrificial material layers 42 are removed. Drain-select-level backside recesses 343 are formed in volumes from which the drain-select-level sacrificial material layers 342 are removed. The removal of the second material of the sacrificial material layers (42, 342) can be selective to the first material of the insulating layers (32, 332, 70), the material of the retro-stepped dielectric material portion 65, the semiconductor material of the semiconductor material layer 10, and the material of the outermost layer of the memory films 50. In one embodiment, the sacrificial material layers (42, 342) can include silicon nitride, and the materials of the insulating layers (32, 332, 70) and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers (42, 342) include silicon nitride, the etch process can be a wet etch process in which the first exemplary structure is immersed within a wet etch tank including phosphoric acid, which etches silicon nitride selective to silicon oxide, silicon, and various other materials used in the art. The in-process memory opening fill structures 58', the in-process support pillar structure 20', the retro-stepped dielectric material portion 65, and the memory stack structures 55 provide structural support while the backside recesses (43, 343) are present within volumes previously occupied by the sacrificial material layers (42, 342).

Each backside recess (43, 343) can be a laterally extending cavity having a lateral dimension that is greater than the vertical extent of the cavity. In other words, the lateral dimension of each backside recess (43, 343) can be greater than the height of the backside recess (43, 343). A plurality of backside recesses (43, 343) can be formed in the volumes from which the second material of the sacrificial material layers (42, 342) is removed. The memory openings in which the memory stack structures 55 are formed are herein referred to as front side openings or front side cavities in contrast with the backside recesses (43, 343). In one embodiment, the memory array region 100 comprises an array of monolithic three-dimensional NAND strings having a plurality of device levels disposed above the substrate (9, 10). In this case, each backside recess (43, 343) can define a space for receiving a respective word line of the array of monolithic three-dimensional NAND strings.

Each of the plurality of backside recesses (43, 343) can extend substantially parallel to the top surface of the substrate (9, 10). A backside recess (43, 343) can be vertically bounded by a top surface of an underlying insulating layer (32, 332) and a bottom surface of an overlying insulating layer (32, 332, 70). In one embodiment, each backside recess (43, 343) can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 11B:
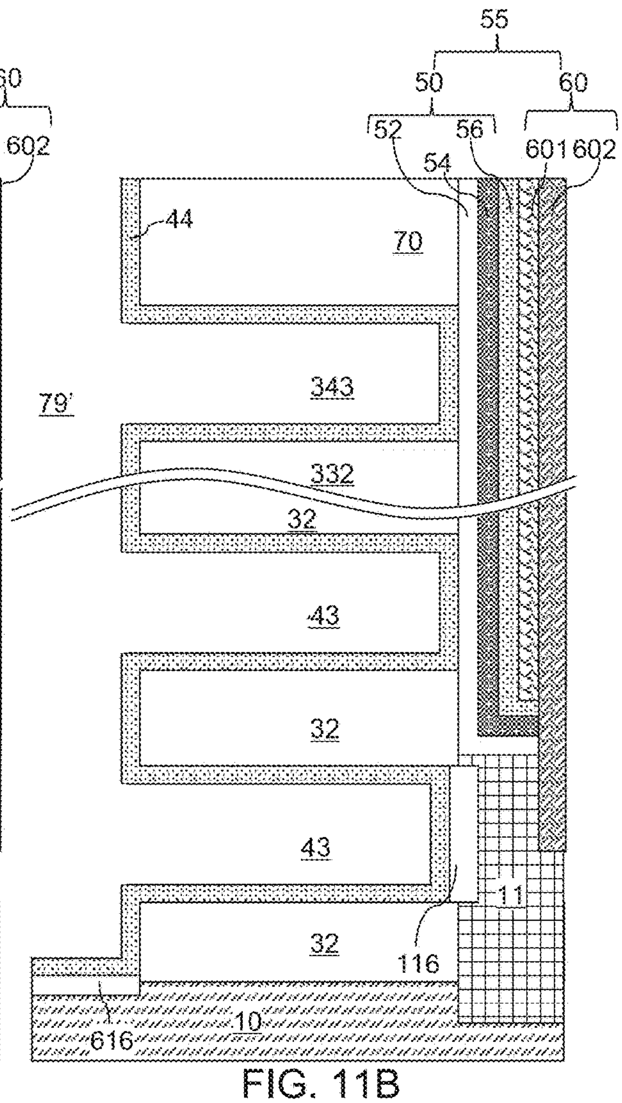

Referring to FIG. 11B, a backside blocking dielectric layer 44 can be optionally formed. The backside blocking dielectric layer 44, if present, comprises a dielectric material that functions as a control gate dielectric for the control gates to be subsequently formed in the backside recesses (43, 343). In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses (43, 343) and on a sidewall of the backside trench 79. The backside blocking dielectric layer 44 can be formed directly on horizontal surfaces of the insulating layers (32, 332, 70) and sidewalls of the memory stack structures 55 within the backside recesses (43, 343). If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers (32, 332, 70), the portions of the sidewall surfaces of the memory stack structures 55 that are physically exposed to the backside recesses (43, 343), and a top surface of the planar dielectric portion 616. A backside cavity 79' is present within the portion of each backside trench 79 that is not filled with the backside blocking dielectric layer 44.

Figures 11C, 11D:
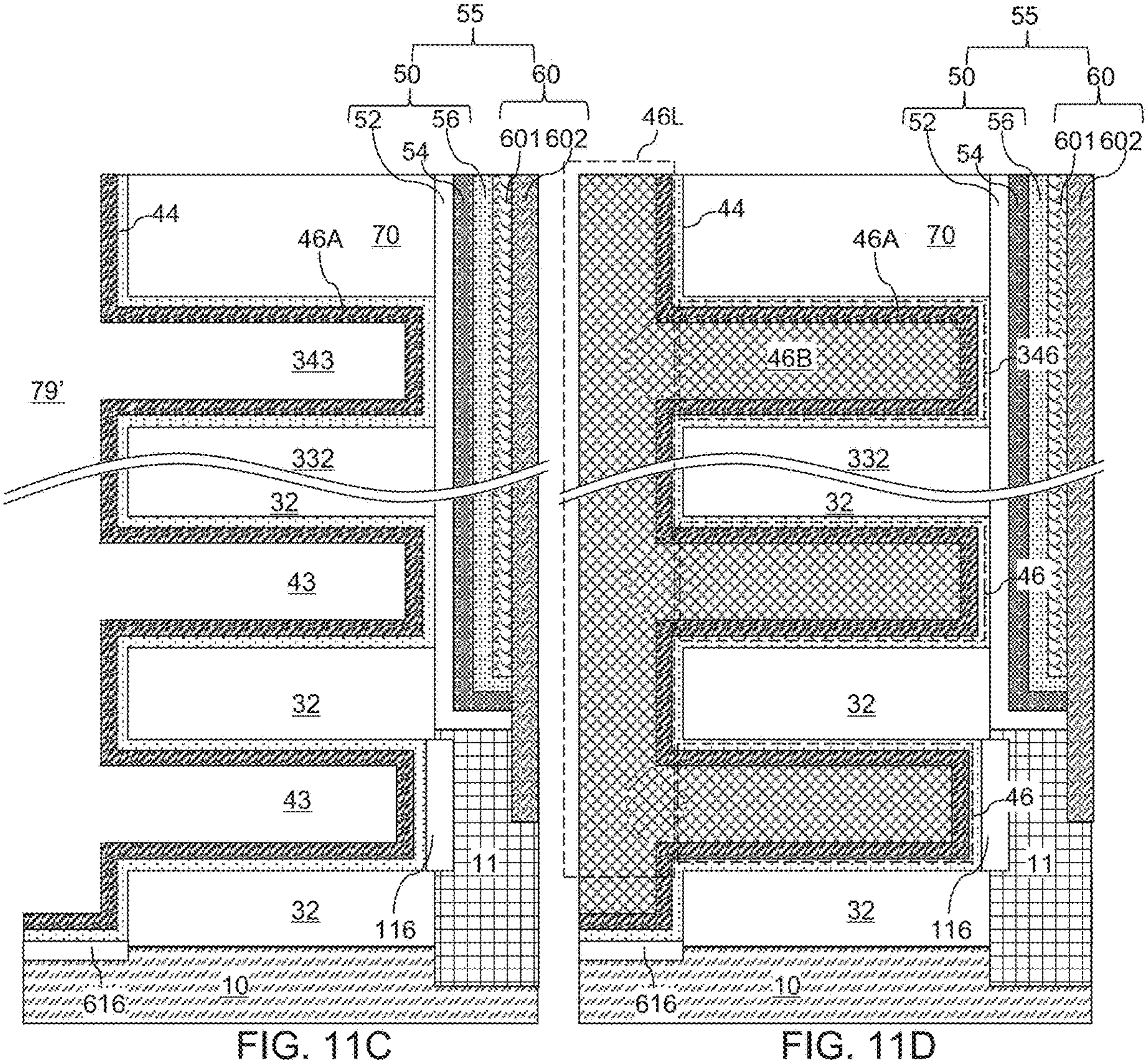

Referring to FIG. 11C, a metallic barrier layer 46A can be deposited in the backside recesses (43, 343). The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 12:
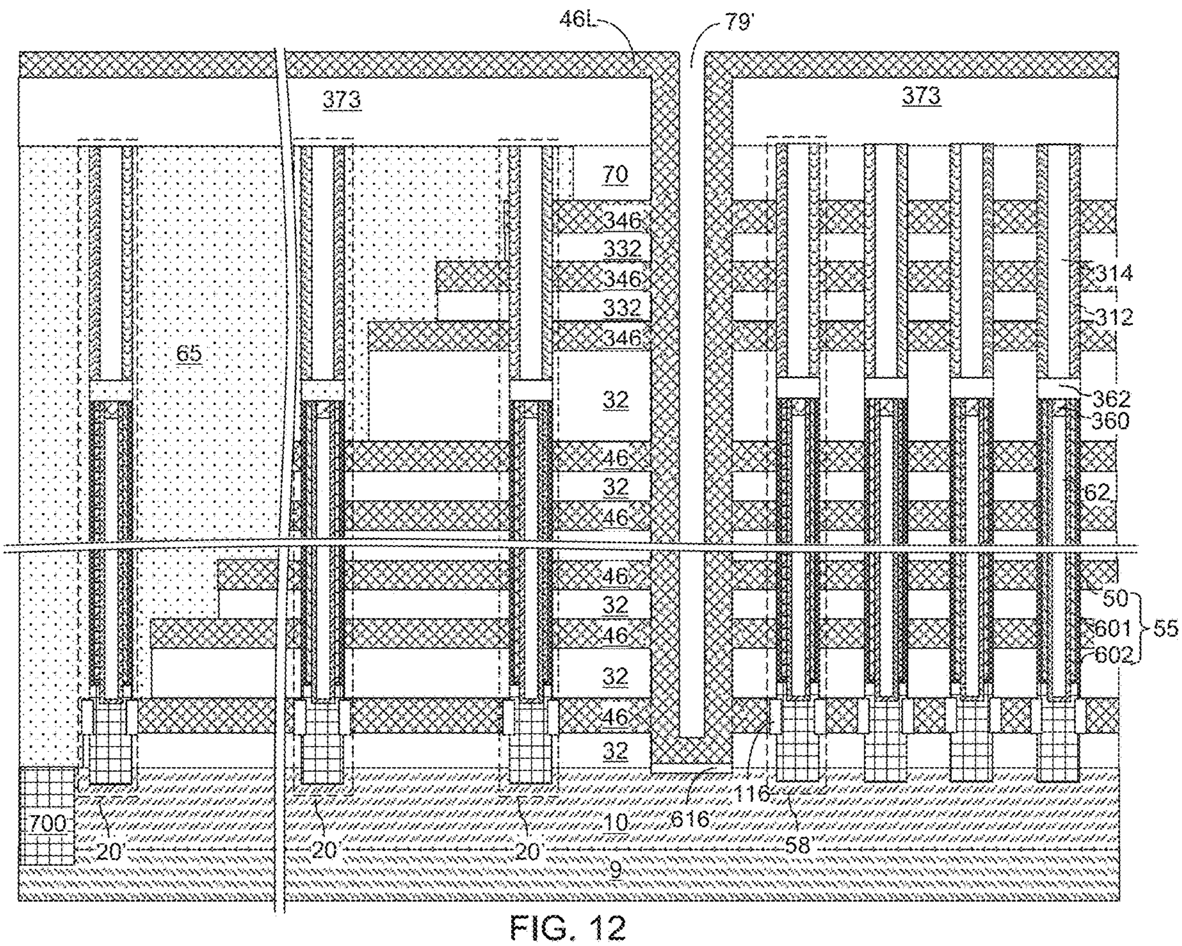
FIG. 12 is a schematic vertical cross-sectional view of the first exemplary structure at the processing step of FIG. 11D.

Referring to FIGS. 11D and 12, a metal fill material is deposited in the plurality of backside recesses (43, 343), on the sidewalls of the at least one the backside trench 79, and over the top surface of the sacrificial planarization stopper layer 373 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers (32, 332, 70) and the memory stack structures 55 by the metallic barrier layer 46A, which is a metallic barrier layer that blocks diffusion of fluorine atoms therethrough.

A plurality of electrically conductive layers (46, 346) can be formed in the plurality of backside recesses (43, 343), and a continuous electrically conductive material layer 46L can be formed on the sidewalls of each backside trench 79 and over the sacrificial planarization stopper layer 373. Each electrically conductive layer (46, 346) includes a portion of the metallic barrier layer 46A and a portion of the metallic fill material layer 46B that are located between a vertically neighboring pair of dielectric material layers such as a pair of insulating layers (32, 332, 70). The continuous electrically conductive material layer 46L includes a continuous portion of the metallic barrier layer 46A and a continuous portion of the metallic fill material layer 46B that are located in the backside trenches 79 or above the sacrificial planarization stopper layer 373.

Each sacrificial material layer (42, 342) can be replaced with an electrically conductive layer (46, 346). A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer (such as a bottommost one of the word-line-level electrically conductive layer 46) laterally surrounds each tubular dielectric spacer 116 upon formation of the electrically conductive layers (46, 346).

Figure 13:
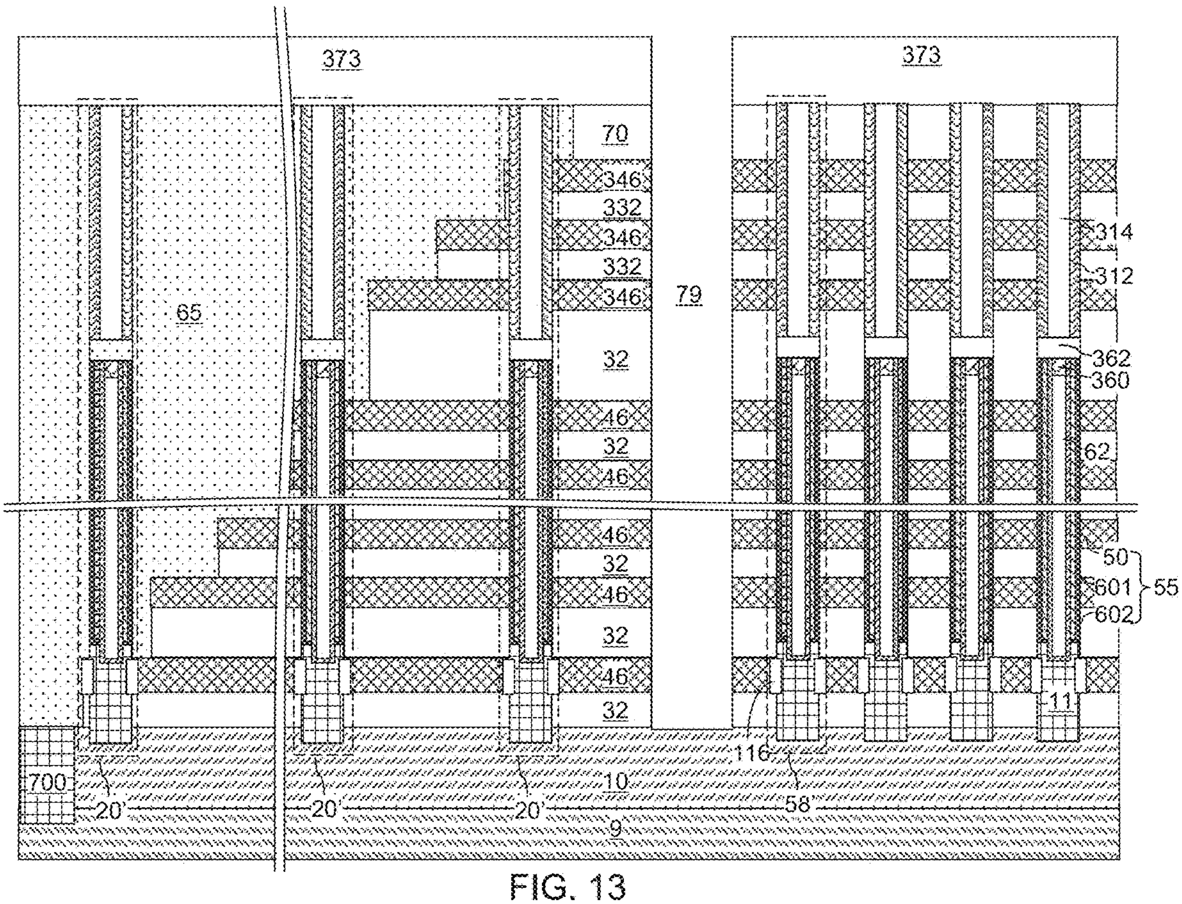
FIG. 13 is a schematic vertical cross-sectional view of the first exemplary structure after removal of a deposited conductive material from within the backside trench according to the first embodiment of the present disclosure.

Referring to FIG. 13, the deposited metallic material of the continuous electrically conductive material layer 46L is etched back from the sidewalls of each backside trench 79 and from above the sacrificial planarization stopper layer 373, for example, by an isotropic wet etch, an anisotropic dry etch, or a combination thereof. Each remaining portion of the deposited metallic material in the backside recesses (43, 343) constitutes an electrically conductive layer (46, 346). The electrically conductive layers (46, 346) include word-line-level electrically conductive layers 46 that are formed in the volumes of the word-line-level backside recesses 43 and drain-select-level electrically conductive layers 346 that are formed in the volumes of the drain-select-level backside recesses 343. Each electrically conductive layer (46, 346) can be a conductive line structure. Thus, the sacrificial material layers (42, 342) are replaced with the electrically conductive layers (46, 346).

Each electrically conductive layer (46, 346) can function as a combination of a plurality of control gate electrodes located at a same level and a word line electrically interconnecting, i.e., electrically connecting, the plurality of control gate electrodes located at the same level. The plurality of control gate electrodes within each electrically conductive layer (46, 346) are the control gate electrodes for the vertical memory devices including the memory stack structures 55. In other words, each electrically conductive layer (46, 346) can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Figure 14A:
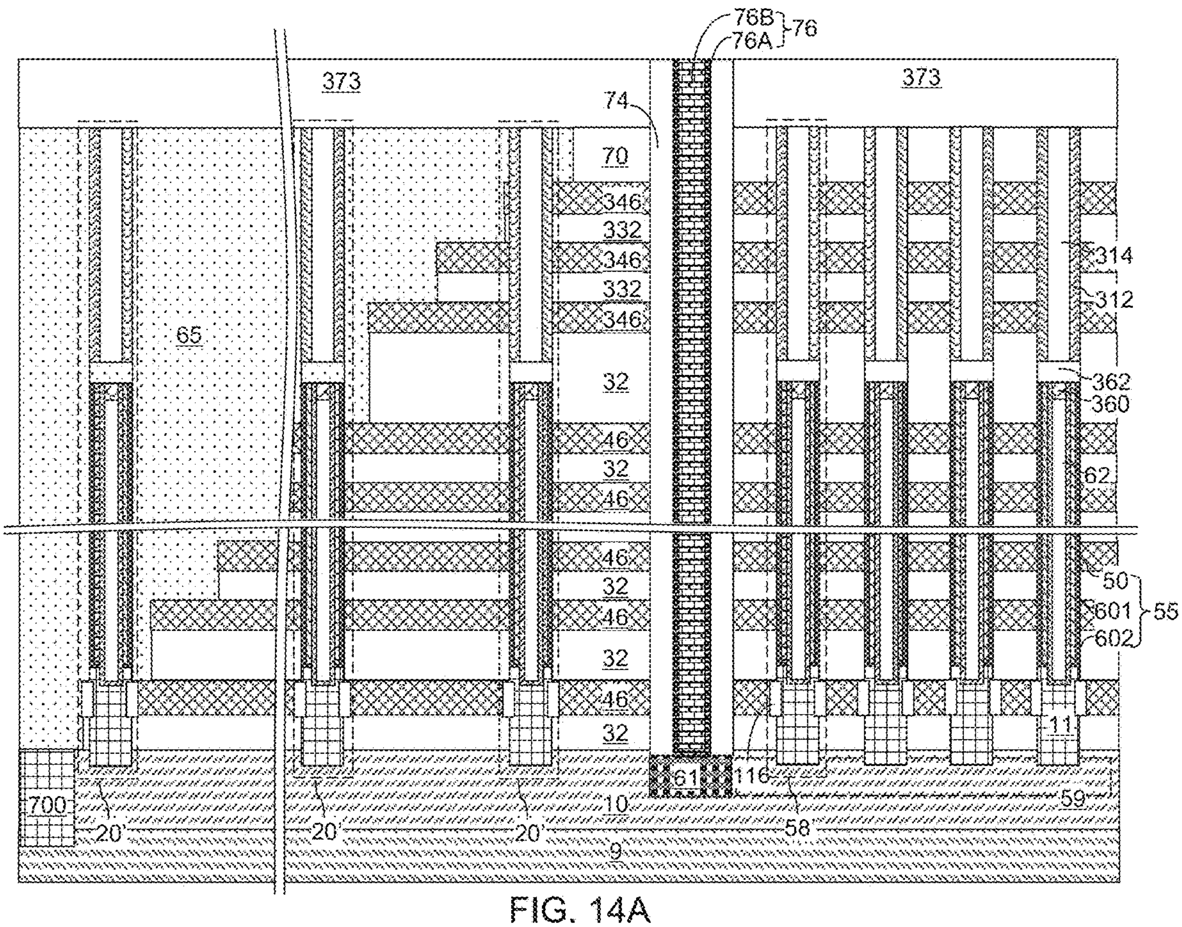
FIG. 14A is a schematic vertical cross-sectional view of the first exemplary structure after formation of an insulating spacer and a backside contact structure according to the first embodiment of the present disclosure.
Figure 14B:
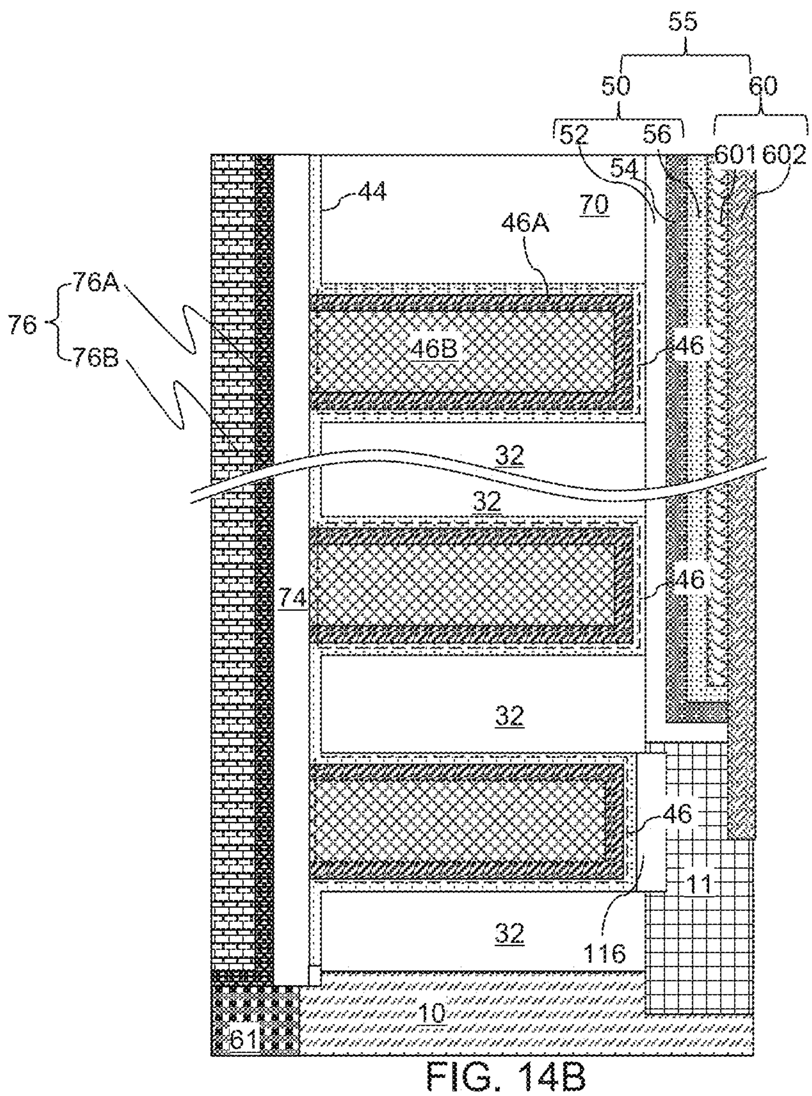
FIG. 14B is a magnified view of a region of the first exemplary structure of FIG. 14A.

Referring to FIGS. 14A and 14B, an insulating material liner can be formed in the backside trenches 79 and over the sacrificial planarization stopper layer 373 by a conformal deposition process. Exemplary conformal deposition processes include, but are not limited to, chemical vapor deposition and atomic layer deposition. The insulating material liner includes an insulating material such as silicon oxide, silicon nitride, a dielectric metal oxide, an organosilicate glass, or a combination thereof. In one embodiment, the insulating material liner can include silicon oxide. The insulating material liner can be formed, for example, by low pressure chemical vapor deposition (LPCVD) or atomic layer deposition (ALD). The thickness of the insulating material liner can be in a range from 1.5 nm to 60 nm, although lesser and greater thicknesses can also be used.

If a backside blocking dielectric layer 44 is present, the insulating material liner can be formed directly on surfaces of the backside blocking dielectric layer 44 and directly on the sidewalls of the electrically conductive layers (46, 346). If a backside blocking dielectric layer 44 is not used, the insulating material liner can be formed directly on sidewalls of the insulating layers (32, 332, 70) and directly on sidewalls of the electrically conductive layers (46, 346).

An anisotropic etch is performed to remove horizontal portions of the insulating material liner from above the sacrificial planarization stopper layer 373 and at the bottom of each backside trench 79. Each remaining portion of the insulating material liner constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer (such as a bottommost one of the word-line-level electrically conductive layer 46) provided upon formation of the electrically conductive layers (46, 346) within the alternating stack (32, 46) can comprise a source-side select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the sacrificial planarization stopper layer 373 overlying the alternating stack (32, 46) as a stopping layer. If chemical mechanical planarization (CMP) process is used, the sacrificial planarization stopper layer 373 can be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 can contact a sidewall of the backside blocking dielectric layer 44.

Figure 15:
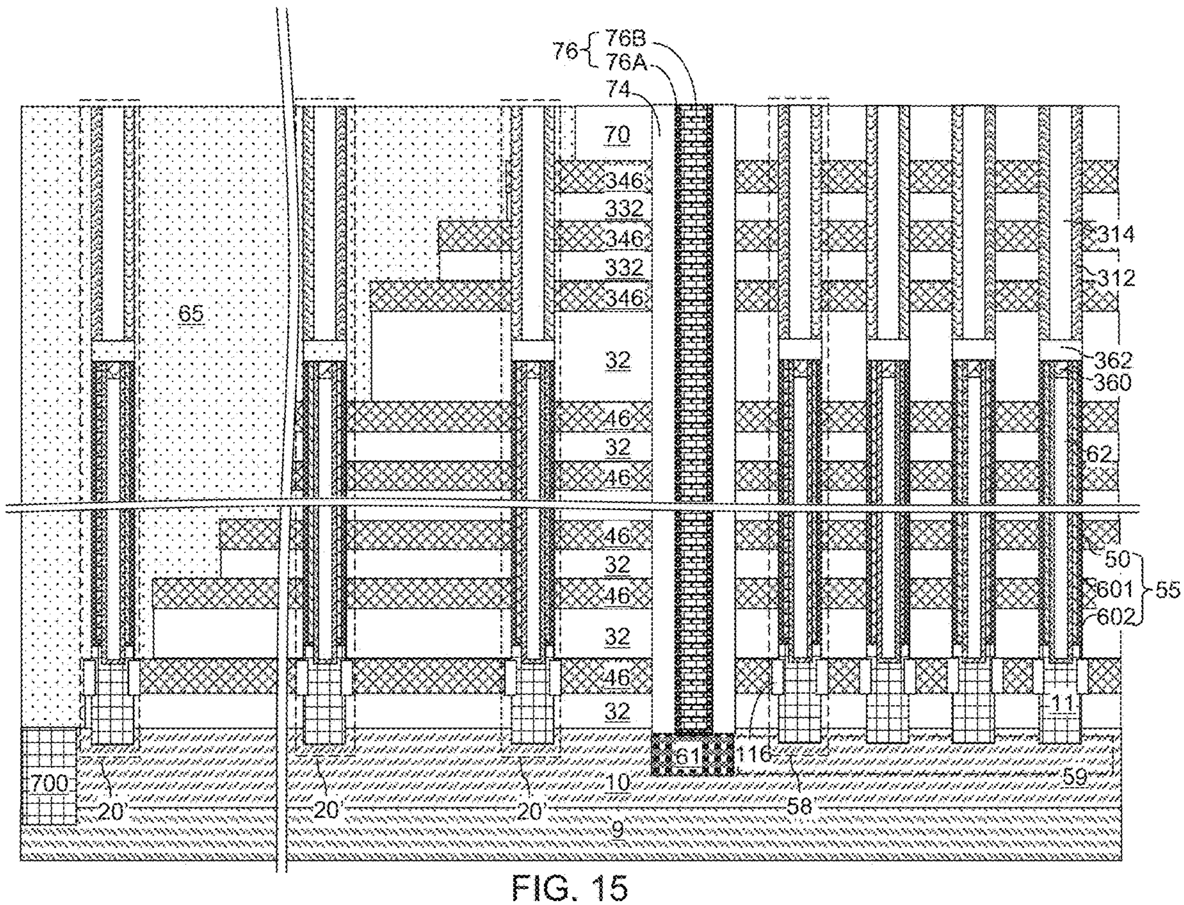
FIG. 15 is a schematic vertical cross-sectional view of the first exemplary structure after removal of the sacrificial planarization stopper layer according to the first embodiment of the present disclosure.
Figure 16A:
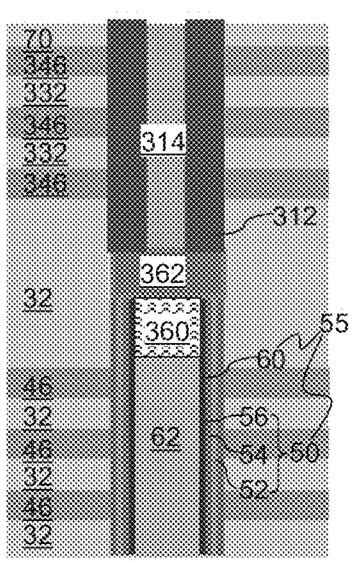
FIG. 16A is a vertical cross-sectional view of a memory opening within the first exemplary structure at the processing steps of FIG. 15A.
Figure 16B:
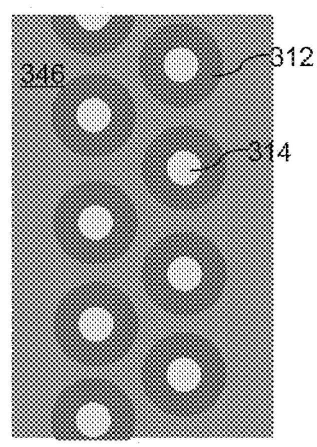
FIG. 16B is a top-down view of a region of the first exemplary structure at the processing steps of FIGS. 15 and 16A.
Figure 17A:
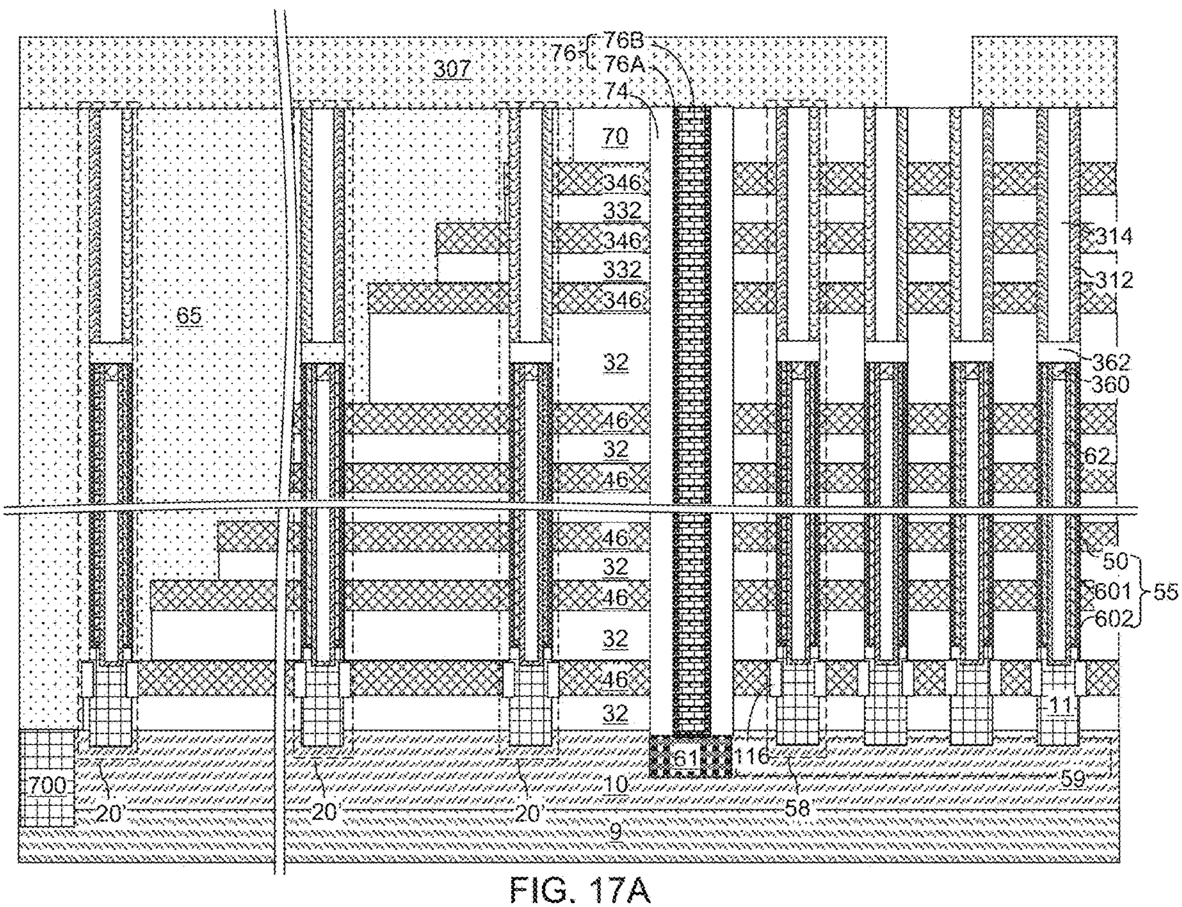
FIG. 17A is a schematic vertical cross-sectional view of the first exemplary structure after formation of a patterned etch mask layer according to the first embodiment of the present disclosure.
Figure 17B:
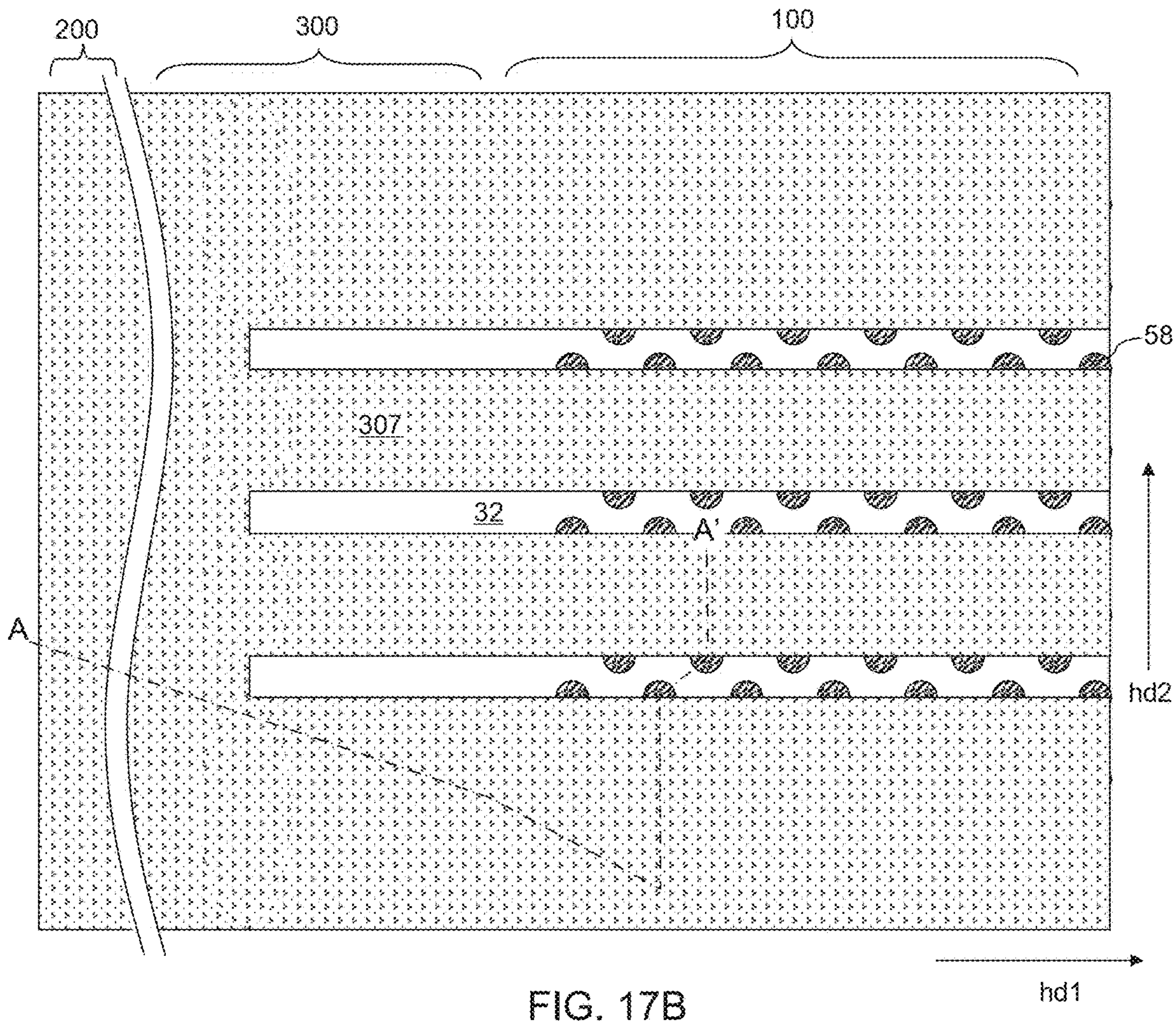
FIG. 17B is a partial see-through top-down view of the first exemplary structure of FIG. 17A. The vertical plane A-A' is the plane of the schematic vertical cross-sectional view of FIG. 17A.
Figure 18A:
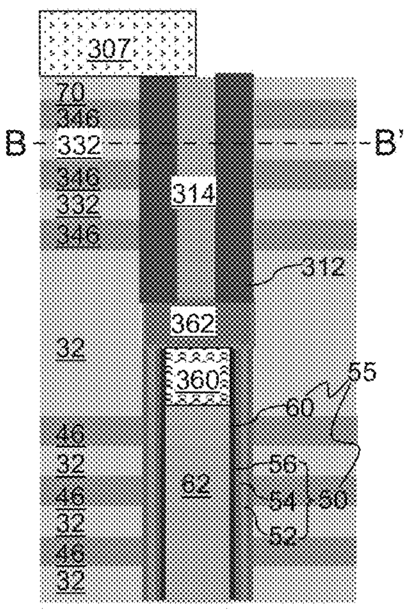
FIG. 18A is a vertical cross-sectional view of a memory opening within the first exemplary structure at the processing steps of FIGS. 17A and 17B.
Figure 18B:
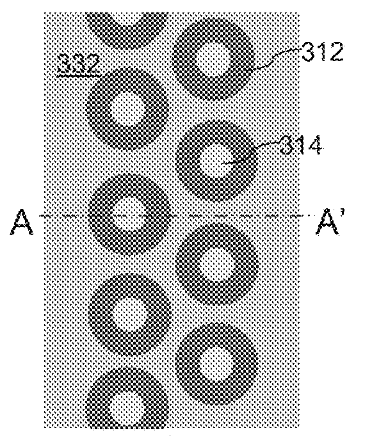
FIG. 18B is a horizontal cross-sectional view of a region of the first exemplary structure along the plane B-B' of FIG. 18A. The vertical plane A-A' is the plane of the vertical cross-sectional view of FIG. 18A.
Figure 18C:
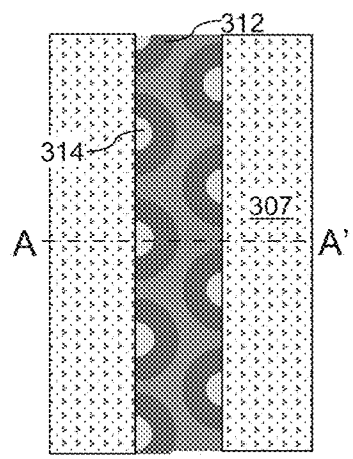
FIG. 18C is a top-down view of a region of the first exemplary structure at the processing steps of FIGS. 17A, 17B, 18A, and 18B. The vertical plane A-A' is the plane of the vertical cross-sectional view of FIG. 18A.

Referring to FIGS. 15, 16A, and 16B, the sacrificial planarization stopper layer 373 and an upper portion of each insulating spacer 74 can be removed from above the horizontal plane including the top surface of the insulating cap layer 70, for example, by a recess etch process, which may use an isotropic etch process or an anisotropic etch process. The backside contact via structures 76 may be vertically recessed so that the top surfaces of backside contact via structures 76 are at about the level of the top surface of the insulating cap layer 70.

Referring to FIGS. 17A, 17B, and 18A-18C, a patterned etch mask layer 307 can be formed over the insulating cap layer 70 and the retro-stepped dielectric material portion 65. The patterned etch mask layer 307 can be a lithographically patterned photoresist layer. The patterned etch mask layer 307 can include elongated openings (such as rectangular openings) that laterally extend along the first horizontal direction hd1. Each elongated opening in the patterned etch mask layer 307 partially overlies a neighboring pair of rows of in-process memory opening fill structures 58'.

Figure 19A:
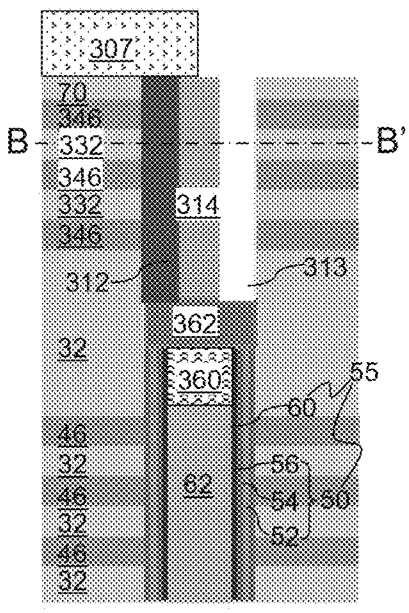
FIG. 19A is a vertical cross-sectional view of a memory opening within the first exemplary structure after formation of discrete corner cavities according to the first embodiment of the present disclosure.
Figure 19B:
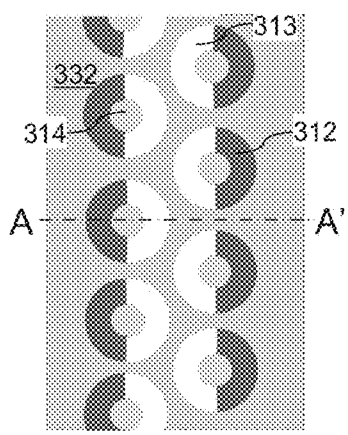
FIG. 19B is a horizontal cross-sectional view of a region of the first exemplary structure along the plane B-B' of FIG. 19A. The vertical plane A-A' is the plane of the vertical cross-sectional view of FIG. 18A.
Figure 19C:
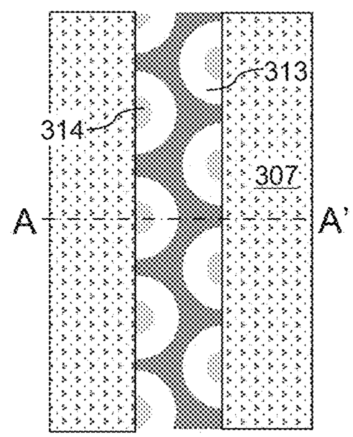
FIG. 19C is a top-down view of a region of the first exemplary structure at the processing steps of FIGS. 19A and 19B. The vertical plane A-A' is the plane of the vertical cross-sectional view of FIG. 18A.

Referring to FIGS. 19A-19C, an anisotropic etch process that etches the material of the 312 selective to the materials of the insulating cap layer 70 and the sacrificial pillar structures 314 can be performed. Unmasked portions of the sacrificial spacer 312 can be etched underneath each elongated opening in the patterned etch mask layer 307 to form discrete corner cavities 313. The discrete corner cavities 313 can have a semi-tubular shape. Sidewalls of the drain-select-level electrically conductive layers 346 are physically exposed on an outer sidewall of each discrete corner cavity 313.

Figures 20A, 20B, 20C:
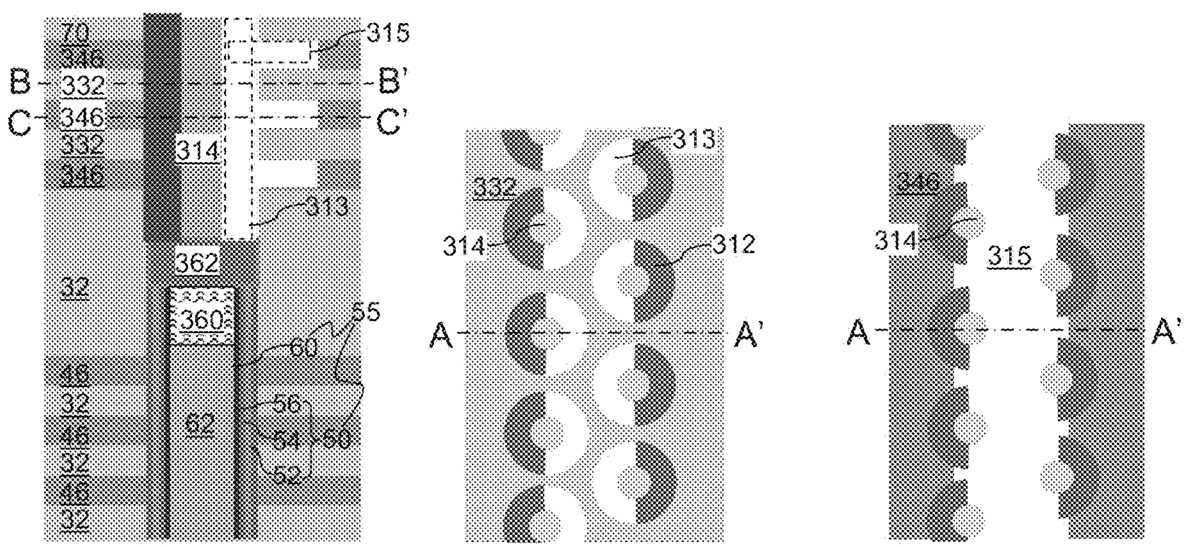
FIG. 20A is a vertical cross-sectional view of a memory opening within the first exemplary structure after formation of laterally-extending cavities according to the first embodiment of the present disclosure.
FIG. 20B is a horizontal cross-sectional view of a region of the first exemplary structure along the plane B-B' of FIG. 20A. The vertical plane A-A' is the plane of the vertical cross-sectional view of FIG. 20A.
FIG. 20C is a horizontal cross-sectional view of a region of the first exemplary structure along the plane C-C' of FIG. 20A. The vertical plane A-A' is the plane of the vertical cross-sectional view of FIG. 20A.

Referring to FIGS. 20A-20C, an isotropic etchant that etches the material(s) of the drain-select-level electrically conductive layers 346 selective to the materials of the insulating cap layer 70, the drain-select-level insulating layers 332, and the sacrificial pillar structures 314 can be introduced into the discrete corner cavities 313. Physically exposed sidewalls of the drain-select-level electrically conductive layers 346 can be laterally recessed in an isotropic etch process using the isotropic etchant. A laterally-extending cavity 315 that laterally extend along the first horizontal direction hd1 can be formed at each level of the drain-select-level electrically conductive layers 346 within each area of the elongated opening in the patterned etch mask layer 307. Each drain-select-level electrically conductive layer 346 can be divided into multiple strips with a cut at the location of each elongated opening in the patterned etch mask layer 307. The patterned etch mask layer 307 can be removed after, or prior to, the isotropic etch process.

Figures 21A, 21B, 21C:
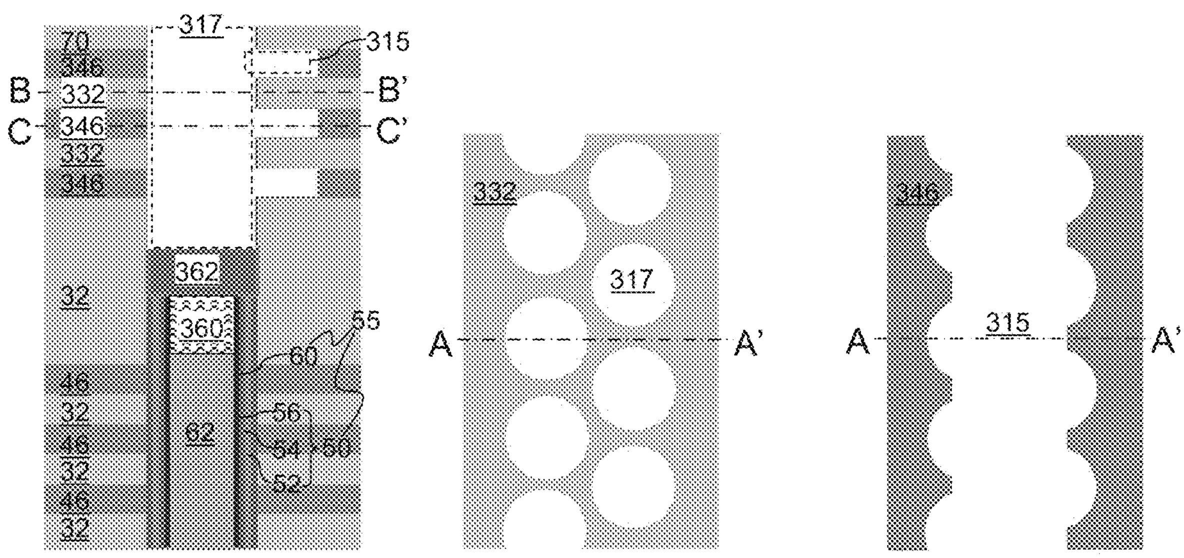
FIG. 21A is a vertical cross-sectional view of a memory opening within the first exemplary structure after removal of remaining portions of the in-process upper memory opening fill structures and formation of an integrated cavity according to the first embodiment of the present disclosure.
FIG. 21B is a horizontal cross-sectional view of a region of the first exemplary structure along the plane B-B' of FIG. 21A. The vertical plane A-A' is the plane of the vertical cross-sectional view of FIG. 21A.
FIG. 21C is a horizontal cross-sectional view of a region of the first exemplary structure along the plane C-C' of FIG. 21A. The vertical plane A-A' is the plane of the vertical cross-sectional view of FIG. 21A.

Referring to FIGS. 21A-21C, remaining portions of each in-process upper memory stack structure overlying a semiconductor oxide plate 362 can be removed selective to the insulating cap layer 70, the drain-select-level insulating layers 332, and the drain-select-level electrically conductive layers 346. In one embodiment, the sacrificial spacers 312 can include polysilicon and the sacrificial pillar structures 314 can include borosilicate glass, and the insulating cap layer 70 and the drain-select-level insulating layers 332 can include undoped silicate glass. A pillar-shaped cavity 317 can be formed above each physically exposed semiconductor oxide plate 362. Each pillar-shaped cavity 317 is connected to at least one laterally-extending cavity 315. An integrated cavity (315, 317) including the volumes of at least one laterally-extending cavity 315 and two rows of pillar-shaped cavities 317 can be formed between each neighboring pair of strips of the drain-select-level electrically conductive layers 346.

Figure 22A:
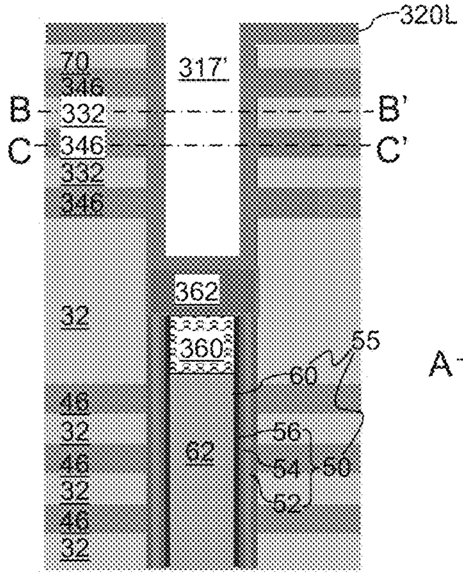
FIG. 22A is a vertical cross-sectional view of a memory opening within the first exemplary structure after formation of a dielectric fill material layer according to the first embodiment of the present disclosure.
Figure 22B:
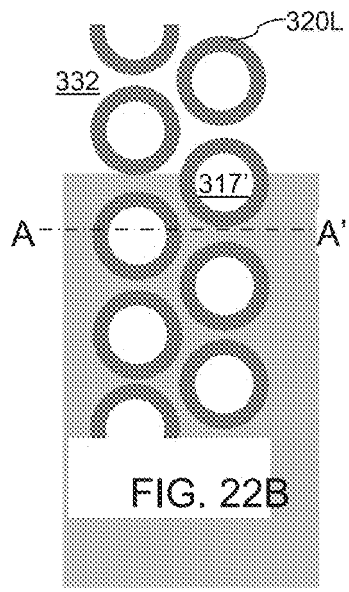
FIG. 22B is a horizontal cross-sectional view of a region of the first exemplary structure along the plane B-B' of FIG. 22A. The vertical plane A-A' is the plane of the vertical cross-sectional view of FIG. 22A.
Figure 22C:
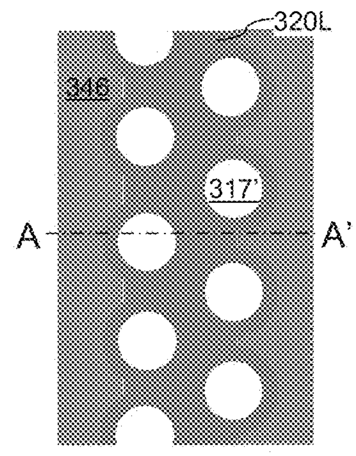
FIG. 22C is a horizontal cross-sectional view of a region of the first exemplary structure along the plane C-C' of FIG. 22A. The vertical plane A-A' is the plane of the vertical cross-sectional view of FIG. 22A.

Referring to FIGS. 22A-22C, a dielectric liner 320L is deposited in the integrated cavities (315, 317) to fill each volume of the laterally-extending cavities 315. The thickness of the dielectric liner 320L is selected such that the laterally-extending cavities 315 are filled with the dielectric liner 320L and a void 317' is present in an upper region of each memory opening 49. The dielectric liner 320L can include silicon oxide.

Figures 23A, 23B, 23C:
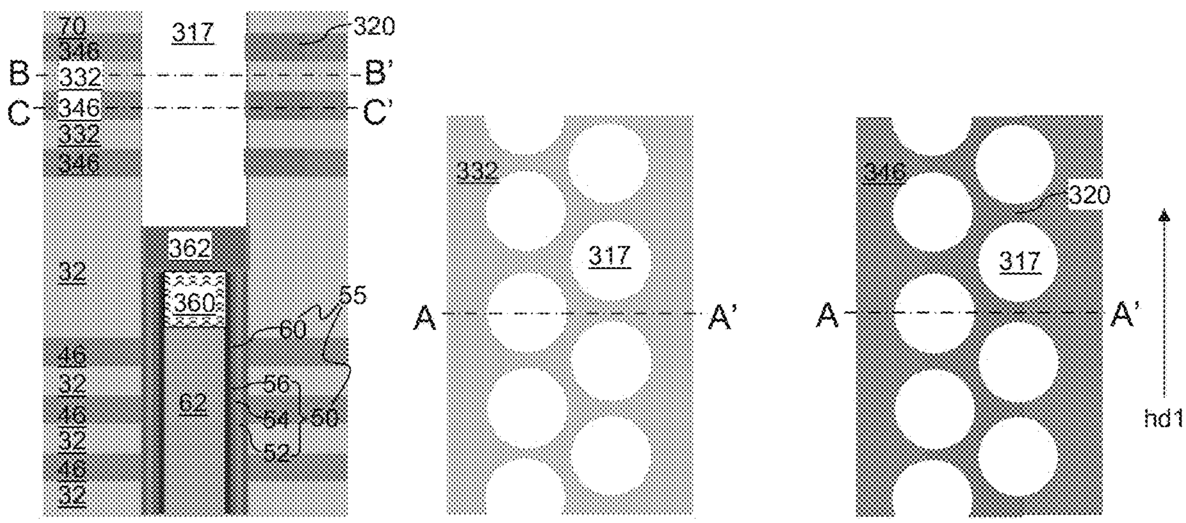
FIG. 23A is a vertical cross-sectional view of a memory opening within the first exemplary structure after formation of drain-select-level isolation structures according to the first embodiment of the present disclosure.
FIG. 23B is a horizontal cross-sectional view of a region of the first exemplary structure along the plane B-B' of FIG. 23A. The vertical plane A-A' is the plane of the vertical cross-sectional view of FIG. 23A.
FIG. 23C is a horizontal cross-sectional view of a region of the first exemplary structure along the plane C-C' of FIG. 23A. The vertical plane A-A' is the plane of the vertical cross-sectional view of FIG. 23A.

Referring to FIGS. 23A-23C, an isotropic etch process can be performed to remove portions of the dielectric liner 320L from inside the memory openings 49 and the support openings 19. Each remaining portion of the dielectric liner 320L filling a respective one of the laterally-extending cavities 315 constitutes a drain-select-level isolation structure 320. Each drain-select-level isolation structure 320 includes a pair of lengthwise sidewalls that laterally extend along the first horizontal direction hd1. Each lengthwise sidewall includes a laterally alternating sequence of vertical straight segments and vertical concave segments. A pillar-shaped cavity 317' is formed in an upper portion of each memory opening 49 and each support opening 19.

Figure 24A:
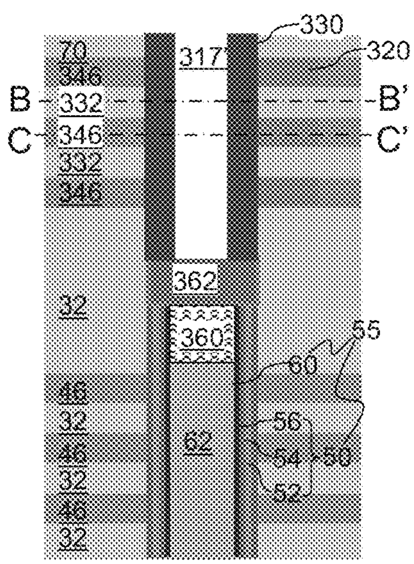
FIG. 24A is a vertical cross-sectional view of a memory opening within the first exemplary structure after formation of tubular gate electrodes according to the first embodiment of the present disclosure.
Figure 24B:
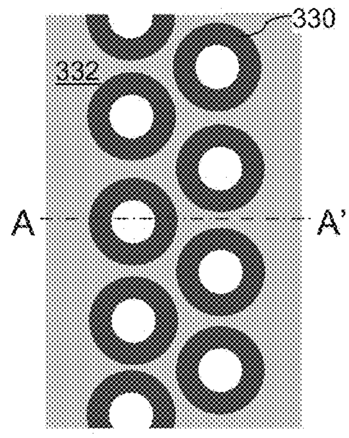
FIG. 24B is a horizontal cross-sectional view of a region of the first exemplary structure along the plane B-B' of FIG. 24A. The vertical plane A-A' is the plane of the vertical cross-sectional view of FIG. 24A.
Figure 24C:
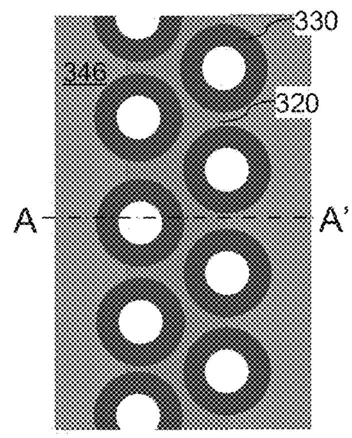
FIG. 24C is a horizontal cross-sectional view of a region of the first exemplary structure along the plane C-C' of FIG. 24A. The vertical plane A-A' is the plane of the vertical cross-sectional view of FIG. 24A.

Referring to FIGS. 24A-24C, a conductive material such as doped polysilicon can be conformally deposited in the pillar-shaped cavities 317' and over the insulating cap layer 70. The conductive material is anisotropically etched to form tubular conductive material portions, which constitute tubular gate electrodes 330. A void 317' is present inside each tubular gate electrode 330.

Figure 25A:
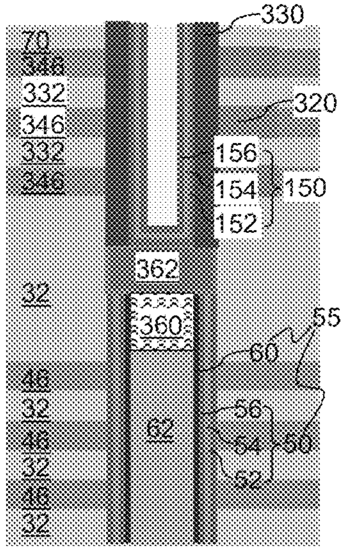
FIG. 25A is a vertical cross-sectional view of a memory opening within the first exemplary structure after formation of a drain-select-level gate dielectric layer according to the first embodiment of the present disclosure.

Referring to FIG. 25A, a drain-select-level gate dielectric layer 150 can be formed over the tubular gate electrodes 330. The drain-select-level gate dielectric layer 150 can include a layer stack of a first gate dielectric layer 152, a second gate dielectric layer 154, and a third gate dielectric layer 156. For example, the first gate dielectric layer 152 can include silicon oxide, the second gate dielectric layer 154 can include silicon nitride, and the third gate dielectric layer 156 can include silicon oxide.

Figure 25B:
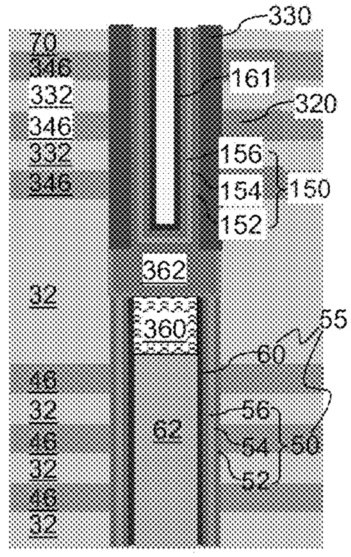
FIG. 25B is a vertical cross-sectional view of a memory opening within the first exemplary structure after formation of a first drain-select-level channel layer according to the first embodiment of the present disclosure.

Referring to FIG. 25B, a first drain-select-level channel layer 161 including a doped semiconductor material having a doping of the first conductivity type can be conformally deposited. The first drain-select-level channel layer 161 can include doped polysilicon.

Figure 25C:
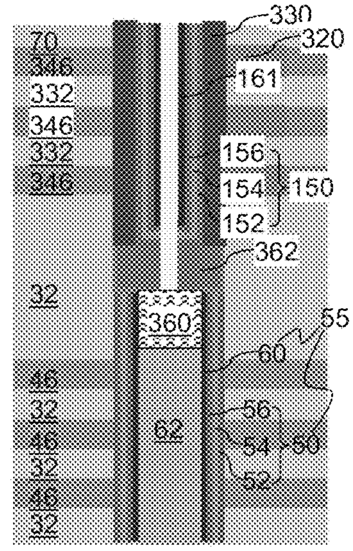
FIG. 25C is a vertical cross-sectional view of a memory opening within the first exemplary structure after formation of an opening extending to a connection channel portion according to the first embodiment of the present disclosure.

Referring to FIG. 25C, an anisotropic etch process is performed to remove horizontal portions of the first drain-select-level channel layer 161 and the drain-select-level gate dielectric layer 150, and a center portion of each semiconductor oxide plate 362 that is not covered by vertically-extending portions of the drain-select-level gate dielectric layer 150, the first drain-select-level channel layer 161, and the tubular gate electrodes 330. An opening extending to a top surface of a connection channel portion 360 is formed through each semiconductor oxide plate 362.

Figure 26A:
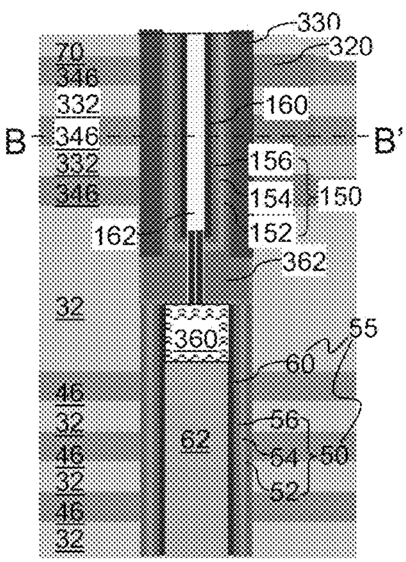
FIG. 26A is a vertical cross-sectional view of a memory opening within the first exemplary structure after formation of a second drain-select-level channel layer and a drain-select-level dielectric core according to the first embodiment of the present disclosure.
Figure 26B:
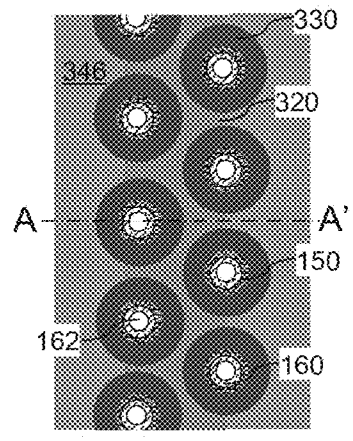
FIG. 26B is a horizontal cross-sectional view of a region of the first exemplary structure along the plane B-B' of FIG. 26A. The vertical plane A-A' is the plane of the vertical cross-sectional view of FIG. 26A.
Figure 27A:
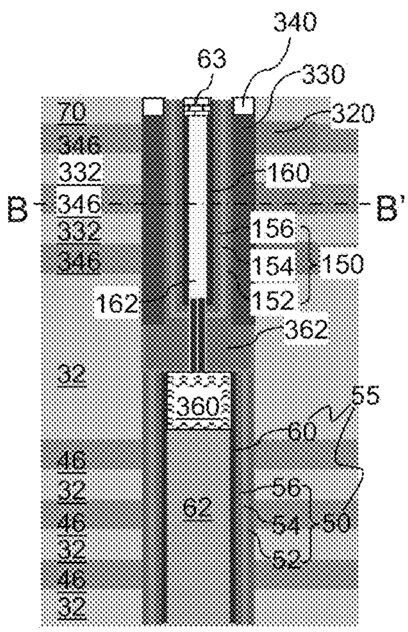
FIG. 27A is a vertical cross-sectional view of a memory opening within the first exemplary structure after formation of an annular dielectric spacer and a drain region according to the first embodiment of the present disclosure.
Figure 27B:
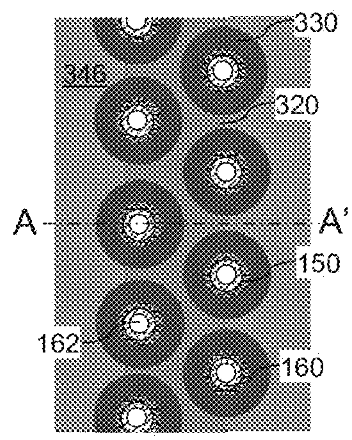
FIG. 27B is a horizontal cross-sectional view of a region of the first exemplary structure along the plane B-B' of FIG. 27A. The vertical plane A-A' is the plane of the vertical cross-sectional view of FIG. 27A.
Figure 28A:
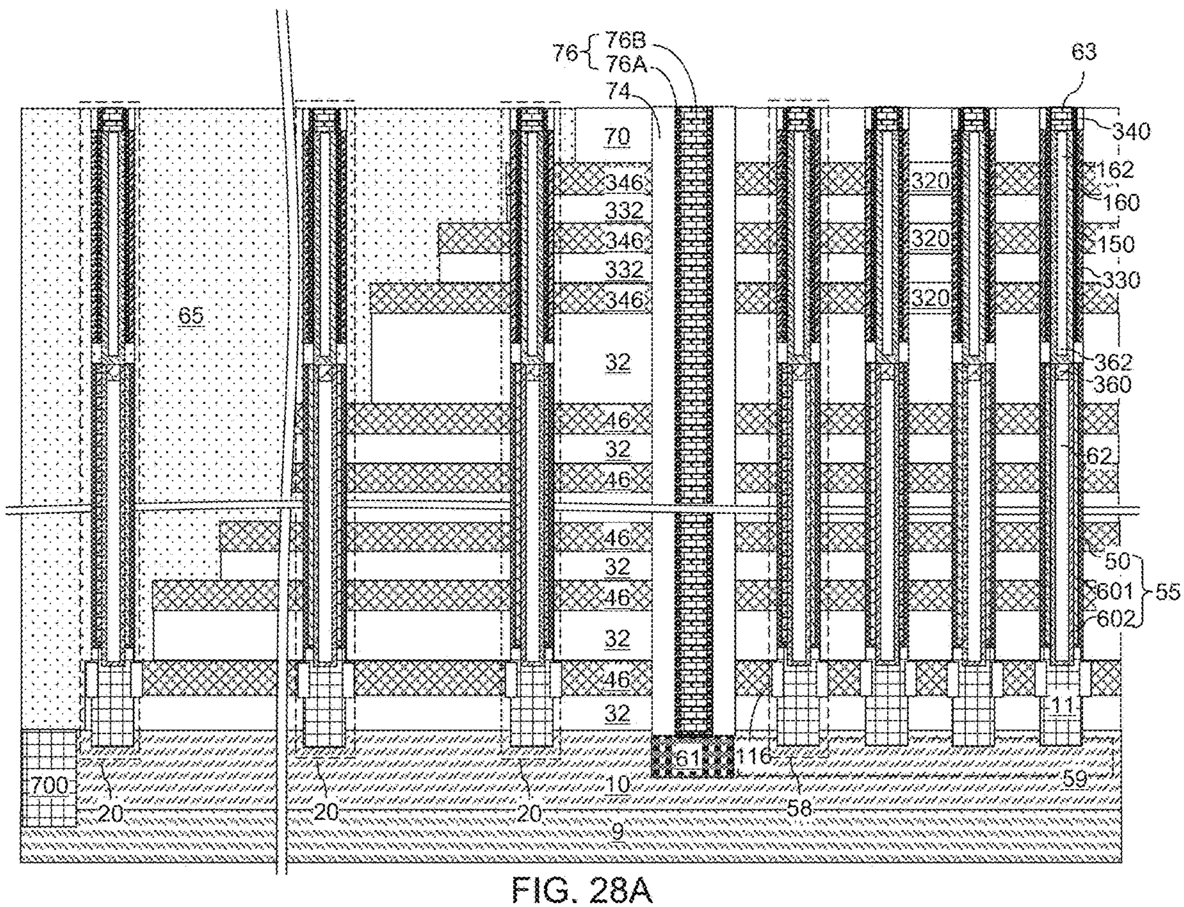
FIG. 28A is a schematic vertical cross-sectional view of the first exemplary structure after the processing steps of FIGS. 27A and 27B.
Figure 28B:
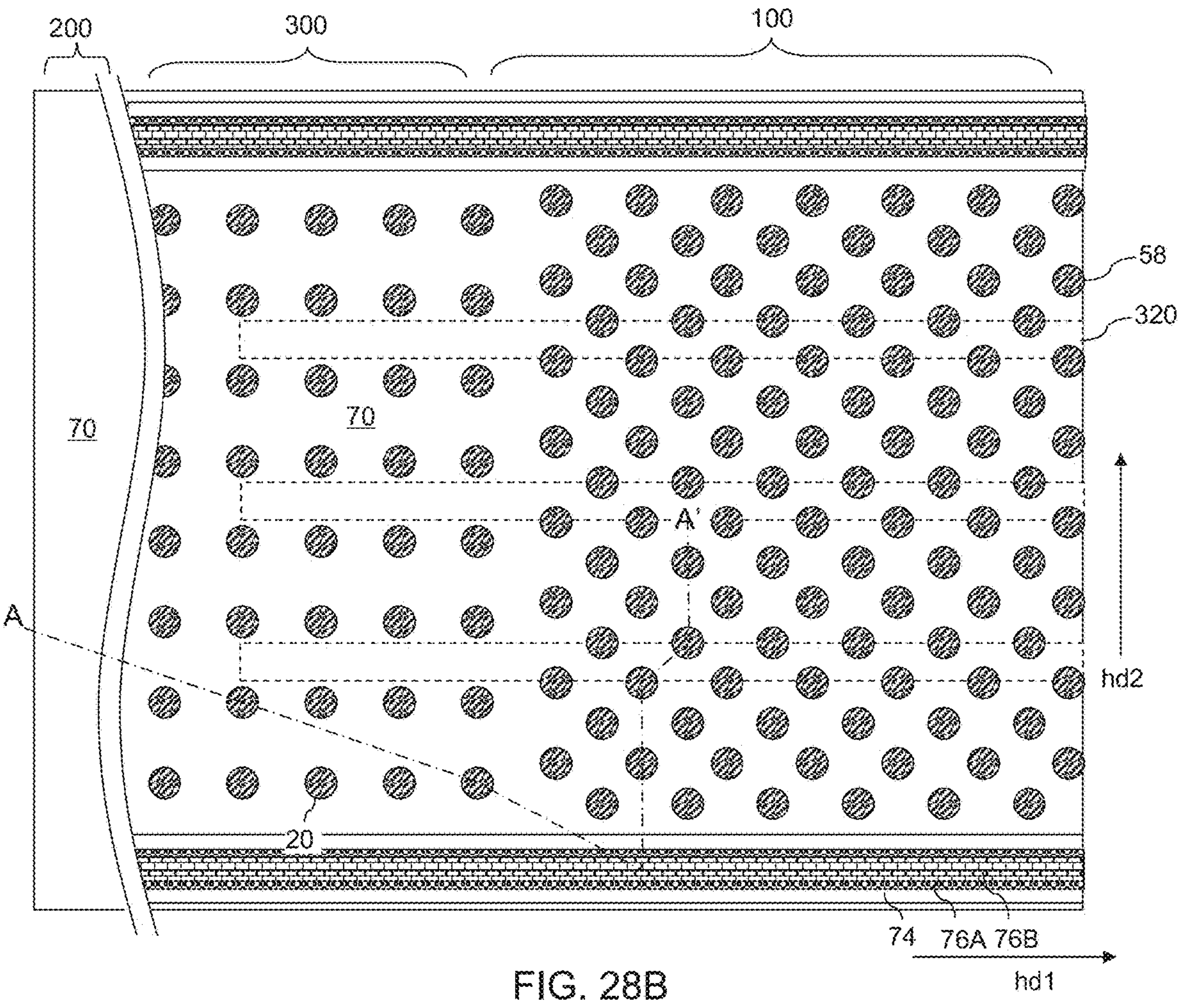
FIG. 28B is a top-down view of the first exemplary structure of FIG. 27A. The vertical plane A-A' is the plane of the schematic vertical cross-sectional view of FIG. 27A.

Referring to FIGS. 26A and 26B, a second drain-select-level channel layer is deposited conformally on each connection channel portion 360 and each remaining portion of the first drain-select-level channel layer, and fills the openings through the semiconductor oxide plates 362. A dielectric material such as borosilicate glass or phosphosilicate glass can be deposited in remaining voids in the memory openings 49 and the support openings 19. Excess portions of the dielectric material and the second drain-select-level channel layer can be removed from above the horizontal plane including the top surface of the insulating cap layer 70 by a planarization process such as a recess etch process and/or chemical mechanical planarization process. Each contiguous combination of remaining portions of the first drain-select-level channel layer 161 and the second drain-select-level channel layer constitutes a drain-select-level channel 160. Each remaining portion of the dielectric material constitutes a drain-select-level dielectric core 162.

Referring to FIGS. 27A, 27B, 28A, and 28B, an upper end portion of each tubular gate electrode 330 can be vertically recessed selective to the insulating cap layer 70 and the drain-select-level dielectric cores 162 by a recess etch. A dielectric material such as silicon nitride or undoped silicate glass can be deposited in the recessed volumes to form annular dielectric caps 340. An upper portion of each drain-select-level dielectric core 162 can be vertically recessed to form cylindrical recesses. A doped semiconductor material having a doping of a second conductivity type is deposited in the cylindrical recesses to form drain regions 63. The second conductivity type is the opposite of the first conductivity type. For example, if the first conductivity type is p-type, the second conductivity type is n-type, and vice versa.

The set of all material portions within each memory opening 49 after formation of the drain region 63 is herein referred to as a memory opening fill structure 58. The set of all material portions within each support opening 19 after formation of drain regions is herein referred to as a support pillar structure. A first subset of the memory opening fill structures 58 can be arranged in rows that laterally extend along the first horizontal direction, and contacts the drain-select-level isolation structures 320. Each drain-select-level isolation structure 320 contacts a pair of rows of memory opening fill structures 58.

At least two rows (such as three rows, four rows, etc.) of memory opening fill structures 58 can be provided between a laterally neighboring pair of drain-select-level isolation structures 320. More than two rows of memory opening fill structures 58 can be provided between each laterally neighboring pair of drain-select-level isolation structures 320.

Figure 29:
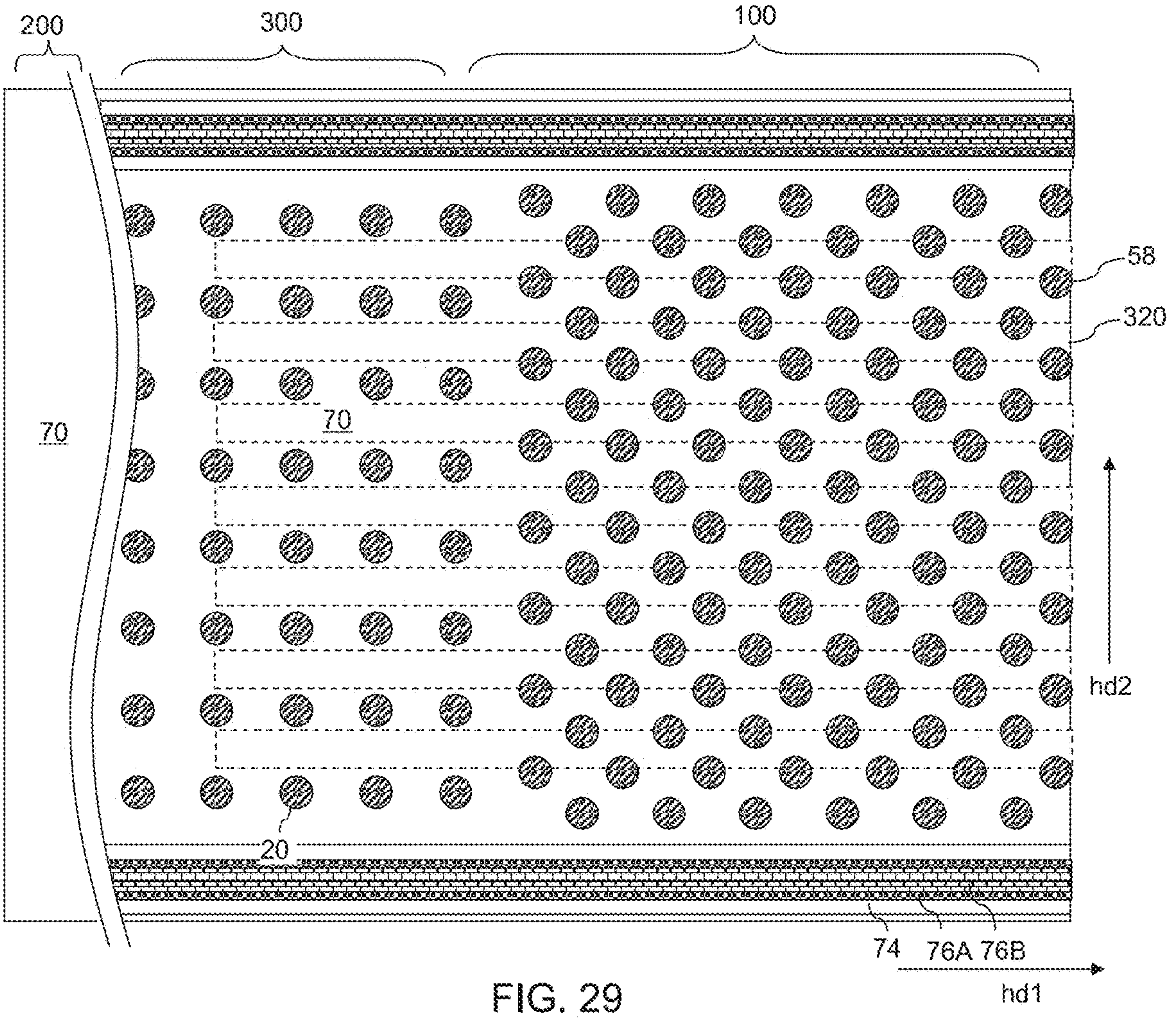
FIG. 29 is a top-down view of an alternative configuration for the first exemplary structure of FIGS. 28A and 28B according to the first embodiment of the present disclosure.

FIG. 29 illustrates an alternative layout for the drain-select-level isolation structures 320 for an alternative configuration in which each strip of drain-select-level electrically conductive layers 346 that are laterally spaced apart by the drain-select-level isolation structures 320 contacts, and controls, two rows of memory opening fill structures 58.

Figure 30A:
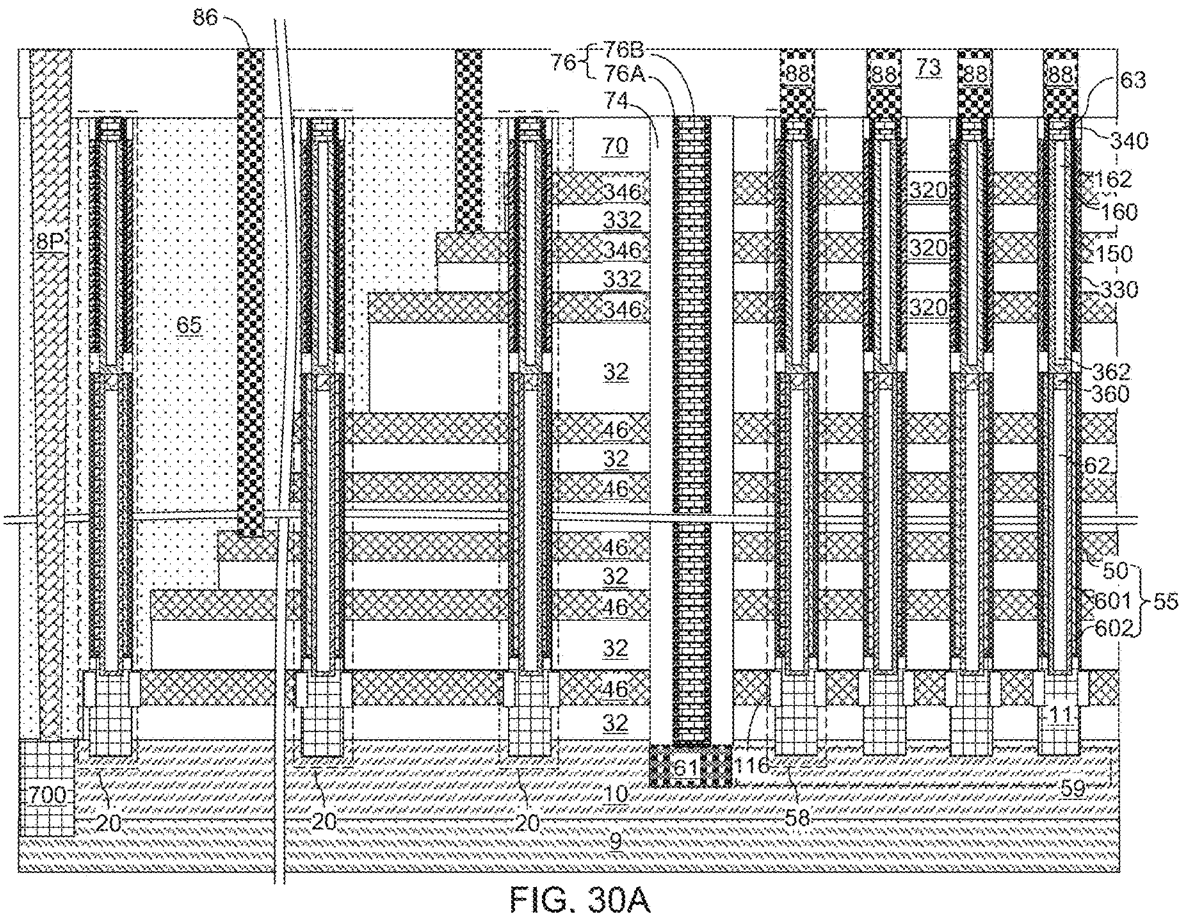
FIG. 30A is a schematic vertical cross-sectional view of the first exemplary structure after formation of a contact level dielectric layer and additional contact via structures according to the first embodiment of the present disclosure.
Figure 30B:
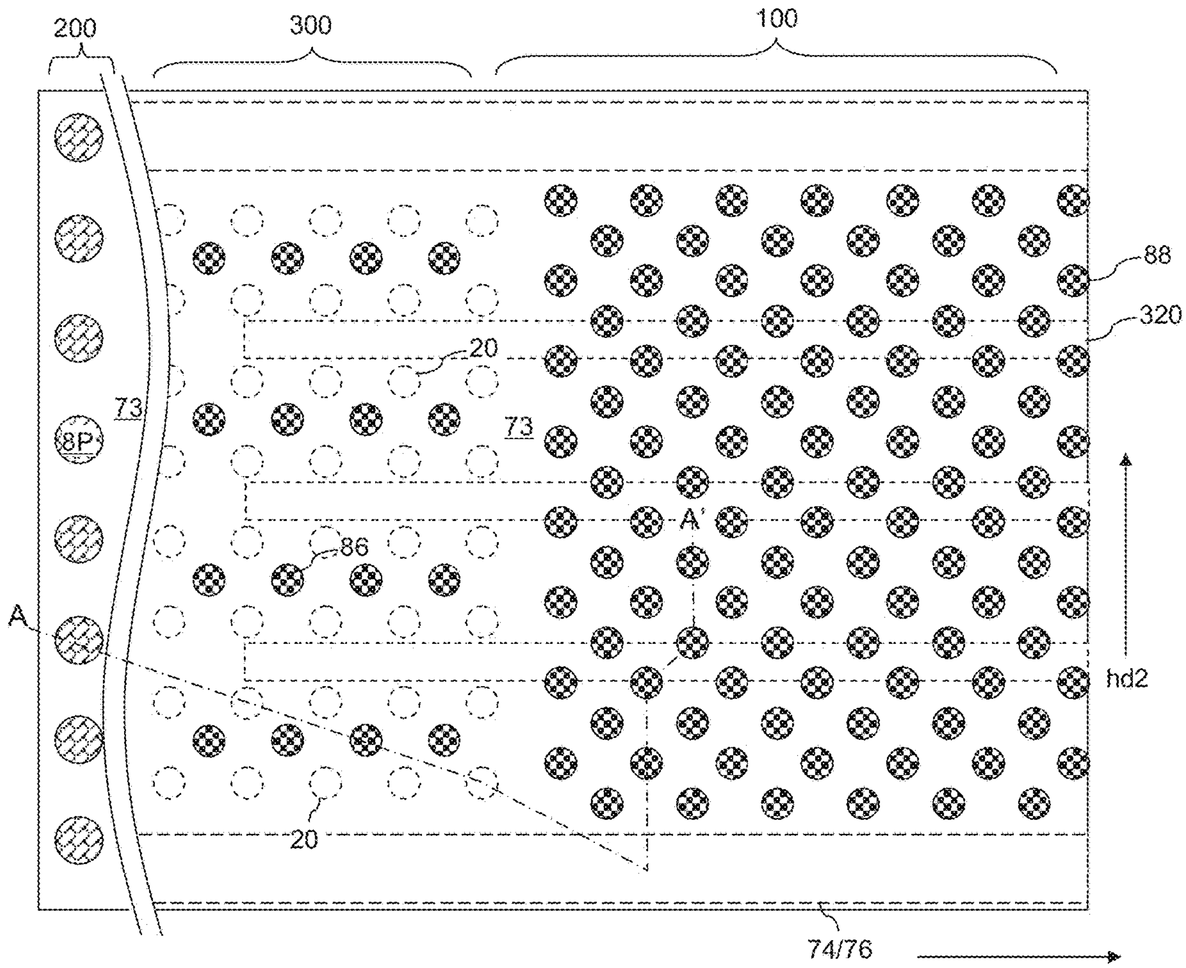
FIG. 30B is a top-down view of the first exemplary structure of FIG. 30A. The vertical plane A-A' is the plane of the schematic vertical cross-sectional view of FIG. 30A.

Referring to FIGS. 30A and 30B, a contact level dielectric layer 73 can be formed over the insulating cap layer 70 and the retro-stepped dielectric material portion 65. Contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers (46, 346) through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 31:
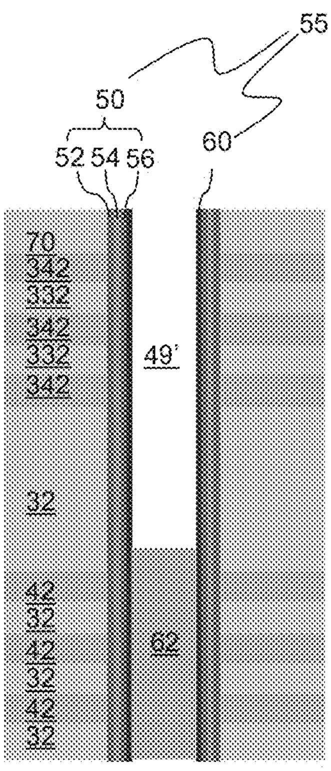
FIG. 31 is a schematic vertical cross-sectional view of a region of a second exemplary structure after formation of a dielectric core within a memory opening according to a second embodiment of the present disclosure.

Referring to FIG. 31, a region of a second exemplary structure is illustrated, which can be the same as the first exemplary structure at the processing steps of FIG. 6B. A memory opening 49 of the second exemplary structure is illustrated after formation of a dielectric core 62 therein. A memory cavity 49' is present over the dielectric core 62. Each vertical semiconductor channel 60 can vertically extend thorough the layers of the alternating stack (32, 42, 332, 332, 70), and can contact a respective sidewall of the insulating cap layer 70. A combination of a memory film 50 and a vertical semiconductor channel 60 within each memory opening 49 constitutes a memory stack structure 55 configured to store electrical charges within a vertical stack of memory elements therein. The vertical stack of memory elements can include portions of the charge storage layers located at each level of the sacrificial material layers (42, 342). A memory cavity 49' is present within an upper portion of each memory opening 49.

Figure 32A:
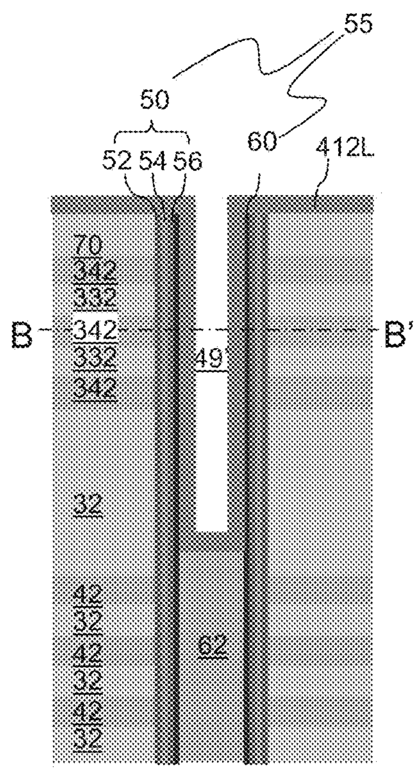
FIG. 32A is a vertical cross-sectional view of a memory opening within the second exemplary structure after formation of a continuous dielectric liner according to the second embodiment of the present disclosure.
Figure 32B:
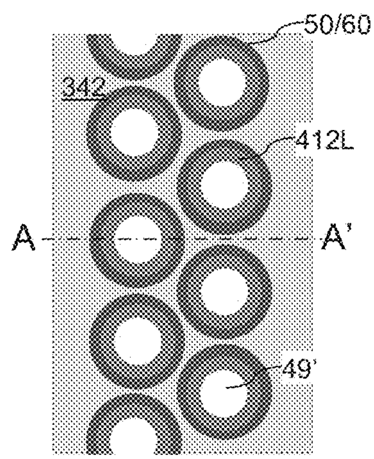
FIG. 32B is a horizontal cross-sectional view of a region of the second exemplary structure along the plane B-B' of FIG. 32A. The vertical plane A-A' is the plane of the vertical cross-sectional view of FIG. 32A.

Referring to FIGS. 32A and 32B, a continuous dielectric liner 412L including a dielectric material such as a doped silicate glass is deposited at peripheral regions of each memory cavity 49' in the memory openings 49. The doped silicate glass can include a dielectric material having a greater etch rate in hydrofluoric acid than undoped silicate glass. For example, the doped silicate glass can include borosilicate glass or phosphosilicate glass.

Figure 33A:
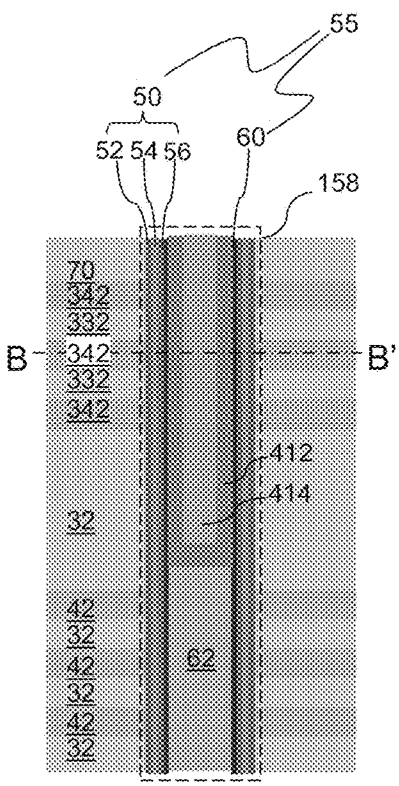
FIG. 33A is a vertical cross-sectional view of a memory opening within the second exemplary structure after formation of a semiconductor fill material portion according to the second embodiment of the present disclosure.
Figure 33B:
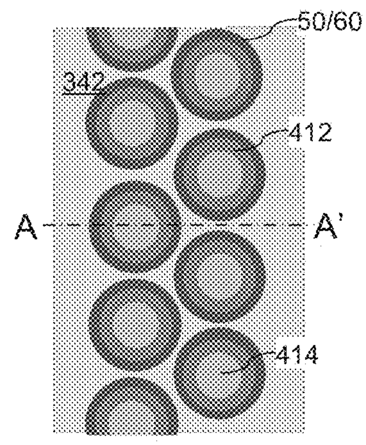
FIG. 33B is a horizontal cross-sectional view of a region of the second exemplary structure along the plane B-B' of FIG. 33A. The vertical plane A-A' is the plane of the vertical cross-sectional view of FIG. 33A.

Referring to FIGS. 33A and 33B, a semiconductor fill material is deposited within each unfilled volume in the memory openings 49 and in the support openings 19. The semiconductor fill material includes a material that can be removed selective to the materials of the insulating cap layer 70 and the continuous dielectric liner 412L. For example, the semiconductor fill material can include amorphous silicon or polysilicon. Portions of the semiconductor fill material and the continuous dielectric liner 412L located above the horizontal plane including the top surface of the insulating cap layer 70 can be removed by a planarization process. Each remaining portion of the semiconductor fill material is herein referred to as a semiconductor fill material portion 414. Each remaining portion of the continuous dielectric liner 412L in the memory openings 49 and the support openings 19 constitutes a dielectric liner 412. Each dielectric liner 412 includes a tubular portion and bottom cap portion adjoined to the tubular portion. A vertical stack of a dielectric core 62 and a semiconductor fill material portion 414 is formed within each volume that is laterally surrounded by a respective one of the memory stack structures 55. A set of all material portions located within a memory opening 49 is herein referred to as an in-process memory opening fill structure 158. A set of all material portions located within a support opening 49 is herein referred to as an in-process support pillar structure.

Figure 34A:
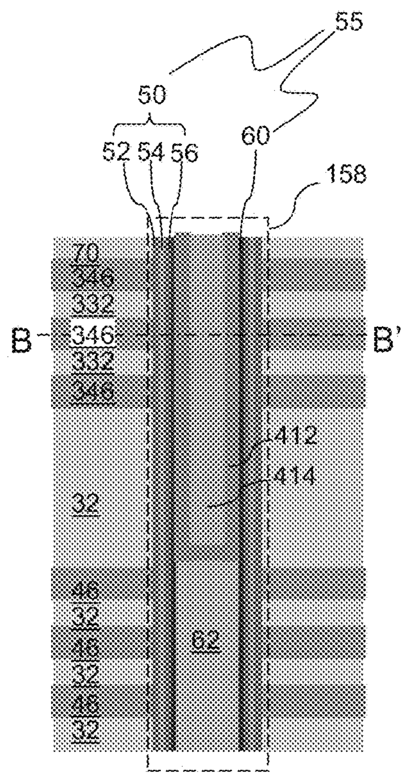
FIG. 34A is a vertical cross-sectional view of a memory opening within the second exemplary structure after replacement of the sacrificial material layers with electrically conductive layers according to the second embodiment of the present disclosure.
Figure 34B:
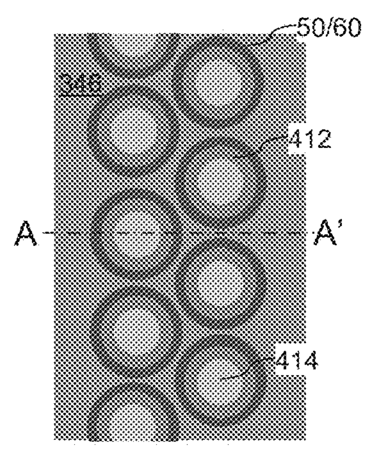
FIG. 34B is a horizontal cross-sectional view of a region of the second exemplary structure along the plane B-B' of FIG. 34A. The vertical plane A-A' is the plane of the vertical cross-sectional view of FIG. 34A.
Figure 35A:
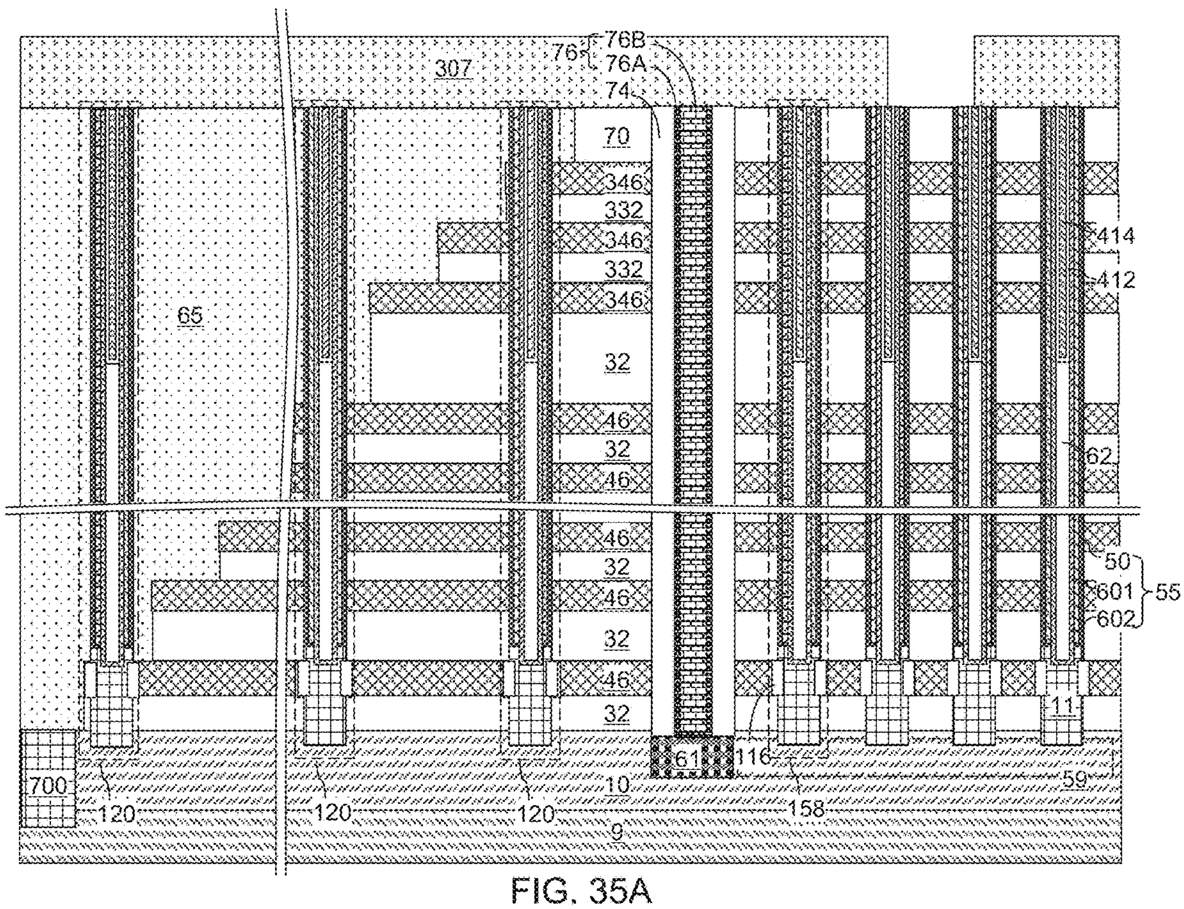
FIG. 35A is a schematic vertical cross-sectional view of the second exemplary structure after formation of a patterned etch mask layer according to the second embodiment of the present disclosure.
Figure 35B:
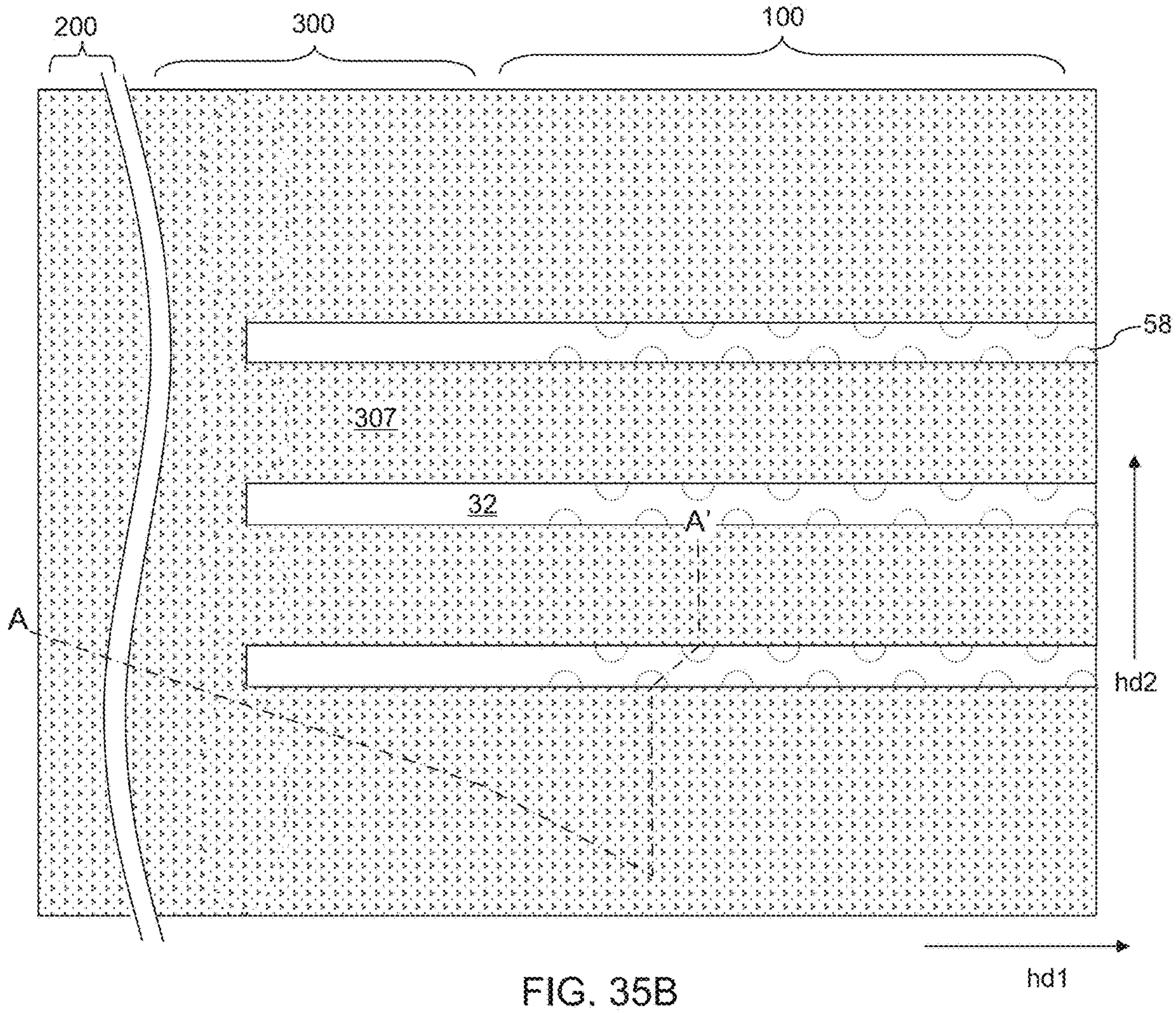
FIG. 35B is a partial see-through top-down view of the second exemplary structure of FIG. 35A. The vertical plane A-A' is the plane of the schematic vertical cross-sectional view of FIG. 35A.
Figure 36A:
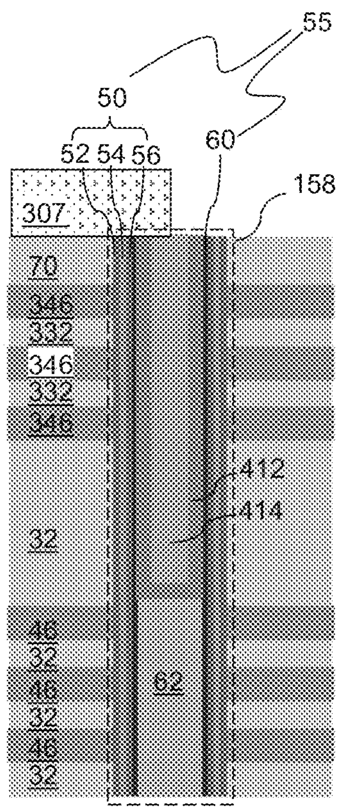
FIG. 36A is a vertical cross-sectional view of a memory opening within the second exemplary structure at the processing steps of FIGS. 35A and 35B.
Figure 36B:
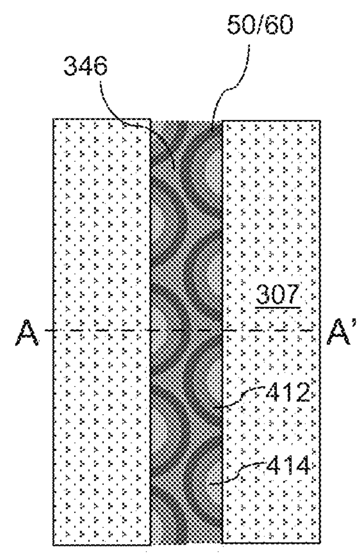
FIG. 36B is a horizontal cross-sectional view of a region of the second exemplary structure along the plane B-B' of FIG. 36A. The vertical plane A-A' is the plane of the vertical cross-sectional view of FIG. 36A.

Referring to FIGS. 34A and 34B, the processing steps of FIGS. 9A and 9B, 10, 11A-11D, 12, 13, 14A and 14B, and 15 can be sequentially performed to form a sacrificial planarization stopper layer 373, backside trenches 79, backside recesses (43, 343), electrically conductive layers (46, 346), source regions 61, horizontal semiconductor channels 59, insulating spacers 74, and backside contact structures 76, and to remove the sacrificial planarization stopper layer 373.

Referring to FIGS. 35A, 35B, 36A, and 36B, a patterned etch mask layer 307 can be formed over the insulating cap layer 70, the retro-stepped dielectric material portion 65, the in-process memory opening fill structures 158, and the in-process support pillar structures 120. The patterned etch mask layer 307 can be a lithographically patterned photoresist layer. The patterned etch mask layer 307 can include elongated openings (such as rectangular openings) that laterally extend along the first horizontal direction hd1. Each elongated opening in the patterned etch mask layer 307 partially overlies a neighboring pair of rows of in-process memory opening fill structures 158. In one embodiment, each elongated opening in the patterned etch mask layer 307 can include a pair of straight edges. Each of the straight edges of an elongated opening can overlie two neighboring rows of memory openings 49 that are filled in-process memory opening fill structures 158.

Figure 37A:
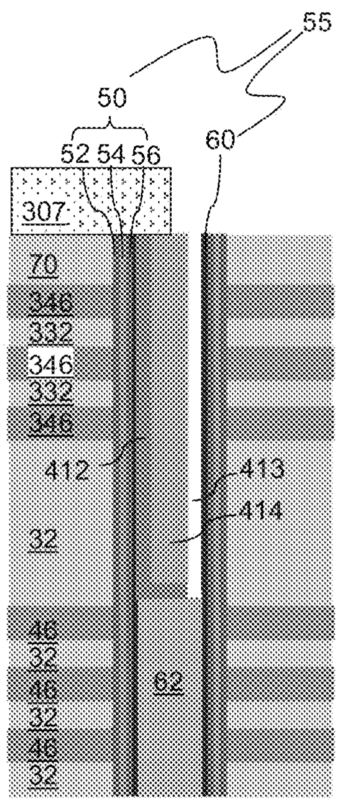
FIG. 37A is a vertical cross-sectional view of a memory opening within the second exemplary structure after removal of unmasked portions of dielectric liners according to the second embodiment of the present disclosure.
Figure 37B:
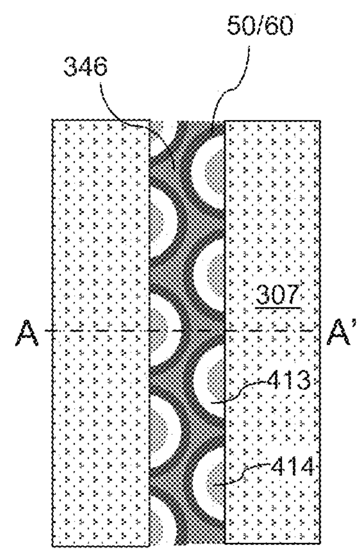
FIG. 37B is a horizontal cross-sectional view of a region of the second exemplary structure along the plane B-B' of FIG. 37A. The vertical plane A-A' is the plane of the vertical cross-sectional view of FIG. 37A.

Referring to FIGS. 37A and 37B, an anisotropic etch process is performed to remove unmasked portions of the dielectric liners 412 within the areas of the elongated openings in the patterned etch mask layer 307. The anisotropic etch process can be selective to the materials of the insulating cap layer 70 and the semiconductor fill material portions 414. In one embodiment, the dielectric liners 412 can include a doped silicate glass such as borosilicate glass or organosilicate glass, or amorphous carbon, the insulating cap layer 70 can include undoped silicate glass, and the semiconductor fill material portions 414 can include amorphous silicon or polysilicon. Discrete corner cavities 413 are formed in volumes from which portions of the dielectric liners 412 are removed. A peripheral portion of a top surface of an underlying dielectric core 62 can be physically exposed at the bottom of each discrete corner cavity 413.

Figure 38A:
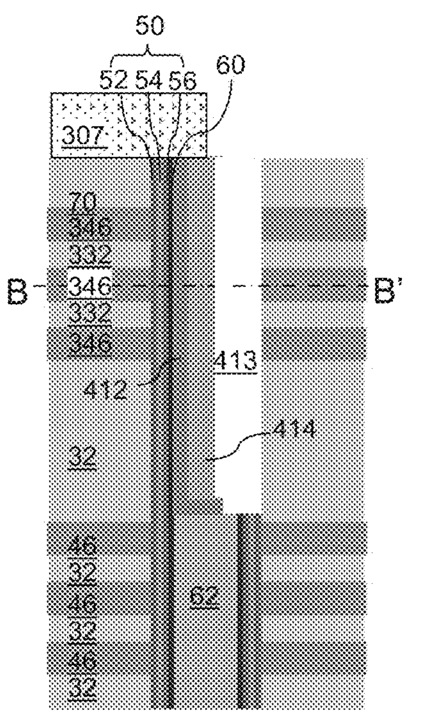
FIG. 38A is a vertical cross-sectional view of a memory opening within the second exemplary structure after etching portions of the vertical semiconductor channels and the memory films that underlie openings in the patterned etch mask layer and formation of discrete corner cavities according to the second embodiment of the present disclosure.
Figure 38B:
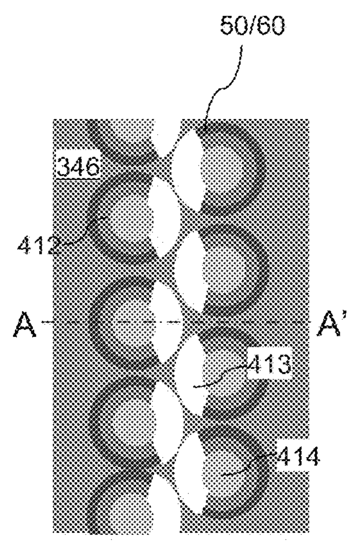
FIG. 38B is a horizontal cross-sectional view of a region of the second exemplary structure along the plane B-B' of FIG. 38A. The vertical plane A-A' is the plane of the vertical cross-sectional view of FIG. 38A.

Referring to FIGS. 38A and 38B, portions of the vertical semiconductor channels 60 that underlie the elongated openings in the patterned etch mask layer 307 are etched by an isotropic etch process around the discrete corner cavities 413. The discrete corner cavities 413 are expanded to incorporate the volumes from which the vertical semiconductor channels 60 are removed. Portions of the memory films 50 adjacent to the discrete corner cavities 413 can be removed, for example, using a sequence of isotropic etch processes. In one embodiment, the sequence of isotropic etch processes can include a sequence of wet etch processes that etch the materials of the tunneling dielectric layer 56, the charge storage layer 54, and the blocking dielectric layer 52. The volumes of the discrete corner cavities 413 are expanded upon removal of the physically exposed portions of the memory films 50. Thus, the discrete corner cavities 413 are formed by removing an upper corner portion of each memory stack structure 55 within the memory openings 49 using at least one etch process. A subset of the discrete corner cavities 413 is formed within the two neighboring rows of memory openings 49 underneath each elongated opening in the patterned etch mask layer 307. The patterned etch mask layer 307 can be removed, for example, by ashing.

Figure 39A:
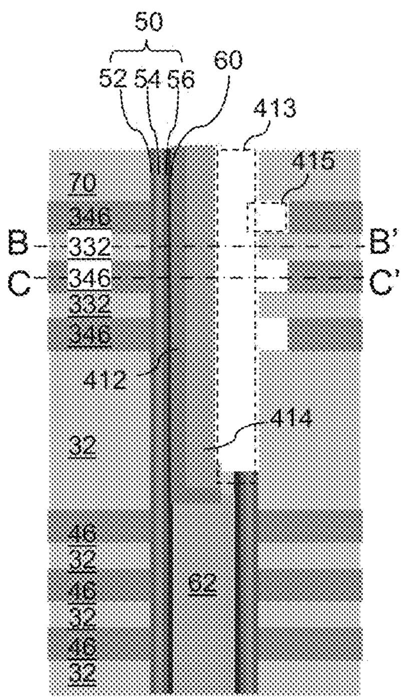
FIG. 39A is a vertical cross-sectional view of a memory opening within the second exemplary structure after formation of laterally-extending cavities according to the second embodiment of the present disclosure.
Figure 39B:
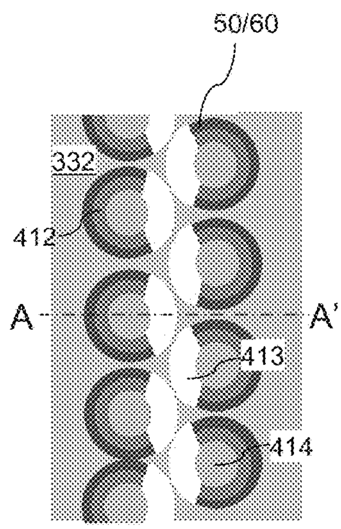
FIG. 39B is a horizontal cross-sectional view of a region of the second exemplary structure along the plane B-B' of FIG. 39A. The vertical plane A-A' is the plane of the vertical cross-sectional view of FIG. 39A.
Figure 39C:
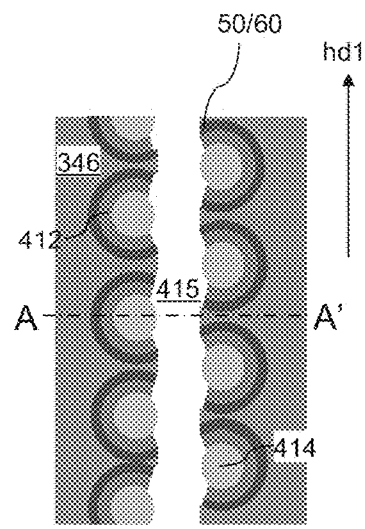
FIG. 39C is a horizontal cross-sectional view of a region of the second exemplary structure along the plane C-C' of FIG. 39A. The vertical plane A-A' is the plane of the vertical cross-sectional view of FIG. 39A.

Referring to FIGS. 39A-39C, an isotropic etch process that uses an isotropic etchant that etches a material of the electrically conductive layers (46, 346) selective to a material of the insulating layers (32, 332, 70) is performed to laterally recess the portions of the electrically conductive layers (46, 346) from the discrete corner cavities 413. The isotropic etchant etches the material(s) of the drain-select-level electrically conductive layers 346 selective to the materials of the insulating cap layer 70, the insulating layers (32, 332), the memory films 50, the dielectric cores 62, and the semiconductor fill material portions 414 can be introduced into the discrete corner cavities 413. Physically exposed sidewalls of the drain-select-level electrically conductive layers 346 can be laterally recessed in an isotropic etch process using the isotropic etchant.

At least one laterally-extending cavity 415 is formed by laterally recessing portions of the at least one drain-select-level electrically conductive layer 346 from the discrete corner cavities 413. If multiple drain-select-level electrically conductive layers 346 are present, a plurality of laterally-extending cavities 415 can be formed by laterally recessing portions of the drain-select-level electrically conductive layers 346 from the discrete corner cavities 413. The lateral recess distance of the isotropic etch process is greater than one half of the minimum separation distance between the memory openings 49.

A laterally-extending cavity 415 that laterally extends along the first horizontal direction hd1 can be formed at each level of the drain-select-level electrically conductive layers 346 within each area of the elongated opening in the patterned etch mask layer 307. At least one laterally-extending cavity 415 laterally connects two neighboring rows of memory openings 49. In one embodiment, a vertical stack of a plurality of laterally-extending cavities 415 laterally connects two neighboring rows of memory openings 49. Each of the at least one laterally-extending cavity 415 connects the discrete corner cavities 413 within the two rows of memory openings 49 to provide a continuous cavity.

The continuous cavity is herein referred to as an integrated cavity (413, 415), and includes all volumes of the discrete corner cavities 413 in the two rows of memory openings 49 and the at least one laterally-extending cavity 415. Each drain-select-level electrically conductive layer 346 can be divided into multiple strips with a cut at the location of each elongated opening in the patterned etch mask layer 307. The patterned etch mask layer 307 can be removed after, or prior to, the isotropic etch process.

Figures 40A, 40B, 40C:
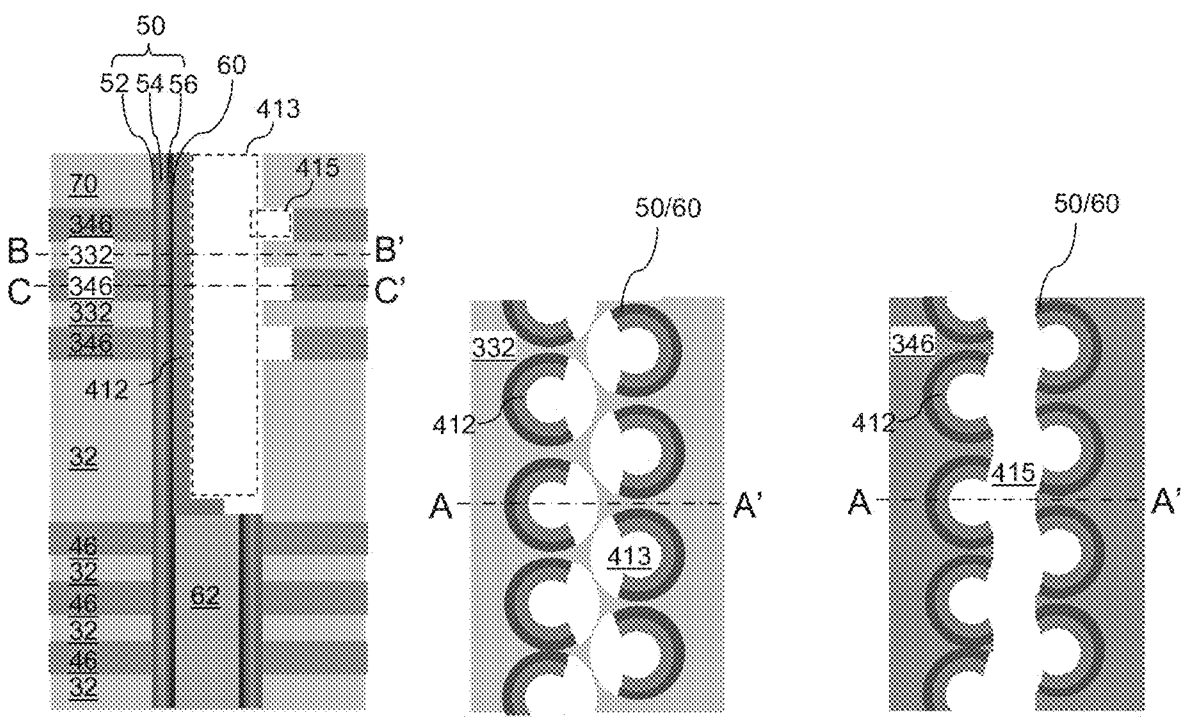
FIG. 40A is a vertical cross-sectional view of a memory opening within the second exemplary structure after removal of remaining portions of the semiconductor fill material portions according to the second embodiment of the present disclosure.
FIG. 40B is a horizontal cross-sectional view of a region of the second exemplary structure along the plane B-B' of FIG. 40A. The vertical plane A-A' is the plane of the vertical cross-sectional view of FIG. 40A.
FIG. 40C is a horizontal cross-sectional view of a region of the second exemplary structure along the plane C-C' of FIG. 40A. The vertical plane A-A' is the plane of the vertical cross-sectional view of FIG. 40A.

Referring to FIGS. 40A-40C, remaining portions of the semiconductor fill material portions 414 can be removed selective to the drain-select-level electrically conductive layers 346, the insulating layers (32, 332, 70), dielectric cores 62, and the dielectric liners 412. For example, if the semiconductor fill material portions 414 include a semiconductor material (such as amorphous silicon or polysilicon), the semiconductor fill material portions 414 can be removed using a wet etch process using hot trimethyl-2 hydroxyethyl ammonium hydroxide ("hot TMY") or tetramethyl ammonium hydroxide (TMAH).

Figures 41A, 41B, 41C:
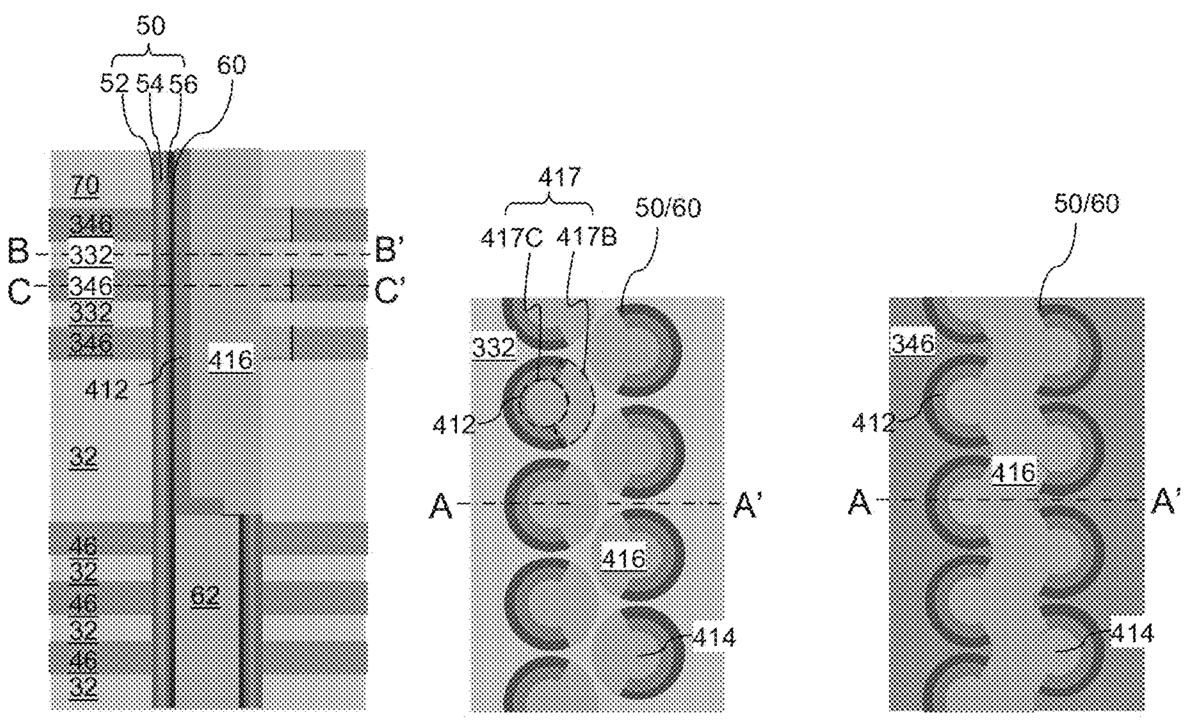
FIG. 41A is a vertical cross-sectional view of a memory opening within the second exemplary structure after formation of multi-pillared drain-select-level isolation structures according to the second embodiment of the present disclosure.
FIG. 41B is a horizontal cross-sectional view of a region of the second exemplary structure along the plane B-B' of FIG. 41A. The vertical plane A-A' is the plane of the vertical cross-sectional view of FIG. 41A.
FIG. 41C is a horizontal cross-sectional view of a region of the second exemplary structure along the plane C-C' of FIG. 41A. The vertical plane A-A' is the plane of the vertical cross-sectional view of FIG. 41A.

Referring to FIGS. 41A-41C, a dielectric material such as a doped silicate glass (such as borosilicate glass or phosphosilicate glass) or organosilicate glass can be deposited in the volumes of the integrated cavities (413, 415) using a conformal deposition process. Excess portions of the dielectric material can be removed from above the horizontal plane including the top surface of the insulating cap layer 70. Each continuous remaining portion of the dielectric material filling a respective integrated cavity (413, 415) constitutes a multi-pillared drain-select-level isolation structure 416. Each multi-pillared drain-select-level isolation structure 416 is formed by depositing a dielectric material in volumes of the at least one laterally-extending cavity 415 and in the discrete corner cavities 413.

Each multi-pillared drain-select-level isolation structure 416 includes a plurality of dielectric pillar portions 417 that fills a volume of a respective one of the discrete corner cavities 413 and at least one horizontally-extending portion adjoining each of the plurality of dielectric pillar portions 417, filling a volume of a respective one of the at least one laterally-extending cavity 415, located between a vertically neighboring pair of insulating layers (such as a vertically neighboring par of drain-select-level insulating layers 332, a drain-select-level insulating layer 332 and an insulating cap layer 70, or a drain-select-level insulating layer 332 and a topmost word-line-level insulating layer 32) within the alternating stack (32, 46, 332, 346, 70), and laterally separating remaining portions of at least one electrically conductive layer (such as the at least one drain-select-level electrically conductive layer 346) within the alternating stack (32, 46, 332, 346, 70).

The multi-pillared drain-select-level isolation structures 416 fill volumes formed by removal of the semiconductor fill material portions 414. In one embodiment, each multi-pillared drain-select-level isolation structure 416 can include a plurality of horizontally-extending portions that laterally extend along the first horizontal direction hd1 and contact a top surface of an underlying one of the insulating layers (332 or 32) within the alternating stack (32, 332, 70), and contact a bottom surface of an overlying one of the insulating layers (332 or 70) within the alternating stack (32, 332, 70).

In one embodiment, each of the memory openings 49 with the two rows of memory openings 49 includes one of the plurality of dielectric pillar portions 417 and one of the memory opening fill structures 58. In one embodiment, each of the plurality of dielectric pillar portions 417 comprises: a cylindrical dielectric pillar portion 417C centered at a vertical axis passing through a geometrical center of a respective one of the memory openings 49 and azimuthally extending around the vertical axis by 360 degrees; and a block arc pillar portion 417B centered at the vertical axis, adjoined to one side of the cylindrical dielectric pillar portion 417C, and azimuthally extends around the vertical axis by an angle in a range from 30 degrees to 270 degrees.

Figure 42A:
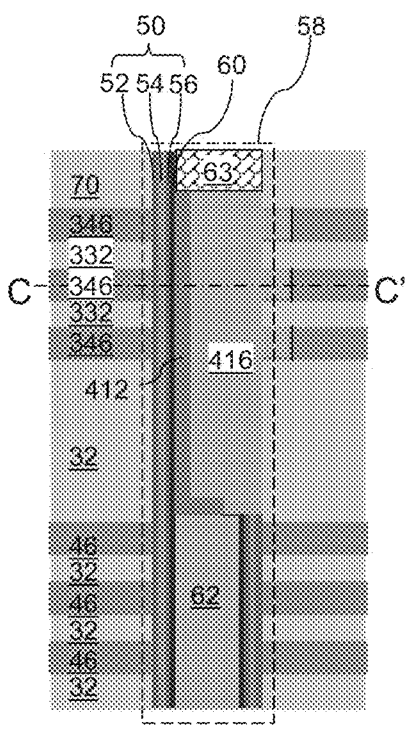
FIG. 42A is a vertical cross-sectional view of a memory opening within the second exemplary structure after formation of drain regions according to the second embodiment of the present disclosure.
Figure 42B:
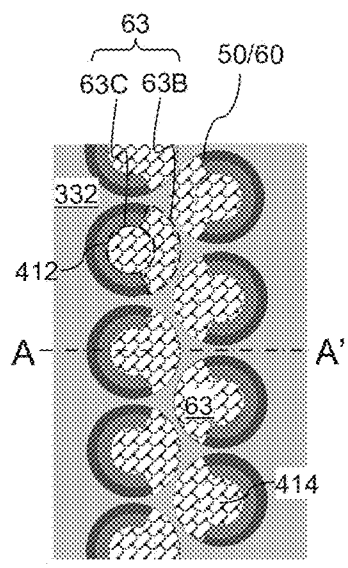
FIG. 42B is a top-down view of a region of the second exemplary structure along the plane B-B' of FIG. 42A. The vertical plane A-A' is the plane of the vertical cross-sectional view of FIG. 42A.
Figure 42C:
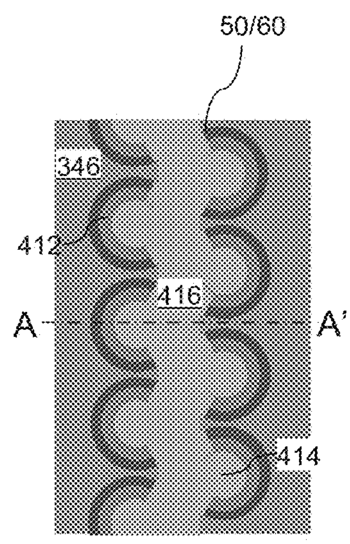
FIG. 42C is a horizontal cross-sectional view of a region of the second exemplary structure along the plane C-C' of FIG. 42A. The vertical plane A-A' is the plane of the vertical cross-sectional view of FIG. 42A.

Referring to FIGS. 42A-42C, upper portions of the multi-pillared drain-select-level isolation structures 416 located in the memory openings 49 can be vertically recessed to form drain cavities. A doped semiconductor material having a doping of the second conductivity type is deposited in the drain cavities to form drain regions 63. Each drain region 63 can include a cylindrical drain segment 63C having a cylindrical shape and a block arc drain segment 63B that vertically extends with a uniform horizontal cross-sectional shape of a block arc, i.e., a shape of a segment of an annulus with a limited range of the azimuthal angle.

The set of all material portions within each memory opening 49 after formation of the drain region 63 is herein referred to as a memory opening fill structure 58. The set of all material portions within each support opening 19 after formation of drain regions is herein referred to as a support pillar structure. A first subset of the memory opening fill structures 58 can be arranged in rows that laterally extend along the first horizontal direction hd1, and contacts a multi-pillared drain-select-level isolation structure 416. Each multi-pillared drain-select-level isolation structure 416 contacts a pair of rows of memory opening fill structures 58.

At least two rows (such as three rows, four rows, etc.) of memory opening fill structures 58 can be provided between a laterally neighboring pair of multi-pillared drain-select-level isolation structures 416. More than two rows of memory opening fill structures 58 can be provided between each laterally neighboring pair of drain-select-level isolation structures 320.

Figure 43:
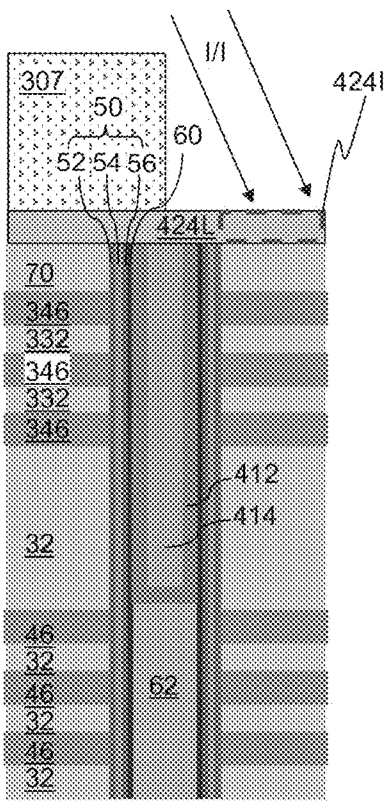
FIG. 43 is a vertical cross-sectional view of a memory opening within an alternative configuration of the second exemplary structure after deposition of a sacrificial semiconductor material layer and an ion implantation process according to the second embodiment of the present disclosure.

Referring to FIG. 43, a region including a memory opening 49 in an alternative configuration of the second exemplary structure is illustrated. The alternative configuration of the second exemplary structure can be derived from the second exemplary structure of FIGS. 34A and 34B by depositing a sacrificial semiconductor material layer 424L, forming a patterned etch mask layer 307 having the same pattern as the patterned etch mask layer 307 of FIGS. 35A, 35B, 36A, and 36B, and implanting electrical dopants into physically exposed portions of the sacrificial semiconductor material layer 424L that are laterally spaced from the straight edges of the patterned etch mask layer 307. The sacrificial semiconductor material layer 424L can be deposited as an undoped semiconductor material layer such as an undoped amorphous silicon layer or an undoped polysilicon layer. The electrical dopants used in the ion implantation process may be p-type dopants such as B or n-type dopants such as P, As, or Sb. A tilt angle of the ion implantation process can be selected such that implanted portions 4241 of the sacrificial semiconductor material layer 424L does not cover portions of the dielectric liners 412 within the areas of the elongated openings in the patterned etch mask layer 307.

Figure 44:
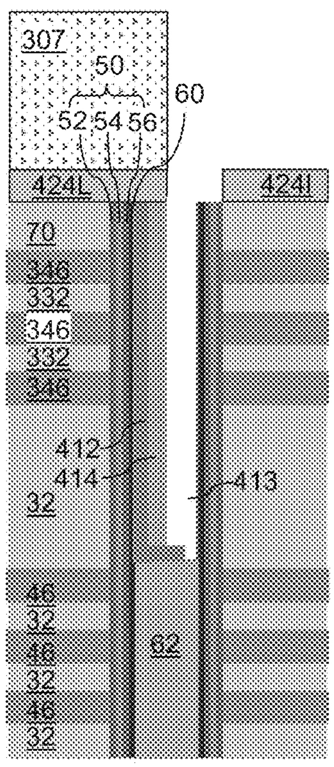
FIG. 44 is a vertical cross-sectional view of a memory opening within the alternative configuration of the second exemplary structure after removal of corner portions of the semiconductor fill material portions according to the second embodiment of the present disclosure.

Referring to FIG. 44, an etch process is performed that etches the undoped semiconductor material of the unimplanted and unmasked portions of the sacrificial semiconductor material layer 424L selective to the implanted portions 4241 of the sacrificial semiconductor material layer 424L. An anisotropic etch process or an isotropic etch process may be performed to remove the unimplanted and unmasked portions of the sacrificial semiconductor material layer 424L. Subsequently, unmasked portions of the dielectric liners 412 can be removed by an anisotropic etch process selective to the material of the implanted portions 4241 of the sacrificial semiconductor material layer 424L. Optionally, unmasked portions of the semiconductor fill material portions 414 may be removed collaterally during the etch process that etches the unimplanted and unmasked portions of the sacrificial semiconductor material layer 424L and/or during the anisotropic etch process that etches the unmasked portions of the semiconductor fill material portions 414. A discrete corner cavity 413 is formed within a void of each memory opening 49 that is formed by removal of the etched material portions.

Figure 45:
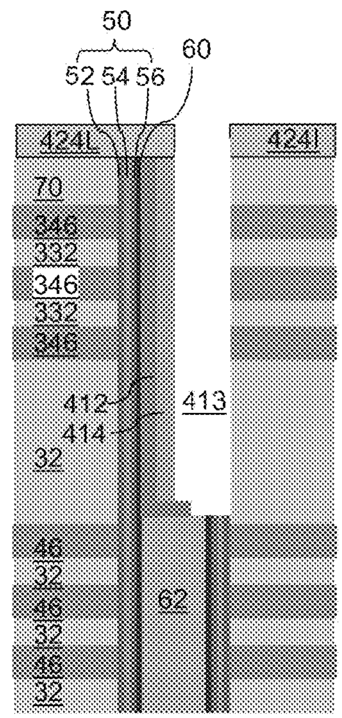
FIG. 45 is a vertical cross-sectional view of a memory opening within the alternative configuration of the second exemplary structure after formation of discrete corner cavities according to the second embodiment of the present disclosure.

Referring to FIG. 45, portions of the vertical semiconductor channels 60 that underlie the elongated openings in the patterned etch mask layer 307 are etched by an isotropic etch process around the discrete corner cavities 413. The discrete corner cavities 413 are expanded to incorporate the volumes from which the vertical semiconductor channels 60 are removed. Portions of the memory films 50 adjacent to the discrete corner cavities 413 can be removed, for example, using a sequence of isotropic etch processes. In one embodiment, the sequence of isotropic etch processes can include a sequence of wet etch processes that etch the materials of the tunneling dielectric layer 56, the charge storage layer 54, and the blocking dielectric layer 52. The volumes of the discrete corner cavities 413 are expanded upon removal of the physically exposed portions of the memory films 50. Thus, the discrete corner cavities 413 are formed by removing an upper corner portion of each memory stack structure 55 within the memory openings 49 using at least one etch process. A subset of the discrete corner cavities 413 is formed within the two neighboring rows of memory openings 49 underneath each elongated opening in the patterned etch mask layer 307. The patterned etch mask layer 307 can be removed, for example, by ashing.

Figure 46:
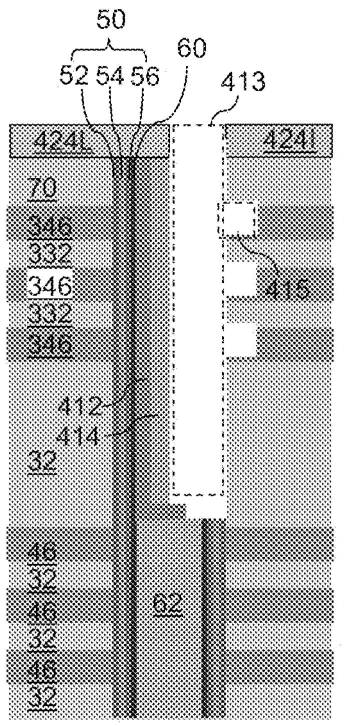
FIG. 46 is a vertical cross-sectional view of a memory opening within the alternative configuration of the second exemplary structure after formation of laterally-extending cavities according to the second embodiment of the present disclosure.

Referring to FIG. 46, an isotropic etch process that uses an isotropic etchant that etches a material of the electrically conductive layers (46, 346) selective to the materials of the insulating layers (32, 332, 70), the semiconductor fill material portions 414, the sacrificial semiconductor material layer 424L is performed to laterally recess the portions of the electrically conductive layers (46, 346) from the discrete corner cavities 413. The isotropic etchant that etches the material(s) of the drain-select-level electrically conductive layers 346 selective to the materials of the insulating cap layer 70, the insulating layers (32, 332), the memory films 50, the dielectric cores 62, and the semiconductor fill material portions 414 can be introduced into the discrete corner cavities 413. Physically exposed sidewalls of the drain-select-level electrically conductive layers 346 can be laterally recessed in an isotropic etch process using the isotropic etchant.

At least one laterally-extending cavity 415 is formed by laterally recessing portions of the at least one drain-select-level electrically conductive layer 346 from the discrete corner cavities 413. If multiple drain-select-level electrically conductive layers 346 are present, a plurality of laterally-extending cavities 415 can be formed by laterally recessing portions of the drain-select-level electrically conductive layers 346 from the discrete corner cavities 413. The lateral recess distance of the isotropic etch process is greater than one half of the minimum separation distance between the memory openings 49.

A laterally-extending cavity 415 that laterally extends along the first horizontal direction hd1 can be formed at each level of the drain-select-level electrically conductive layers 346 within each area of the elongated opening in the patterned etch mask layer 307. At least one laterally-extending cavity 415 laterally connects two neighboring rows of memory openings 49. In one embodiment, a vertical stack of a plurality of laterally-extending cavities 415 laterally connects two neighboring rows of memory openings 49. Each of the at least one laterally-extending cavity 415 connects the discrete corner cavities 413 within the two rows of memory openings 49 to provide a continuous cavity.

The continuous cavity is herein referred to as an integrated cavity (413, 415), and includes all volumes of the discrete corner cavities 413 in the two rows of memory openings 49 and the at least one laterally-extending cavity 415. Each drain-select-level electrically conductive layer 346 can be divided into multiple strips with a cut at the location of each elongated opening in the patterned etch mask layer 307. The patterned etch mask layer 307 can be removed after, or prior to, the isotropic etch process.

Figure 47:
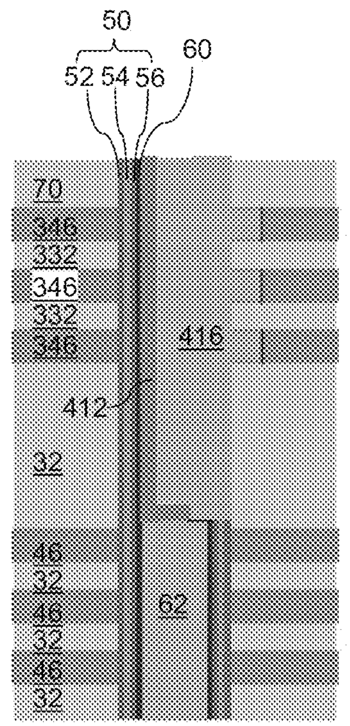
FIG. 47 is a vertical cross-sectional view of a memory opening within the alternative configuration of the second exemplary structure after removal of remaining portions of the sacrificial semiconductor material layer and formation of multi-pillared drain-select-level isolation structures according to the second embodiment of the present disclosure.

Referring to FIG. 47, remaining portions of the sacrificial semiconductor material layer 424L and the semiconductor fill material portions 414 can be removed selective to the drain-select-level electrically conductive layers 346, the insulating layers (32, 332, 70), dielectric cores 62, and the dielectric liners 412. For example, if the semiconductor fill material portions 414 include a semiconductor material (such as amorphous silicon or polysilicon), the semiconductor fill material portions 414 can be removed using a wet etch process using hot trimethyl-2 hydroxyethyl ammonium hydroxide ("hot TMY"), tetramethyl ammonium hydroxide (TMAH), or a potassium oxide (KOH) solution.

A dielectric material such as a doped silicate glass (such as borosilicate glass or phosphosilicate glass) or organosilicate glass can be deposited in the volumes of the integrated cavities (413, 415) using a conformal deposition process. Excess portions of the dielectric material can be removed from above the horizontal plane including the top surface of the insulating cap layer 70. Each continuous remaining portion of the dielectric material filling a respective integrated cavity (413, 415) constitutes a multi-pillared drain-select-level isolation structure 416. Each multi-pillared drain-select-level isolation structure 416 is formed by depositing a dielectric material in volumes of the at least one laterally-extending cavity 415 and in the discrete corner cavities 413.

Each multi-pillared drain-select-level isolation structure 416 includes a plurality of dielectric pillar portions 417 that fills a volume of a respective one of the discrete corner cavities 413 and at least one horizontally-extending portion adjoining each of the plurality of dielectric pillar portions 417, filling a volume of a respective one of the at least one laterally-extending cavity 415, located between a vertically neighboring pair of insulating layers (such as a vertically neighboring par of drain-select-level insulating layers 332, a drain-select-level insulating layer 332 and an insulating cap layer 70, or a drain-select-level insulating layer 332 and a topmost word-line-level insulating layer 32) within the alternating stack (32, 46, 332, 346, 70), and laterally separating remaining portions of at least one electrically conductive layer (such as the at least one drain-select-level electrically conductive layer 346) within the alternating stack (32, 46, 332, 346, 70).

The multi-pillared drain-select-level isolation structures 416 fill volumes formed by removal of the semiconductor fill material portions 414. In one embodiment, each multi-pillared drain-select-level isolation structure 416 can include a plurality of horizontally-extending portions that laterally extend along the first horizontal direction hd1, contact a top surface of an underlying one of the insulating layers (332 or 32) within the alternating stack (32, 332, 70) and contact a bottom surface of an overlying one of the insulating layers (332 or 70) within the alternating stack (32, 332, 70).

Figure 48:
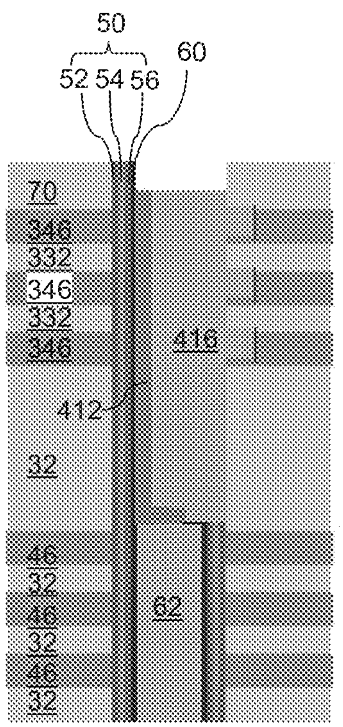
FIG. 48 is a vertical cross-sectional view of a memory opening within the alternative configuration of the second exemplary structure after vertically recessing dielectric pillar portions of the multi-pillared drain-select-level isolation structures according to the second embodiment of the present disclosure.

Referring to FIG. 48, upper portions of the multi-pillared drain-select-level isolation structures 416 located in the memory openings 49 can be vertically recessed to form drain cavities.

Figure 49:
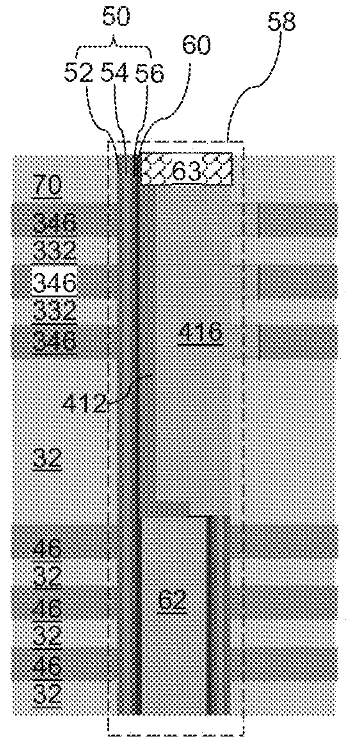
FIG. 49 is a vertical cross-sectional view of a memory opening within the alternative configuration of the second exemplary structure after formation of drain regions according to the second embodiment of the present disclosure.
Figure 50A:
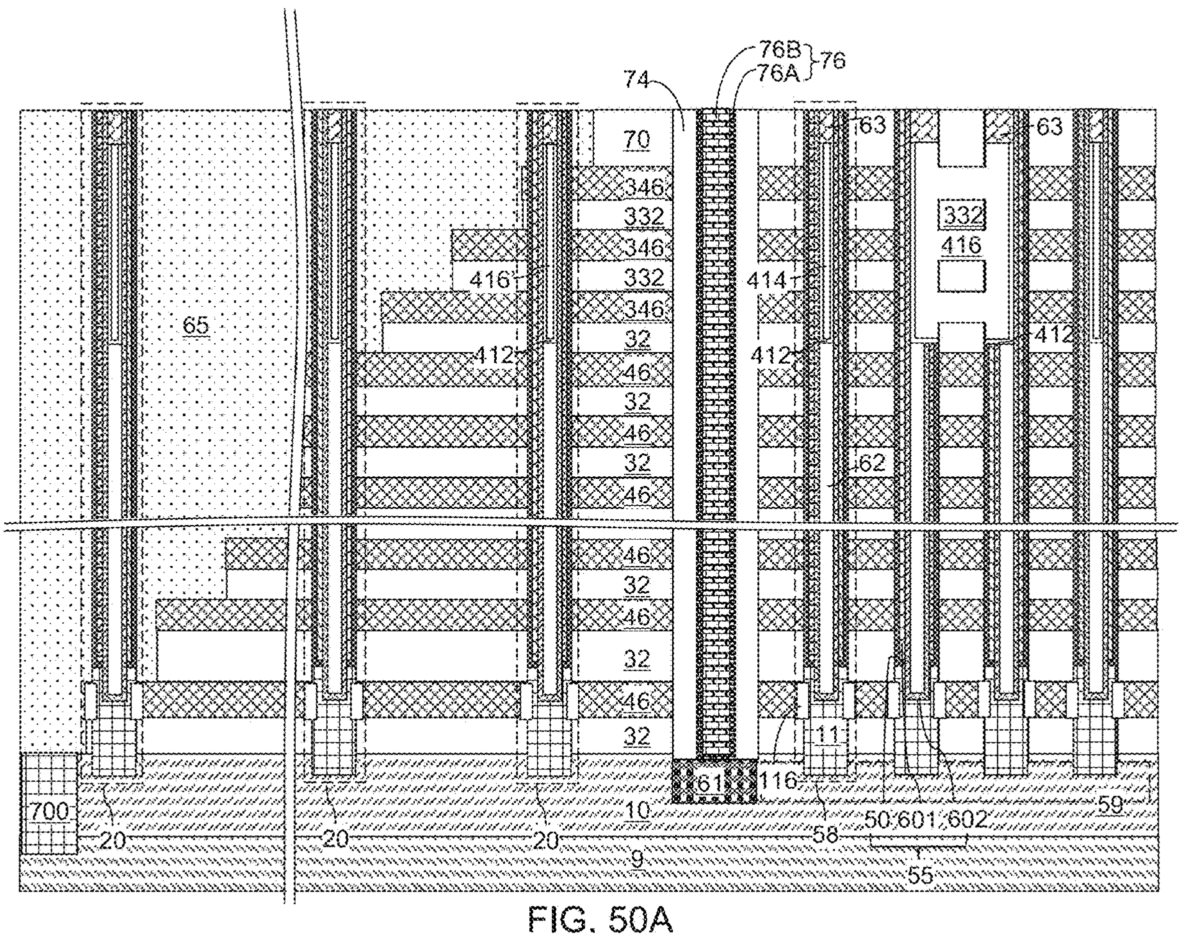
FIG. 50A is a schematic vertical cross-sectional view of the second exemplary structure after the processing steps of FIG. 49.
Figure 50B:
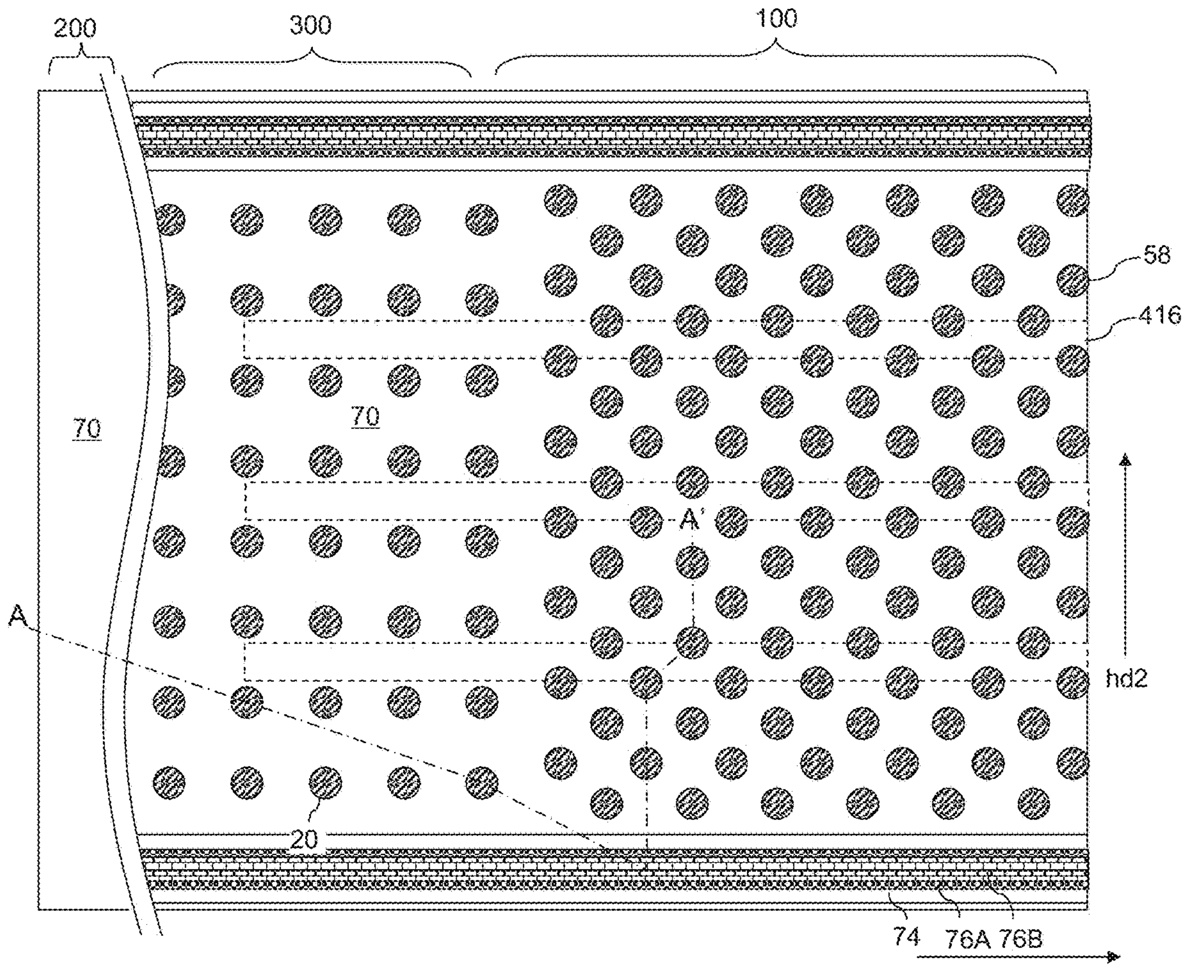
FIG. 50B is a top-down view of the second exemplary structure of FIG. 50A. The vertical plane A-A' is the plane of the schematic vertical cross-sectional view of FIG. 50A.

Referring to FIGS. 49, 50A, and 50B, a doped semiconductor material having a doping of the second conductivity type is deposited in the drain cavities to form drain regions 63. Each drain region 63 can include a cylindrical drain segment 63C having a cylindrical shape and a block arc drain segment 63B that vertically extends with a uniform horizontal cross-sectional shape of a block arc, i.e., a shape of a segment of an annulus with a limited range of the azimuthal angle.

The set of all material portions within each memory opening 49 after formation of the drain region 63 is herein referred to as a memory opening fill structure 58. The set of all material portions within each support opening 19 after formation of drain regions is herein referred to as a support pillar structure. A first subset of the memory opening fill structures 58 can be arranged in rows that laterally extend along the first horizontal direction hd1, and contacts a multi-pillared drain-select-level isolation structure 416. Each multi-pillared drain-select-level isolation structure 416 contacts a pair of rows of memory opening fill structures 58.

At least two rows (such as three rows, four rows, etc.) of memory opening fill structures 58 can be provided between a laterally neighboring pair of multi-pillared drain-select-level isolation structures 416. More than two rows of memory opening fill structures 58 can be provided between each laterally neighboring pair of drain-select-level isolation structures 320.

Figure 51:
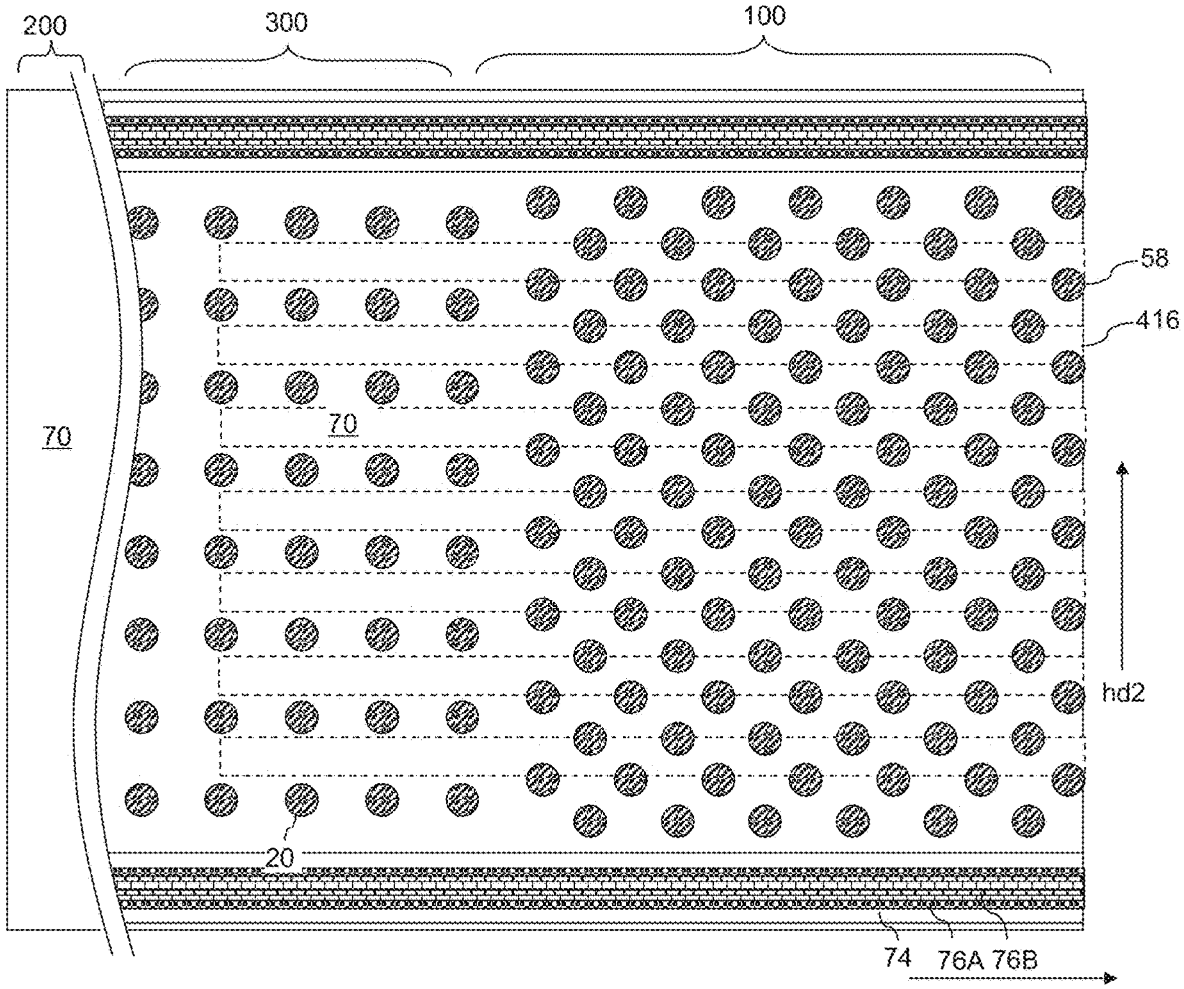
FIG. 51 is a top-down view of an alternative configuration for the second exemplary structure of FIGS. 50A and 50B according to the second embodiment of the present disclosure.

FIG. 51 is a top-down view of an alternative configuration for the second exemplary structure of FIGS. 50A and 50B according to the second embodiment of the present disclosure. FIG. 51 illustrates an alternative layout for the multi-pillared drain-select-level isolation structures 416 in which each strip of drain-select-level electrically conductive layers 346 that are laterally spaced apart by the multi-pillared drain-select-level isolation structures 416 contacts and controls two rows of memory opening fill structures 58.

Figure 52A:
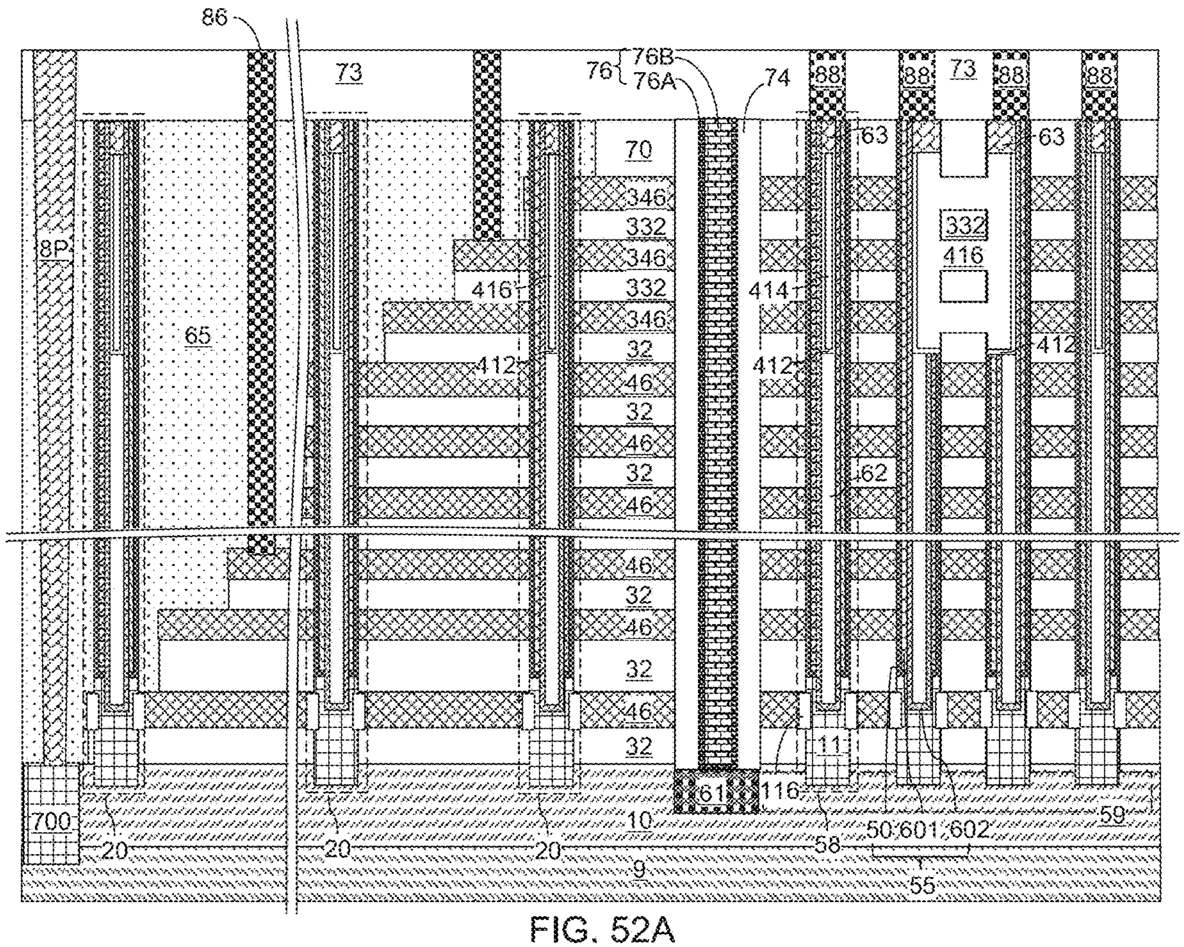
FIG. 52A is a schematic vertical cross-sectional view of the second exemplary structure after formation of a contact level dielectric layer and additional contact via structures according to the second embodiment of the present disclosure.
Figure 52B:
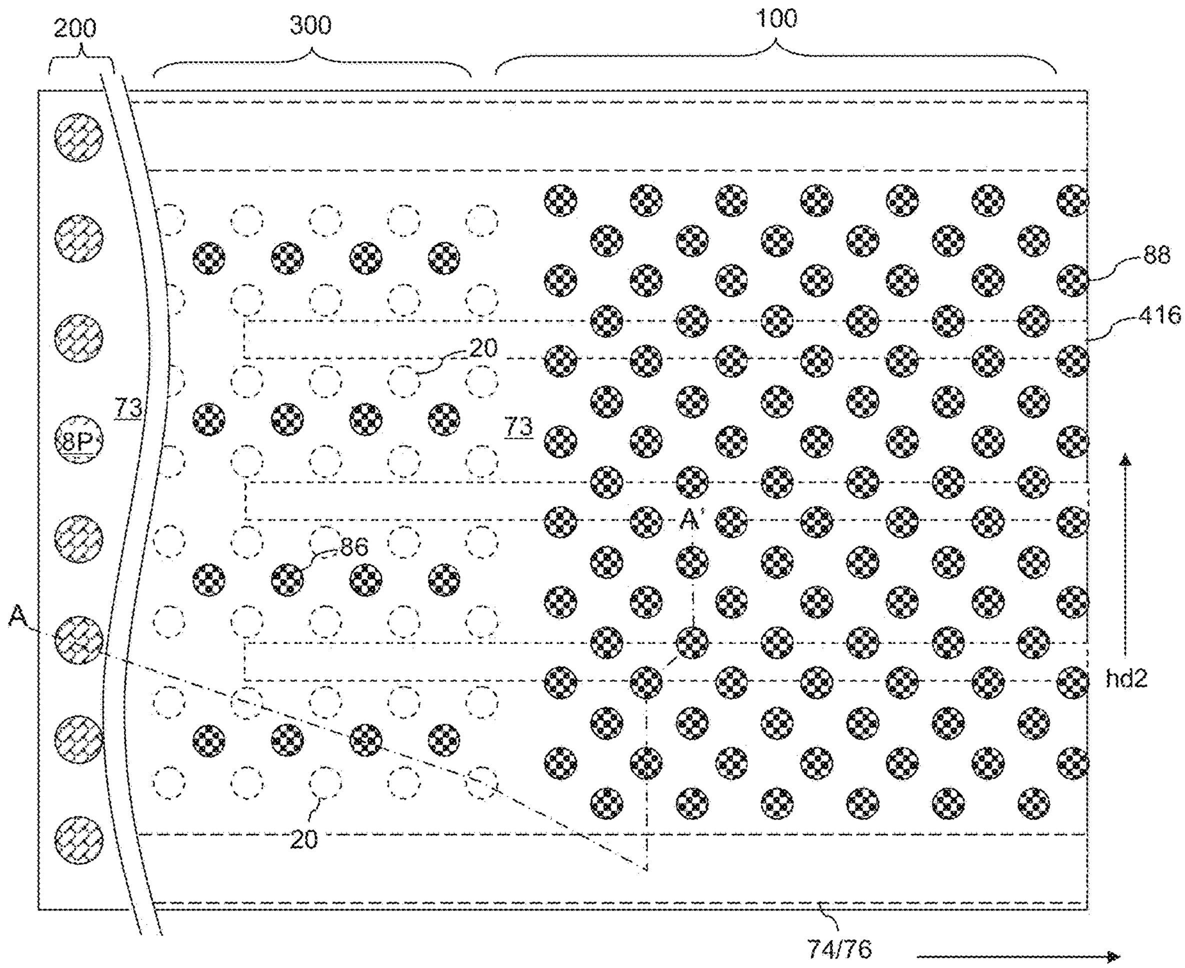
FIG. 52B is a top-down view of the second exemplary structure of FIG. 52A. The vertical plane A-A' is the plane of the schematic vertical cross-sectional view of FIG. 52A.

Referring to FIGS. 52A and 52B, a contact level dielectric layer 73 can be formed over the insulating cap layer 70 and the retro-stepped dielectric material portion 65. Contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers (46, 346) through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 53:
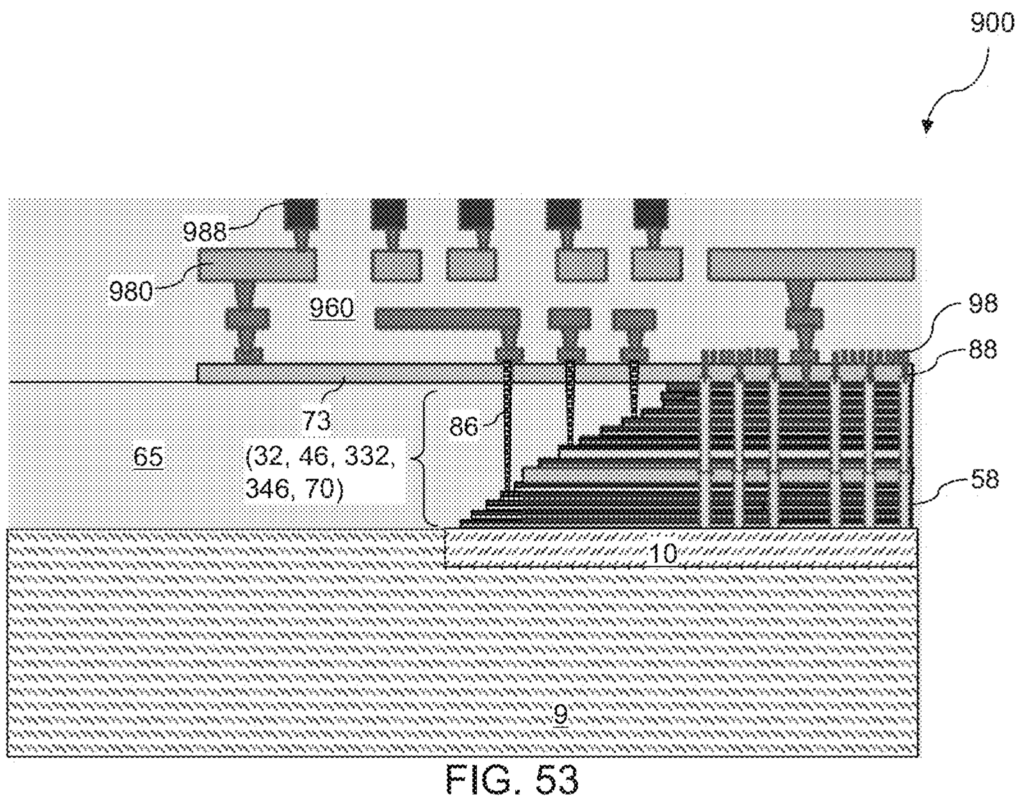
FIG. 53 is a vertical cross-sectional view of a memory die including the first or second exemplary structure according to an embodiment of the present disclosure.

Referring to FIG. 53, a memory die 900 can be provided by forming additional interconnect-level dielectric material layers 960 including metal interconnect structures 980 over the first exemplary structure or the second exemplary structure. The metal interconnect structures 980 can include bit lines 98 that are electrically connected to a respective subset of the drain regions 63 through a respective subset of the drain contact via structures 88. Bonding pads 988 can be formed on top of the metal interconnect structures 980.

Referring to all drawings and according to various embodiments of the present disclosure, a three-dimensional memory device is provided, which comprises: an alternating stack of insulating layers (32, 332, 70) and electrically conductive layers (46, 346) located over a substrate (9, 10); memory openings 49 vertically extending through the alternating stack (32, 46, 332, 346, 70); memory stack structures located within a respective one of the memory openings, wherein each of the memory stack structures 55 comprises a memory film 50 and a vertical semiconductor channel 60; and a multi-pillared drain-select-level isolation structure 416 comprising a plurality of dielectric pillar portions 417 located within a respective one of the memory openings 49 and at least one horizontally-extending portion adjoining each of the plurality of dielectric pillar portions 417 and located between a vertically neighboring pair of insulating layers (32, 332, 70) within the alternating stack (32, 46, 332, 346, 70) and laterally separating laterally neighboring strips of at least one electrically conductive layer (such as the drain-select-level electrically conductive layers 346) within the alternating stack (32, 46, 332, 346, 70).

In one embodiment, an entirety of the multi-pillared drain-select-level isolation structure 416 is a structure of integral construction and has a homogeneous composition throughout. As used herein, a structure of "integral construction" refers to a structure of a single continuous piece including a single structural component therein without any physically observable interface that divides the structure into multiple portions.

Each memory opening fill structure 58 that contacts a dielectric pillar portion 417 of a multi-pillared drain-select-level isolation structure 416 is herein referred to as a first memory opening fill structure 58. Each memory opening fill structure 58 that does not contact any dielectric pillar portion 417 of a multi-pillared drain-select-level isolation structure 416 is herein referred to as a second memory opening fill structure 58. Each second memory opening fill structure 58 includes a semiconductor fill material portion 414 that is laterally surrounded by a respective dielectric liner 412 that azimuthally extends around a vertical axis passing through the second memory opening fill structure by 360 degrees.

In one embodiment, each of the vertical semiconductor channels 60 comprises: a tubular semiconductor channel portion including a top surface that contacts a bottom surface of a respective one of the plurality of dielectric pillar portions 417; and a semitubular semiconductor channel portion adjoined to an upper end of the tubular semiconductor channel portion and contacting sidewalls of the respective one of the plurality of dielectric pillar portions 417.

In one embodiment, the three-dimensional memory device comprises drain regions 63 contacting a respective one of the semitubular semiconductor channel portions and having a cylindrical drain segment 63C and a block arc drain segment 63B.

In one embodiment, the plurality of dielectric pillar portions 417 contacts bottom surfaces of the drain regions 63.

In one embodiment, each of the memory films 50 comprises: a tubular memory film portion including a top surface that contacts a bottom surface of one of the plurality of dielectric pillar portions 417; and a semitubular memory film portion adjoined to an upper end of the tubular memory film portion and contacting sidewalls of the one of the plurality of dielectric pillar portions 417.

In one embodiment, the three-dimensional memory device further comprises: dielectric liners 412 located within the memory openings 49 and contacting a sidewall of a respective one of the semitubular semiconductor channel portions and a sidewalls of a respective one of the plurality of dielectric pillar portions 417; and dielectric cores 62 located within the memory openings 49, contacting a bottom surface of a respective one of the plurality of dielectric pillar portions 417, and laterally surrounded by a respective one of the tubular semiconductor channel portions.

In one embodiment, dielectric pillar portions 417 within the plurality of dielectric pillar portions 417 are laterally spaced from each other by one of the insulating layers (such as each of the drain-select-level insulating layers 332) within the alternating stack (32, 46, 332, 346, 70), wherein the one of the insulating layers (such as each of the drain-select-level insulating layers 332) laterally encircles and encloses each of the memory openings 49 within two rows of memory openings 49.

In one embodiment, each of the memory openings 49 with the two rows of memory openings 49 includes one of the plurality of dielectric pillar portions 417 and one of the memory opening fill structures 58.

In one embodiment, each of the plurality of dielectric pillar portions 417 comprises: a cylindrical dielectric pillar portion 417C centered at a vertical axis passing through a geometrical center of a respective one of the memory openings 49 and azimuthally extending around the vertical axis by 360 degrees; and a block arc pillar portion 417B centered at the vertical axis, adjoined to one side of the cylindrical dielectric pillar portion 417C, and azimuthally extending around the vertical axis by an angle in a range from 30 degrees to 270 degrees.

In one embodiment, the alternating stack (32, 46, 332, 346, 70) comprises a terrace region in which each electrically conductive layer (46, 346) other than a topmost electrically conductive layer (such as the topmost one of the drain-select-level electrically conductive layer 346) within the alternating stack (32, 46, 332, 346, 70) laterally extends farther than any overlying electrically conductive layer (46, 346) within the alternating stack (32, 46, 332, 346, 70); the terrace region includes stepped surfaces of the alternating stack (32, 46, 332, 346, 70) that continuously extend from a bottommost layer within the alternating stack (32, 46, 332, 346, 70) to a topmost layer within the alternating stack (32, 46, 332, 346, 70); and support pillar structures 20 extend through the stepped surfaces and through a retro-stepped dielectric material portion 65 that overlies the stepped surfaces.

In one embodiment, the three-dimensional memory device comprises a backside blocking dielectric layer 44 disposed between each neighboring pair of an electrically conductive layer (46, 346) and an insulating layer (32, 332, 70) and extending from a bottommost layer within the alternating stack (32, 46, 332, 346, 70) to a topmost layer within the alternating stack (32, 46, 332, 346, 70), wherein pedestal channel portions underlying a respective one of the vertical semiconductor channels are laterally spaced from the backside blocking dielectric layer 44 by tubular dielectric spacers 116.

In one embodiment, at least one horizontally-extending portion comprises a plurality of horizontally-extending portions that laterally extend along a first horizontal direction hd1, contact a top surface of an underlying one of the insulating layers (such as a topmost one of the word-line-level insulating layers 32 or a drain-select-level insulating layer 332) within the alternating stack (32, 46, 332, 346, 70), and contact a bottom surface of an overlying one of the insulating layers (such as the insulating cap layer 70 or one of the drain-select-level insulating layer 332) within the alternating stack (32, 46, 332, 346, 70).

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a charge storage layer 54 at a level of a word-line-level electrically conductive layer 46) in a first device level of the array of monolithic three-dimensional NAND strings can be located over another memory cell (comprising another portion of the charge storage layer 54 at a level of another word-line-level electrically conductive layer 46) in a second device level of the array of monolithic three-dimensional NAND strings. The silicon substrate can contain an integrated circuit comprising a driver circuit (comprising a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion (such as a vertical semiconductor channel 60) of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element can be located adjacent to a respective one of the plurality of semiconductor channels (59, 11, 60).

The drain-select-level isolation structures (320, 416) of various embodiments of the present disclosure can be used to provide electrical isolation between neighboring pairs of strips of each drain-select-level electrically conductive layer 346 while enabling formation of the memory openings 49 and the memory opening fill structures 58 as a periodic two-dimensional array including multiple rows that extend along the lengthwise direction of the backside trenches 79 and having a uniform inter-row pitch between neighboring pairs of rows. The memory opening fill structures 58 can be formed without allocation of any extra space for providing electrical isolation between neighboring pairs of strips of drain-select-level isolation structures.

Referring to FIGS. 54A-54D, sequential vertical cross-sectional views of a memory opening 49 are shown during formation of a memory opening fill structure 58 in a third exemplary structure.

Figure 54A:
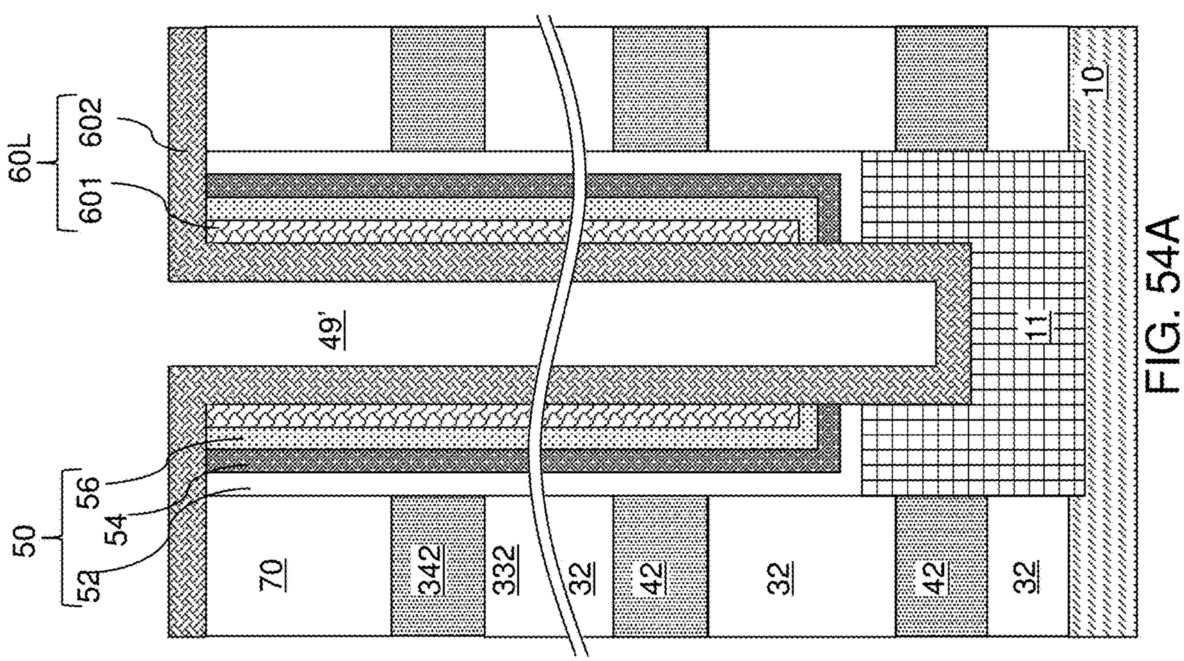
FIGS. 54A-54D are sequential vertical cross-sectional views of a memory opening during formation of a memory opening fill structure in a third exemplary structure according to an embodiment of the present disclosure.

Referring to FIG. 54A, the third exemplary structure according to an embodiment of the present disclosure can be the same as the first exemplary structure at the processing steps of FIG. 5E.

Figure 54B:
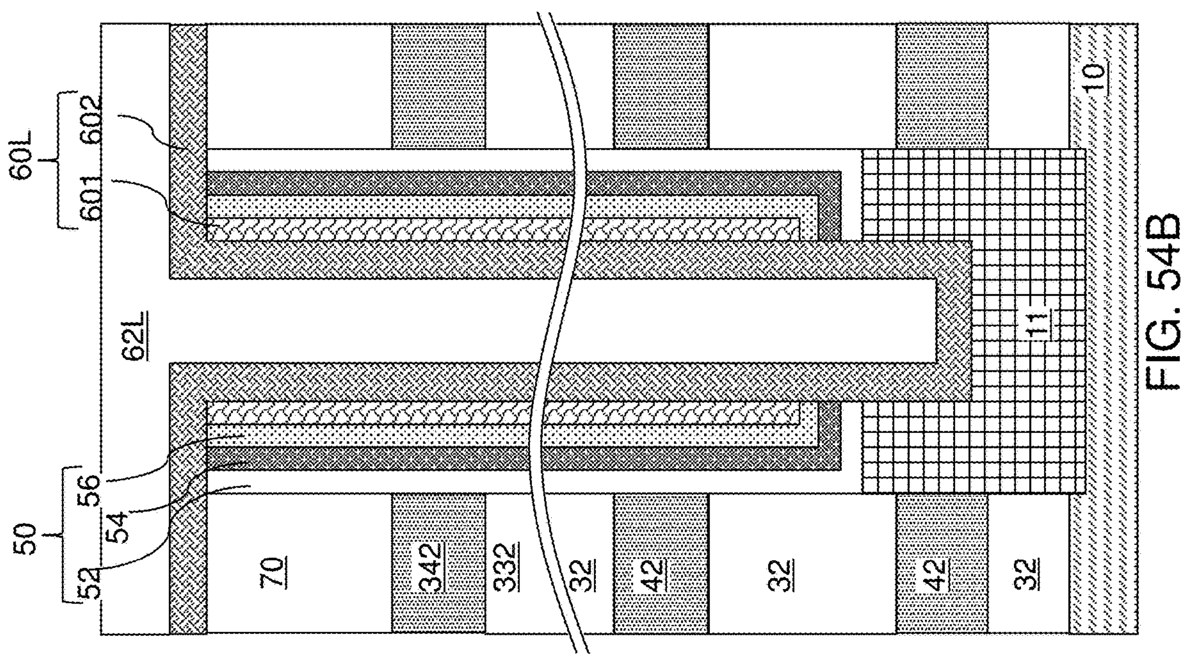

Referring to FIG. 54B, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 54D:
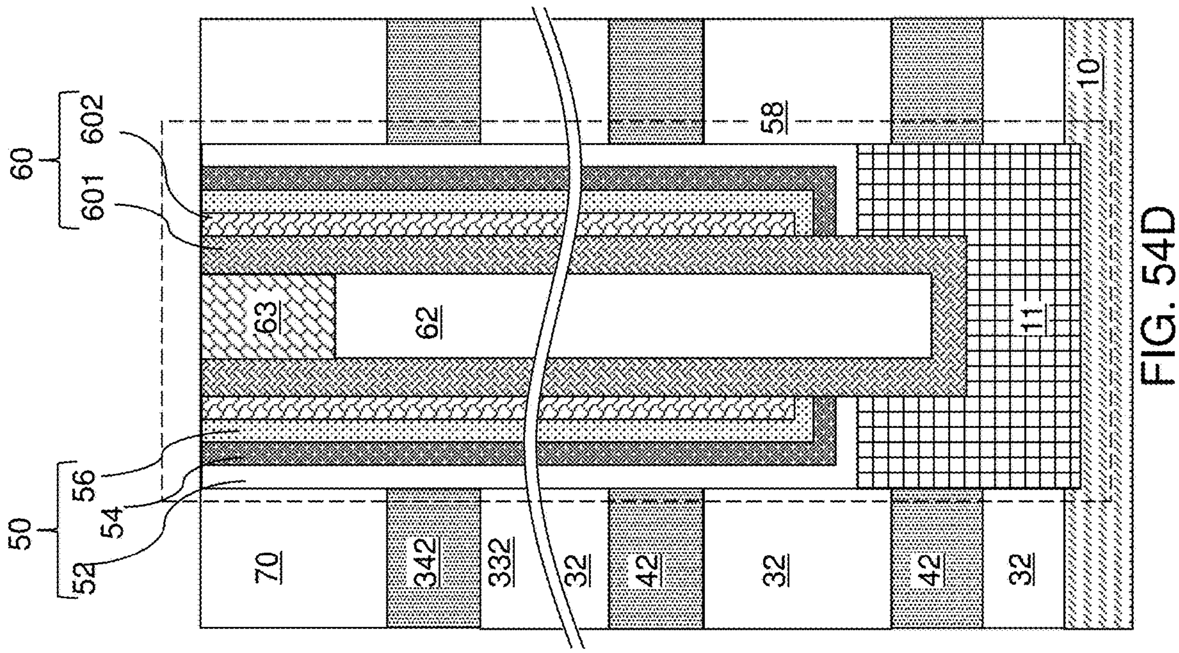
Figure 54C:
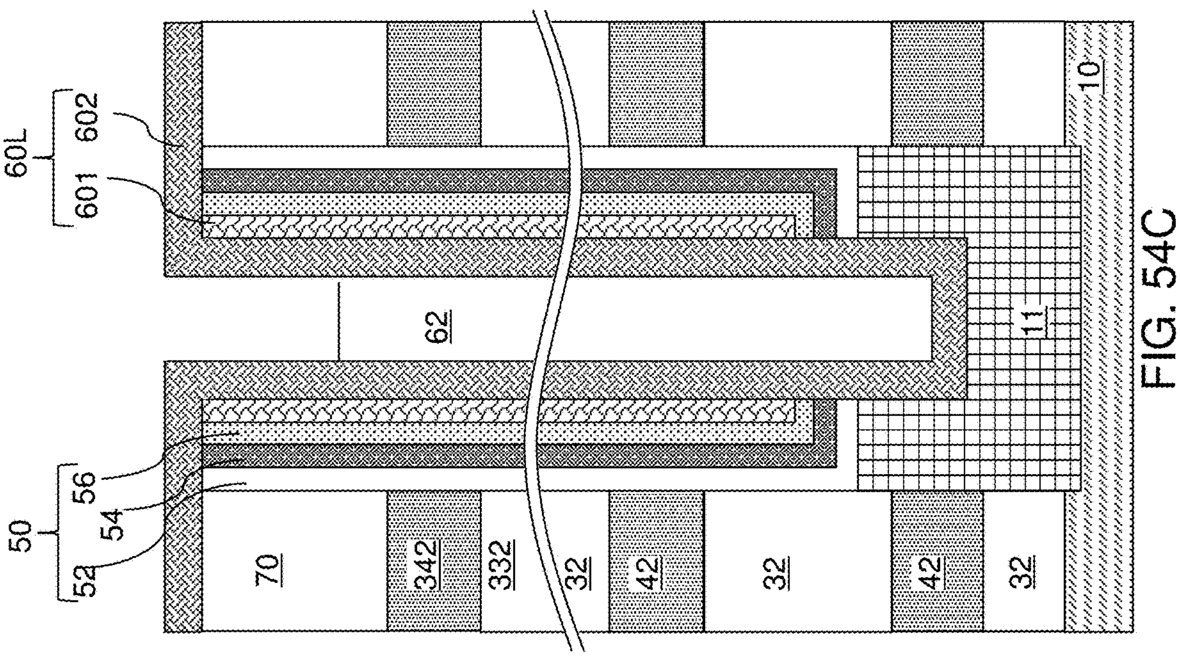

Referring to FIG. 54C, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 54D, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the tunneling dielectric layer 56.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional tunneling dielectric layer 56, a vertical semiconductor channel 60, a drain region 63 and a dielectric core 62. A tunneling dielectric layer 56 may laterally surround the vertical semiconductor channel 60. The memory material layer 54 can laterally surround the tunneling dielectric layer 56.

Figure 55A:
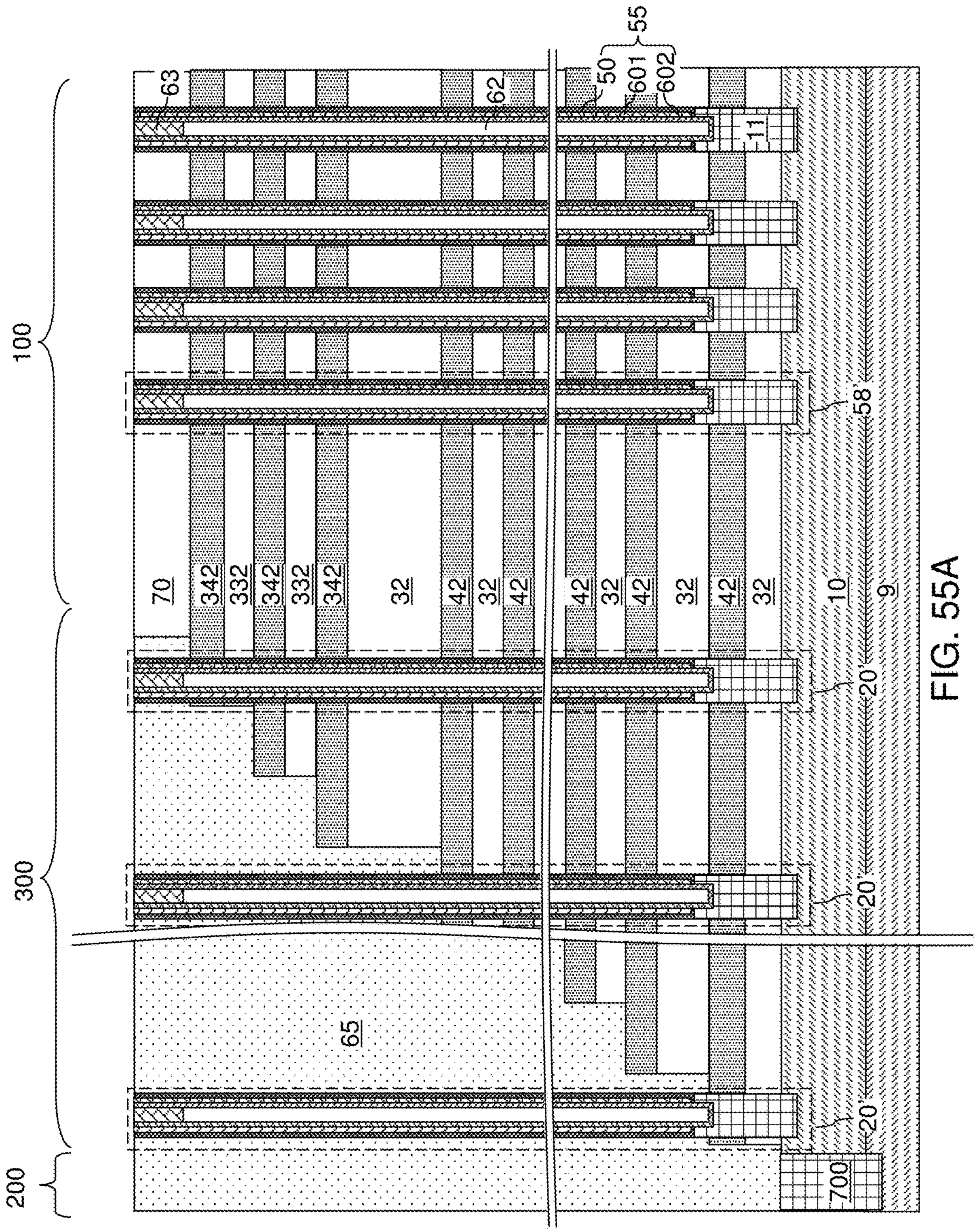
FIG. 55A is a vertical cross-sectional view the third exemplary structure after formation of memory opening fill structures according to an embodiment of the present disclosure.
Figure 55B:
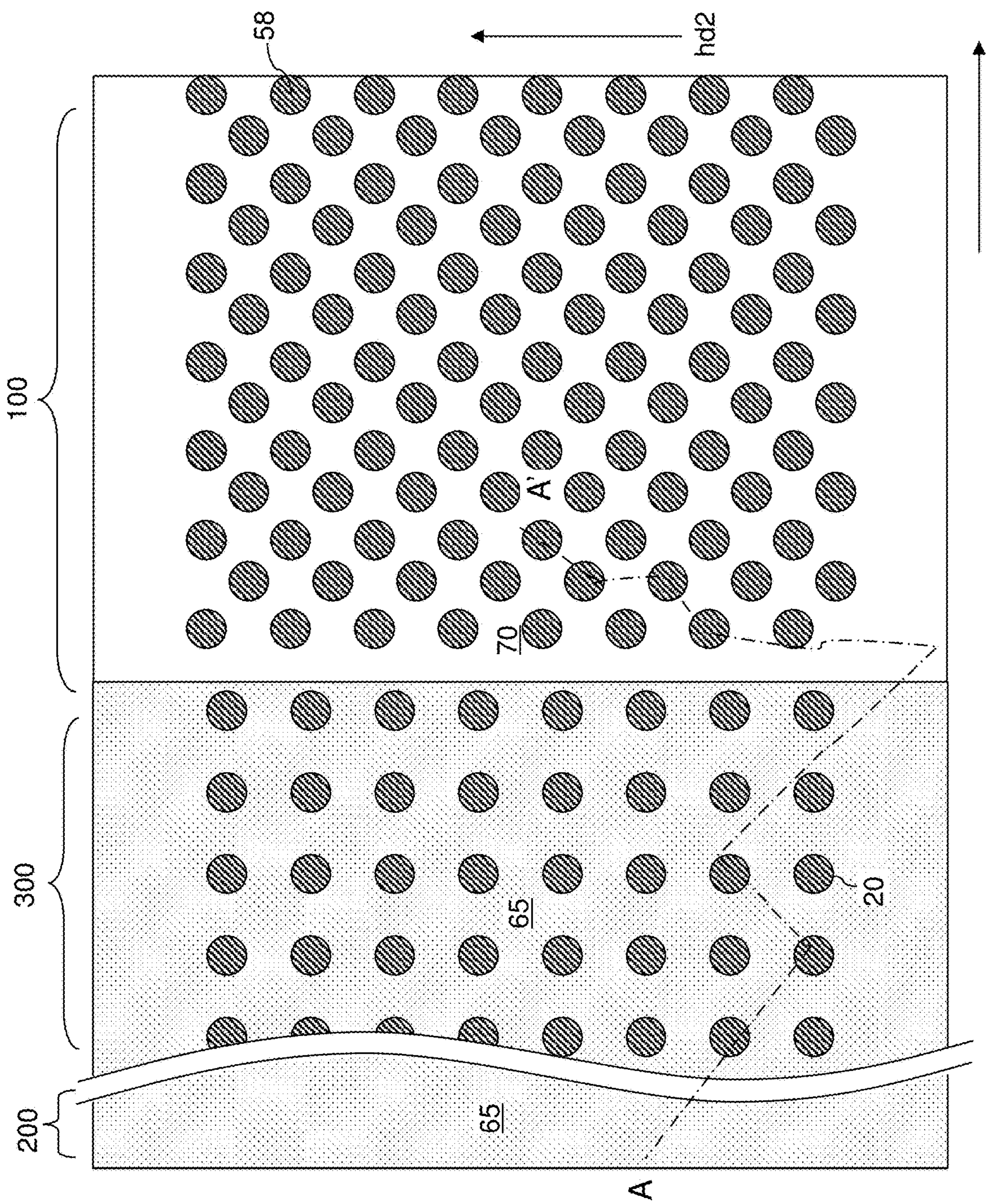
FIG. 55B is a top-down view of the third exemplary structure of FIG. 55A. The vertical plane A-A' is the plane of the schematic vertical cross-sectional view of FIG. 55A.

Referring to FIGS. 55A and 55B, the third exemplary structure is illustrated after formation of memory opening fill structures 58 and support pillar structure 20 within the memory openings 49 and the support openings 19, respectively. An instance of a memory opening fill structure 58 can be formed within each memory opening 49. An instance of the support pillar structure 20 can be formed within each support opening 19. The memory opening fill structures 58 comprise rows of memory opening fill structures 58 arranged along the first horizontal direction (e.g., word line direction) hd1. In one embodiment, memory opening fill structures 58 within each row of memory opening fill structures 58 may be arranged as a periodic one-dimensional array having a first pitch along the first horizontal direction hd1. In one embodiment, neighboring rows of memory opening fill structures 58 may be laterally offset along the first horizontal direction hd1 by one half of the first pitch. In one embodiment, a group of memory opening fill structures 58 may be arranged as a periodic two-dimensional array having a first periodicity of the first pitch along the first horizontal direction hd1, and having a second periodicity along the second horizontal direction (e.g., bit line direction) hd2 that is twice the center-to-center distance between neighboring rows of memory opening fill structures 58.

Figure 56A:
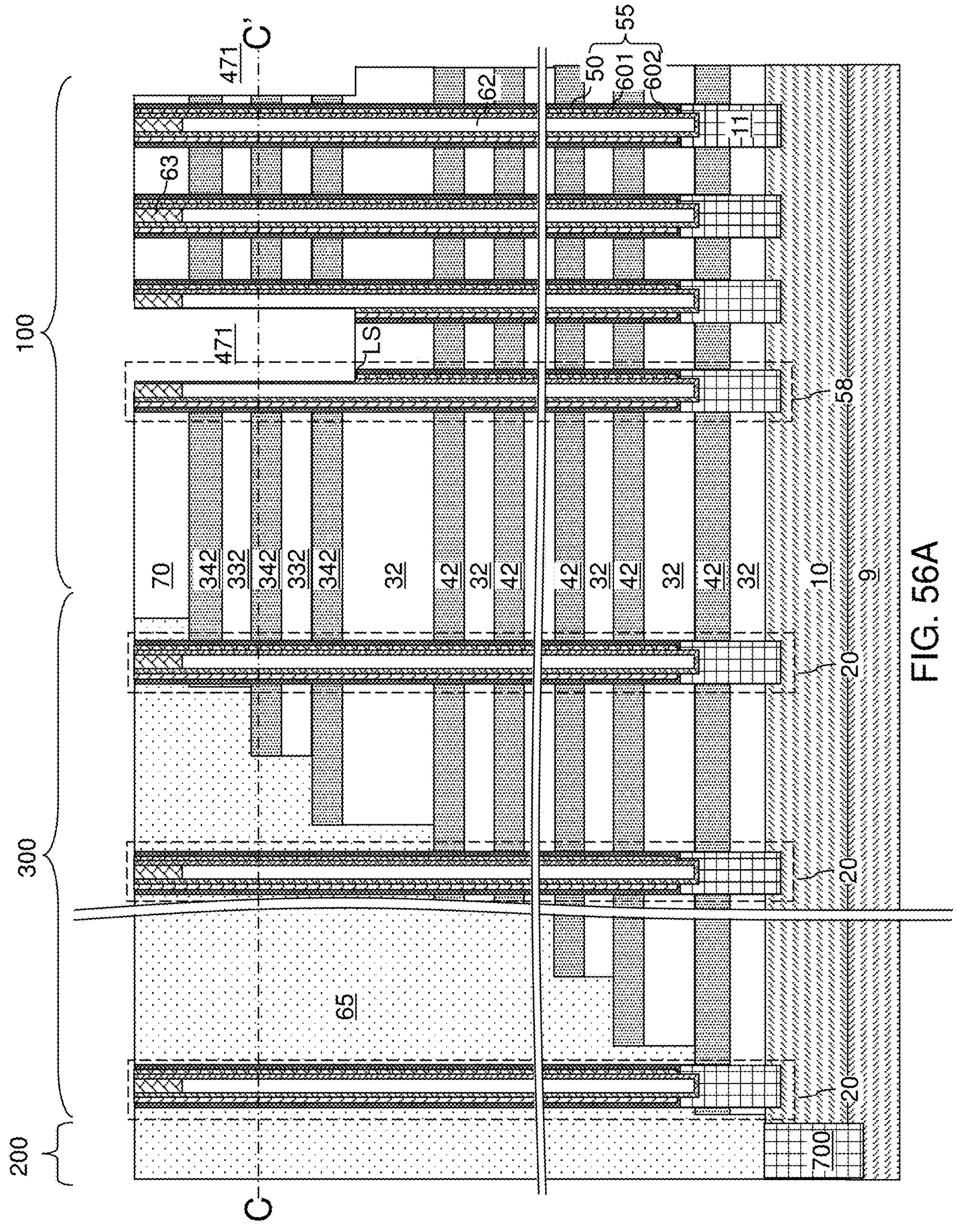
FIG. 56A is a vertical cross-sectional view the third exemplary structure after formation of drain-select-level isolation trenches according to an embodiment of the present disclosure.
Figure 56B:
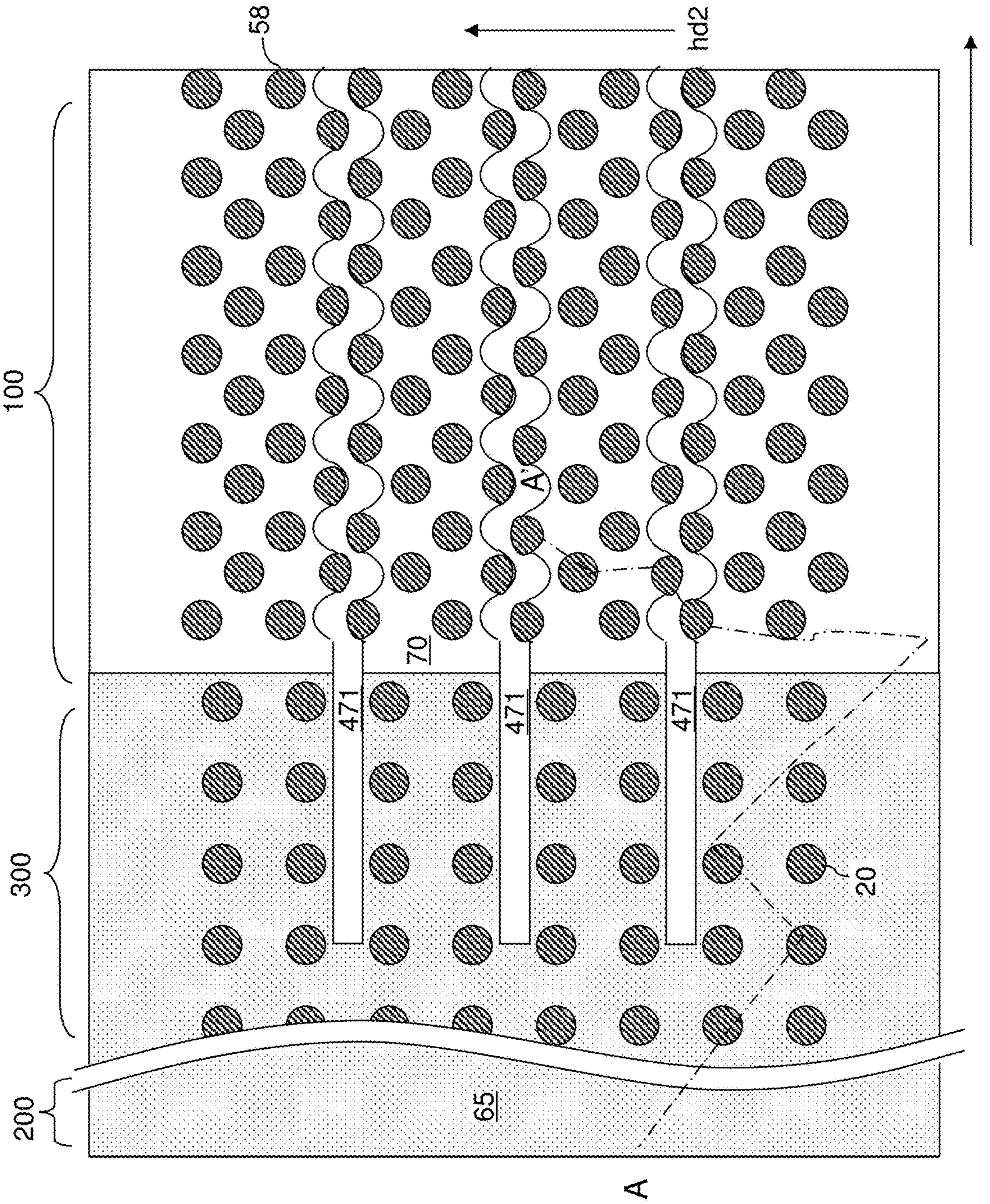
FIG. 56B is a top-down view of the third exemplary structure of FIG. 56A. The vertical plane A-A' is the plane of the schematic vertical cross-sectional view of FIG. 56A.
Figure 56C:
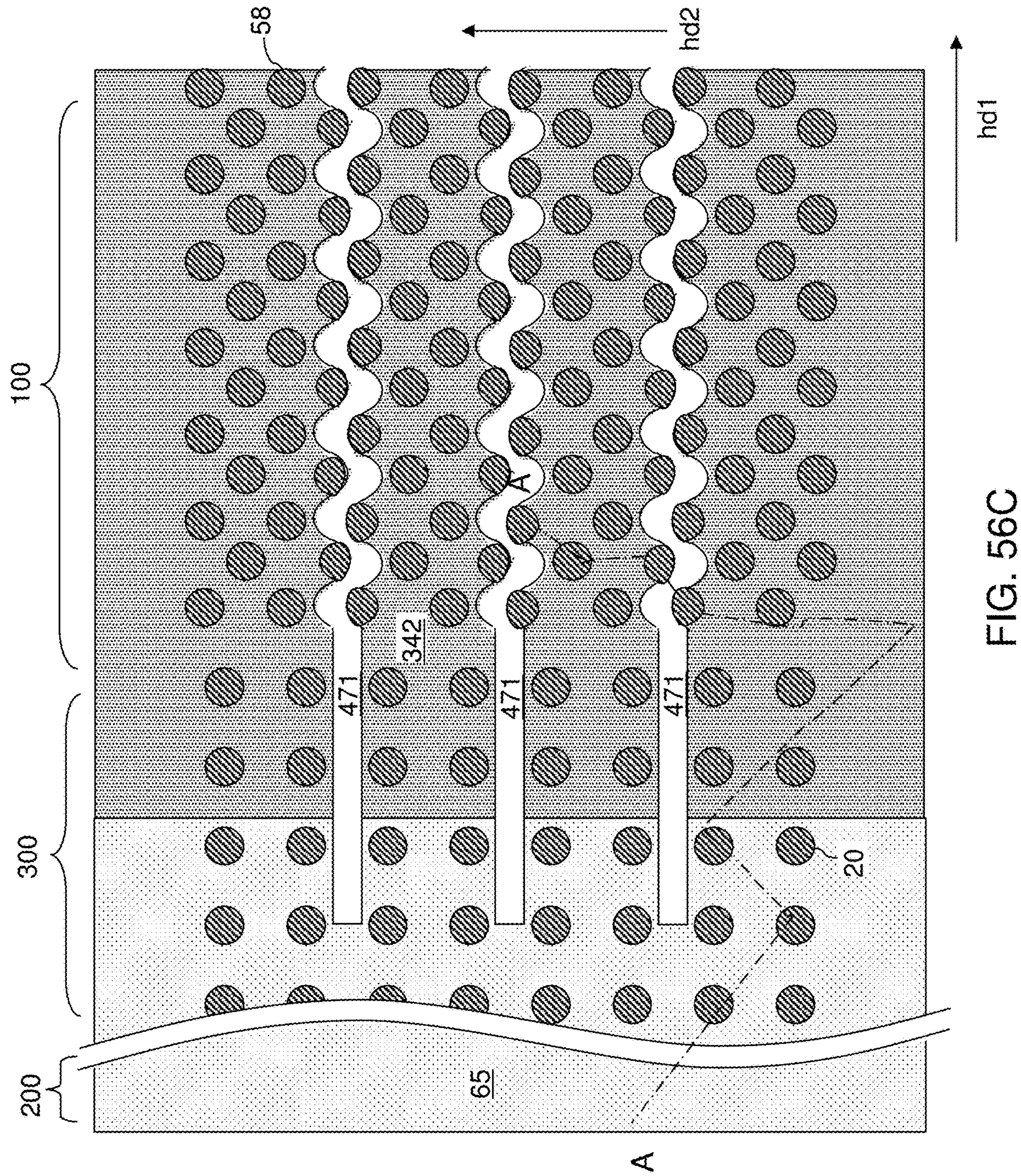
FIG. 56C is a horizontal cross-sectional view of the third exemplary structure along the horizontal plane C-C' of FIG. 56A. The vertical plane A-A' is the plane of the schematic vertical cross-sectional view of FIG. 56A.

Referring to FIGS. 56A-56C, a photoresist layer (not shown) can be applied over the insulating cap layer 70, and can be lithographically patterned to form slit-shaped openings over areas between a respective neighboring pair of rows of memory opening fill structures 58 and an adjoined region located in the staircase region 300. According to an aspect of the present disclosure, each slit-shaped opening extends generally along the first horizontal direction hd1 and has a periodic repetition of lateral wiggles along the second horizontal direction hd2 that is perpendicular to the first horizontal direction hd1. In other words, the opening zigzags diagonally between the memory opening fill structures in a direction that is inclined at 30 to 60 degrees, such as 45 degrees with respect to the first and the second horizontal directions. In one embodiment, the slit-shaped openings in the photoresist layer can be formed such that the slit-shaped openings in the photoresist layer have a partial areal overlap with the areas of the memory opening fill structures 58.

An anisotropic etch process can be performed to transfer the pattern of the slit-shaped openings in the photoresist layer through the insulating cap layer 70, the drain-select-level sacrificial material layer 342, and the drain-select-level insulating layers 332. Drain-select-level isolation trenches 471 are formed in volumes from which the materials of the insulating cap layer 70, the drain-select-level sacrificial material layer 342, and the drain-select-level insulating layers 332 are removed. The drain-select-level isolation trenches 471 laterally extend generally along the first horizontal direction hd1 and have a respective periodic repetition of lateral wiggles along the second horizontal direction hd1. As used herein, a lateral wiggle refers to a lateral bidirectional undulation of a surface along a direction that is perpendicular to a general lateral propagation direction of the surface such that at least two lateral undulation of the surface alternates along the general lateral propagation of the surface. In other words, the drain-select-level isolation trenches 471 zig-zag diagonally between the memory opening fill structures 58 in a direction that is inclined at 30 to 60 degrees, such as 45 degrees with respect to the first and the second horizontal directions. Each drain-select-level isolation trench 471 vertically extends through the insulating cap layer 70 and each of the drain-select-level sacrificial material layer 342 and the drain-select-level insulating layers 332. In one embodiment, one or more drain-select-level isolation trenches 471 can be formed within the area of a two-dimensional periodic array of memory opening fill structures 58 located between a neighboring pair of backside trench regions in which backside trenches are subsequently formed.

Generally, the periodicity of the lateral wiggles along the second horizontal direction hd2 can be the same as a periodicity of memory opening fill structures 58 within each row of memory opening fill structures 58 among the memory opening fill structures 58. In one embodiment, the drain-select-level isolation trenches 471 cut through a portion of the memory opening fill structures 58, such as a portion of the memory film 50 and optionally a portion of the vertical semiconductor channel 60. Specifically, the drain-select-level isolation trenches 471 cut through drain-select-level portions (i.e., upper portions) of the memory opening fill structures 58 located above the topmost word-line-level insulating layer 32, i.e., may cut through upper portions of the memory opening fill structures 58 that are located at the levels of the insulating cap layer 70, the drain-select-level sacrificial material layers 342, and the drain-select-level insulating layers 332. In this case, the drain-select-level portions of the memory opening fill structures 58 located in rows adjacent to the drain-select-level isolation trenches 471 have a horizontal cross-sectional shape of a segment of a circle, such as a semi-circle or a segment having a one or two chords extending between end points of a major arc (e.g., a segment having a larger area than a semi-circle). In contrast, the drain-select-level portions of the memory opening fill structures 58 located in rows that are spaced from the drain-select-level isolation trenches 471 by another row of memory opening fill structures 58 have a horizontal cross-sectional shape of a full circle. Portions of all memory opening fill structures 58 located below the drain-select-level (i.e., below the trenches 471) have a horizontal cross-sectional shape of a full circle. Thus, the drain-select-level portions of the memory opening fill structures 58 located in rows adjacent to the drain-select-level isolation trenches 471 have a lateral step LS at the bottom of the trenches 471, while the drain-select-level portions of the memory opening fill structures 58 located in rows that are spaced from the drain-select-level isolation trenches 471 lack this lateral step.

Generally, the drain-select-level isolation trenches 471 can be formed through the at least one drain-select-level sacrificial material layer 342 between a neighboring pair of rows of memory opening fill structures 58 among the memory opening fill structures 58. In one embodiment, each of the drain-select-level isolation trenches 471 may have a uniform width along the second horizontal direction hd2 that is invariant under translation along the first horizontal direction hd1. In other words, the distance between a pair of lengthwise sidewalls of each drain-select-level isolation trench 471 as measured along the second horizontal direction hd2 may be the same irrespective of the measurement location. The two lengthwise sidewalls of each drain-select-level isolation trench 471 define a pair of vertical zig-zag planes that are laterally spaced apart from each other by a uniform spacing. The pair of vertical planes include sidewalls of the insulating cap layer 70, the at least one drain-select-level sacrificial material layer 342, and the at least one drain-select-level insulating layer 332.

Figure 57A:
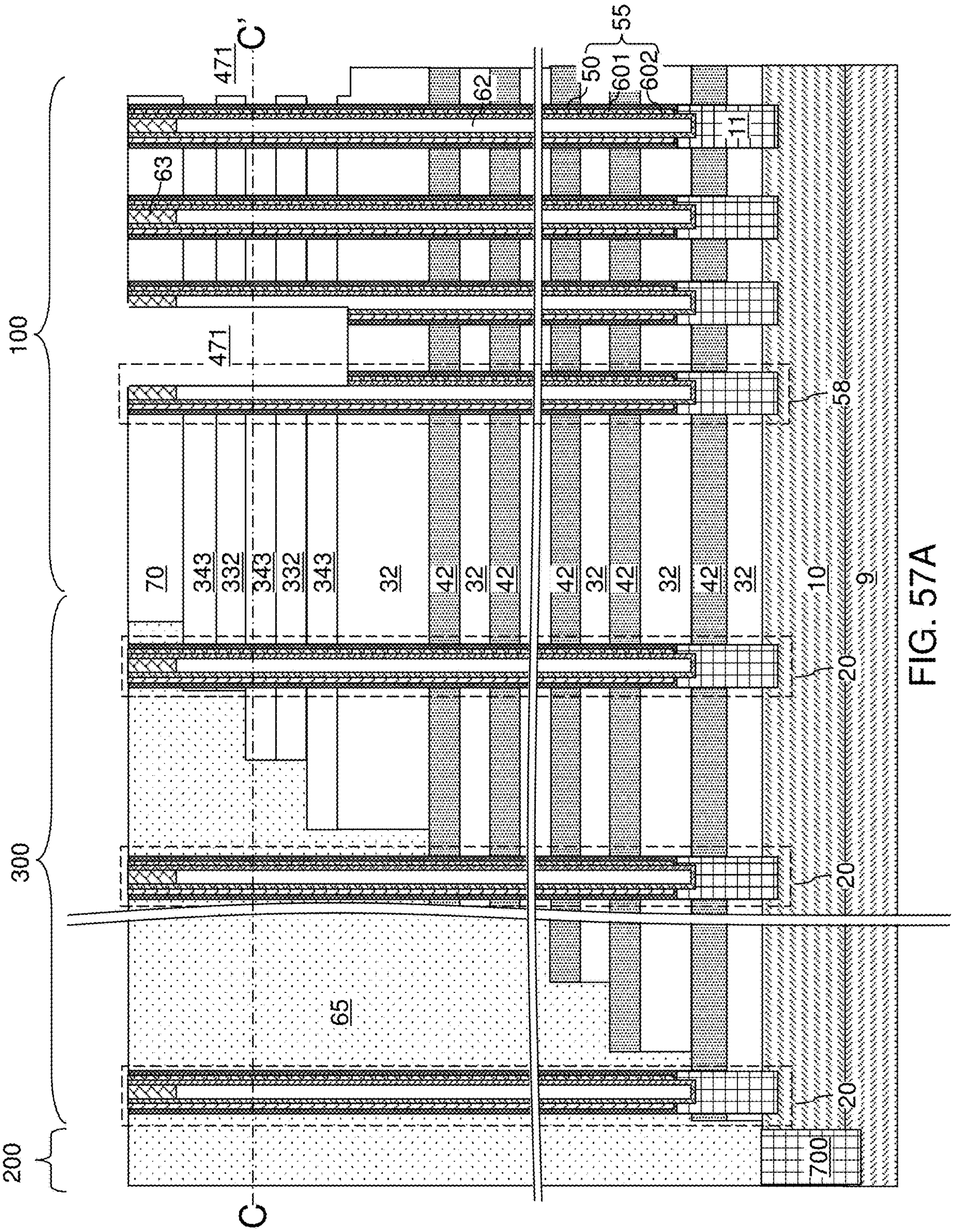
FIG. 57A is a vertical cross-sectional view the third exemplary structure after formation of drain-select-level backside recesses according to an embodiment of the present disclosure.
Figure 57B:
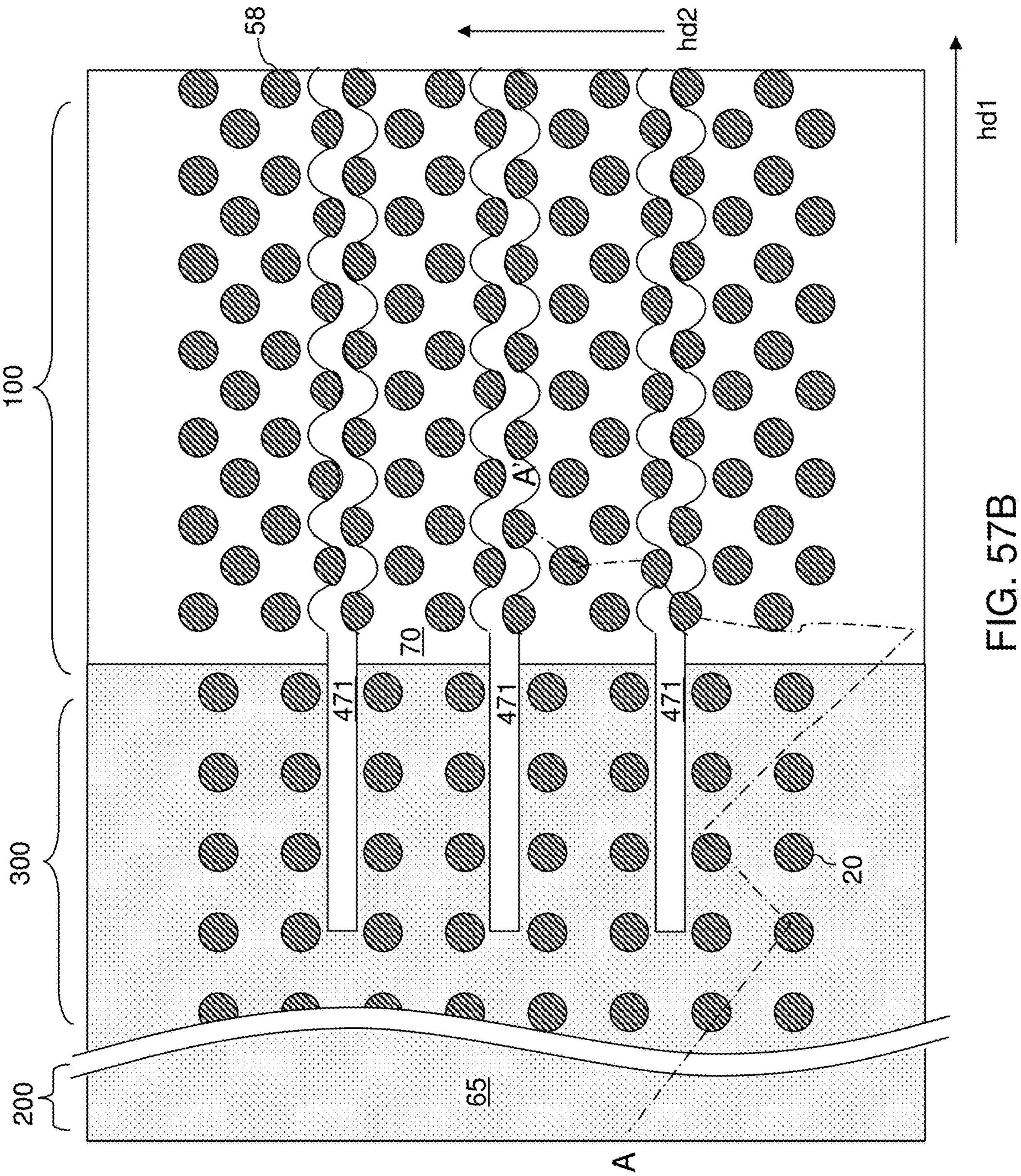
FIG. 57B is a top-down view of the third exemplary structure of FIG. 57A. The vertical plane A-A' is the plane of the schematic vertical cross-sectional view of FIG. 57A.
Figure 57C:
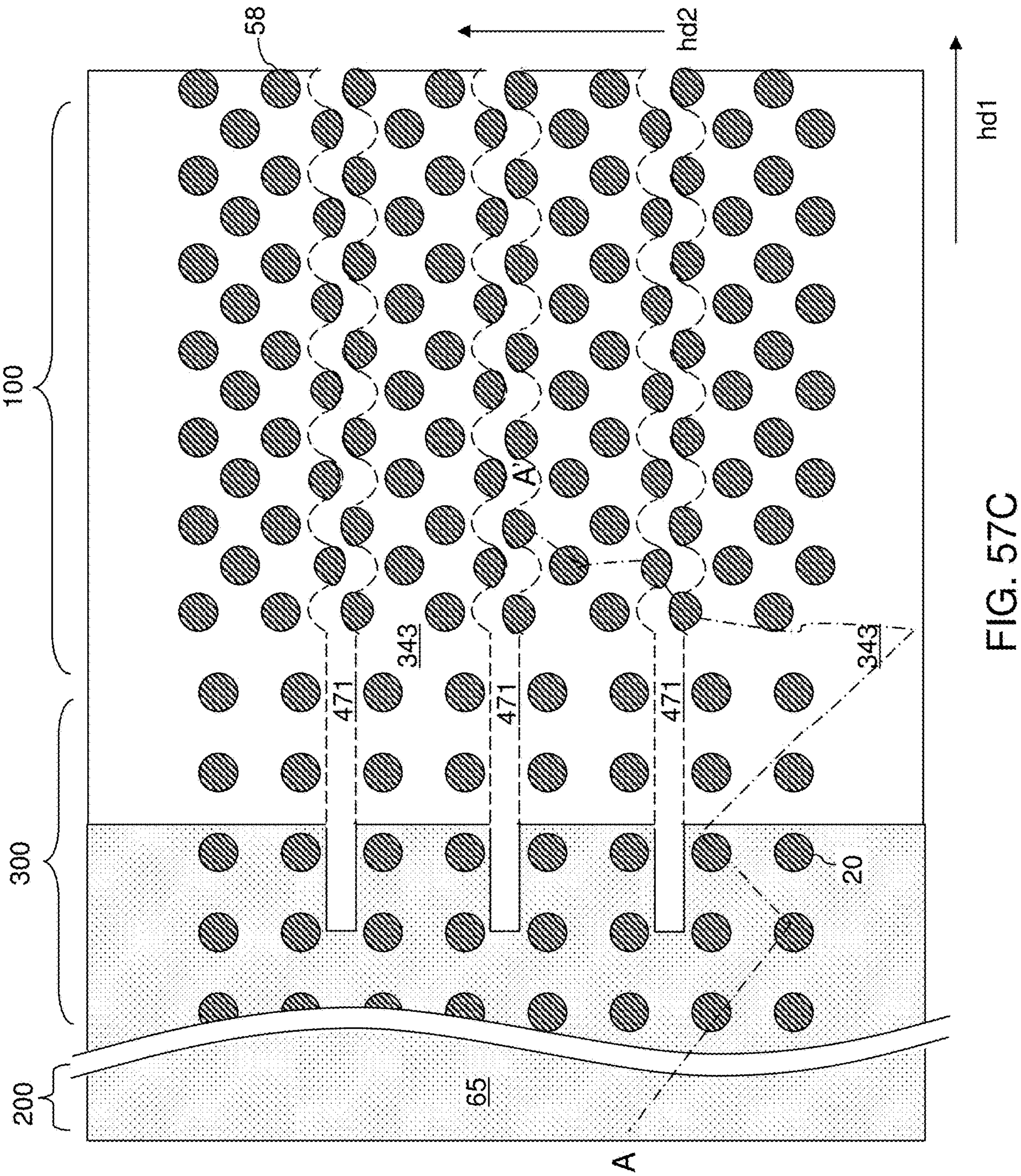
FIG. 57C is a horizontal cross-sectional view of the third exemplary structure along the horizontal plane C-C' of FIG. 57A. The vertical plane A-A' is the plane of the schematic vertical cross-sectional view of FIG. 57A.

Referring to FIGS. 57A-57C, drain-select-level backside recesses 343 can be formed by removing the materials of the at least one drain-select-level sacrificial material layers 342 selective to the materials of the insulating cap layer 70, the drain-select-level insulating layers 332, and the word-line-level insulating layers 32. An etchant that selectively etches the material of the at least one drain-select-level sacrificial material layers 342 with respect to the materials of the insulating cap layer 70, the drain-select-level insulating layers 332, and the word-line-level insulating layers 32 can be introduced into the drain-select-level isolation trenches 471 employing an isotropic etch process. The isotropic etch process may be a wet etch process employing a wet etch solution, or can be a gas phase (dry) etch process in which the etchant is introduced in a vapor phase into the drain-select-level isolation trenches 471. For example, if the drain-select-level sacrificial material layers 342 include silicon nitride, the etch process can be a wet etch process in which the exemplary structure is immersed within a wet etch tank including phosphoric acid, which etches silicon nitride selective to silicon oxide and silicon. The support pillar structure 20, the retro-stepped dielectric material portion 65, and the memory opening fill structures 58 provide structural support while the drain-select-level backside recesses 343 are present within volumes previously occupied by the drain-select-level sacrificial material layers 342. Planar sidewall segments of the defined by a chord of the segment shaped memory opening fill structures 58 can be physically exposed to each drain-select-level backside recess 343.

Figure 58A:
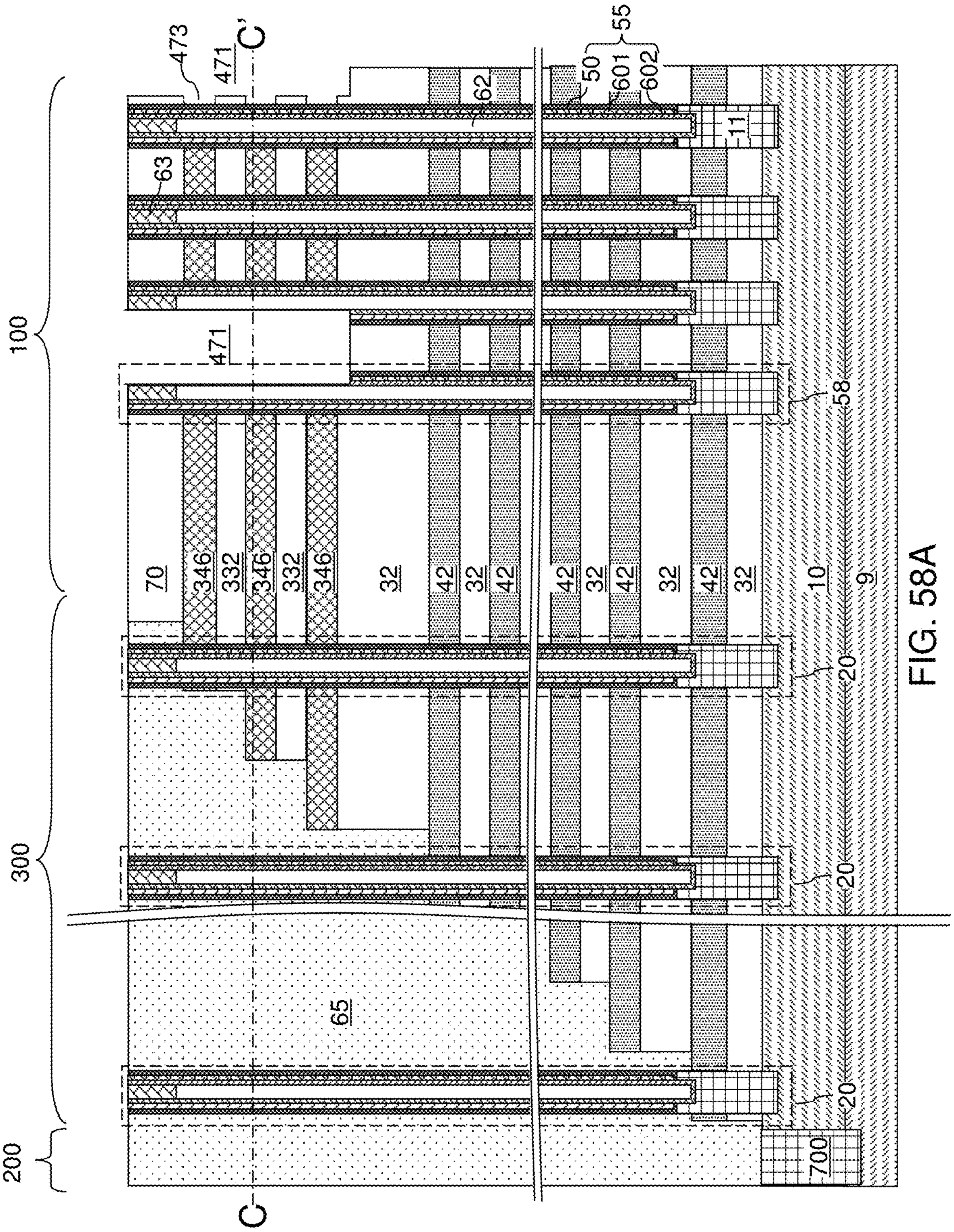
FIG. 58A is a vertical cross-sectional view the third exemplary structure after formation of drain-select-level electrically conductive layers and lateral recessing of the electrically conductive layers according to an embodiment of the present disclosure.
Figure 58B:
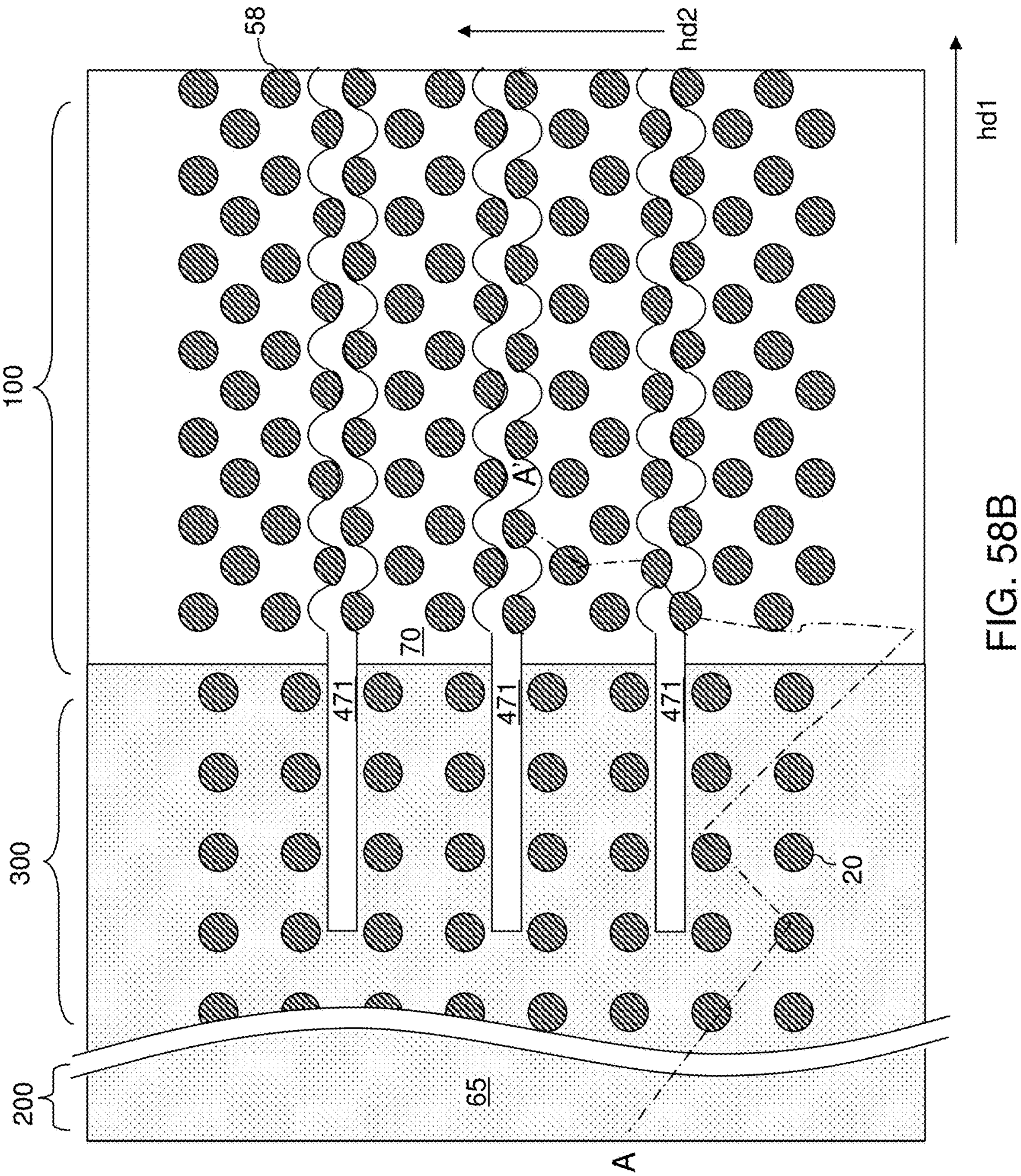
FIG. 58B is a top-down view of the third exemplary structure of FIG. 58A. The vertical plane A-A' is the plane of the schematic vertical cross-sectional view of FIG. 58A.
Figure 58C:
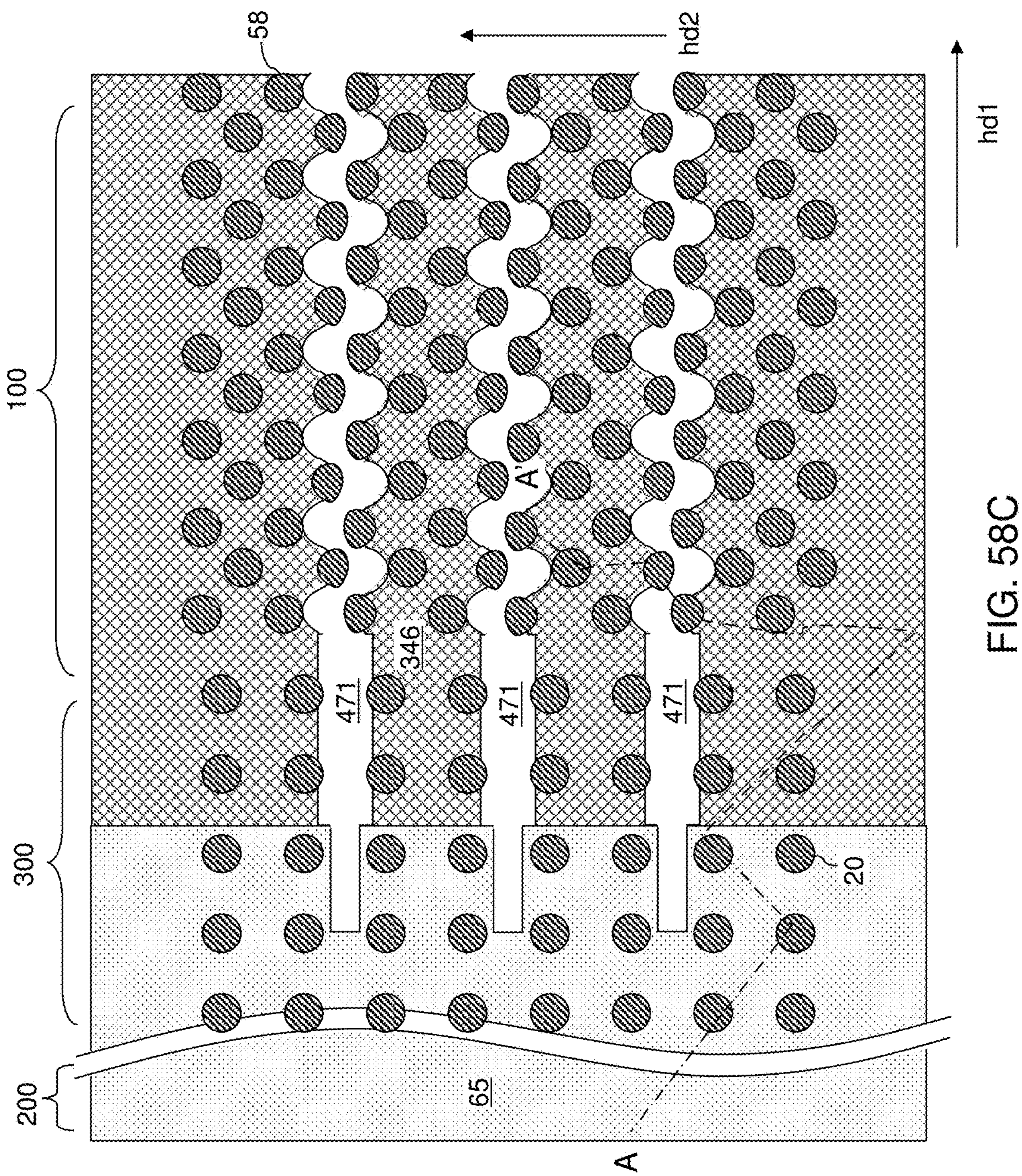
FIG. 58C is a horizontal cross-sectional view of the third exemplary structure along the horizontal plane C-C' of FIG.

Referring to FIGS. 58A-58C, a drain-select-level backside blocking dielectric layer (not shown) may be optionally deposited on the physically exposed surfaces of the insulating cap layer 70, the drain-select-level insulating layers 332, and the word-line-level insulating layers 32. The drain-select-level blocking dielectric layer comprises at least one dielectric material such as silicon oxide and/or a dielectric metal oxide. The thickness of the drain-select-level blocking dielectric layer, if present, may be in a range from 1 nm to 6 nm, although lesser and greater thicknesses may also be employed.

At least one conductive material is deposited in the drain-select-level backside recesses 343, on the sidewalls of the drain-select-level isolation trenches 471, and over the top surface of the sacrificial planarization stopper layer 373. The at least one conductive material may comprise, for example, a drain-select-level metallic barrier liner including a metallic barrier material (such as TiN, TaN, or WN) and a drain-select-level metallic fill material that includes a metal such as W, Co, Ru, Mo, etc. The at least one conductive material can be deposited by a conformal deposition method, which can be, for example, chemical vapor deposition (CVD), atomic layer deposition (ALD), electroless plating, electroplating, or a combination thereof.

Portions of the at least one conductive material that are present over the insulating cap layer 70 or in the drain-select-level isolation trenches 471 can be removed by performing an anisotropic etch process selective to the materials of the insulating cap layer 70, the drain-select-level insulating layers 332, and the topmost one of the word-line-level insulating layers 32. Remaining portions of the at least one conductive material located within the drain-select-level backside recesses 343 constitute drain-select-level electrically conductive layers (i.e., drain side select gate electrodes) 346. Each of the at least one drain-select-level sacrificial material layer 342 is replaced with at least one drain-select-level electrically conductive layer 346. Each of the at least one drain-select-level electrically conductive layer 346 includes multiple discrete segments that are laterally spaced apart by the drain-select-level isolation trenches 471.

According to an optional embodiment of the present disclosure, an isotropic recess etch process can be performed to laterally recess each of the at least one drain-select-level electrically conductive layer 346 around the drain-select-level isolation trenches 471 selective to the drain-select-level insulating layers 332 and the insulating cap layer 70. Lateral recesses 473 are formed in volumes from which the material of the at least one drain-select-level electrically conductive layer 346 is removed. The isotropic recess etch process may have an isotropic metal etch chemistry that etches the metallic material(s) of the at least one drain-select-level electrically conductive layer 346 selective to the dielectric materials of the drain-select-level insulating layers 332 and the insulating cap layer 70. The lateral recess distance of the isotropic recess etch process may be in a range from 1 nm to 50 nm, such as from 3 nm to 20 nm, although lesser and greater lateral recess distances may also be employed.

Generally, each discrete strip portion of the at least one drain-select-level electrically conductive layer 346 can be laterally recessed from each of the drain-select-level isolation trenches 471 such that proximal regions of each discrete strip portion of the at least one drain-select-level electrically conductive layer 346 are removed from around each of the drain-select-level isolation trenches 471. In one embodiment, planar outer sidewall portions of two rows of memory opening fill structures 58 can be physically exposed to each of the drain-select-level isolation trenches 471.

Referring to FIGS. 59A-59C, a dielectric fill material such as silicon oxide can be deposited in the drain-select-level isolation trenches 471. Excess portions of the dielectric fill material can be removed from above the horizontal plane including the top surface of the insulating cap layer 70 by a planarization process, which may employ a chemical mechanical polishing (CMP) process or a recess etch process. Remaining portions of the dielectric fill material that fill the drain-select-level isolation trenches 471 comprise drain-select-level isolation structures 472. The drain-select-level isolation structures 472 are formed directly on laterally recessed sidewalls of the at least one drain-select-level electrically conductive layer 346. Each drain-select-level isolation structure 472 can be formed within a combined volume including a drain-select-level isolation trench 471 and lateral recesses 473 that are adjoined to the drain-select-level isolation trench 471.

Generally, at least one drain-select-level isolation structure 472 vertically extends through the at least one drain-select-level electrically conductive layer 346. In one embodiment, each of the at least one drain-select-level isolation structure 472 comprises a vertically-extending dielectric material portion 472V having a lateral extent that is bounded by a pair of vertical planes that generally extend along a first horizontal direction hd1 and located between a neighboring pair of rows of the memory opening fill structures 58; and multiple rows of laterally-protruding dielectric material portions 472P adjoined to the vertically-extending dielectric material portion 472V and laterally protruding along a second horizontal direction hd2 that is perpendicular to the first horizontal direction hd1 from a respective one of the pair of vertical planes. In one embodiment, the pair of vertical planes may include sidewalls of the insulating cap layer 70 and sidewalls of the drain-select-level insulating layer(s) 332.

In one embodiment, the multiple rows of laterally-protruding dielectric material portions 472P may include two rows of laterally-protruding dielectric material portions in case the drain-select-level electrically conductive layer 346 is located within a single level, may include four rows of multiple rows of laterally-protruding dielectric material portions in case two drain-select-level electrically conductive layers 346 are present, or may include six rows of multiple rows of laterally-protruding dielectric material portions in case three drain-select-level electrically conductive layers 346 are present, etc.

In one embodiment, each laterally-protruding dielectric material portion 472P of the multiple rows of laterally-protruding dielectric material portions comprises a respective sidewall that is laterally offset from a respective proximal one of the pair of vertical planes by a uniform lateral offset distance, which is the same as lateral recess distance of the isotropic recess etch process that laterally recesses sidewalls of the discrete strips of the at least one drain-select-level electrically conductive layer 346 at the processing steps of FIGS. 58A-58C.

In one embodiment, each of the at least one drain-select-level isolation structure 472 comprises a periodic repetition of lateral wiggles along the second horizontal direction hd2. In one embodiment, the memory opening fill structures 58 comprise multiple rows of memory opening fill structures 58 that are arranged along the first horizontal direction hd1 with a first pitch; and the periodic repetition of lateral wiggles has a periodicity of the first pitch along the first horizontal direction hd1.

In one embodiment, the pair of lengthwise sidewalls of the vertically-extending dielectric material portion comprises a pair of straight lengthwise sidewall segments that are parallel to the first horizontal direction hd1 in the staircase region 300. In one embodiment, the pair of vertical planes is laterally spaced from each other along the second horizontal direction hd2 by a uniform lateral spacing that is invariant along the first horizontal direction hd1.

In one embodiment, the multiple rows of laterally-protruding dielectric material portions 472P contact sidewalls of each memory opening fill structure 58 within the neighboring pair of rows of the memory opening fill structures 58. In one embodiment, the multiple rows of laterally-protruding dielectric material portions 472P contact sidewalls of each memory opening fill structure 58 within four rows of the memory opening fill structures 58 that includes the neighboring pair of rows of the memory opening fill structures 58 and include two additional rows of memory opening fill structures 58.

Referring to FIGS. 60A-60C, the processing steps of FIGS. 9A and 9B, 10, 11A-11D, 12, 13, 14A and 14B, and 15 can be subsequently performed with needed changes to form backside trenches 79, to form source regions 61, to replace the word-line-level sacrificial material layers 42 with word-line-level electrically conductive layers 46, and to form backside trench fill structures (74, 76). In this case, the backside trenches 79 may cut through the at least one drain-select-level electrically conductive layers 346. Alternatively, dummy drain-select-level isolation structures (not shown) may be formed concurrently with formation of the drain-select-level isolation structures 472 by forming patterns of line trenches within the areas for the backside trenches 79 at the processing steps of FIGS. 56A-56C, and the backside trenches 79 may be formed through the volumes of the dummy drain-select-level isolation structures, thereby removing the entirety of a predominant portion of the dummy drain-select-level isolation structures.

During the isotropic etch process that removes the word-line-level sacrificial material layers 42 to form word-line-level backside recesses, the etchant that removes the word-line-level sacrificial material layers 42 does not etch the drain-select-level electrically conductive layers 346. Thus, the drain-select-level electrically conductive layers 346 are not changed during the processing steps employed to replace the word-line-level sacrificial material layers 42 with word-line-level electrically conductive layers 46, which correspond to the processing steps of FIGS. 10, 11A-11D, 12, and 13.

Generally, backside trenches 79 can be formed through the alternating stack of insulating layers (32, 332) and electrically conductive layers (46, 346) after formation of the drain-select-level isolation structures 472. The word-line-level sacrificial material layers 42 can be replaced with the word-line-level electrically conductive layers 46 by providing an etchant that etches the word-line-level sacrificial material layers 42 into the backside trenches 79 and by providing a reactant that deposits a conductive material into volumes from which the word-line-level sacrificial material layers 42 are removed through the backside trenches 79. In this case, the backside trenches 79 are employed as a conduit for the etchant and the reactant.

Referring to FIGS. 61A-61C, a contact level dielectric layer 73 can be formed over the insulating cap layer 70 and the retro-stepped dielectric material portion 65. Contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers (46, 346) through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to FIG. 62A, an alternative configuration of the third exemplary structure can be derived from the third exemplary structure illustrated in FIGS. 57A-57C by performing the processing steps of FIGS. 58A-58C but omitting the isotopic recess etch process. In this case, each discrete strip portion of the at least one drain-select-level electrically conductive layer 346 can be formed without any laterally recessed sidewall. In other words, each discrete strip portion of the at least one drain-select-level electrically conductive layer 346 can have sidewalls that are vertically coincident with a sidewall of the insulating cap layer 70 and/or a sidewall of each of the at least one drain-select-level insulating layer 332.

Referring to FIG. 62B, the processing steps of FIGS. 59A-59C, 60A-60C, and 61A-61C can be performed to form drain-select-level isolation structures 472, to form backside trenches 79, to replace the word-line-level sacrificial material layers 42 with word-line-level electrically conductive layers 46, to form backside trench fill structures (74, 76), and to form various contact via structures (86, 88, 8P). The drain-select-level isolation structures 472 in this embodiment lacks the laterally-protruding dielectric material portions 472P, and include only the vertically-extending dielectric material portion 472V.

In another alternative embodiment of the third exemplary structure, all electrically conductive layers (46, 346) (i.e., the word lines and the drain side select gate electrodes) may be formed before formation of the drain-select-level isolation trenches 471 by depositing the electrically conductive layers (46, 346) into the backside recesses. In this alternative embodiment, the drain-select-level isolation trenches 471 and optionally the lateral recesses 473 are formed by etching through the drain-select-level electrically conductive layers (i.e., the drain side select gate electrodes) 346, followed by formation of the drain-select-level isolation structures 472 in the drain-select-level isolation trenches 471 and in the optional lateral recesses 473.

In an alternative configuration of the third exemplary structure, drain-select-level isolation structures 472 are formed before the electrically conductive layers (46, 346). As shown in FIGS. 63A-63C, the drain-select-level isolation structures 472 are formed drain-select-level isolation trenches 471. The drain-select-level isolation structures 472 extend through the at least one drain-select-level sacrificial material layer 342, and the at least one drain-select-level insulating layer 332.

Referring to FIGS. 64A-64C, the backside trenches 79 described in the previous embodiment are formed through the alternating stack (32, 42, 332, 342). The sacrificial material layers 42 and the at least one drain-select-level sacrificial material layer 342 are selectively etched through the backside trenches 79 to form the backside recesses (43, 243) as described above. The electrically conductive layers (46, 346) are then formed in the backside recesses (43, 243) as described above. The insulating spacer 74 and the backside contact via structure 76 are then formed in each backside trench 79 as described above.

FIG. 65A is horizontal cross-sectional view of electric field lines in a portion of comparative structure during device operation. The comparative structure contains a linear (i.e., non-wiggled, straight line) drain-select-level isolation structure 72 between two memory opening fill structures 58F and 58N containing respective memory films (50F, 50N), vertical semiconductor channels (60F, 60N) and dielectric cores (62F, 62N). During a step in the device operation, the first memory opening fill structure 58F is turned off (e.g., the adjacent drain-select-level electrically conductive layer 346F is turned off), while the second memory opening fill structure 58N is turned on (e.g., the adjacent drain-select-level electrically conductive layer 346N is turned on by applying a turn on voltage). The linear drain-select-level isolation structure 72 contains a high electric field region 72E adjacent to the end portion 346E of the drain-select-level electrically conductive layer 346N which partially surrounds the second memory opening fill structure 58N. This may result in a high leakage current region 60C in the vertical semiconductor channel 60F which faces high electric field region 72E. The leakage current through the channel 60F of the first memory opening fill structure 58F which is turned off is undesirable.

FIG. 65B is horizontal cross-sectional view of electric field lines a portion of the third exemplary structure during device operation. Due to the wiggled shape of the drain-select-level isolation structure 472, the end portion 346E of the drain-select-level electrically conductive layer 346N which partially surrounds the second memory opening fill structure 58N is spaced farther from the first memory opening fill structure 58F than in the comparative structure of FIG. 65A. The area of the end portion 346E of the drain-select-level electrically conductive layer 346N facing the first memory opening fill structure 58F is also reduced due to the wiggled shape of the drain-select-level isolation structure 472. Therefore, the high electric field region 472E in the drain-select-level isolation structure 472 is also located farther from the first memory opening fill structure 58F and has a smaller area facing the first memory opening fill structure 58F than in the comparative structure of FIG. 65A. Therefore, the third exemplary structure may exclude the high leakage current region 60C in the vertical semiconductor channel 60F of the turned off first memory opening fill structure 58F. Thus, the wiggled drain-select-level isolation structure 472 may reduce neighboring memory opening fill structure interference and leakage current through the channel 60F of the turned off first memory opening fill structure 58F.

Furthermore, if the drain-select-level isolation structure 472 include the optional laterally-protruding dielectric material portions 472P, then the laterally-protruding dielectric material portion 472P causes the end portion 346E of the drain-select-level electrically conductive layer 346N to be further spaced from the first memory opening fill structure 58F located on the opposite side of the drain-select-level isolation structure 472 from layer 346N. This may also reduce neighboring memory opening fill structure interference and leakage current through the channel 60F of the turned off first memory opening fill structure 58F.

Referring to FIGS. 66A-66C, a fourth exemplary structure according to an embodiment of the present disclosure can be derived from the third exemplary structure of FIGS. 56A-56C by employing straight line (i.e., linear) trenches having a respective pair of straight lengthwise sidewall segments that are parallel to the first horizontal direction hd1 as the drain-select-level isolation trenches 471. In this case, the drain-select-level isolation trenches 471 may cut through drain-select-level portions (i.e., upper portions) of the memory opening fill structures 58 located above the topmost word-line-level insulating layer 32, i.e., may cut through upper portions of the memory opening fill structures 58 that are located at the levels of the insulating cap layer 70, the drain-select-level sacrificial material layers 342, and the drain-select-level insulating layers 332. In one embodiment, the entirety of each lengthwise sidewall of the drain-select-level isolation trenches 471 may be straight. The two horizontally-straight lengthwise sidewall segments of each drain-select-level isolation trench 471 define a pair of vertical planes that are laterally spaced apart from each other by a uniform spacing. The pair of vertical planes include sidewalls of the insulating cap layer 70, the at least one drain-select-level sacrificial material layer 342, and the at least one drain-select-level insulating layer 332.

In one embodiment, each drain-select-level isolation trench 471 may vertically extend between a respective neighboring pair of rows of memory opening fill structures 58. In one embodiment, at least one of the memory opening fill structures 58 within the respective neighboring pair of rows of memory opening fill structures 58 may comprise a laterally stepped sidewall including a first sidewall segment underlying a horizontal plane including each bottom surface of the drain-select-level isolation trenches 471, a second sidewall segment overlying the horizontal plane, and a connecting segment (i.e., the lateral step LS) that connects the first sidewall segment to the second sidewall segment within the horizontal plane. In one embodiment, each memory opening fill structure 58 within the respective neighboring pair of rows of memory opening fill structures 58 may comprise a respective stepped sidewall including a first sidewall segment underlying a horizontal plane including each bottom surface of the drain-select-level isolation trenches 471, a second sidewall segment overlying the horizontal plane, and a connecting segment LS that connects the first sidewall segment to the second sidewall segment within the horizontal plane.

Planar sidewalls of a subset of the memory opening fill structures 58 can be physically exposed to the drain-select-level isolation trenches 471. Each of the planar sidewalls of the subset of the memory opening fill structures 58 may be contained within a respective Euclidean vertical plane. The planar sidewalls of the memory opening fill structures 58 may include planar vertical surface segments of memory films 50, and may include planar vertical surface segments of vertical semiconductor channels 60, and may include planar vertical surface segments of dielectric cores 62. Generally, the drain-select-level isolation trenches 471 can be formed through at least one spacer material layer (such as the at least one drain-select-level sacrificial material layer 342) including a topmost spacer material layer between a respective neighboring pair of rows of memory opening fill structures 58.

Referring to FIGS. 67A-67C, the processing steps of FIGS. 57A-57C and 58A-58C can be performed to remove the at least one drain-select-level sacrificial material layer 342 selective to the insulating cap layer 70 and the at least one drain-select-level insulating layer 332, and to form at least one drain-select-level electrically conductive layer 346 in the drain-select-level backside recesses 343 through the drain-select-level isolation trenches 471. In alternative embodiments, the drain-select-level electrically conductive layers 346 may be formed during a different step in the process, as described above with respect to the alternative configurations of the third exemplary structure. After an anisotropic etch process that removes at least one conductive fill material from above the insulating cap layer 70 and from inside the drain-select-level isolation trenches 471, an isotropic recess etch process can be performed to laterally recess each of the at least one drain-select-level electrically conductive layer 346 around the drain-select-level isolation trenches 471 selective to the drain-select-level insulating layers 332 and the insulating cap layer 70. Lateral recesses 473 are formed in volumes from which the material of the at least one drain-select-level electrically conductive layer 346 is removed. The isotropic recess etch process may have an isotropic metal etch chemistry that etches the metallic material(s) of the at least one drain-select-level electrically conductive layer 346 selective to the dielectric materials of the drain-select-level insulating layers 332 and the insulating cap layer 70. The lateral recess distance of the isotropic recess etch process may be in a range from 1 nm to 50 nm, such as from 3 nm to 20 nm, although lesser and greater lateral recess distances may also be employed.

Generally, each discrete strip portion of the at least one drain-select-level electrically conductive layer 346 can be laterally recessed from each of the drain-select-level isolation trenches 471 such that proximal regions of each discrete strip portion of the at least one drain-select-level electrically conductive layer 346 are removed from around each of the drain-select-level isolation trenches 471. In one embodiment, a planar vertical sidewall segment and two horizontally-convex and vertically straight segments of each memory opening fill structure 58 within a neighboring pair of rows of memory opening fill structures 58 can be physically exposed around each of the drain-select-level isolation trenches 471.

Referring to FIGS. 68A-68C, the processing steps of FIGS. 59A-59C can be performed. Specifically, a dielectric fill material such as silicon oxide can be deposited in the drain-select-level isolation trenches 471. Excess portions of the dielectric fill material can be removed from above the horizontal plane including the top surface of the insulating cap layer 70 by a planarization process, which may employ a chemical mechanical polishing (CMP) process or a recess etch process. Remaining portions of the dielectric fill material that fill the drain-select-level isolation trenches 471 comprise drain-select-level isolation structures 472. The drain-select-level isolation structures 472 are formed directly on laterally recessed sidewalls of the at least one drain-select-level electrically conductive layer 346. Each drain-select-level isolation structure 472 can be formed within a combined volume including a drain-select-level isolation trench 471 and lateral recesses 473 that are adjoined to the drain-select-level isolation trench 471.

Generally, at least one drain-select-level isolation structure 472 vertically extends through the at least one drain-select-level electrically conductive layer 346. In one embodiment, each of the at least one drain-select-level isolation structure 472 comprises a vertically-extending dielectric material portion 472V having a lateral extent that is bounded by a pair of laterally-straight vertical planes that generally extend along a first horizontal direction hd1 and located between a neighboring pair of rows of the memory opening fill structures 58; and multiple rows of laterally-protruding dielectric material portions 472P adjoined to the vertically-extending dielectric material portion and laterally protruding along a second horizontal direction hd2 that is perpendicular to the first horizontal direction hd1 from a respective one of the pair of vertical planes. In one embodiment, the pair of vertical planes may include sidewalls of the insulating cap layer 70 and sidewalls of the drain-select-level insulating layer(s) 332. In one embodiment, the multiple rows of laterally-protruding dielectric material portions may include two rows of laterally-protruding dielectric material portions in case the drain-select-level electrically conductive layer 346 is located within a single level, may include four rows of multiple rows of laterally-protruding dielectric material portions in case two drain-select-level electrically conductive layers 346 are present, or may include six rows of multiple rows of laterally-protruding dielectric material portions in case three drain-select-level electrically conductive layers 346 are present, etc.

In one embodiment, each laterally-protruding dielectric material portion of the multiple rows of laterally-protruding dielectric material portions comprises a respective sidewall that is laterally offset from a respective proximal one of the pair of vertical planes by a uniform lateral offset distance, which is the same as lateral recess distance of the isotropic recess etch process that laterally recesses sidewalls of the discrete strips of the at least one drain-select-level electrically conductive layer 346 at the processing steps of FIGS. 67A-67C.

Referring to FIGS. 69A-69C, the processing steps of FIGS. 9A and 9B, 10, 11A-11D, 12, 13, 14A and 14B, and 15 can be subsequently performed with any needed changes to form backside trenches 79, to form source regions 61, to replace the word-line-level sacrificial material layers 42 with word-line-level electrically conductive layers 46, and to form backside trench fill structures (74, 76). In this case, the backside trenches 79 may cut through the at least one drain-select-level electrically conductive layers 346. Alternatively, dummy drain-select-level isolation structures (not shown) may be formed concurrently with formation of the drain-select-level isolation structures 472 by forming patterns of line trenches within the areas for the backside trenches 79 at the processing steps of FIGS. 66A-66C, and the backside trenches 79 may be formed through the volumes of the dummy drain-select-level isolation structures, thereby removing the entirety of a predominant portion of the dummy drain-select-level isolation structures.

During the isotropic etch process that removes the word-line-level sacrificial material layers 42 to form word-line-level backside recesses, the etchant that removes the word-line-level sacrificial material layers 42 does not etch the drain-select-level electrically conductive layers 346. Thus, the drain-select-level electrically conductive layers 346 are not changed during the processing steps employed to replace the word-line-level sacrificial material layers 42 with word-line-level electrically conductive layers 46, which correspond to the processing steps of FIGS. 10, 11A-11D, 12, and 13.

Generally, backside trenches 79 can be formed through the alternating stack of insulating layers (32, 332) and spacer material layers (46, 346) after formation of the drain-select-level isolation structures 472. The word-line-level sacrificial material layers 42 can be replaced with the word-line-level electrically conductive layers 46 by providing an etchant that etches the word-line-level sacrificial material layers 42 into the backside trenches 79 and by providing a reactant that deposits a conductive material into volumes from which the word-line-level sacrificial material layers 42 are removed through the backside trenches 79. In this case, the backside trenches 79 are employed as a conduit for the etchant and the reactant.

Referring to FIGS. 70A-70C, the processing steps of FIGS. 59A-59C, 60A-60C, and 61A-61C can be performed to form drain-select-level isolation structures 472, to form backside trenches 79, to replace the word-line-level sacrificial material layers 42 with word-line-level electrically conductive layers 46, to form backside trench fill structures (74, 76), and to form various contact via structures (86, 88, 8P).

In an alternative configuration of the fourth exemplary structure, drain-select-level isolation structures 472 are formed before the electrically conductive layers (46, 346). Referring to FIG. 71, each discrete strip portion of the at least one drain-select-level sacrificial material layer 342 can be laterally recessed from each of the drain-select-level isolation trenches 471 such that proximal regions of each discrete strip portion of the at least one drain-select-level sacrificial material layer 342 are removed from around each of the drain-select-level isolation trenches 471. Lateral recesses 473 are formed in volumes from which the material of the at least one drain-select-level sacrificial material layer 342 is removed.

As shown in FIG. 72, the drain-select-level isolation structures 472 are formed drain-select-level isolation trenches 471. The drain-select-level isolation structures 472 extend through the at least one drain-select-level sacrificial material layer 342, and the at least one drain-select-level insulating layer 332. Each of the at least one drain-select-level isolation structure 472 comprises the vertically-extending dielectric material portion 472V and multiple rows of laterally-protruding dielectric material portions 472P adjoined to the vertically-extending dielectric material portion 472V and laterally protruding into the lateral recesses 473.

Referring to FIG. 73, the backside trenches 79 described in the previous embodiment are formed through the alternating stack (32, 42, 332, 342). The sacrificial material layers 42 and the at least one drain-select-level sacrificial material layer 342 are selectively etched through the backside trenches 79 to form the backside recesses (43, 243) as described above. The electrically conductive layers (46, 346) are then formed in the backside recesses (43, 243) as described above with respect to FIGS. 64A-64C. The insulating spacer 74 and the backside contact via structure 76 are then formed in each backside trench 79 as described above.

Referring to all drawings related to the third exemplary structure and alternative configurations thereof and according to various embodiments of the present disclosure, a three-dimensional memory device includes an alternating stack of insulating layers (32, 332) and electrically conductive layers (46, 346) located over a substrate (9, 10); memory openings 49 vertically extending through the alternating stack {(32, 46), (332, 346)}; memory opening fill structures 58 located within a respective one of the memory openings 49, wherein each of the memory opening fill structures {(32, 46), (332, 346)} comprises a memory film 50 and a vertical semiconductor channel 60; and at least one drain-select-level isolation structure 472 vertically extending through at least a topmost electrically conductive layer 346 of the electrically conductive layers (46, 346). The at least one drain-select-level isolation structure 472 laterally extends generally along a first horizontal direction hd1 and having a periodic repetition of lateral wiggles along a second horizontal direction hd2 that is perpendicular to the first horizontal direction, and the at least one drain-select-level isolation structure 472 cuts through drain-select-level portions (e.g., upper portions) of at least some of the memory opening fill structures 58.

In one embodiment, the memory opening fill structures 58 comprise multiple rows of memory opening fill structures that are arranged along the first horizontal direction hd1 with a first pitch, and the periodic repetition of lateral wiggles has a periodicity of the first pitch along the first horizontal direction hd1. In one embodiment, the at least one drain-select-level isolation structure 472 cuts through the drain-select-level portions of the memory opening fill structures 58 in first rows located adjacent to the at least one drain-select-level isolation structures, and the at least one drain-select-level isolation structure 472 does not cut through the drain-select-level portions of the memory opening fill structures 58 in second rows that are spaced from the at least one drain-select-level isolation structure by the first row of memory opening fill structures.

In one embodiment, the drain-select-level portions of the memory opening fill structures 58 located in the first rows have a horizontal cross-sectional shape of a segment of a circle having two planar sidewalls corresponding to two chords extending between end points of a major arc, and the drain-select-level portions of the memory opening fill structures 58 located in the second rows have a horizontal cross-sectional shape of a circle. In one embodiment, the memory opening fill structures 58 located in the first rows comprise a stepped sidewall including a first sidewall segment underlying a horizontal plane including each bottom surface of the at least one drain-select-level isolation structure 472, a second sidewall segment overlying the horizontal plane, and a connecting segment LS that connects the first sidewall segment to the second sidewall segment within the horizontal plane, and the at least one drain-select-level isolation structure 472 does not contact, and is laterally spaced from, the memory opening fill structures 58 located in the second rows.

In one embodiment, the at least one drain-select-level isolation structure 472 comprises a vertically-extending dielectric material portion 472V located between the adjacent first rows of the memory opening fill structures, and laterally-protruding dielectric material portions 472P adjoined to the vertically-extending dielectric material portion and laterally protruding into lateral recesses located adjacent to the at least the topmost electrically conductive layer 346.

Referring to all drawings related to the fourth exemplary structure and alternative configurations thereof and according to various embodiments of the present disclosure, a three-dimensional memory device includes an alternating stack of insulating layers (32, 332) and electrically conductive layers (46, 346) located over a substrate (9, 10); memory openings 49 vertically extending through the alternating stack {(32, 46), (332, 346)}; memory opening fill structures 58 located within a respective one of the memory openings 49, wherein each of the memory opening fill structures {(32, 46), (332, 346)} comprises a memory film 50 and a vertical semiconductor channel 60; and at least one drain-select-level isolation structure 472 vertically extending through at least a topmost electrically conductive layer 346 of the electrically conductive layers (46, 346). The at least one drain-select-level isolation structure 472 comprises a vertically-extending dielectric material portion 472V and laterally-protruding dielectric material portions 472P adjoined to the vertically-extending dielectric material portion and laterally protruding into lateral recesses 473 located adjacent to the at least the topmost electrically conductive layer 346.

In one embodiment, the vertically-extending dielectric material portion 472V has a lateral extent that is bounded by a pair of vertical planes that generally extend along a first horizontal direction hd1 and located between a neighboring pair of rows of the memory opening fill structures 58, and the laterally-protruding dielectric material portions 472P laterally protrude along a second horizontal direction hd2 that is perpendicular to the first horizontal direction from a respective one of the pair of vertical planes.

In one embodiment, the at least one drain-select-level isolation structure 472 cuts through drain-select-level portions 58 of at least some of the memory opening fill structures, and the memory opening fill structures 59 comprise multiple rows of memory opening fill structures that are arranged along the first horizontal direction hd1 with a first pitch. In one embodiment, the at least one drain-select-level isolation structure 472 cuts through the drain-select-level portions of the memory opening fill structures 58 in first rows located adjacent to the at least one drain-select-level isolation structures, and the at least one drain-select-level isolation structure 472 does not cut through the drain-select-level portions of the memory opening fill structures 58 in second rows that are spaced from the at least one drain-select-level isolation structure by the first row of memory opening fill structures.

In one embodiment, the at least one drain-select-level isolation structure comprises a periodic repetition of lateral wiggles along the second horizontal direction hd2, and the periodic repetition of lateral wiggles has a periodicity of the first pitch along the first horizontal direction. In one embodiment, the drain-select-level portions of the memory opening fill structures 58 located in the first rows have a horizontal cross-sectional shape of a segment of a circle having two planar sidewalls corresponding to two chords extending between end points of a major arc, and the drain-select-level portions of the memory opening fill structures 58 located in the second rows have a horizontal cross-sectional shape of a circle.

In another embodiment, the pair of lengthwise sidewalls of the vertically-extending dielectric material portion 472 comprises a pair of straight lengthwise sidewall segments that are parallel to the first horizontal direction.

In one embodiment, the memory opening fill structures 58 located in the first rows comprise a stepped sidewall including a first sidewall segment underlying a horizontal plane including each bottom surface of the at least one drain-select-level isolation structure, a second sidewall segment overlying the horizontal plane, and a connecting segment LS that connects the first sidewall segment to the second sidewall segment within the horizontal plane, and the at least one drain-select-level isolation structure 472 does not contact, and is laterally spaced from, the memory opening fill structures 58 located in the second rows. In one embodiment, each of the memory opening fill structures 58 located in the second rows has a respective cylindrical shape and all sidewalls of the memory opening fill structures in the second rows vertically extend straight from a bottommost layer within the alternating stack to a topmost layer within the alternating stack without any lateral step therein.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

an alternating stack of insulating layers and electrically conductive layers;

memory openings vertically extending through the alternating stack;

memory opening fill structures located within a respective one of the memory openings, wherein each of the memory opening fill structures comprises a memory film and a vertical semiconductor channel; and at least one drain-select-level isolation structure vertically extending through at least a topmost electrically conductive layer of the electrically conductive layers and laterally extending generally along a first horizontal direction and having a periodic repetition of lateral wiggles along a second horizontal direction that is perpendicular to the first horizontal direction, wherein the at least one drain-select-level isolation structure cuts through drain-select-level portions of at least some of the memory opening fill structures.

2. The three-dimensional memory device of claim 1, wherein:

the memory opening fill structures comprise multiple rows of memory opening fill structures that are arranged along the first horizontal direction with a first pitch; and the periodic repetition of lateral wiggles has a periodicity of the first pitch along the first horizontal direction.

3. The three-dimensional memory device of claim 2, wherein:

the at least one drain-select-level isolation structure cuts through the drain-select-level portions of the memory opening fill structures in first rows located adjacent to the at least one drain-select-level isolation structure; and the at least one drain-select-level isolation structure does not cut through the drain-select-level portions of the memory opening fill structures in second rows that are spaced from the at least one drain-select-level isolation structure by the first row of memory opening fill structures.

4. The three-dimensional memory device of claim 3, wherein:

the drain-select-level portions of the memory opening fill structures located in the first rows have a horizontal cross-sectional shape of a segment of a circle having two planar sidewalls corresponding to two chords extending between end points of a major arc; and the drain-select-level portions of the memory opening fill structures located in the second rows have a horizontal cross-sectional shape of a circle.

5. The three-dimensional memory device of claim 3, wherein:

the memory opening fill structures located in the first rows comprise a stepped sidewall including a first sidewall segment underlying a horizontal plane including each bottom surface of the at least one drain-select-level isolation structure, a second sidewall segment overlying the horizontal plane, and a connecting segment that connects the first sidewall segment to the second sidewall segment within the horizontal plane; and the at least one drain-select-level isolation structure does not contact, and is laterally spaced from, the memory opening fill structures located in the second rows.

6. The three-dimensional memory device of claim 1, wherein the at least one drain-select-level isolation structure comprises:

a vertically-extending dielectric material portion located between the adjacent first rows of the memory opening fill structures; and laterally-protruding dielectric material portions adjoined to the vertically-extending dielectric material portion and laterally protruding into lateral recesses located adjacent to the at least the topmost electrically conductive layer.

7. A three-dimensional memory device, comprising:

an alternating stack of insulating layers and electrically conductive layers;

memory openings vertically extending through the alternating stack;

memory opening fill structures located within a respective one of the memory openings, wherein each of the memory opening fill structures comprises a memory film and a vertical semiconductor channel; and at least one drain-select-level isolation structure vertically extending through at least a topmost electrically conductive layer of the electrically conductive layers, wherein the at least one drain-select-level isolation structure comprises a vertically-extending dielectric material portion and laterally-protruding dielectric material portions adjoined to the vertically-extending dielectric material portion and laterally protruding into lateral recesses located adjacent to the at least the topmost electrically conductive layer.

8. The three-dimensional memory device of claim 7, wherein:

the vertically-extending dielectric material portion has a lateral extent that is bounded by a pair of vertical planes that generally extend along a first horizontal direction and located between a neighboring pair of rows of the memory opening fill structures; and the laterally-protruding dielectric material portions laterally protrude along a second horizontal direction that is perpendicular to the first horizontal direction from a respective one of the pair of vertical planes.

9. The three-dimensional memory device of claim 7, wherein:

the at least one drain-select-level isolation structure cuts through drain-select-level portions of at least some of the memory opening fill structures; and the memory opening fill structures comprise multiple rows of memory opening fill structures that are arranged along the first horizontal direction with a first pitch.

10. The three-dimensional memory device of claim 9, wherein:

the at least one drain-select-level isolation structure cuts through the drain-select-level portions of the memory opening fill structures in first rows located adjacent to the at least one drain-select-level isolation structures; and the at least one drain-select-level isolation structure does not cut through the drain-select-level portions of the memory opening fill structures in second rows that are spaced from the at least one drain-select-level isolation structure by the first row of memory opening fill structures.

11. The three-dimensional memory device of claim 10, wherein the at least one drain-select-level isolation structure comprises a periodic repetition of lateral wiggles along the second horizontal direction, and the periodic repetition of lateral wiggles has a periodicity of the first pitch along the first horizontal direction.

12. The three-dimensional memory device of claim 11, wherein:

the drain-select-level portions of the memory opening fill structures located in the first rows have a horizontal cross-sectional shape of a segment of a circle having two planar sidewalls corresponding to two chords extending between end points of a major arc; and the drain-select-level portions of the memory opening fill structures located in the second rows have a horizontal cross-sectional shape of a circle.

13. The three-dimensional memory device of claim 10, wherein the pair of lengthwise sidewalls of the vertically-extending dielectric material portion comprises a pair of straight lengthwise sidewall segments that are parallel to the first horizontal direction.

14. The three-dimensional memory device of claim 10, wherein:

the memory opening fill structures located in the first rows comprise a stepped sidewall including a first sidewall segment underlying a horizontal plane including each bottom surface of the at least one drain-select-level isolation structure, a second sidewall segment overlying the horizontal plane, and a connecting segment that connects the first sidewall segment to the second sidewall segment within the horizontal plane; and the at least one drain-select-level isolation structure does not contact, and is laterally spaced from, the memory opening fill structures located in the second rows.

15. The three-dimensional memory device of claim 14, wherein each of the memory opening fill structures located in the second rows has a respective cylindrical shape and all sidewalls of the memory opening fill structures in the second rows vertically extend straight from a bottommost layer within the alternating stack to a topmost layer within the alternating stack without any lateral step therein.

16. A method of forming a three-dimensional memory device, comprising:

forming an alternating stack of insulating layers and sacrificial material layers over a substrate, wherein the sacrificial material layers comprise word-line-level sacrificial material layers and at least one drain-select-level sacrificial material layer that overlies the drain-select-level sacrificial material layers;

forming memory openings vertically extending through the alternating stack;

forming memory opening fill structures within the memory openings, wherein each of the memory opening fill structures comprises a memory film and a vertical semiconductor channel;

forming a drain-select-level isolation trench through the at least one drain-select-level sacrificial material layer between a neighboring pair of rows of memory opening fill structures of the memory opening fill structures;

forming lateral recesses around the drain-select-level isolation trench by laterally recessing the at least one drain-select-level sacrificial material layer selective to the insulating layers or by laterally recessing at least one drain-select-level electrically conductive layer that is formed by replacing the at least one drain-select-level sacrificial material layer selective to the insulating layers; and forming a drain-select-level isolation structure within a combined volume including the drain-select-level isolation trench and the lateral recesses.

17. The method of claim 16, wherein:

the lateral recesses are formed by laterally recessing the at least one sacrificial material layer selective to the insulating layers; and the method further comprises replacing remaining portions of the at least one drain-select-level sacrificial material layer with at least one drain-select-level electrically conductive layer after formation of the drain-select-level isolation structure.

18. The method of claim 17, further comprising:

forming a backside trench through the alternating stack after formation of the drain-select-level isolation structure; and replacing the word-line-level sacrificial material layers with word-line-level electrically conductive layers by providing an etchant that etches the sacrificial material layers into the backside trench and by providing a reactant that deposits a conductive material into volumes from which the sacrificial material layers are removed through the backside trench.

19. The method of claim 16, wherein:

the at least one drain-select-level sacrificial material layer is replaced with the at least one drain-select-level electrically conductive layer after formation of the drain-select-level isolation trench and prior to formation of the lateral recesses;

the lateral recesses are formed by laterally recessing the at least one drain-select-level electrically conductive layer selective to the insulating layers after formation of the drain-select-level isolation trench; and the drain-select-level isolation structure is formed directly on laterally recessed sidewalls of the at least one drain-select-level electrically conductive layer.

20. The method of claim 16, wherein:

the memory opening fill structures comprise rows of memory opening fill structures arranged along a first horizontal direction; and the drain-select-level isolation trench laterally extends generally along the first horizontal direction and has a periodic repetition of lateral wiggles along a second horizontal direction that is perpendicular to the first horizontal direction, wherein a periodicity of the lateral wiggles along the second horizontal direction is the same as a periodicity of memory opening fill structures within each row of memory opening fill structures among the memory opening fill structures.

* * * * *